United States Patent
Kamimura et al.

(10) Patent No.: US 12,013,644 B2
(45) Date of Patent: *Jun. 18, 2024

(54) METHOD FOR MANUFACTURING ELECTRONIC DEVICE

(71) Applicant: FUJIFILM Corporation, Tokyo (JP)

(72) Inventors: Tetsuya Kamimura, Shizuoka (JP); Tetsuya Shimizu, Shizuoka (JP); Satoru Murayama, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/561,999

(22) Filed: Dec. 27, 2021

(65) Prior Publication Data

US 2022/0121123 A1    Apr. 21, 2022

Related U.S. Application Data

(63) Continuation of application No. 16/143,496, filed on Sep. 27, 2018, now Pat. No. 11,256,173, which is a continuation of application No. PCT/JP2017/010620, filed on Mar. 16, 2017.

(30) Foreign Application Priority Data

| Mar. 31, 2016 | (JP) | 2016-073255 |
| Jul. 29, 2016 | (JP) | 2016-150624 |
| Mar. 9, 2017 | (JP) | 2017-045323 |

(51) Int. Cl.
| G03F 7/32 | (2006.01) |
| G03F 7/00 | (2006.01) |
| G03F 7/027 | (2006.01) |
| G03F 7/039 | (2006.01) |
| G03F 7/40 | (2006.01) |
| H01L 21/02 | (2006.01) |

(52) U.S. Cl.
CPC ............ *G03F 7/32* (2013.01); *G03F 7/027* (2013.01); *G03F 7/0397* (2013.01); *G03F 7/322* (2013.01); *G03F 7/40* (2013.01); *G03F 7/70925* (2013.01); *H01L 21/0206* (2013.01)

(58) Field of Classification Search
CPC . G03F 7/32; G03F 7/322; G03F 7/025; C07D 241/06
See application file for complete search history.

(56) References Cited

U.S. PATENT DOCUMENTS 11,256,173 B2 * 2/2022 Kamimura ............... G03F 7/40
2010/0068210 A1   3/2010 Ji et al.

FOREIGN PATENT DOCUMENTS

| CN | 103189965 | 7/2013 |
| TW | 200941155 | 10/2009 |
| TW | 201423289 | 6/2014 |

OTHER PUBLICATIONS

"Third Party Observation of Taiwan Counterpart Application", dated Nov. 25, 2021, with partial English translation thereof, p. 1-p. 75.
"Office Action of Taiwan Counterpart Application", issued on Mar. 26, 2024, with English translation thereof, p. 1-p. 10.

* cited by examiner

*Primary Examiner* — Daborah Chacko-Davis
(74) *Attorney, Agent, or Firm* — JCIPRNET

(57) ABSTRACT

A method for manufacturing an electronic device, the method including performing a treatment using a treatment liquid for manufacturing a semiconductor, the treatment liquid for manufacturing a semiconductor includes: a quaternary ammonium compound represented by the following Formula (N); at least one additive selected from the group consisting of an anionic surfactant, a nonionic surfactant, a cationic surfactant, and a chelating agent; water; and one kind or two or more kinds of metal atoms selected from the group consisting of Na, K, Ca, Fe, Cu, Mg, Mn, Li, Al, Cr, Ni, and Zn. A ratio $T_1$ of a total mass of the metal atoms to the sum of a total mass of the additive and the total mass of the metal atoms is in a range from 1 ppt to 1 ppm.

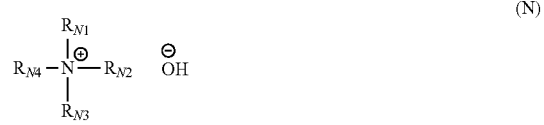

34 Claims, No Drawings

METHOD FOR MANUFACTURING ELECTRONIC DEVICE

CROSS-REFERENCE TO RELATED APPLICATIONS

This application is a Continuation of U.S. patent application Ser. No. 16/143,496, filed on Sep. 27, 2018, which claims priority under 35 U.S.C. § 119(a) to Patent Application No. 2016-073255, filed in Japan on Mar. 31, 2016; No. 2016-150624, filed in Japan on Jul. 29, 2016; and No. 2017-045323, filed in Japan on Mar. 9, 2017, all of which are hereby expressly incorporated by reference into the present application.

BACKGROUND OF THE INVENTION

1. Field of the Invention

The present invention relates to a method for manufacturing an electronic device.

More specifically, the present invention relates to a method for manufacturing an electronic device using a treatment liquid which is used in a manufacturing step of a semiconductor such as an integrated circuit (IC), a manufacturing step of a circuit substrate such as a liquid crystal or a thermal head, a lithography step of other photofabrication steps, and the like, and a pattern forming method.

2. Description of the Related Art

In the related art, in a manufacturing process of a semiconductor device such as an integrated circuit (IC) or a large scale integrated circuit (LSI), lithographic microfabrication using a photoresist composition (actinic ray-sensitive or radiation-sensitive resin composition) has been performed. Recently, along with high integration of integrated circuits, ultrafine pattern formation on a submicron region or a quarter micron region has been required. Accordingly, the wavelength of an exposure wavelength tends to be shortened. For example, an i-ray or further KrF excimer laser light is used instead of using a g-ray. The wavelength of an exposure light source has been shortened, and the numerical aperture (NA) of a projection lens has been increased. Currently, an exposure device in which an ArF excimer laser having a wavelength of 193 nm is used as a light source has been developed. In addition, the development of not only lithography using excimer laser light but also lithography using an electron beam, an X-ray, or an extreme ultraviolet (EUV) ray has been progressing.

In this lithography, a pattern is formed through the following steps. That is, a film is formed using a photoresist composition (also referred to as "actinic ray-sensitive or radiation-sensitive resin composition" or "chemically amplified resist composition"), the obtained film is exposed, and the exposed film is developed using a developer. Further, the developed film may be cleaned (rinsed) with a rinsing liquid.

For example, JP5055453B discloses a configuration in which an alkali developer is used as a developer and pure water is used as a rinsing liquid.

SUMMARY OF THE INVENTION

Recently, needs for further refinement (for example, 30 nm node or less) through the formation of a contact hole or a trench pattern have been increasing.

However, in the pattern forming method in which the photoresist composition (actinic ray-sensitive or radiation-sensitive resin composition) is used, particles may be formed in a step such as development or rinsing. The particles may include metal atoms. In a case where a fine pattern that has been recently required is formed, the presence of the particles including metal atoms has a large effect on the formation of an excellent pattern.

The present invention has been made in consideration of the above-described circumstances, and provides a method for manufacturing an electronic device, in which the formation of particles including metal atoms can be reduced and an excellent pattern can be formed.

The present invention is as follows.

[1] A method for manufacturing an electronic device, the method comprising performing a treatment using a treatment liquid for manufacturing a semiconductor, the treatment liquid for manufacturing a semiconductor comprising:

a quaternary ammonium compound represented by the following Formula (N);

at least one additive selected from the group consisting of an anionic surfactant, a nonionic surfactant, a cationic surfactant, and a chelating agent;

water; and one kind or two or more kinds of metal atoms selected from the group consisting of Na, K, Ca, Fe, Cu, Mg, Mn, Li, Al, Cr, Ni, and Zn, wherein a ratio $T_1$ of a total mass of the metal atoms to the sum of a total mass of the additive and the total mass of the metal atoms as defined by the following formula is in a range from 1 ppt to 1 ppm, $T_1$=[total mass of the metal atoms]/([total mass of the additive]+[total mass of the metal atoms]),

(N)

in Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent.

[2] The method for manufacturing an electronic device according to [1], in which the ratio $T_1$ is in a range from 1 ppb to 1 ppm.

[3] The method for manufacturing an electronic device according to [1] or [2], in which a ratio $T_2$ of a total mass of particulate metal of the metal atoms measured by a SP-ICP-MS method to the sum of the total mass of the additive and the total mass of the particulate metal as defined by the following formula is in a range from 0.1 ppt to 0.1 ppm, $T_2$ = [total mass of the particulate metal]/
([total mass of the additive] + [total mass of the particulate metal]).

[4] The method for manufacturing an electronic device according to any one of [1] to [3], in which a ratio $T_2$ of a total mass of particulate metal of the metal atoms measured by a SP-ICP-MS method to the sum of the total mass of the additive and the total mass of the particulate metal as defined by the following formula is in a range from 0.1 ppt to 1 ppb, $T_2$ = [total mass of the particulate metal] /

([total mass of the additive] + [total mass of the particulate metal]).

[5] The method for manufacturing an electronic device according to any one of [1] to [4],
in which a content of the quaternary ammonium compound is 25 mass % or lower and a content of the additive is 1 mass % or lower with respect to the treatment liquid for manufacturing a semiconductor.

[6] The method for manufacturing an electronic device according to any one of [1] to [5],
in which a content of each of the one kind or two or more kinds of metal atoms selected from the group consisting of Na, K, Ca, Fe, Cu, Mg, Mn, Li, Al, Cr, Ni, and Zn is 1 mass ppq to 1000 mass ppt with respect to the treatment liquid for manufacturing a semiconductor.

[7] The method for manufacturing an electronic device according to any one of [1] to [6],
in which a content of each of the one kind or two or more kinds of metal atoms selected from the group consisting of Na, K, and Ca is 1 mass ppq to 1000 mass ppt with respect to the treatment liquid for manufacturing a semiconductor.

[8] The method for manufacturing an electronic device according to any one of [1] to [7],
in which the treatment liquid for manufacturing a semiconductor comprises at least the nonionic surfactant as the additive and further comprises a peroxide, and
a content of the peroxide is 1 mass ppq to 1000 mass ppt with respect to the treatment liquid for manufacturing a semiconductor.

[9] The method for manufacturing an electronic device according to any one of [1] to [8],
in which the treatment liquid for manufacturing a semiconductor comprises at least the nonionic surfactant as the additive and further comprises an ester compound, and
a content of the ester compound is 1 mass ppq to 1000 mass ppt with respect to the treatment liquid for manufacturing a semiconductor.

[10] The method for manufacturing an electronic device according to any one of [1] to [9],
in which the treatment liquid for manufacturing a semiconductor comprises at least the nonionic surfactant as the additive and further comprises an amine compound, and
a content of the amine compound is 1 mass ppq to 1000 mass ppt with respect to the treatment liquid for manufacturing a semiconductor.

[11] The method for manufacturing an electronic device according to any one of [1] to [10],
in which the treatment liquid for manufacturing a semiconductor comprises at least the nonionic surfactant as the additive, and
an HLB of the nonionic surfactant is 8 or higher.

[12] The method for manufacturing an electronic device according to any one of [1] to [11], in which the treatment liquid for manufacturing a semiconductor comprises at least the nonionic surfactant as the additive, and
the treatment liquid for manufacturing a semiconductor comprises at least a compound represented by the following Formula (A1) as the nonionic surfactant,

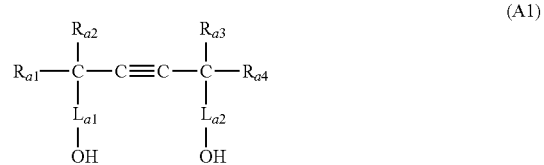

in Formula (A1),
$R_{a1}$, $R_{a2}$, $R_{a3}$, and $R_{a4}$ each independently represent an alkyl group, and
$L_{a1}$ and $L_{a2}$ each independently represent a single bond or a divalent linking group.

[13] The method for manufacturing an electronic device according to any one of [1] to [12],
in which the treatment liquid for manufacturing a semiconductor comprises at least the anionic surfactant as the additive and further comprises an inorganic salt, and
a content of the inorganic salt is 1 mass ppq to 1000 mass ppt with respect to the treatment liquid for manufacturing a semiconductor.

[14] The method for manufacturing an electronic device according to any one of [1] to [13],
in which the treatment liquid for manufacturing a semiconductor comprises at least the cationic surfactant as the additive and further comprises an inorganic salt, and
a content of the inorganic salt is 1 mass ppq to 1000 mass ppt with respect to the treatment liquid for manufacturing a semiconductor.

[15] The method for manufacturing an electronic device according to any one of [1] to [14],
in which the treatment liquid for manufacturing a semiconductor comprises at least a chelating agent represented by the following Formula (K1) or (K2) as the additive,
a portion of the chelating agent forms a chelate complex with the one kind or two or more kinds of metal atoms selected from the group consisting of Na, K, Ca, Fe, Cu, Mg, Mn, Li, Al, Cr, Ni, and Zn, and
a content of the chelate complex is 1 mass ppq to 1000 mass ppt with respect to the treatment liquid for manufacturing a semiconductor,

-continued

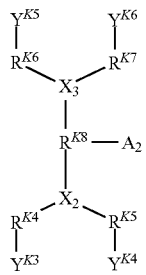
(K2)

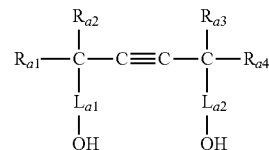
(A1)

in Formula (K1), $R^{K1}$ and $R^{K2}$ each independently represent a single bond or an alkylene group, $R^{K3}$ represents a divalent organic group, $X_1$ represents a CH group or a nitrogen atom, $Y^{K1}$ and $Y^{K2}$ each independently represent a metal-adsorbing group, and $A_1$ represents a hydrogen atom or a hydrophilic group, and in Formula (K2), $R^{K4}$, $R^{K}$, $R^{K6}$, and $R^{K7}$ each independently represent a single bond or an alkylene group, $R^{K8}$ represents a trivalent organic group, $X_2$ and $X_3$ each independently represent a CH group or a nitrogen atom, $Y^{K3}$, $Y^{K4}$, $Y^{K5}$, and $Y^{K6}$ each independently represent a metal-adsorbing group, and $A_2$ represents a hydrogen atom or a hydrophilic group.

[16] The method for manufacturing an electronic device according to any one of [1] to [7], in which the treatment liquid for manufacturing a semiconductor comprises two or more additives.

[17] The method for manufacturing an electronic device according to any one of [1] to [7] and [16], in which the treatment liquid for manufacturing a semiconductor comprises two or more nonionic surfactants as the additive.

[18] The method for manufacturing an electronic device according to [17], in which the treatment liquid for manufacturing a semiconductor comprises at least one nonionic surfactant having an HLB of 12 or higher and at least one nonionic surfactant having an HLB of 10 or lower as the two or more nonionic surfactants.

[19] The method for manufacturing an electronic device according to [18], wherein a total mass of the nonionic surfactant having an HLB of 12 or higher is 0.5 to 4 with respect to a total mass of the nonionic surfactant having an HLB of 10 or lower.

[20] The method for manufacturing an electronic device according to any one of [1] to [11] and [16] to [19], in which the treatment liquid for manufacturing a semiconductor comprises at least the nonionic surfactant as the additive, and the treatment liquid for manufacturing a semiconductor comprises at least a compound represented by the following Formula (A1) as the nonionic surfactant, in Formula (A1), $R_{a1}$, $R_{a2}$, $R_{a3}$, and $R_{a4}$ each independently represent an alkyl group, and $L_{a1}$ and $L_{a2}$ each independently represent a single bond or a divalent linking group.

[21] The method for manufacturing an electronic device according to [20], in which the treatment liquid for manufacturing a semiconductor comprises at least two nonionic surfactants as the additive, and the at least two nonionic surfactants are the compounds represented by Formula (A1).

[22] The method for manufacturing an electronic device according to [20] or [21], in which the compound represented by Formula (A1) is a compound represented by the following Formula (A2),

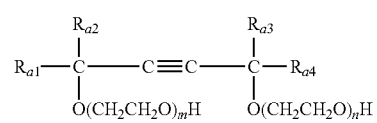
(A2)

in Formula (A2), $R_{a1}$, $R_{a2}$, $R_{a3}$, and Ra each independently represent an alkyl group, m and n each independently represent a positive number of 0.5 to 80, and $m+n \geq 1$ is satisfied.

[23] The method for manufacturing an electronic device according to any one of [1] to [22], comprising a pattern forming method comprising:

forming a film using an actinic ray-sensitive or radiation-sensitive resin composition or a coloring curable resin composition;

exposing the formed film; and treating the exposed film using the treatment liquid for manufacturing a semiconductor.

[24] The method for manufacturing an electronic device according to [23], in which the treatment is developing.

[25] The method for manufacturing an electronic device according to [23], in which the treatment is developing and rinsing.

[26] The method for manufacturing an electronic device according to any one of [23] to [25], further comprising:

cleaning the developed film using a rinsing liquid including an organic solvent or using water.

[27] The method for manufacturing an electronic device according to [26], in which the rinsing liquid including an organic solvent is a rinsing liquid including at least one organic solvent selected from the group consisting of a hydrocarbon solvent, a ketone solvent, an ester solvent, an alcohol solvent, an amide solvent, and an ether solvent as the organic solvent.

[28] The method for manufacturing an electronic device according to [26] or [27], in which the rinsing liquid including an organic solvent is a rinsing liquid including at least an alcohol solvent as the organic solvent.

[29] The method for manufacturing an electronic device according to any one of [26] to [28], in which the rinsing liquid including an organic solvent is a rinsing liquid including a linear, branched, or cyclic monohydric alcohol having 6 to 8 carbon atoms as the organic solvent.

[30] The method for manufacturing an electronic device according to any one of [26] to [29], in which a moisture content of the rinsing liquid including an organic solvent is 30 mass % or lower.

[31] A method for manufacturing an electronic device, the method comprising performing a treatment using a treatment liquid for manufacturing a semiconductor, the treatment liquid for manufacturing a semiconductor comprising:

a quaternary ammonium compound represented by the following Formula (N);

at least one additive selected from the group consisting of an anionic surfactant, a nonionic surfactant, a cationic surfactant, and a chelating agent;

water; and one kind or two or more kinds of metal atoms selected from the group consisting of Na, K, Ca, Fe, Cu, Mg, Mn, Li, Al, Cr, Ni, and Zn, wherein a ratio $T_1$ of a total mass of the metal atoms to the sum of a total mass of the additive and the total mass of the metal atoms as defined by the following formula is in a range from 1 ppt to 1 ppm, $T_1$ = [total mass of the metal atoms]/

([total mass of the additive] + [total mass of the metal atoms]),

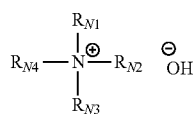

in Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent, a content of each of the one kind or two or more kinds of metal atoms selected from the group consisting of Na, K, Ca, Fe, Cu, Mg, Mn, Li, Al, Cr, Ni, and Zn is 1 mass ppq to 500 mass ppt with respect to the treatment liquid for manufacturing a semiconductor, and a content of the additive is 1 mass % or lower with respect to the treatment liquid for manufacturing a semiconductor.

[32] The method for manufacturing an electronic device according to [31], wherein a content of each of the one kind or two or more kinds of metal atoms selected from the group consisting of Na, K, and Ca is 1 mass ppq to 500 mass ppt with respect to the treatment liquid for manufacturing a semiconductor.

[33] The method for manufacturing an electronic device according to [1] wherein the ratio $T_1$ is in a range from 400 ppt to 1 ppm.

[34] The method for manufacturing an electronic device according to [1], wherein the ratio $T_1$ is in a range from 35 ppb to 0.105 ppm.

[35] A method for manufacturing an electronic device, the method comprising performing a treatment using a treatment liquid for manufacturing a semiconductor, the treatment liquid for manufacturing a semiconductor comprising:

a quaternary ammonium compound represented by the following Formula (N);

at least one additive selected from the group consisting of an anionic surfactant, a nonionic surfactant, a cationic surfactant, and a chelating agent;

water; and one kind or two or more kinds of metal atoms selected from the group consisting of Na, K, Ca, Fe, Cu, Mg, Mn, Li, Al, Cr, Ni, and Zn, wherein a ratio $T_1$ of a total mass of the metal atoms to the sum of a total mass of the additive and the total mass of the metal atoms as defined by the following formula is in a range from 1 ppt to 1 ppm, $T_1$ = [total mass of the metal atoms]/

([total mass of the additive] + [total mass of the metal atoms]), a ratio $T_2$ of a total mass of particulate metal of the metal atoms measured by a SP-ICP-MS method to the sum of the total mass of the additive and the total mass of the particulate metal as defined by the following formula is in a range from 0.1 ppt to 0.1 ppm, $T_2$ = [total mass of the particulate metal]/

([total mass of the additive] + [total mass of the particulate metal]), where the particulate metal is a nonionic metal component derived from the metal atoms which is not dissolved in the treatment liquid and exists as a solid, and

in Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent.

According to the present invention, a method for manufacturing an electronic device can be provided, in which the formation of particles including metal atoms can be reduced.

DESCRIPTION OF THE PREFERRED EMBODIMENTS

Hereinafter, preferred embodiments of the present invention will be described in detail.

In this specification, unless specified as a substituted group or as an unsubstituted group, a group or an atomic group denotes not only a group having no substituent but also a group having a substituent. For example, "alkyl group" that is not specified as a substituted group or as an unsubstituted group denotes not only an alkyl group having no substituent (unsubstituted alkyl group) but also an alkyl group having a substituent (substituted alkyl group).

In addition, in the present invention, "actinic ray" or "radiation" denotes, for example, a bright light spectrum of a mercury lamp, a far ultraviolet ray represented by excimer laser, an extreme ultraviolet ray (EUV ray), an X-ray, or a corpuscular beam such as an electron beam or an ion beam. In addition, in the present invention, "light" denotes an actinic ray or radiation.

In this specification, unless specified otherwise, "exposure" denotes not only exposure using a mercury lamp, a far ultraviolet ray represented by excimer laser, an X-ray, an extreme ultraviolet (EUV) ray, or the like but also drawing using a corpuscular beam such as an electron beam or an ion beam.

In this specification, "(meth)acrylate" represents "at least one of acrylate or methacrylate". In addition, "(meth)acrylic acid" represents "at least one of acrylic acid or methacrylic acid".

In this specification, numerical ranges represented by "to" include numerical values before and after "to" as lower limit values and upper limit values.

<Treatment Liquid for Manufacturing Semiconductor>

First, a treatment liquid for manufacturing a semiconductor according to the present invention will be described. The treatment liquid for manufacturing a semiconductor may be used as a developer in a development step, and may be used as a rinsing liquid in a rinsing step. In both the development step and the rinsing step, it is preferable that developing and rising are performed using the treatment liquid for manufacturing a semiconductor according to the present invention.

The treatment liquid for manufacturing a semiconductor according to the present invention includes: a quaternary ammonium compound represented by the following Formula (N); at least one additive (hereinafter, also simply referred to as "additive") selected from the group consisting of an anionic surfactant, a nonionic surfactant, a cationic surfactant, and a chelating agent; and water, in which the treatment liquid for manufacturing a semiconductor includes at least one kind or two or more kinds of metal atoms (hereinafter, also simply referred to as "metal atoms") selected from the group consisting of Na, K, Ca, Fe, Cu, Mg, Mn, Li, Al, Cr, Ni, and Zn, and a total mass of the metal atoms is 1 mass ppt (parts per trillion) to 1 mass ppm (parts per million) with respect to the sum of a total mass of the additive and the total mass of the metal atoms.

The present inventors found that, by controlling a ratio (hereinafter, also referred to as "metal atom ratio $T_1$") of the total mass of the metal atoms to the sum of the total mass of the additive and the total mass of the metal atoms in the treatment liquid for manufacturing a semiconductor, in a case where the treatment liquid for manufacturing a semiconductor is used particularly as a developer, the formation of particles including metal atoms can be reduced. The detailed reason for this is not clear but is presumed to be as follows.

In a case where the total mass of the metal atoms in the treatment liquid for manufacturing a semiconductor is higher than 1 mass ppm with respect to the sum of the total mass of the additive and the total mass of the metal atoms, it is considered that the additive aggregates around the metal atoms. The aggregated additive forms particles including metal atoms. Therefore, it is presumed that, by controlling the content of the metal atoms with respect to the sum of the total mass of the additive and the total mass of the metal atoms in the treatment liquid for manufacturing a semiconductor, the formation of particles including metal atoms can be reduced.

In addition, in order to reduce the total mass of the metal atoms in the treatment liquid for manufacturing a semiconductor to be lower than 1 mass ppt with respect to the sum of the total mass of the additive and the total mass of the metal atoms, a large load is applied to purification steps such as filtration, ion exchange, and distillation. The reason for this is that, in order to reduce the total mass of the metal atoms in the treatment liquid for manufacturing a semiconductor to be lower than the above-described numerical value, it is necessary to perform treatments in the purification step multiple times, for example, to increase the number of times of treatments such as filtration and to combine the respective treatments with each other. It is presumed that, in a case where the total mass of the metal atoms in the treatment liquid for manufacturing a semiconductor is 1 mass ppt or higher with respect to the sum of the total mass of the additive and the total mass of the metal atoms as in the case of the present invention, most of the metal atoms are dispersed in the form of metal hydroxide colloid in which metal oxide hydrates are condensed and are in a state where ionized metal atoms are not substantially present. Therefore, by reducing the total mass of the metal atoms in the treatment liquid for manufacturing a semiconductor to be 1 mass ppt or higher with respect to the sum of the total mass of the additive and the total mass of the metal atoms, easily-soluble metal ions that are difficult to remove are not substantially included, and thus the effects of defects and the like are not likely to appear in a device.

In addition, in an aspect of the present invention, it is preferable that a total mass of particulate metal of the metal atoms is 0.1 mass ppt (parts per trillion) to 0.1 mass ppm (parts per million) with respect to the sum of the total mass of the additive and the total mass of the particulate metal of the metal atoms.

Here, "the particulate metal of the metal atoms" refers to a metal component that is present as a solid without being dissolved in a solution among the metal atoms present in the solution. According to a recently developed single particle inductively coupled plasma-mass spectrometry (SP-ICP-MS) method, particulate metal (nonionic metal) can be selectively measured from all the metal atoms present in a solution. Specifically, the measurement of the particulate metal using the SP-ICP-MS method is a method in which an intensity of a signal detected using an ICP-MS method is measured per elapsed time and a signal peak exceeding a predetermined intensity is identified as a signal derived from the particulate metal. In this specification, the total amount of all the metal atoms is measured using the ICP-MS method, the amount of the particulate metal (the amount of the nonionic metal) is measured using the SP-ICP-MS method, and the amount of ionic metal is obtained from a difference between the total amount of all the metal atoms and the amount of the particulate metal.

In the related art, the amount of metal atoms included in a treatment liquid for manufacturing a semiconductor is typically analyzed using the ICP-MS method or the like. In the method of the related art such as the ICP-MS method, the ionic metal and the particulate metal (nonionic metal) derived from the metal atoms cannot be distinguished from each other, and thus the quantity thereof is determined as the total mass of the metal atoms, that is, the total mass of the ionic metal and the particulate metal (nonionic metal).

The present inventors found that, by controlling a ratio (hereinafter, also referred to as "particulate metal ratio $T_2$") of the total mass of the particulate metal to the sum of the total mass of the additive and the total mass of the particulate metal, which can be measured using the SP-ICP-MS method, in the treatment liquid for manufacturing a semiconductor, the following effect can be obtained. That is, the present inventors found that, in a case where the treatment liquid for manufacturing a semiconductor is used particularly as a developer, the formation of particles including metal atoms can be further reduced. The detailed reason for this is not clear but is presumed to be as follows.

It is presumed that, in a case where the total mass of the particulate metal of the metal atoms in the treatment liquid for manufacturing a semiconductor is higher than 0.1 mass ppm with respect to the sum of the total mass of the additive and the total mass of the particulate metal of the metal atoms, the metal particles themselves aggregate on a semiconductor substrate. The aggregated metal particles form particles on the semiconductor substrate. Therefore, it is presumed that, by controlling the content of the particulate metal of the metal atoms with respect to the sum of the total mass of the additive and the total mass of the particulate metal of the metal atoms in the treatment liquid for manufacturing a semiconductor, the formation of particles including metal atoms can be reduced.

In addition, in order to reduce the total mass of the particulate metal of the metal atoms in the treatment liquid for manufacturing a semiconductor to be lower than 0.1 mass ppt with respect to the sum of the total mass of the additive and the total mass of the particulate metal of the metal atoms, a large load is applied to purification steps such as filtration, ion exchange, and distillation. The reason for this is that, in order to reduce the total mass of the metal atoms in the treatment liquid for manufacturing a semiconductor to be lower than the above-described numerical value, it is necessary to perform treatments in the purification step multiple times, for example, to increase the number of times of treatments such as filtration and to combine the respective treatments with each other. It is presumed that, in a case where the total mass of the particulate metal of the metal atoms in the treatment liquid for manufacturing a semiconductor is 0.1 mass ppt or higher with respect to the sum of the total mass of the additive and the total mass of the particulate metal of the metal atoms, most of the metal atoms are dispersed in the form of metal hydroxide colloid in which metal oxide hydrates are condensed and are in a state where particulate metal atoms causing defects and ionized metal atoms are not substantially present. Therefore, by reducing the total mass of the particulate metal of the metal atoms in the treatment liquid for manufacturing a semiconductor to be 0.1 mass ppt or higher with respect to the sum of the total mass of the additive and the total mass of the particulate metal of the metal atoms, easily-soluble metal ions that are difficult to remove are not substantially included, and thus the effects of defects and the like are not likely to appear in a device.

In the present invention, the formation of the particles including metal atoms will also be referred to as "defects".

Hereinafter, each of the components will be described in detail.

[1] Quaternary Ammonium Compound

The treatment liquid for manufacturing a semiconductor according to the present invention includes a quaternary ammonium compound represented by the following Formula (N).

In Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent.

The number of carbon atoms in the alkyl group represented by $R_{N1}$ to $R_{N4}$ is preferably 1 to 8 and more preferably 1 to 4.

Examples of the substituent which may be included in the alkyl group, the phenyl group, the benzyl group, or the cyclohexyl group represented by $R_{N1}$ to $R_{N4}$ include a hydroxy group.

Examples of the quaternary ammonium compound include tetramethylammonium hydroxide (TMAH), tetraethylammonium hydroxide (TEAH), tetrapropylammonium hydroxide, tetrabutylammonium hydroxide (TBAH), tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, dibutyldipentylammonium hydroxide, triethylphenylammonium hydroxide, trimethylbenzylammonium hydroxide, triethylbenzylammonium hydroxide, tribenzylmethylammonium hydroxide, tetrabenzylammonium hydroxide, trimethylcyclohexylammonium hydroxide, tributylcyclohexylammonium hydroxide, monohydroxyethyltrimethylammonium hydroxide, dihydroxyethyldimethylammonium hydroxide (dimethyl bis(2-hydroxyethyl)ammonium hydroxide), trihydroxyethylmonomethylammonium hydroxide, monohydroxyethyltriethylammonium hydroxide, dihydroxyethyldiethylammonium hydroxide, trihydroxyethylmonoethylammonium hydroxide, monohydroxypropyltrimethylammonium hydroxide, dihydroxypropyldimethylammonium hydroxide, trihydroxypropylmonomethylammonium hydroxide, monohydroxypropyltriethylammonium hydroxide, dihydroxypropyldiethylammonium hydroxide, and trihydroxypropylmonoethylammonium hydroxide.

As the quaternary ammonium compound, tetramethylammonium hydroxide, tetraethylammonium hydroxide, tetrabutylammonium hydroxide, or dimethyl bis(2-hydroxyethyl)ammonium hydroxide is preferable. The quaternary ammonium compound is not particularly limited and is still more preferably tetramethylammonium hydroxide or dimethyl bis(2-hydroxyethyl)ammonium hydroxide.

The content of the quaternary ammonium compound is preferably 25 mass % or lower and more preferably 20 mass % or lower with respect to the treatment liquid for manufacturing a semiconductor. In addition, the content of the quaternary ammonium compound is preferably 1 mass % or higher and more preferably 2 mass % or higher with respect to the treatment liquid for manufacturing a semiconductor.

As the quaternary ammonium compound, two or more kinds may be used.

In addition, the quaternary ammonium compound can be purified using a well-known method. For example, the purification can be performed by repeating filter filtration as well as adsorption purification using silicon carbide as described in WO2012/043496A.

[2] Additive

The treatment liquid for manufacturing a semiconductor according to the present invention includes at least one additive selected from the group consisting of an anionic surfactant, a nonionic surfactant, a cationic surfactant, and a chelating agent. In this case, the additive does not include the quaternary ammonium compound.

As the additive, an anionic surfactant, a nonionic surfactant, or a cationic surfactant is preferable, and a nonionic surfactant is more preferable.

As the additive, the treatment liquid for manufacturing a semiconductor according to the present invention includes at least one surfactant selected from the group consisting of an anionic surfactant, a nonionic surfactant, and a cationic surfactant. As a result, wettability on a resist film is improved, and development and/or rinsing is more effectively carried out.

As the additive, a combination of two or more kinds may be used. As the combination of two or more additives, a combination of at least one selected from an anionic surfactant, a nonionic surfactant, and a cationic surfactant with a chelating agent is preferable, and a combination of a nonionic surfactant with a chelating agent is more preferable.

In addition, it is preferable that the additive includes two or more nonionic surfactants.

The content of the additive is preferably 1 mass % or lower and more preferably 0.75 mass % or lower with respect to the treatment liquid for manufacturing a semiconductor. In addition, the content of the additive is preferably 0.5 mass % or higher and more preferably 0.2 mass % or higher with respect to the treatment liquid for manufacturing a semiconductor.

As the additive, it is preferable that an inorganic ion such as a sulfate ion, a chloride ion, or a nitrate ion that is derived from an inorganic salt described below, or an additive in which the content of specific metal atoms included in the treatment liquid for manufacturing a semiconductor according to the present invention is reduced is used, or that the additive is further purified for use.

Hereinafter, each of the additives will be described in detail.

[2-1] Anionic Surfactant

Examples of the anionic surfactant include alkylsulfonic acid esters, alkylsulfonic acid, alkylbenzenesulfonic acid, alkylnaphthalenesulfonic acid, alkyldiphenylethersulfonic acid, polyoxyethylene alkyl ether carboxylic acid, polyoxyethylene alkyl ether acetic acid, polyoxyethylene alkyl ether propionic acid, polyoxyethylene alkyl ether sulfuric acid, polyoxyethylene aryl ether acetic acid, polyoxyethylene aryl ether propionic acid, polyoxyethylene aryl ether sulfuric acid, and salts thereof.

The anionic surfactant is not particularly limited, and is preferably alkylsulfonic acid esters, polyoxyethylene aryl ether sulfuric acid, or polyoxyethylene alkyl ether sulfuric acid, and is more preferably polyoxyethylene aryl ether sulfuric acid.

The sulfate as the anionic surfactant can be obtained, for example, by sulfating a formed aliphatic alcohol alkylene oxide adduct as it is and neutralizing the sulfate using an alkali such as sodium hydroxide. Examples of the sulfating method include a method using sulfuric acid. In this case, the reaction temperature is typically 50° C. to 150° C. and preferably 60° C. to 130° C. As the reaction form, both a continuous reaction and a batchwise reaction can be adopted.

The content of the anionic surfactant is preferably 100000 mass ppm (parts per million) or lower and more preferably 50000 mass ppm or lower with respect to the treatment liquid for manufacturing a semiconductor. In addition, the content of the anionic surfactant is preferably 50 mass ppm or higher and more preferably 100 mass ppm or higher with respect to the treatment liquid for manufacturing a semiconductor.

[2-2] Nonionic Surfactant

Examples of the nonionic surfactant include a polyalkylene oxide alkylphenyl ether surfactant, a polyalkylene oxide alkyl ether surfactant, a block polymer surfactant including polyethylene oxide and polypropylene oxide, a polyoxyalkylene distyrenated phenyl ether surfactant, a polyalkylene tribenzylphenyl ether surfactant, and an acetylene polyalkylene oxide surfactant.

As the nonionic surfactant, a compound represented by the following Formula (A1) is preferable.

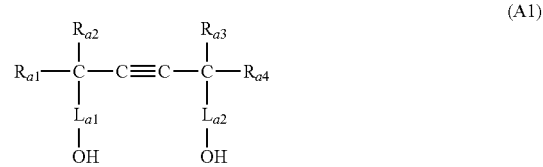

(A1)

In Formula (A1), $R_{a1}$, $R_{a2}$, $R_{a3}$, and $R_{a4}$ each independently represent an alkyl group, and $L_{a1}$ and $L_{a2}$ each independently represent a single bond or a divalent linking group.

Hereinafter, Formula (A1) will be described.

$R_{a1}$, $R_{a2}$, $R_{a3}$, and $R_{a4}$ each independently represent an alkyl group.

The alkyl group represented by $R_{a1}$, $R_{a2}$, $R_{a3}$, and $R_{a4}$ may be linear or branched and may have a substituent.

The number of carbon atoms in the alkyl group represented by $R_{a1}$, $R_{a2}$, $R_{a3}$, and $R_{a4}$ is preferably 1 to 5. Examples of the alkyl group having 1 to 5 carbon atoms include a methyl group, an ethyl group, an isopropyl group, and a butyl group.

$L_{a1}$ and $L_{a2}$ each independently represent a single bond or a divalent organic group.

As the divalent linking group represented by $L_{a1}$ and $L_{a2}$, an alkylene group, an $—OR_{a5}—$ group, or a combination thereof is preferable. $R_{a5}$ represents an alkylene group.

Examples of the nonionic surfactant include 2,4,7,9-tetramethyl-5-decyne-4,7-diol, 3,6-dimethyl-4-octyne-3,6-diol, and 3,5-dimethyl-1-hexyn-3-ol.

Examples of the compound represented by Formula (A1) include a compound represented by the following Formula (A2).

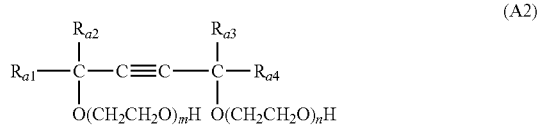

(A2)

In Formula (A2), $R_{a1}$, $R_{a2}$, $R_{a3}$, and $R_{a4}$ each independently represent an alkyl group, m and n each independently represent a positive number of 0.5 to 80, and m+n≥1 is satisfied.

Hereinafter, Formula (A2) will be described.

$R_{a1}$, $R_{a2}$, $R_{a3}$, and $R_{a4}$ each independently represent an alkyl group.

The alkyl group represented by $R_{a1}$, $R_{a2}$, $R_{a3}$, and $R_{a4}$ is the same as the alkyl group represented by the alkyl group represented by $R_{a1}$, $R_{a2}$, $R_{a3}$, and $R_{a4}$ in Formula (A1).

m and n represent an addition mol number of ethylene oxide and each independently represent a positive number of 0.5 to 80, and m+n≥1 is satisfied. Any values can be selected as long as they are in a range where m+n≥1 is satisfied. m and n are preferably in a range where 1≤m+n≤100 and more preferably in a range where 3≤m+n≤80.

Examples of the compound represented by Formula (A2) include 2,5,8,11-tetramethyl-6-dodecyne-5,8-diol, 5,8-dimethyl-6-dodecyne-5,8-diol, 2,4,7,9-tetramethyl-5-decyne-4,7-diol, 4,7-dimethyl-5-decyne-4,7-diol, 8-hexadecyne-7,10-diol, 7-tetradecyne-6,9-diol, 2,3,6,7-tetramethyl-4-octyne-3,6-diol, 3,6-diethyl-4-octyne-3,6-diol, 3,6-dimethyl-4-octyne-3,6-diol, and 2,5-dimethyl-3-hexyne-2,5-diol.

In addition, as the nonionic surfactant, a commercially available product can be used. Specific examples of the commercially available product include: SURFYNOL 82, 465, and 485 and DYNOL 604 and 607 (all of which are manufactured by Air Products&Chemicals Ltd.); and OLFINE STG and OLFINE E1010 (all of which are manufactured by Nissin Chemical Co., Ltd.).

A hydrophile-lipophile balance (HLB) value of the nonionic surfactant is preferably 8 or higher and more preferably 10 or higher. In addition, the HLB value of the nonionic surfactant is preferably 16 or lower and more preferably 14 or lower. Here, the HLB value is defined as a value calculated from the GRIFFIN formula (20 Mw/M; Mw=molecular weight of hydrophilic moiety; M=molecular weight of nonionic surfactant), and a catalog value or a value calculated using another method may be used in some cases.

As the nonionic surfactant, a combination of two or more kinds may be used. Among the two or more nonionic surfactants, it is preferable that at least two nonionic surfactants are the compounds represented by Formula (A1).

It is also preferable that the two or more nonionic surfactants are a combination of at least one nonionic surfactant having an HLB of 12 or higher and at least one nonionic surfactant having an HLB of 10 or lower. The present inventors found that, with the above-described combination, in a case where the treatment liquid for manufacturing a semiconductor according to the present invention is used as a developer, a pattern having excellent rectangularity can be formed. The detailed reason for this is not clear but is presumed to be as follows.

In a resist film using a photoresist composition, an exposed portion chemically changes. Depending on this chemical change, the exposed portion exhibits hydrophilicity or hydrophobicity. By using a nonionic surfactant having high hydrophilicity and a nonionic surfactant having high hydrophobicity in combination, each of the nonionic surfactants is selectively adsorbed on a hydrophilic portion or a hydrophobic portion of the resist film. As a result, it is presumed that a pattern shape having excellent rectangularity can be obtained.

The total mass of the nonionic surfactant having an HLB of 12 or higher is preferably 0.5 to 4, more preferably 0.7 to 3.5, and still more preferably 1.0 to 3.0 with respect to the total mass of the nonionic surfactant having an HLB of 10 or lower. The present inventors found that, by adjusting the total mass of the nonionic surfactant having an HLB of 12 or higher to be higher than respect to the total mass of the nonionic surfactant having an HLB of 10 or lower, in a case where the treatment liquid for manufacturing a semiconductor according to the present invention is used as a developer, a pattern having excellent rectangularity can be formed. The reason for this is presumed that, with this configuration, each of the nonionic surfactants is selectively adsorbed on a hydrophilic portion or a hydrophobic portion of the resist film more effectively.

In addition, the content of the nonionic surfactant is preferably 10000 mass ppm or lower and more preferably 5000 mass ppm or lower with respect to the treatment liquid for manufacturing a semiconductor. In addition, the content of the nonionic surfactant is preferably 50 mass ppm or higher and more preferably 100 mass ppm or higher with respect to the treatment liquid for manufacturing a semiconductor.

[2-3] Cationic Surfactant

Examples of the cationic surfactant include a quaternary ammonium salt surfactant and an alkylpyridinium surfactant.

Examples of the quaternary ammonium salt surfactant include tetramethylammonium chloride, tetrabutylammonium chloride, dodecyldimethylbenzylammonium chloride, alkyltrimethylammonium chloride, octyltrimethylammonium chloride, decyltrimethylammonium chloride, dodecyltrimethylammonium chloride, tetradecyltrimethylammonium chloride, cetyltrimethylammonium chloride, and stearyltrimethylammonium chloride. The quaternary ammonium salt surfactant is not particularly limited and is preferably dodecyldimethylbenzylammonium chloride.

Examples of the alkylpyridinium surfactant include butylpyridinium chloride, dodecylpyridinium chloride, and cetylpyridinium chloride. The alkylpyridinium surfactant is not particularly limited and is preferably butylpyridinium chloride.

The cationic surfactant can be obtained, for example, as follows. First, triethanolamine, methyldiethanolamine, 3-(N,N-dimethylamino)-1,2-propylene glycol, or the like is acylated using a long chain fatty acid or a fatty acid methyl ester and to synthesize alkanol amine ester as an intermediate. Next, the alkanol amine ester is converted into a cationic compound using a quaternizing agent such as methyl chloride, dimethyl sulfate, or diethyl sulfate. This way, the cationic surfactant can be obtained.

In addition, the content of the cationic surfactant is preferably 10000 mass ppm or lower and more preferably 5000 mass ppm or lower with respect to the treatment liquid for manufacturing a semiconductor.

[2-4] Chelating Agent

The chelating agent which may be included in the treatment liquid according to the present invention is not particularly limited and is preferably a compound that forms a coordinate bond with a metal atom through two or more functional groups in one molecule. It is preferable that the functional group is a metal-adsorbing group. It is more preferable that the chelating agent which may be included in the treatment liquid according to the present invention includes two or more metal-adsorbing groups in one molecule.

As the metal-adsorbing group, an acid group or a cationic group is preferable.

It is preferable that the acid group has an acid dissociation constant (pKa) of 7 or lower. Examples of the acid group include a phenolic hydroxyl group, —COOH, —SO$_3$H, —OSO$_3$H, —PO$_3$H$_2$, —OPO$_3$H$_2$, and COCH$_2$COCH$_3$. As the acid group, —COOH is preferable.

In addition, the acid group may be a salt of the acid group. Examples of the salt of the acid group include a metal salt and a salt of a nitrogen-containing cation.

The metal salt is preferably a salt of a metal atom selected from the group consisting of Na, K, Ca, Fe, Cu, Mg, Mn, Li, Al, Cr, Ni, and Zn.

The nitrogen-containing cation is not particularly limited as long as it is a quaternary ammonium cation or a cation that is a hydrogen adduct of amine.

As the quaternary ammonium cation, for example, a tetramethylammonium cation, a tetraethylammonium cation, a tetrapropylammonium cation, a methyltributylammonium cation, a tetrabutylammonium cation, or a choline cation (hydroxyethyltrimethylammonium ammonium cation) is preferable, a tetramethylammonium cation, a tetraethylammonium cation, a tetrapropylammonium cation, a tetrabutylammonium cation, or a choline cation is more preferable, and a tetramethylammonium cation, a tetraethylammonium cation, a tetrapropylammonium cation, or a choline cation is still more preferable.

In addition, a cationic polymer may be a counter ion.

It is preferable that the cationic group as the metal-adsorbing group is an onium group. Examples of the onium group include an ammonium group, a phosphonium group, an arsonium group, a stibonium group, an oxonium group, a sulfonium group, a selenonium group, a stannonium group, and an iodonium group. As the onium group, an ammonium group, a phosphonium group, or a sulfonium group is preferable, an ammonium group or a phosphonium group is more preferable, and an ammonium group is most preferable.

Specific examples of the chelating agent according to the present invention include a compound having a carboxyl group (hereinafter, appropriately also referred to as "carboxylic acid compound"). The carboxylic acid compound has at least one carboxyl group in one molecule and more preferably has two or more carboxyl groups in one molecule.

In addition to the carboxyl group, it is preferable that the carboxylic acid compound having one carboxyl group has another metal-adsorbing group or a functional group having weaker coordinating properties than the carboxyl group but still having coordinating properties to metal, for example, an alcoholic hydroxyl group, a mercapto group, an amino group, or a carbonyl group. Specific examples include glycolic acid, thioglycolic acid, lactic acid, β-hydroxypropionic acid, gluconic acid, pyruvic acid, acetoacetic acid, salicylic acid, 5-sulfosalicylic acid, β-alanine, phenylalanine, and N-ethylglycine.

Specific examples of a carboxylic acid compound having two carboxyl groups include oxalic acid, malonic acid, succinic acid, glutaric acid, adipic acid, pimelic acid, suberic acid, azelaic acid, sebacic acid, maleic acid, phthalic acid, 3-sulfophthalic acid, 4-sulfophthalic acid, 2-sulfoterephthalic acid, 3-hydroxyphthalic acid, 4-hydroxyphthalic acid, tartaric acid, malic acid, dipicolinic acid, and citric acid.

Among these, a compound having two or more carboxyl groups and one sulfo group in the aromatic ring, such as, 3-sulfophthalic acid, 4-sulfophthalic acid, or 2-sulfoterephthalic acid, a compound having a hydroxyl group, a carboxyl group, and a sulfo group in the aromatic ring, for example, such as 5-sulfosalicylic acid, 4-hydroxyphthalic acid, oxalic acid, tartaric acid, malic acid, or dipicolinic acid, is more preferable, and a sulfophthalic acid such as 3-sulfophthalic acid or 4-sulfophthalic acid, 5-sulfosalicylic acid, or 4-hydroxyphthalic acid is still more preferable.

In addition, a low molecular weight organic compound that has three or more carboxyl groups and does not have another functional group having an element other than carbon or hydrogen is also preferable as the carboxylic acid compound, and specific examples of the low molecular weight organic compound are as follows.

Specific examples include propane-1,2,3-tricarboxylic acid, butane-1,2,3-tricarboxylic acid, butane-1,2,4-tricarboxylic acid, butane-1,2,3,4-tetracarboxylic acid, 2-carboxymethylpropane-1,3-dicarboxylic acid, pentane-1,2,3-tricarboxylic acid, pentane-1,2,4-tricarboxylic acid, pentane-1,2,5-tricarboxylic acid, pentane-1,3,4-tricarboxylic acid, pentane-2,3,4-tricarboxylic acid, pentane-1,2,3,4-tetracarboxylic acid, pentane-1,2,3,5-tetracarboxylic acid, 2-carboxymethylbutane-1,3-dicarboxylic acid, 2-carboxymethylbutane-1,4-dicarboxylic acid, 3-carboxymethylbutane-1,2-dicarboxylic acid, 3-carboxy methylbutane-1,2,4-tricarboxylic acid, 2,2-dicarboxy methylpropane-1,3-dicarboxylic acid, 1,2,3,4-cyclopentane tetracarboxylic acid, hemimellitic acid, trimellitic acid, pyromellitic acid, and naphthalene-1,4,5,8-tetracarboxylic acid.

Among these, the above-described groups in which an alkyl group having 5 or less carbon atoms is substituted with three or more carboxyl groups are more preferable, and propane-1,2,3-tricarboxylic acid is most preferable.

In addition, for example, a compound that has three or more carboxyl groups and has another functional group having a hetero element, for example, 2-phosphonobutane-1,2,3-tricarboxylic acid is also preferable.

In addition, it is preferable that the chelating agent is a chelating agent represented by the following Formula (K1) or (K2).

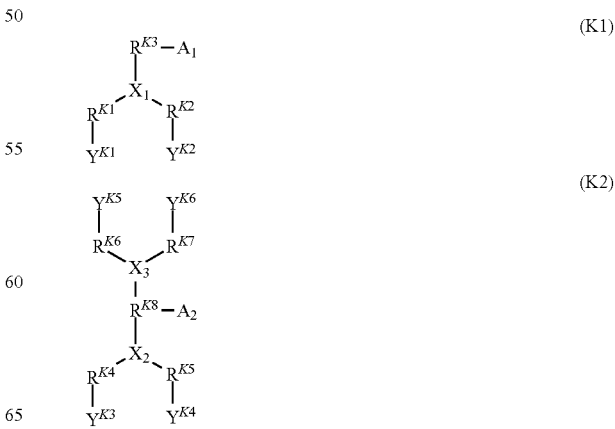

In Formula (K1), $R^{K1}$ and $R^{K2}$ each independently represent a single bond or an alkylene group, $R^{K3}$ represents a divalent organic group, $X_1$ represents a CH group or a nitrogen atom, $Y^{K1}$ and $Y^{K2}$ each independently represent a metal-adsorbing group, and $A_1$ represents a hydrogen atom or a hydrophilic group.

In Formula (K2), $R^{K4}$, $R^{K5}$, $R^{K6}$, and $R^{K7}$ each independently represent a single bond or an alkylene group, $R^{K8}$ represents a trivalent organic group, $X_2$ and $X_3$ each independently represent a CH group or a nitrogen atom, $Y^{K3}$, $Y^{K4}$, $Y^{K5}$, and $Y^{K6}$ each independently represent a metal-adsorbing group, and $A_2$ represents a hydrogen atom or a hydrophilic group.

Hereinafter, Formula (K1) will be described.

$R^{K1}$ and $R^{K2}$ each independently represent a single bond or an alkylene group.

The number of carbon atoms in the alkylene group represented by $R^{K1}$ and $R^{K2}$ is, for example, preferably 1 to 6 and more preferably 1 to 3.

The alkylene group represented by $R^{K1}$ and $R^{K2}$ may be linear or branched and is preferably linear.

As the alkylene group represented by $R^{K1}$ and $R^{K2}$, specifically, a methylene group is more preferable.

$R^{K3}$ represents a divalent organic group. The organic group refers to a group having at least one carbon atom.

Examples of the divalent organic group represented by $R^{K3}$ include an alkylene group and an arylene group.

The alkylene group represented by $R^{K3}$ may be linear or branched and is preferably linear.

The number of carbon atoms in the alkylene group and the arylene group represented by $R^{K3}$ is preferably 1 to 10, more preferably 1 to 8, and most preferably 1 to 6.

As the divalent organic group represented by $R^{K3}$, a methylene group, an ethylene group, or a phenyl group is preferable.

$X_1$ represents a CH group or a nitrogen atom. It is preferable that $X^1$ represents a nitrogen atom.

$Y^{K1}$ and $Y^{K2}$ each independently represent a metal-adsorbing group.

As the metal-adsorbing group, an acid group or a cationic group is preferable. Specific examples are the same as the specific examples of the acid group or the cationic group described above regarding the metal-adsorbing group of the carboxylic acid compound. In addition, the cationic polymer may be a counter ion.

$A_1$ represents a hydrogen atom or a hydrophilic group.

Preferable examples of the hydrophilic group represented by $A_1$ include a hydroxyl group, a carboxyl group, a carboxylate group, a hydroxyethyl group, a polyoxyethyl group, a hydroxypropyl group, a polyoxypropyl group, an amino group, an aminoethyl group, an aminopropyl group, an ammonium group, an amido group, a carboxymethyl group, a sulfo group, and a phosphate group.

As the hydrophilic group represented by $A_1$, a hydroxyl group is most preferable.

Hereinafter, Formula (K2) will be described.

$R^{K4}$, $R^{K5}$, $R^{K6}$, and $R^{K7}$ each independently represent a single bond or an alkylene group.

The alkylene group represented by $R^{K4}$, $R^{K5}$, $R^{K6}$, and $R^{K7}$ have the same definition as $R^{K1}$ and $R^{K2}$ in Formula (K1). A preferable aspect of $R^{K4}$, $R^{K5}$, $R^{K6}$, and $R^{K7}$ is the same as the preferable aspect of $R^{K1}$ and $R^{K2}$ in Formula (K1).

$R^{K8}$ represents a trivalent organic group. The organic group refers to a group having at least one carbon atom.

The number of carbon atoms in the trivalent organic group represented by $R^{K8}$ is preferably 1 to 10, more preferably 1 to 8, and most preferably 1 to 6. In addition, the trivalent organic group may have a substituent, may have a cyclic structure which is formed by substituents being bonded to each other, or may have a heteroatom in the organic chain. As the cyclic structure which is formed by substituents being bonded to each other, a cycloalkyl group is preferable. In addition, as the heteroatom which may be included in the main chain of the organic group, an oxygen atom or a nitrogen atom is preferable.

$X_2$ and $X_3$ each independently represent a CH group or a nitrogen atom. It is preferable that $X_2$ represents a nitrogen atom. It is preferable that $X_3$ represents a nitrogen atom.

$Y^{K3}$, $Y^{K4}$, $Y^{K5}$, and $Y^{K6}$ each independently represent a metal-adsorbing group.

The metal-adsorbing group represented by $Y^{K3}$, $Y^{K4}$, $Y^{K5}$, and $Y^{K6}$ has the same definition as the metal-adsorbing group represented by $Y^{K1}$ and $Y^{K2}$ in Formula (K1). A preferable aspect of the metal-adsorbing group represented by $Y^{K3}$, $Y^{K4}$, $Y^{K5}$, and $Y^{K6}$ is the same as the preferable aspect of the metal-adsorbing group represented by $Y^{K1}$ and $Y^{K2}$ in Formula (K1).

$A_2$ represents a hydrogen atom or a hydrophilic group.

The hydrophilic group represented by $A_2$ has the same definition as $A_1$ in Formula (K1). A preferable aspect of $A_2$ is the same as the preferable aspect of $A_1$ in Formula (K1).

Hereinafter, specific examples of the chelating agent represented by Formula (K1) or (K2) will be shown.

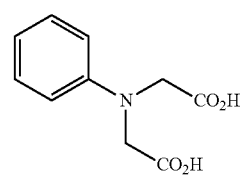

(K-1)

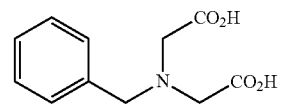

(K-2)

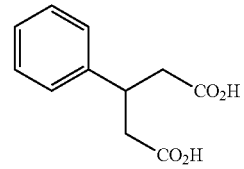

(K-3)

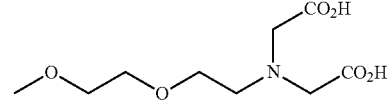

(K-4)

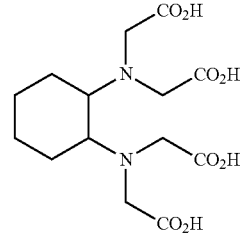

(K-5)

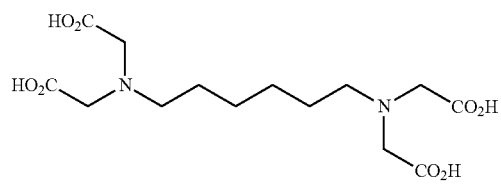 (K-6)

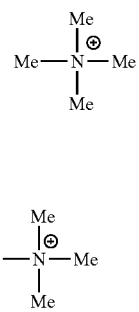 (K-7)

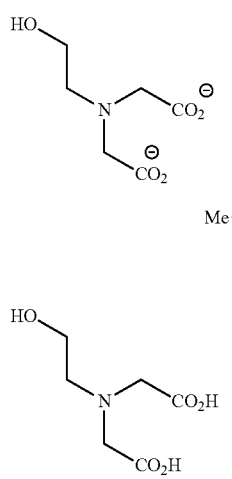 (K-8)

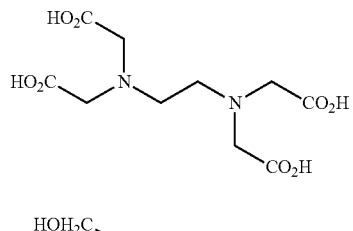 (K-9)

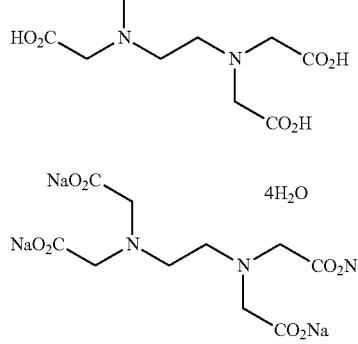 (K-10)

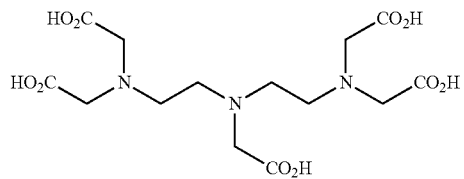 (K-11)

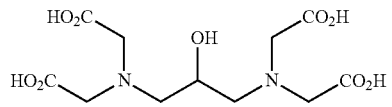 (K-12)

(K-13)

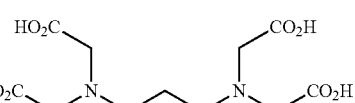 (K-14)

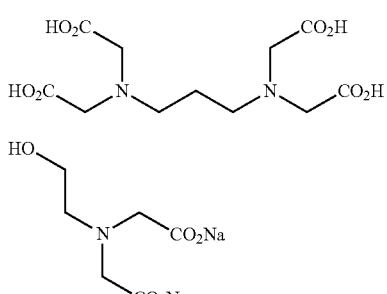 (K-15)

(K-16)

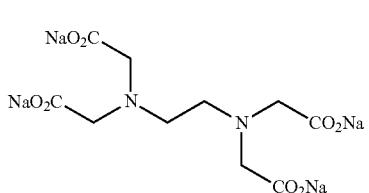 (K-17)

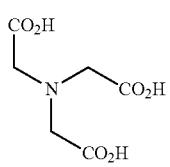 (K-18)

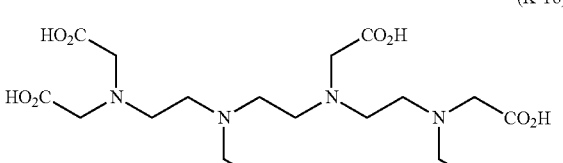 (K-19)

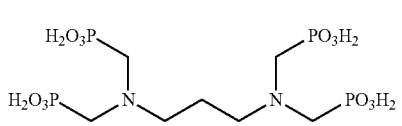 (K-20)

In a case where the treatment liquid for manufacturing a semiconductor according to the present invention is used as a developer, it is preferable that the chelating agent is a chelating agent for divalent metal.

Examples of the chelating agent for divalent metal include a polyphosphate such as $Na_2P_2O_7$, $Na_5P_3O_3$, $Na_3P_3O_9$, $Na_2O_4P(NaO_3P)PO_3Na_2$, or Calgon (polymetaphosphate), for example, an amino polycarboxylic acid such as: ethylenediaminetetraacetic acid, a potassium salt thereof, a sodium salt thereof, or an amine salt thereof; diethylenetriaminepentaacetic acid, a potassium salt thereof, or a sodium salt thereof; triethylenetetraminehexaacetic acid, a potassium salt thereof, or a sodium salt thereof; hydroxyethylethylenediaminetriacetic acid, a potassium salt thereof, or a sodium salt thereof; nitrilotriacetic acid, a potassium salt thereof, or a sodium salt thereof; 1,2-diaminocyclohexanetetraacetic acid, a potassium salt thereof, or a sodium salt thereof; and 1,3-diamino-2-propanoltetraacetic acid, a potassium salt thereof, or a sodium salt thereof, and an organic phosphonic acid such as: 2-phosphonobutane tricarboxylic acid-1,2,4, a potassium salt thereof, or a sodium salt thereof; 2-phosphonobutanone tricarboxylic acid-2,3,4, a potassium salt thereof, or a sodium salt thereof; 1-phosphonoethane tricarboxylic acid-1,2,2, a potassium salt thereof, or a sodium salt thereof; 1-hydroxyethane-1,1-diphosphonic acid, a potassium salt thereof, or a sodium salt thereof; and amino tri(methylene phosphonic acid) and potassium and sodium salts thereof.

Among these, ethylenediaminetetraacetic acid, a potassium salt thereof, a sodium salt thereof, or an amine salt thereof; ethylenediaminetetra(methylenephosphonic acid), an ammonium salt thereof, or a potassium salt thereof; or hexamethylenediaminetetra(methylenephosphonic acid), an ammonium salt thereof, or a potassium salt thereof is preferable.

In general, the optimum amount of the chelating agent for divalent metal in a developer during use is preferably 0.01 to 5 mass % and more preferably 0.01 to 0.5 mass %.

Typically, a commercially available product of the additive according to the present invention may include several mass ppm to several thousands of mass ppm of metal impurities such as Na, K or Fe. In this case, the additive functions as a metal contamination source. Therefore, in a case where the additive includes metal impurities, it is preferable that the additive is purified for use such that the content of each of the metal impurities is preferably 500 mass ppt or lower and more preferably 100 mass ppt or lower. As the purification method, for example, a method of dissolving the additive in water to obtain solution and filtering the obtained solution using an ion exchange resin to trap the metal impurities with the ion exchange resin is preferable. By using the surfactant purified as described above, the treatment liquid for manufacturing a semiconductor in which the metal impurity content is extremely reduced can be obtained.

[3] Water

The treatment liquid for manufacturing a semiconductor according to the present invention includes water.

Water is not particularly limited, it is preferable that ultrapure water used for manufacturing a semiconductor is used, and it is more preferable that water obtained by further purifying the ultrapure water such that inorganic anions, metal ions, and the like are reduced is used. The purification method is not particularly limited, and purification using a filtration film or an ion-exchange membrane or purification using distillation is preferable. In addition, for example, it is preferable that the purification is performed using a method described in JP2007-254168A.

In addition, the metal content in water is preferably lower than 0.001 mass ppt (parts per trillion).

It is preferable that the water used in the embodiment of the present invention is obtained as described above. From the viewpoint of significantly obtaining a desired effect as the treatment liquid for manufacturing a semiconductor, it is preferable that the water is used not only as the treatment liquid according to the present invention but also as water for cleaning a storage container or for a kit described below.

[4] Metal Atoms

The treatment liquid for manufacturing a semiconductor according to the present invention includes one kind or two or more kinds of metal atoms selected from the group consisting of Na, K, Ca, Fe, Cu, Mg, Mn, Li, Al, Cr, Ni, and Zn. The ratio $T_1$ of the total mass of the one kind or two or more kinds of metal atoms to the sum of the total mass of the additive and the total mass of the metal atoms is 1 mass ppt (parts per trillion) to 1 mass ppm (parts per million). This metal atom ratio $T_1$ is preferably 1 mass ppb (parts per billion) to 1 mass ppm, more preferably 2 mass ppb to 1 mass ppm, and still more preferably 10 mass ppb to 1 mass ppm.

The content of each of the one kind or two or more kinds of metal atoms selected from the group consisting of Na, K, Ca, Fe, Cu, Mg, Mn, Li, Al, Cr, Ni, and Zn is preferably 1 mass ppq (parts per quadrillion) to 1000 mass ppt, more preferably 5 mass ppq to 500 mass ppt, still more preferably 10 mass ppq to 500 ppt, and most preferably 100 mass ppq to 100 mass ppt with respect to the treatment liquid for manufacturing a semiconductor.

In particular, the content of each of the one kind or two or more kinds of metal atoms selected from the group consisting of Na, K, and Ca is preferably 1 mass ppq to 1000 mass ppt, more preferably 5 mass ppq to 500 mass ppt, still more preferably 10 mass ppq to 500 ppt, and most preferably 100 mass ppq to 100 mass ppt with respect to the treatment liquid for manufacturing a semiconductor.

In addition, the ratio $T_2$ of the total mass of the particulate metal of the one kind or two or more kinds of metal atoms to the sum of the total mass of the additive and the total mass of the particulate metal of the metal atoms is preferably 0.1 mass ppt (parts per trillion) to 0.1 mass ppm (parts per million). The particulate metal ratio $T_2$ is more preferably 0.1 mass ppt to 0.01 mass ppm, still more preferably 0.1 mass ppt to 1 mass ppb, and even still more preferably 1 mass ppt to 1 mass ppb.

The content of the particulate metal of each of the one kind or two or more kinds of metal atoms selected from the group consisting of Na, K, Ca, Fe, Cu, Mg, Mn, Li, Al, Cr, Ni, and Zn is preferably 1 mass ppq (parts per quadrillion) to 1000 mass ppt, more preferably 5 mass ppq to 500 mass ppt, still more preferably 10 mass ppq to 500 ppt, and most preferably 100 mass ppq to 100 mass ppt with respect to the treatment liquid for manufacturing a semiconductor.

In particular, the content of the particulate metal of each of the one kind or two or more kinds of metal atoms selected from the group consisting of Na, K, and Ca is preferably 1 mass ppq to 1000 mass ppt, more preferably 5 mass ppq to 500 mass ppt, still more preferably 10 mass ppq to 500 ppt, and most preferably 100 mass ppq to 100 mass ppt with respect to the treatment liquid for manufacturing a semiconductor.

The metal atoms can be measured using an inductively coupled plasma-mass spectrometry (ICP-MS) device described below. The metal atoms may be in the form of a salt. In addition, the particulate metal can be measured using a single particle inductively coupled plasma-mass spectrometry (SP-ICP-MS) device. The particulate metal can be measured by using, for example, Agilent 8800 triple quadrupole ICP-MS (inductively coupled plasma mass spectrometry; manufactured by Agilent Technologies Inc.; for analyzing a semiconductor, option #200) as the device that can be used in the measurement using the SNP-ICP-MS method. In addition, for example, Agilent 8900 (manufactured by Agilent Technologies Inc.) as a succession machine or NexION 350S (manufactured by PerkinElmer Inc.) can also be used.

[5] Inorganic Salt, Peroxide, Ester Compound, Amine Compound, and Chelate Complex The treatment liquid for manufacturing a semiconductor according to the present invention may include one kind of impurity selected from the group consisting of an inorganic salt, a peroxide, an ester compound, an amine compound, and a chelate complex.

Hereinafter, each of the impurities will be described.

[5-1] Inorganic Salt

In a case where the treatment liquid for manufacturing a semiconductor according to the present invention includes the anionic surfactant or the cationic surfactant as the additive, the treatment liquid for manufacturing a semiconductor may include, for example, an inorganic salt as the impurity.

Examples of the inorganic salt include a sulfate, a nitrate, an acetate, and a phosphate.

For example, the content of the inorganic salt is preferably 1 mass ppq to 1000 mass ppt, more preferably 5 mass ppq to 500 mass ppt, still more preferably 10 mass ppq to 500 mass ppt, and even still more preferably 100 mass ppq to 100 mass ppt with respect to the treatment liquid for manufacturing a semiconductor. The reason is as follows.

The inorganic salt reacts with the metal atoms included in the treatment liquid for manufacturing a semiconductor such that a metal salt deposits. As a result, defects are generated in a pattern. Therefore, the content of the inorganic salt is preferably in the above-described range with respect to the treatment liquid for manufacturing a semiconductor.

[5-2] Peroxide

In a case where the treatment liquid for manufacturing a semiconductor according to the present invention includes the nonionic surfactant as the additive, the treatment liquid for manufacturing a semiconductor may include, for example, a peroxide as the impurity.

Examples of the peroxide include calcium peroxide, magnesium peroxide, potassium peroxide, and sodium peroxide.

The content of the peroxide in the nonionic surfactant is preferably 1 mass ppq to 1000 mass ppt, more preferably 5 mass ppq to 500 mass ppt, still more preferably 10 mass ppq to 500 mass ppt, and most preferably 100 mass ppq to 100 mass ppt with respect to the treatment liquid for manufacturing a semiconductor. The reason is as follows.

The peroxide deteriorates electric characteristics of an electronic device and causes pattern defects. Therefore, the content of the peroxide is preferably in the above-described range with respect to the treatment liquid for manufacturing a semiconductor.

[5-3] Ester Compound

In a case where the treatment liquid for manufacturing a semiconductor according to the present invention includes the nonionic surfactant as the additive, the treatment liquid for manufacturing a semiconductor may include, for example, an ester compound as the impurity.

Examples of the ester compound include stearic acid methyl ester, stearic acid octyl ester, oleic acid butyl ester, lauric acid oleyl ester, palmitic acid stearyl ester, behenic acid stearyl ester, myristic acid myristyl ester, acrylic acid hexyl ester, methacrylic acid octyl ester, caproic acid vinyl ester, and oleyl acetic acid ester.

The content of the ester compound in the nonionic surfactant is preferably 1 mass ppq to 1000 mass ppt, more preferably 5 mass ppq to 500 mass ppt, still more preferably 10 mass ppq to 500 ppt, and most preferably 100 mass ppq to 100 mass ppt with respect to the treatment liquid for manufacturing a semiconductor. The reason is as follows.

The ester compound is adsorbed on the metal atoms and aggregates. The aggregated ester compound is adsorbed on a substrate during a treatment using the treatment liquid for manufacturing a semiconductor, and remains in this state. As a result, defects occur. Therefore, the content of the ester compound is preferably in the above-described range with respect to the treatment liquid for manufacturing a semiconductor.

[5-4] Amine Compound

In a case where the treatment liquid for manufacturing a semiconductor according to the present invention includes the nonionic surfactant as the additive, the treatment liquid for manufacturing a semiconductor may include, for example, an amine compound as the impurity.

Examples of the amine compound include monomethylamine, dimethylamine, trimethylamine, monoethylamine, diethylamine, and triethylamine.

The content of the amine compound in the nonionic surfactant is preferably 1 mass ppq to 1000 mass ppt, more preferably 5 mass ppq to 500 mass ppt, still more preferably 10 mass ppq to 500 mass ppt, and most preferably 100 mass ppq to 100 mass ppt with respect to the treatment liquid for manufacturing a semiconductor. The reason is as follows.

The amine compound is adsorbed on the metal atoms and aggregates. The aggregated amine compound is adsorbed on a substrate during a treatment using the treatment liquid for manufacturing a semiconductor, and remains in this state. As a result, defects occur. Therefore, the content of the inorganic salt is preferably in the above-described range with respect to the treatment liquid for manufacturing a semiconductor.

[5-5] Chelate Complex

In a case where the treatment liquid for manufacturing a semiconductor according to the present invention includes the chelating agent as the additive, the treatment liquid for manufacturing a semiconductor may include, for example, a chelate complex as the impurity. The chelate complex does not consist of only the chelating agent but is formed a part of the chelating agent and the one kind or two or more kinds of metal atoms selected from the group consisting of Na, K, Ca, Fe, Cu, Mg, Mn, Li, Al, Cr, Ni, and Zn included in the treatment liquid for manufacturing a semiconductor.

Examples of the chelate complex include monocalcium ethylenediamine tetraacetate and copper (II) ethylenediamine tetraacetate.

The content of the chelate complex is preferably 1 mass ppq to 1000 mass ppt, more preferably 5 mass ppq to 500 mass ppt, still more preferably 10 mass ppq to 500 mass ppt, and most preferably 100 mass ppq to 100 mass ppt with respect to the treatment liquid for manufacturing a semiconductor. The reason is as follows.

The chelate complex is adsorbed and accumulates on a wafer substrate during a treatment using the treatment liquid for manufacturing a semiconductor. As a result, a load increases due to development and cleaning such as rinsing. Further, the chelate complex that is not completely removed by development and cleaning such as rinsing form defects. Therefore, the content of the chelate complex is preferably in the above-described range with respect to the treatment liquid for manufacturing a semiconductor.

[5-6] Measurement Method

The inorganic salt, the peroxide, the ester compound, the amine compound, and the chelate complex can be measured using a well-known method. Examples of the measurement method include methods described in JP2010-1000048A and JP2014-209578A. The content of the inorganic salt, the peroxide, the ester compound, the amine compound, and the chelate complex can be measured using a method described in Examples described below.

(Coarse Particles)

It is preferable that the treatment liquid for manufacturing a semiconductor according to the embodiment of the present invention does not substantially coarse particles. Here, the coarse particles included in the treatment liquid refer to particles of dirt, dust, an organic solid matter, an inorganic solid matter, or the like included in raw materials as impurities or particles of dirt, dust, an organic solid matter, an inorganic solid matter, or the like introduced as contaminant during the preparation of the treatment liquid. The coarse particles correspond to particles that finally remain in the treatment liquid without being dissolved. The amount of the coarse particles present in the treatment liquid can be measured in a liquid phase using a commercially available measuring device according to a light scattering particle measurement method in liquid in which a laser is used as a light source.

(Kit and Concentrated Liquid)

The treatment liquid for manufacturing a semiconductor according to the embodiment of the present invention may be used as a kit in which the respective components are divided. In particular, the treatment liquid for manufacturing a semiconductor may be prepared as a concentrated liquid. In this case, the treatment liquid for manufacturing a semiconductor can be diluted with water during use. From the viewpoint of significantly obtaining the effects of the treatment liquid for manufacturing a semiconductor according to the embodiment of the present invention, it is preferable that the water used for the dilution is the above-described purified water.

(Method of Preparing Treatment Liquid for Manufacturing Semiconductor)

The treatment liquid for manufacturing a semiconductor according to the present invention can be prepared using a well-known method.

As a method of adjusting the content of the specific metal atoms and the content of the inorganic salt, the peroxide, the ester compound, the amine compound, and the chelate complex in the treatment liquid for manufacturing a semiconductor according to the present invention to be desired values, for example, a method of purifying the treatment liquid in at least one step among a step of preparing the respective raw materials used for manufacturing the treatment liquid and a step after the preparation of the treatment liquid can be used. From the viewpoint of obtaining the desired effects of the treatment liquid for manufacturing a semiconductor according to the present invention, it is preferable that the purification of the treatment liquid for manufacturing a semiconductor is performed in the step of preparing the respective raw materials used for manufacturing the treatment liquid. In the raw materials, it is preferable that the content of the specific metal atoms according to the present invention or the content of an inorganic ion such as a sulfate ion, a chloride ion, or a nitrate ion and a metal ion derived from the metal atoms are reduced.

A method of purifying the treatment liquid is not particularly limited, and examples thereof include adsorption purification using silicon carbide, distillation, filter filtration, and filtration using an ion exchange resin described in WO2012/043496A. It is preferable that the purification of the treatment liquid is repeated by using the above-described purification methods in combination.

For example, in order to remove foreign matter or defects, it is preferable that the treatment liquid for manufacturing a semiconductor according to the present invention is filtered through a filter. As the filter, any filter which is used in the related art for filtering or the like can be used without any particular limitation. Examples of a material of the filter include: a fluororesin such as polytetrafluoroethylene (PTFE); a polyamide resin such as nylon; and a polyolefin resin (having a high density, an ultrahigh molecular weight) such as polyethylene or polypropylene (PP), and a polysulfone resin. Among these materials, polypropylene (including high-density polypropylene) or nylon is preferable. The pore size of the filter is suitably about 0.001 to 1.0 μm and is preferably about 0.02 to 0.5 μm and more preferably about 0.01 to 0.1 μm. In the above-described range, fine foreign matter such as impurities or aggregates included in the treatment liquid can be reliably removed while suppressing filter clogging.

In a filter is used, a combination of different filters may be used. At this time, the filtering using a first filter may be performed once, or twice or more. In a case where filtering is performed two or more times using different filters in combination, it is preferable that the pore size of the filter used for the second or subsequent filtering is equal to or more than that of the filter used for the first filtering. In addition, a combination of first filters having different pore sizes in the above-described range may be used. Here, the pore size of the filter can refer to a nominal value of a manufacturer of the filter. A commercially available filter can be selected from various filters manufactured by Pall Corporation, Toyo Roshi Kaisha, Ltd., Entegris Japan Co., Ltd. (former Mykrolis Corporation), or Kits Microfilter Corporation.

A second filter may be formed of the same material as that of the first filter. The pore size of the second filter is suitably about 0.01 to 1.0 μm and is preferably about 0.1 to 0.5 μm. In the above-described range, in a case where the treatment liquid includes component particles, foreign matter incorporated into the treatment liquid can be removed in a state where the component particles remain.

For example, the filtering using the first filter may be performed on the mixed solution including some components of the treatment liquid, and then the second filtering may be performed after mixing the remaining components with each other to prepare the treatment liquid.

In addition, in the present invention, in a case where the content of the particulate metal of one kind or two or more kinds of metal atoms selected from the group consisting of Na, K, Ca, Fe, Cu, Mg, Mn, Li, Al, Cr, Ni, and Zn is particularly low with respect to the treatment liquid (for example, in a case where the content of the particulate metal of each of the metal atoms is 1000 mass ppt or lower with respect to the treatment liquid), impurities including the metal atoms tend to become colloidal. Therefore, it is likely to difficult to remove the colloidal impurities from an ion adsorbing film. Therefore, the present inventors found that the colloidal impurities can be removed by purification using a microfilter membrane having a pore size of 20 nm or less.

In addition, in a case where fine particles are present in the treatment liquid in addition to the colloidal impurities, in particular, the colloidal particles including metal atoms such as iron or aluminum, it is preferable that the treatment liquid is purified by filtering the treatment liquid using a microfilter membrane having a pore size of 50 nm or more for removing fine particles before filtering the treatment liquid using a microfilter membrane having a pore size of 20 nm or less.

It is preferable that the treatment liquid according to the present invention is purified using ion adsorption means in addition to the above-described filters. It is preferable that the ion adsorption means is ion adsorption means in which a surface of cellulose, diatom earth, nylon, polyethylene, polypropylene, polystyrene, a fluororesin, or the like is modified with either or both of an anionic group such as a sulfo group or a carboxyl group and a cationic group. The ion adsorption means modified with an anionic group can remove a cation such as a Na ion or a Ca ion. The ion adsorption means modified with a cationic group can remove an anion such as a Cl ion and an acid component.

According to the purpose, the ion adsorption means may be used in combination with either or both of an anionic group and a cationic group. The ion adsorption means may be a filter.

The filtration step may be repeated multiple times according to the purpose.

In addition, it is preferable that the filter to be used is treated before filtering the treatment liquid. The liquid used for the treatment is not particularly limited, and the metal content is preferably lower than 1 mass ppt (parts per trillion) and more preferably lower than 0.001 mass ppt (parts per trillion). In a case where the liquid used for the treatment is water or another organic solvent that is purified such that the metal content in the above-described range, the treatment liquid according to the present invention, a diluted solution of the treatment liquid, or a liquid including a compound added to the treatment liquid, the desired effects of the treatment liquid for manufacturing a semiconductor according to the present invention can be significantly obtained.

As another method of adjusting the content of the specific metal atoms and the content of the inorganic salt, the peroxide, the ester compound, the amine compound, and the chelate complex in the treatment liquid for manufacturing a semiconductor according to the present invention to be desired values, for example, a method of using a container in which the elution of the specific metal atoms and the impurities is small as a container that stores the raw materials used for manufacturing the treatment liquid can be used. Examples of the container in which the elution of the impurities and the like is small include a storage container described below. In addition, for example, a method of lining an inner wall of a pipe with a fluororesin to prevent the specific metal atoms from being eluted from the pipe used for the preparation of the treatment liquid can also be used.

(Storage Container)

Irrespective of whether or not it is the above-described kit, the treatment liquid for manufacturing a semiconductor according to the embodiment of the present invention can be filled into any container to be stored, transported, and used unless it has a problem such as corrosiveness. As the container, a container for manufacturing a semiconductor that carries a small amount of the metal atoms and the impurities and in which the elution of the impurities and the like is small is preferable. Examples of the container to be used include "Green Bottle" series (manufactured by Alcello Chemical Co., Ltd.) and "Pure Bottle" (manufactured by Kodama Plastics Co., Ltd.). However, the present invention is not limited to the examples. It is preferable that the inner wall of the container is formed of a different resin other than one or more resins selected from the group consisting of a polyethylene resin, a polypropylene resin, and a polyethylene-polypropylene resin or is formed of a metal which is treated to inhibit rust and to prevent metal elution, for example, stainless steel, HASTELLOY, INCONEL, or MONEL.

As the different resin, a fluororesin (perfluororesin) can be preferably used. This way, by using the container having an inner wall formed of a fluororesin, the occurrence of problems such as the elution of ethylene, propylene, or an oligomer can be suppressed as compared to a case where a container having an inner wall formed of a polyethylene resin, a polypropylene resin, or a polyethylene-polypropylene resin is used.

Specific examples of the container having an inner wall formed of a fluororesin include a Fluoro Pure PFA composite drum (manufactured by Entegris, Inc.). In addition, for example, containers described in page 4 and the like of JP1991-502677A (JP-H3-502677A), page 3 and the like of WO2004/016526A, and pages 9 and 16 and the like of WO1999/46309A can be used.

It is preferable that the inside of these containers is cleaned before filling. The liquid used for the cleaning is not particularly limited, and the metal content is preferably lower than 1 mass ppt (parts per trillion) and more preferably lower than 0.001 mass ppt (parts per trillion). In a case where the liquid used for the treatment is water or another organic solvent that is purified such that the metal content in the above-described range, the treatment liquid according to the present invention, a diluted solution of the treatment liquid, or a liquid including a compound to which the treatment liquid is added, the desired effects of the present invention can be significantly obtained.

It is preferable that all the handling operations including the preparing of the treatment liquid for manufacturing a semiconductor according to the present invention, the unsealing and/or cleaning of the storage container, and the filling of the treatment liquid for manufacturing a semiconductor, the treatment analysis, and the measurement are performed in a clean room. It is preferable that the clean room satisfies the clean room standards 14644-1. It is preferable that the clean room satisfies any one of ISO Class 1, ISO Class 2, ISO Class 3, and ISO Class 4, it is more preferable that the clean room satisfies ISO Class 1 or ISO Class 2, and it is still more preferable that the clean room satisfies ISO Class 1.

<Pattern Forming Method>

A pattern forming method according to the present invention includes: forming a film using an actinic ray-sensitive or radiation-sensitive resin composition or a coloring curable resin composition (hereinafter, also referred to as "resist composition); exposing the formed film; and treating the exposed film using the treatment liquid for manufacturing a semiconductor.

Hereinafter, each of the steps included in the pattern forming method according to the present invention will be described.

[Film Forming Step]

The film forming step is a step of forming a film using the actinic ray-sensitive or radiation-sensitive resin composition described below or using the coloring curable resin composition described below and, for example, can be performed using the following method.

(1) Resist Film

In order to form the resist film (actinic ray-sensitive or radiation-sensitive film) on the substrate using the actinic ray-sensitive or radiation-sensitive resin composition described below, respective components described below are dissolved in a solvent to prepare an actinic ray-sensitive or radiation-sensitive resin composition, and the actinic ray-sensitive or radiation-sensitive resin composition is optionally filtered through a filter and applied to the substrate. As the filter, a filter formed of polytetrafluoroethylene, polyethylene, or nylon and having a pore size of preferably 0.1 microns or less, more preferably 0.05 microns or less, and still more preferably 0.03 microns or less is preferable.

The actinic ray-sensitive or radiation-sensitive resin composition is applied to the substrate (for example, silicon or a silicon dioxide coating), which is used for manufacturing an integrated circuit element, using an appropriate coating method such as a method using a spinner. Next, the actinic ray-sensitive or radiation-sensitive resin composition is dried to form a resist film. Optionally, various underlayer films (an inorganic film, an organic film, or an antireflection film) may be formed below the resist film.

As the drying method, a method of drying heating the composition is generally used. Heating may be performed using means provided in a typical exposure or developing device, and may be performed using a hot plate or the like.

The heating temperature is preferably 80° C. to 180° C., more preferably 80° C. to 150° C., still more preferably 80° C. to 140° C., and even still more preferably 80° C. to 130° C. The heating time is preferably 30 to 1000 seconds, more preferably 60 to 800 seconds, and still more preferably 60 to 600 seconds.

The thickness of the resist film is generally 200 nm or less and preferably 100 nm or less. For example, in order to resolve a 1:1 line-and-space pattern having a size of 30 nm or less, the thickness of a resist film to be formed is preferably 50 nm or less. In a case where a resist film having a thickness of 50 nm or less is applied to a development step described below, pattern collapse is not likely to occur, and higher resolution performance can be obtained.

The thickness is more preferably in a range of 15 nm to 45 nm. In a case where the thickness is 15 nm or more, sufficient etching resistance can be obtained. The thickness is still more preferably is in a range of 15 nm to 40 nm. In a case where the thickness is in the above-described range, etching resistance and higher resolution performance can be simultaneously satisfied.

In the pattern forming method according to the present invention, an upper layer film (top coat film) may be formed over the resist film. The upper layer film can be formed using, for example, an upper layer film-forming composition including a hydrophobic resin, an acid generator, and a basic compound. The upper layer film and the upper layer film-forming composition will be described below.

(2) Coloring Curable Film

As a support for forming a color filter (coloring curable film) using the coloring curable resin composition described below, for example, a substrate (for example, a silicon substrate) for a solid image pickup element on which an image pickup element (light-receiving element) such as a charge coupled device (CCD) or a complementary metal-oxide semiconductor (CMOS) is provided can be used.

The colored pattern may be formed on an image pickup element-formed surface (front surface) of the substrate for a solid image pickup element, or may be formed on an image pickup element non-formed surface (back surface) thereof.

A light shielding film may be provided between image pickup elements in a substrate for a solid image pickup element or on a back surface of a substrate for a solid image pickup element. In addition, an undercoat layer may be partially provided on the support to improve adhesion with a layer above the support, to prevent diffusion of materials, or to make a surface of the substrate flat. By forming the color filter on both a portion where the undercoat layer is provided and a portion where the undercoat layer is not provided, the color filter on a hydrophilic layer and the color filter on a hydrophobic layer can be allowed to be present together on one substrate.

Here, as the undercoat layer, an overcoat layer described below can be used.

As a method of applying the coloring curable resin composition to the support, various coating methods such as slit coating, an ink jet method, spin coating, cast coating, roll coating, or screen printing method can be applied.

The coloring curable film applied to the support can be dried (pre-baked) using, for example, a hot plate or an oven at a temperature of 50° C. to 140° C. for 10 seconds to 300 seconds.

The thickness of the curing film (color filter) is preferably 0.05 μm or more, more preferably 0.1 μm or more, and still more preferably 0.5 μm or more. The upper limit is preferably 10 μm or less, more preferably 5 μm or less, still more preferably 4 μm or less, and even still more preferably 3 μm or less.

The size (pattern width) of the colored pattern (colored pixel) is preferably 5 μm or less, more preferably 4 μm or less, and still more preferably 3 μm or less. The lower limit is 0.1 μm or more in practice.

In a case where the color filter (coloring curable film) is used as a permanent film, a step of forming an overcoat layer on the substrate (support) may be provided before the step of forming the coloring curable film.

In order to form the overcoat layer, a radiation-sensitive epoxy resin composition (overcoat-forming composition) is used based, for example, WO2010/010899A, JP4269480B, JP2005-227525A, JP2000-250217A, JP1997-221602A (JP-H9-221602A), and JP2001-343748A.

[Exposure Step]

The exposure step is a step of exposing the obtained film and, for example, can be performed using the following method.

(1) Resist Film

The resist film formed as described above is irradiated with an actinic ray or radiation through a predetermined mask. For irradiation of an electron beam, drawing (direct drawing) not using a mask is generally used.

The actinic ray or radiation is not particularly limited, and examples thereof include KrF excimer laser light, ArF excimer laser light, extreme ultraviolet (EUV) light, and an electron beam (EB). The exposure may be immersion exposure.

(2) Coloring Curable Film

The coloring curable film formed as described above is exposed in a pattern shape using an exposure device such as a stepper through a mask having a predetermined mask pattern. As radiation (light) used for the exposure, in particular, ultraviolet rays such as g-rays or i-rays are preferably used (i-rays are more preferably used). The irradiation dose (exposure dose) is preferably 30 to 1500 mJ/cm$^2$, more preferably 50 to 1000 mJ/cm$^2$, and most preferably 80 to 500 mJ/cm$^2$.

[Baking Step]

(1) Resist Film

In the pattern forming method according to the present invention, in a case where the resist film is formed using the actinic ray-sensitive or radiation-sensitive resin composition, it is preferable that baking (heating) is performed before development after exposure. Due to the baking, a reaction of an exposed portion is promoted, and sensitivity and a pattern shape are further improved.

The heating temperature is preferably 80° C. to 150° C., more preferably 80° C. to 140° C., and still more preferably 80° C. to 130° C.

The heating time is preferably 30 to 1000 seconds, more preferably 60 to 800 seconds, and still more preferably 60 to 600 seconds.

Heating may be performed using means provided in a typical exposure or developing device, and may be performed using a hot plate or the like.

(2) Coloring Curable Film

In a case where the coloring curable film is formed using the coloring curable resin composition, it is preferable that the coloring curable film is dried and then heated (post-baking) after development described below. At this time, it is preferable that colored patterns of multiple colors are formed, and the coloring curable film can be manufactured by repeating the steps for each color. As a result, a color filter can be obtained. Post-baking is a heat treatment which is performed after development to complete curing. The heating temperature is preferably 250° C. or lower, more preferably 240° C. or lower, still more preferably 230° C. or lower, and even still more preferably 220° C. or lower. Unless specified otherwise, in consideration of an efficient and effective treatment, the lower limit is preferably 50° C. or higher and more preferably 100° C. or higher for the thermal curing treatment. Instead of performing post-baking by heating, a pixel of the color filter may be cured by ultraviolet (UV) irradiation.

[Development Step]

The development step is a step of developing the exposed resist film or coloring curable film with the developer.

Examples of the developing method include: a method (dipping method) of dipping the substrate in a container filled with the developer for a given period of time; a method (puddle method) of causing the developer to accumulate on a surface of the substrate with a surface tension and maintaining this state for a given period of time for development; a method (spraying method) of spraying the developer to a surface of the substrate; and a method (dynamic dispense method) of continuously jetting the developer to the substrate, which is rotating at a given speed, while scanning a developer jetting nozzle on the substrate at a given speed.

In addition, a step of stopping development while replacing the solvent with another solvent may be performed after the development step The developing time is not particularly limited as long as it is a period of time where a non-exposed portion of a resin is sufficiently dissolved. The development time is typically 10 to 300 seconds and preferably 20 to 120 seconds.

The temperature of the developer is preferably 0° C. to 50° C. and more preferably 15° C. to 35° C.

In a case where the coloring curable film is developed, the developing temperature is typically 20° C. to 30° C., and the developing time is, for example, 20 seconds to 90 seconds. Recently, in order to further remove a residue, the developing type may be set as 120 seconds to 180 seconds. Further, in order to further improve residue removing properties, a step of shaking the developer off per 60 seconds and supplying a new developer may be repeated multiple times.

As the developer used in the development step, the above-described treatment liquid for manufacturing a semiconductor is preferably used. In the case of the resist film, In addition to the development using the treatment liquid for manufacturing a semiconductor, development using an organic solvent developer may be further performed (so-called double development).

[Rinsing Step]

The rinsing step is a step of performing rinsing with the rinsing liquid after the development step.

In the rinsing step, a developed wafer is rinsed with the above-described rinsing liquid.

A rinsing method is not particularly limited, and examples thereof include: a method (rotation jetting method) of continuously jetting the rinsing liquid to the substrate which is rotating at a given speed; a method (dipping method) of dipping the substrate in a container filled with the rinsing liquid for a given period of time; and a method (spraying method) of spraying the rinsing liquid to a surface of the substrate. In particular, it is preferable that the rinsing step is performed using the rotation jetting method such that the rinsed substrate is rotated at a rotation speed of 2000 rpm to 4000 rpm to remove the rinsing liquid from the substrate.

The rinsing time is not particularly limited, and is typically 10 seconds to 300 seconds, preferably 10 seconds to 180 seconds, and most preferably 20 seconds to 120 seconds.

The temperature of the rinsing liquid is preferably 0° C. to 50° C. and more preferably 15° C. to 35° C.

A vapor pressure of the rinsing liquid (in the case of a mixed solvent, the total vapor pressure) at 20° C. is preferably 0.05 kPa or higher and 5 kPa or lower, more preferably 0.1 kPa or higher and 5 kPa or lower, and most preferably 0.12 kPa or higher and 3 kPa or lower. By adjusting the vapor pressure of the rinsing liquid to be 0.05 kPa or higher and 5 kPa or lower, uniformity in the temperature in a wafer surface is improved. Further, swelling of the resist film caused by permeation of the rinsing liquid is suppressed, and uniformity in the dimension in a wafer surface is improved.

As the rinsing liquid, for example, the above-described treatment liquid for manufacturing a semiconductor, a rinsing liquid including an organic solvent, or water can be used. As the rinsing liquid, the above-described treatment liquid for manufacturing a semiconductor is preferably used.

As the water, ultrapure water is preferably used.

As the organic solvent included in the rinsing liquid, various organic solvents may be used, and at least one organic solvent selected from the group consisting of a hydrocarbon solvent, a ketone solvent, an ester solvent, an alcohol solvent, an amide solvent, and an ether solvent is preferably used.

Examples of the hydrocarbon solvent include: an aliphatic hydrocarbon solvent such as pentane, hexane, octane, nonane, decane, dodecane, undecane, hexadecane, 2,2,4-trimethylpentane, 2,2,3-trimethylhexane, perfluorohexane, or perfluoroheptane; and an aromatic hydrocarbon solvent such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, or dipropylbenzene.

In addition, as the hydrocarbon solvent, an unsaturated hydrocarbon solvent can be used, and examples thereof include octene, nonene, decene, undecene, dodecene, and hexadecene. The number of double bonds or triple bonds in the unsaturated hydrocarbon solvent is not particularly limited, and a hydrocarbon chain may be present at an arbitrary position. In addition, in a case where the unsaturated hydrocarbon solvent has a double bond, a cis-form and a trans-form may be present together.

The aliphatic hydrocarbon solvent, which is the hydrocarbon solvent, may be a mixture of compounds having the same carbon atoms and different structures. For example, in a case where decane is used as the aliphatic hydrocarbon solvent, the aliphatic hydrocarbon solvent may include compounds having the same carbon atoms and different structures such as 2-methylnonane, 2,2-dimethyloctane, 4-ethyloctane, and isooctane.

In addition, as the compounds having the same carbon atoms and different structures, one kind may be included, and a plurality of kinds may be included.

Examples of the ketone solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone. Among these, 2-heptanone is preferable.

Examples of the ester solvent include methyl acetate, ethyl acetate, butyl acetate, isobutyl acetate, pentyl acetate, propyl acetate, isopropyl acetate, amyl acetate (pentyl acetate), isoamyl acetate (isopentyl acetate), 3-methylbutyl acetate, 2-methylbutyl acetate, 1-methylbutyl acetate, hexyl acetate, isohexyl acetate, heptyl acetate, octyl acetate, ethyl methoxyacetate, ethyl ethoxyacetate, propylene glycol monomethyl ether acetate (PGMEA; synonym: 1-methoxy-2-acetoxy propane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, butyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate, amyl acetate, isoamyl acetate, 2-methylbutyl acetate, 1-methylbutyl acetate, hexyl acetate, pentyl propionate, hexyl propionate, heptyl propionate, or butyl butanoate is preferably used, and isoamyl acetate is more preferably used.

Examples of the alcohol solvent include: an alcohol (monohydric alcohol) such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 4-methyl-2-pentanol, 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, 3-methoxy-1-butanol; a glycol solvent such as ethylene glycol, diethylene glycol, or triethylene glycol; and glycol ether solvent having a hydroxyl group such as ethylene glycol monomethyl ether, propylene glycol monomethyl ether (PGME; synonym: 1-methoxy-2-propanol), diethylene glycol monomethyl ether, triethylene glycol monoethyl ether, methoxy methyl butanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, or propylene glycol monophenyl ether. Among these, a monohydric alcohol or a glycol ether solvent is preferably used. Further, it is preferable that the monohydric alcohol is a linear, branched, or cyclic monohydric alcohol having 6 to 8 carbon atoms.

Examples of the amide solvent include N-methyl-2-pyrrolidone, N,N-dimethylacetamide, N,N-dimethylformamide, hexamethylphosphoric amide, and 1,3-dimethyl-2-imidazolidinone.

Examples of the ether solvent include: the above-described glycol ether solvent having a hydroxyl group; an glycol ether solvent having no hydroxyl group such as propylene glycol dimethyl ether, propylene glycol diethyl ether, diethylene glycol dimethyl ether, or diethylene glycol diethyl ether; an aromatic ether solvent such as anisole or phenetole; and dioxane, tetrahydrofuran, tetrahydropyran, perfluoro-2-butyl tetrahydrofuran, perfluoro tetrahydrofuran, 1,4-dioxane, and isopropyl ether. Preferably, a glycol ether solvent, or an aromatic ether solvent such as anisole is used.

In a case where an extreme ultraviolet (EUV) ray or an electron beam (EB) is used in an exposure step described below, as the organic solvent included in the rinsing liquid, among the above-described organic solvents, a hydrocarbon solvent is preferably used, and an aliphatic hydrocarbon solvent is more preferably used. As the aliphatic hydrocarbon solvent used in the rinsing liquid, from the viewpoint of further improving the effects, an aliphatic hydrocarbon solvent having 5 or more carbon atoms (for example, pentane, hexane, octane, decane, undecane, dodecane, or hexadecane) is preferable, an aliphatic hydrocarbon solvent having 8 or more carbon atoms is more preferable, and an aliphatic hydrocarbon solvent having 10 or more carbon atoms is still more preferable.

The upper limit value of the number of carbon atoms in the aliphatic hydrocarbon solvent is not particularly limited and, for example, is 16 or less, preferably 14 or less, and more preferably 12 or less.

Among the aliphatic hydrocarbon solvents, decane, undecane, or dodecane is still more preferable, and undecane is most preferable.

In addition, as the hydrocarbon solvent included in the rinsing liquid, an unsaturated hydrocarbon solvent can be used, and examples thereof include octene, nonene, decene, undecene, dodecene, and hexadecene. The number of double bonds or triple bonds in the unsaturated hydrocarbon solvent is not particularly limited, and a hydrocarbon chain may be present at an arbitrary position. In addition, in a case where the unsaturated hydrocarbon solvent has a double bond, a cis-form and a trans-form may be present together.

By using the hydrocarbon solvent (in particular, the aliphatic hydrocarbon solvent) as the organic solvent included in the rinsing liquid, a small amount of the developer permeating into the developed resist film is rinsed. Therefore, swelling is further suppressed, and an effect of suppressing pattern collapse is further exhibited.

In addition, as the organic solvent included in the rinsing liquid, a mixed solvent of the ester solvent and the hydrocarbon solvent or a mixed solvent of the ketone solvent and the hydrocarbon solvent may be used. It is preferable that the mixed solvent includes a hydrocarbon solvent as a major component.

Further, as the organic solvent included in the rinsing liquid, at least one selected from the group consisting of the ester solvent and the ketone solvent may be used from the viewpoint that the ester solvent and the ketone solvent are particularly effective for reducing a residue after development.

In a case where the rinsing liquid includes at least one selected from the group consisting of the ester solvent and the ketone solvent, it is preferable that the rinsing liquid includes at least one solvent selected from the group consisting of butyl acetate, isopentyl acetate (isoamyl acetate), n-pentyl acetate, ethyl 3-ethoxypropionate (EEP), and 2-heptanone as a major component, and it is more preferable that the rinsing liquid includes at least one solvent selected from the group consisting of butyl acetate and 2-heptanone as a major component.

In addition, in a case where the rinsing liquid includes at least one selected from the group consisting of the ester solvent and the ketone solvent, it is preferable that the rinsing liquid includes a solvent selected from the group consisting of an ester solvent, a glycol ether solvent, a ketone solvent, and an alcohol solvent as an accessory component, and it is more preferable that the rinsing liquid includes a solvent selected from the group consisting of propylene glycol monomethyl ether acetate (PGMEA), propylene glycol monomethyl ether (PGME), ethyl acetate, ethyl lactate, 3-methyl methoxypropionate, cyclohexanone, methyl ethyl ketone, γ-butyrolactone, propanol, 3-methoxy-1-butanol, N-methylpyrrolidone, and propylene carbonate an accessory component.

In particular, in a case where an ester solvent is used as the organic solvent, it is preferable that two or more ester solvents are used from the viewpoint of further exhibiting the effects. Specific examples of the above-described case include a case where an ester solvent (preferably butyl acetate) is used as major component and another ester solvent having a different chemical structure (preferably propylene glycol monomethyl ether acetate (PGMEA)) is used as an accessory component.

In a case where an ester solvent is used as the organic solvent, not only an ester solvent (one kind or two or more kinds) but also a glycol ether solvent may be used from the viewpoint of further exhibiting the effects. Specific examples of the above-described case include a case where an ester solvent (preferably butyl acetate) is used as major component and a glycol ether solvent (preferably propylene glycol monomethyl ether (PGME)) is used as an accessory component.

In a case where a ketone solvent is used as the organic solvent, not only a ketone solvent (one kind or two or more kinds) but also an ester solvent and/or a glycol ether solvent may be used from the viewpoint of further exhibiting the effects. Specific examples of the above-described case include a case where a ketone solvent (preferably 2-heptanone) is used as major component and an ester solvent (preferably, propylene glycol monomethyl ether acetate (PGMEA)) and/or a glycol ether solvent (preferably propylene glycol monomethyl ether (PGME)) is used as an accessory component.

Here, "major component" described above represents that the content of the major component is 50 to 100 mass %, preferably 70 to 100 mass %, more preferably 80 to 100 mass %, still more preferably 90 to 100 mass %, and even still more preferably 95 to 100 mass % with respect to the total mass of the organic solvent.

In addition, "accessory component" described above represents that the content of the accessory component is preferably 0.1 to 20 mass %, more preferably 0.5 to 10 mass %, and still more preferably 1 to 5 mass % with respect to the total mass (100 mass %) of the major component.

A mixture of a plurality of kinds among the organic solvents may be used, or a mixture of one of the organic solvent and a solvent other than the organic solvents and water may be used. The solvent may be mixed with water. In this case, the moisture content in the rinsing liquid is typically 60 mass % or lower, preferably 30 mass % or lower, more preferably 10 mass % or lower, and most preferably 5 mass % or lower. By adjusting the moisture content to be 60 mass % or lower, excellent rinsing properties can be obtained.

In addition, after the development or the rising, a treatment of removing the developer or the rinsing liquid, which is attached to the pattern, with supercritical fluid may be performed.

Further, after the development, the rinsing, or the treatment using the supercritical fluid, heating may be performed to remove the solvent remaining in the pattern. The heating temperature is not particularly limited as long as an excellent resist pattern can be obtained, and is typically 40° C. to 160° C. The heating temperature is preferably 50° C. to 150° C. and most preferably 50° C. to 110° C. The heating time is not particularly limited as long as an excellent resist pattern can be obtained, and is typically 15 to 300 seconds and preferably 15 to 180 seconds.

<Actinic Ray-Sensitive or Radiation-Sensitive Resin Composition>

Next, the actinic ray-sensitive or radiation-sensitive resin composition (hereinafter, also referred to as "resist composition") used in the pattern forming method according to the present invention will be described in detail. This composition may be used for positive type development, or may be used for negative type development. In addition, this composition may be used for development using an alkali developer, or may be used for development using a developer including an organic solvent.

The actinic ray-sensitive or radiation-sensitive resin composition includes, for example, a resin (A), a compound (B) which generates an acid by actinic ray or radiation, and a solvent (C). Further, the actinic ray-sensitive or radiation-sensitive resin composition may include a basic compound (D), a hydrophobic resin (A') other than the resin (A), and an additive and the like.

[1] Resin (A)

It is preferable that the resin (A) is included as the actinic ray-sensitive or radiation-sensitive resin composition which is preferably used in combination with the treatment liquid according to the present invention. The resin (A) includes at least (i) a repeating unit having a group which is decomposed by the action of an acid to produce a carboxyl group (may further include a repeating unit having a phenolic hydroxyl group), or includes may at least (ii) a repeating unit having a phenolic hydroxyl group.

In a case where the resin (A) includes the repeating unit having a group which is decomposed by the action of an acid to produce a carboxyl group, the solubility in an alkali developer increases and the solubility in the organic solvent increases due to the action of an acid.

[1-1] Repeating Unit which is Decomposed by Action of Acid to Produce Carboxyl Group The repeating unit having a group which is decomposed by the action of an acid to produce a carboxyl group included in the resin (A) is a repeating unit having a group which is substituted with a group obtained by a hydrogen atom being removed from a carboxyl group due to decomposition caused by the action of an acid.

Examples of the group which is removed by an acid include —$C(R_{36})(R_{37})(R_{38})$, —$C(R_{36})(R_{37})(OR_{39})$, and —$C(R_{01})(R_{02})(OR_{39})$.

In the formulae, $R_{36}$ to $R_{39}$ each independently represent an alkyl group, a cycloalkyl group, an aryl group, an aralkyl group, or an alkenyl group. $R_{36}$ and $R_{37}$ may be bonded to each other to form a ring.

$R_{01}$ to $R_{02}$ each independently represent a hydrogen atom, an alkyl group, a cycloalkyl group, an aryl group, an aralkyl group, or an alkenyl group.

As the repeating unit having a group which is decomposed by the action of an acid to produce a carboxyl group included in the resin (A), a repeating unit represented by the following Formula (AI) is preferable.

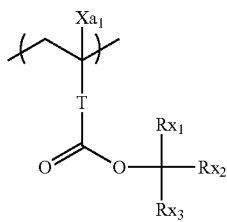

(AI)

In Formula (AI), $X_{a1}$ represents a hydrogen atom or an alkyl group which may have a substituent.

T represents a single bond or a divalent linking group.

$Rx_1$ to $Rx_3$ each independently represent an alkyl group (linear or branched) or a cycloalkyl group (monocyclic or polycyclic). In a case where all of $Rx_1$ to $Rx_3$ represent an alkyl group (linear or branched), it is preferable that at least two of $Rx_1$, $Rx_2$, or $Rx_3$ represent a methyl group.

Two of $Rx_1$ to $Rx_3$ may be bonded to each other to form a cycloalkyl group (monocyclic or polycyclic).

Examples of the alkyl group which may have a substituent represented by $X_{a1}$ include a methyl group or a group represented by —$CH_2$—$R_{11}$. $R_{11}$ represents a halogen atom (for example, a fluorine atom), a hydroxyl group, or a monovalent organic group, and examples thereof include an alkyl group having 5 or less carbon atoms and an acyl group having 5 or less carbon atoms. In particular, an alkyl group having 3 or less carbon atoms is preferable, and a methyl group is more preferable. In one aspect, $X_{a1}$ represents preferably a hydrogen atom, a methyl group, a trifluoromethyl group, or a hydroxymethyl group.

Examples of the divalent linking group represented by T include an alkylene group, a —COO-Rt- group, and a —O-Rt- group. In the formula, Rt represents an alkylene group or a cycloalkylene group.

T represents preferably a single bond or a —COO-Rt- group. Rt represents preferably an alkylene group having 1 to 5 carbon atoms and more preferably a —$CH_2$— group, a —$(CH_2)_2$— group, or a —$(CH_2)_3$— group.

As the alkyl group represented by $Rx_1$ to $Rx_3$, an alkyl group having 1 to 4 carbon atoms such as a methyl group, an ethyl group, a n-propyl group, an isopropyl group, a n-butyl group, an isobutyl group, or a t-butyl group is preferable.

As the cycloalkyl group represented by $Rx_1$ to $Rx_3$, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable.

As the cycloalkyl group which is formed by two of $Rx_1$ to $Rx_3$ being bonded to each other, a monocycloalkyl group such as a cyclopentyl group or a cyclohexyl group, or a polycycloalkyl group such as a norbornyl group, a tetracyclodecanyl group, a tetracyclododecanyl group, or an adamantyl group is preferable. In particular, a monocycloalkyl group having 5 or 6 carbon atoms is preferable.

In the cycloalkyl group which is formed by two of $Rx_1$ to $Rx_3$ being bonded to each other, for example, one methylene group constituting the ring may be substituted with a heteroatom such as an oxygen atom or a group having a heteroatom such as a carbonyl group.

In the repeating unit represented by Formula (AI), for example, it is preferable that $Rx_1$ represents a methyl group or an ethyl group and that $Rx_2$ and $Rx_3$ are bonded to each other to form the cycloalkyl group.

Each of the groups may have a substituent, and examples of the substituent include an alkyl group (having 1 to 4 carbon atoms), a halogen atom, a hydroxyl group, an alkoxy group (having 1 to 4 carbon atoms), a carboxyl group, and an alkoxycarbonyl group (having 2 to 6 carbon atoms), in which the number of carbon atoms is preferably 8 or less.

As the repeating unit represented by Formula (AI), an acid-decomposable tertiary alkyl (meth)acrylate repeating unit (a repeating unit in which $X_{a1}$ represents a hydrogen atom or a methyl group, and T represents a single bond) is preferable. A repeating unit in which $Rx_1$ to $Rx_3$ each independently represent a linear or branched alkyl group is more preferable, and a repeating unit in which $Rx_1$ to $Rx_3$ each independently represent a linear alkyl group is still more preferable.

Hereinafter, specific examples of the repeating unit having a group which is decomposed by the action of an acid to produce a carboxyl group included in the resin (A) will be shown, but the present invention is not limited thereto.

In the specific examples, Rx and $X_{a1}$ represent a hydrogen atom, $CH_3$, $CF_3$, or $CH_2OH$. Rxa and Rxb each independently represent an alkyl group having 1 to 4 carbon atoms. Z represents a substituent having a polar group. In a case where a plurality of Z's are present, Z's each independently represent a substituent having a polar group. p represents 0 or a positive integer. Examples of the substituent having a polar group represented by Z include a linear or branched alkyl group having a hydroxyl group, a cyano group, an amino group, an alkylamido group, or a sulfonamide group, or a cycloalkyl group. In particular, an alkyl group having a hydroxyl group is preferable. As the branched alkyl group, an isopropyl group is preferable.

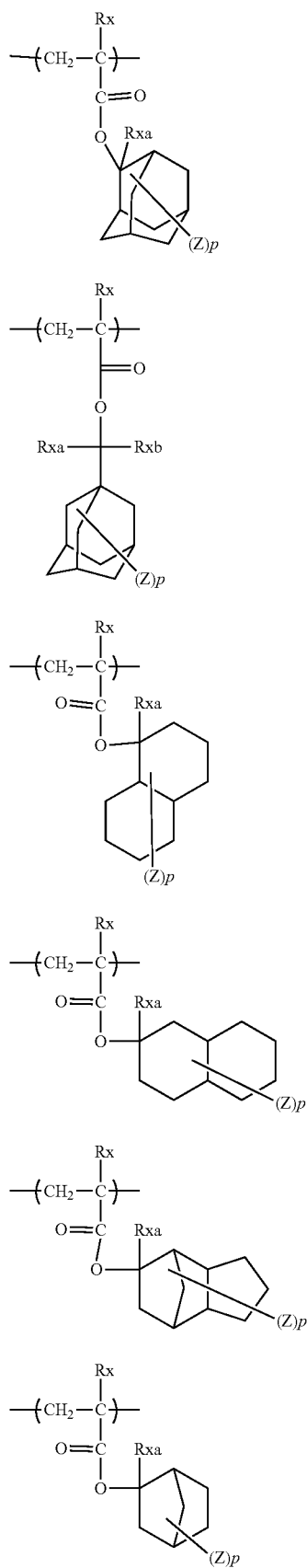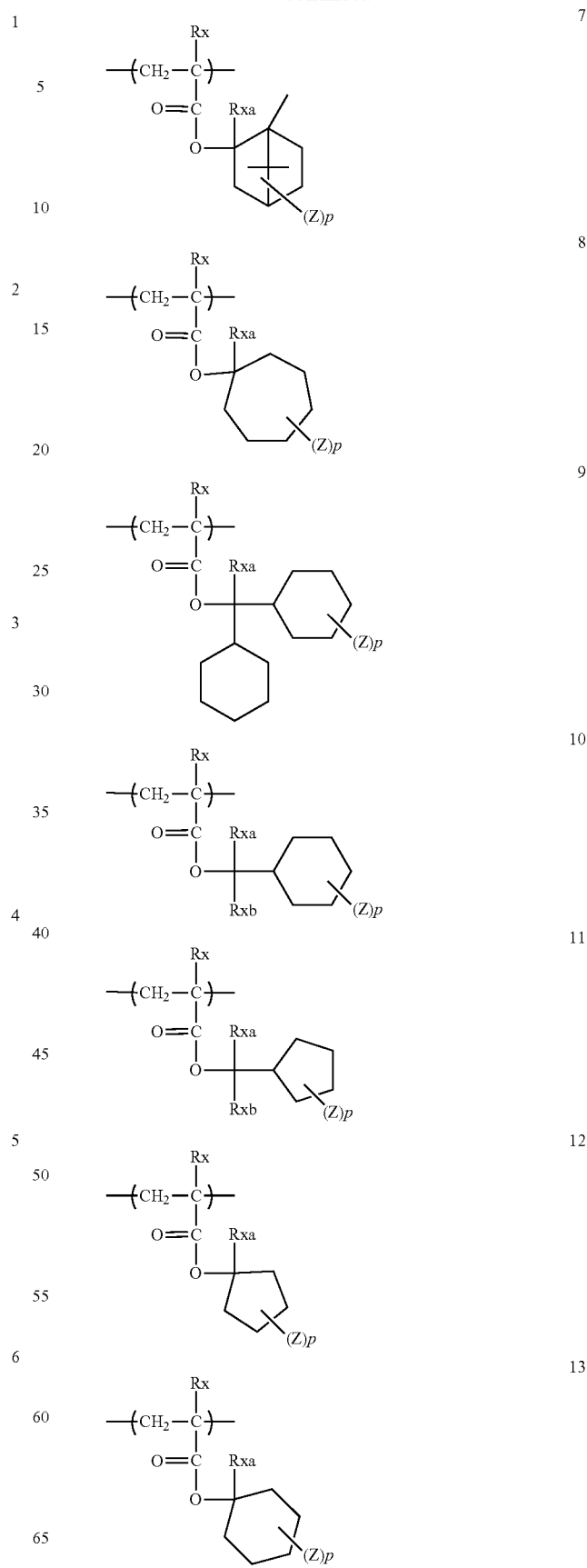

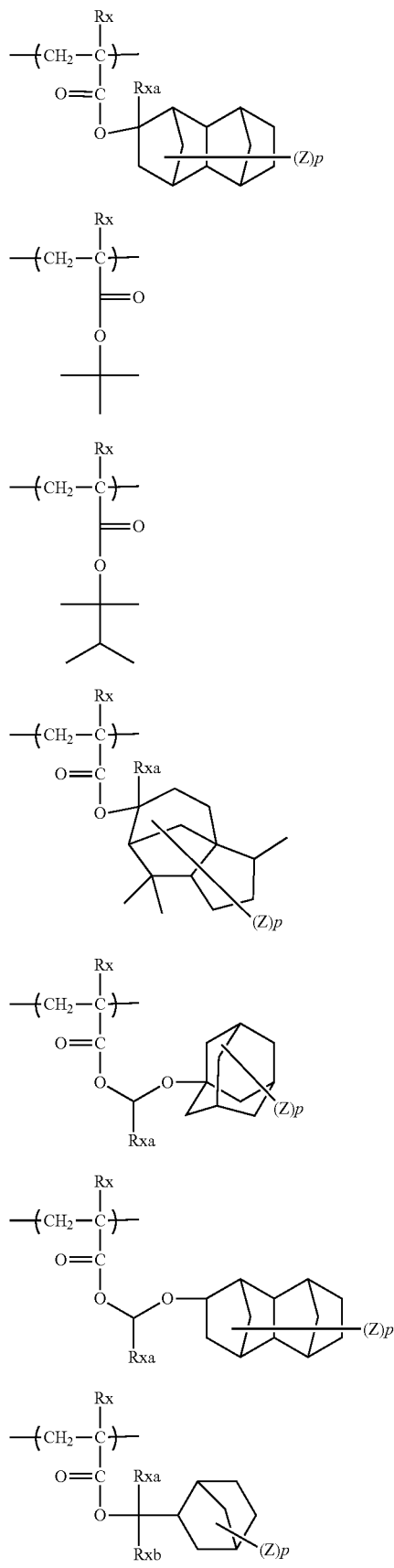
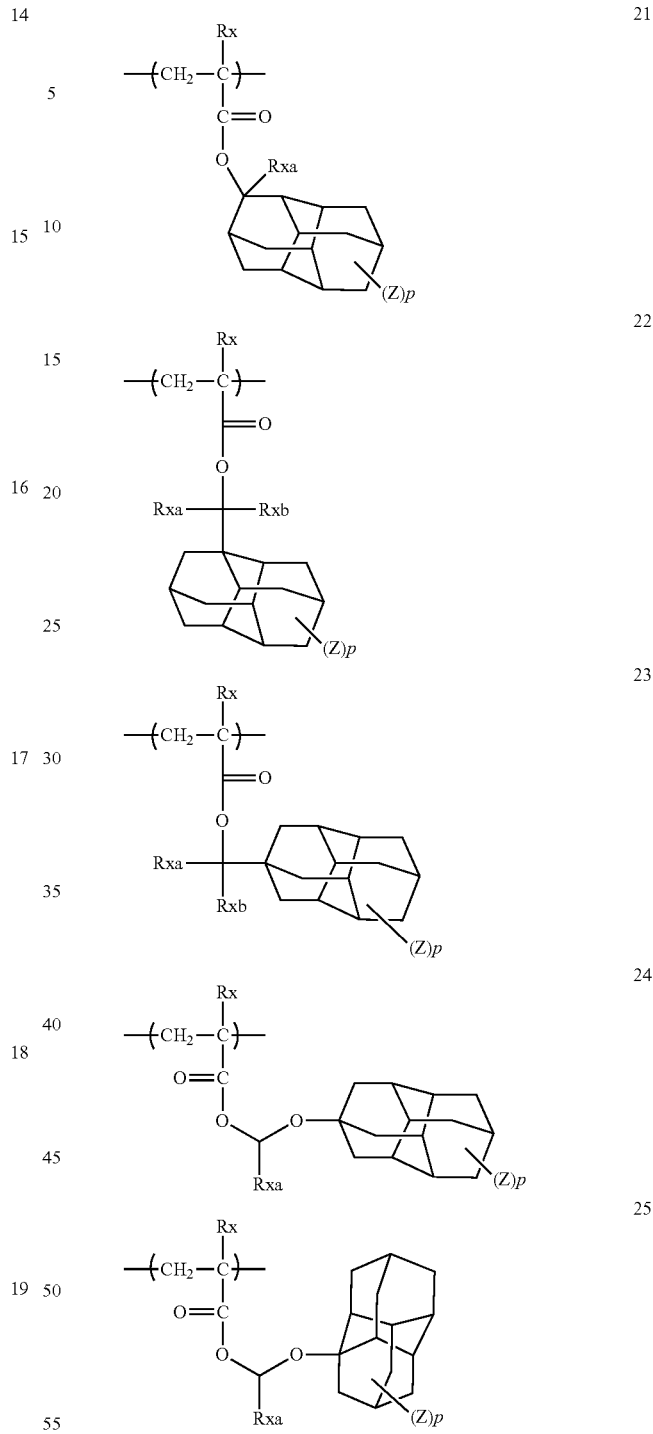

The content of the repeating unit having a group which is decomposed by the action of an acid to produce a carboxyl group is preferably 15 to 90 mol %, more preferably 20 to 90 mol %, still more preferably 25 to 80 mol %, and even still more preferably 30 to 70 mol % with respect to all the repeating units of the resin (A).

[1-2] Repeating Unit having Phenolic Hydroxyl Group

Examples of the repeating unit having a phenolic hydroxyl group included in the resin (A) include a repeating unit represented by the following Formula (I).

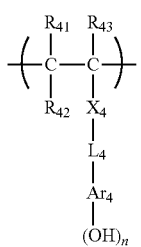

(I)

In the formula, $R_{41}$, $R_{42}$, and $R_{43}$ each independently represent a hydrogen atom, an alkyl group, a halogen atom, a cyano group, or an alkoxycarbonyl group. $R_{42}$ may be bonded to $Ar_4$ to form a ring. In this case, $R_{42}$ represents a single bond or an alkylene group.

$X_4$ represents a single bond, —COO—, or —CONR$_{64}$—, and $R_{64}$ represents a hydrogen atom or an alkyl group.

$L_4$ represents a single bond or an alkylene group.

$Ar_4$ represents a (n+1)-valent aromatic ring group, and in a case where $Ar_4$ is bonded to $R_{42}$ to form a ring, $Ar_4$ represents a (n+2)-valent aromatic ring group. n represents an integer of 1 to 5.

As the alkyl group represented by $R_{41}$, $R_{42}$, and $R_{43}$ in Formula (I), an alkyl group having 20 or less carbon atoms which may have a substituent such as a methyl group, an ethyl group, a propyl group, an isopropyl group, a n-butyl group, a sec-butyl group, a hexyl group, a 2-ethylhexyl group, an octyl group, or a dodecyl group is preferable, an alkyl group having 8 or less carbon atoms is more preferable, and an alkyl group having 3 or less carbon atoms is still more preferable.

In Formula (I), the cycloalkyl group represented by $R_{41}$, $R_{42}$, and $R_{43}$ may be monocyclic or polycyclic. In particular, a monocycloalkyl group having 3 to 8 carbon atoms which may have a substituent such as a cyclopropyl group, a cyclopentyl group, or a cyclohexyl group is preferable.

Examples of the halogen atom represented by $R_{41}$, $R_{42}$, and $R_{43}$ in Formula (I) include a fluorine atom, a chlorine atom, a bromine atom, and an iodine atom. In particular, a fluorine atom is preferable.

As the alkyl group included in the alkoxycarbonyl group represented by $R_{41}$, $R_{42}$, and $R_{43}$ in Formula (I), the same alkyl groups as described above regarding $R_{41}$, $R_{42}$, and $R_{43}$ are preferable.

Preferable examples of a substituent of each of the groups include an alkyl group, a cycloalkyl group, an aryl group, an amino group, an amido group, an ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The number of carbon atoms in the substituent is preferably 8 or less.

$Ar_4$ represents an (n+1)-valent aromatic ring group. In a case where n represents 1, a divalent aromatic ring group may have a substituent, and preferable examples thereof include an arylene group having 6 to 18 carbon atoms such as a phenylene group, a tolylene group, a naphthylene group, or an anthracenylene group; and an aromatic ring group having a heterocycle such as thiophene, furan, pyrrole, benzothiophene, benzofuran, benzopyrrole, triazine, imidazole, benzoimidazole, triazole, thiadiazole, or thiazole.

In a case where n represents an integer of 2 or more, preferable specific examples of the (n+1)-valent aromatic ring group include groups obtained by removing arbitrary (n−1) hydrogen atoms from the specific examples of the above-described divalent aromatic ring groups.

The (n+1)-valent aromatic ring group may further have a substituent.

Examples of a substituent which may be included in the alkyl group, the cycloalkyl group, the alkoxycarbonyl group, the alkylene group, and the (n+1)-valent aromatic ring group include: the alkoxy groups represented by $R_{41}$, $R_{42}$, and $R_{43}$ in Formula (I), such as an alkyl group, a methoxy group, an ethoxy group, a hydroxyethoxy group, a propoxy group, a hydroxypropoxy group, or a butoxy group; and an aryl group such as a phenyl group.

As an alkyl group represented by $R_{64}$ in —CONR$_{64}$— ($R_{a4}$ represents a hydrogen atom or an alkyl group) represented by $X_4$, an alkyl group having 20 or less carbon atoms which may have a substituent such as a methyl group, an ethyl group, a propyl group, an isopropyl group, a n-butyl group, a sec-butyl group, a hexyl group, a 2-ethylhexyl group, an octyl group, or a dodecyl group is preferable, and an alkyl group having 8 or less carbon atoms is more preferable.

As $X_4$, a single bond, —COO—, or —CONH— is preferable, and a single bond or —COO— is more preferable.

Preferable examples of the alkylene group represented by La include an alkylene group having 1 to 8 carbon atoms which may have a substituent such as a methylene group, an ethylene group, a propylene group, a butylene group, a hexylene group, or an octylene group.

As $Ar_4$, an aromatic ring group having 6 to 18 carbon atoms which may have a substituent is more preferable, and a benzene ring group, a naphthalene ring group, or a biphenylene ring group is still more preferable.

It is preferable that the repeating unit represented by Formula (I) includes a hydroxystyrene structure. That is, it is preferable that $Ar_4$ represents a benzene ring group.

Preferable examples of the repeating unit having a phenolic hydroxyl group included in the resin (A) include a repeating unit represented by the following Formula (p1).

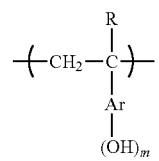

(p1)

In Formula (p1), R represents a hydrogen atom or a linear or branched alkyl group having a halogen atom or 1 to 4 carbon atoms. A plurality of R's may be the same as or different from each other. As R in Formula (p1), a hydrogen atom is preferable.

Ar in Formula (p1) represents an aromatic ring, and examples thereof include: an aromatic hydrocarbon ring having 6 to 18 carbon atoms which may have a substituent such as a benzene ring, a naphthalene ring, an anthracene ring, a fluorene ring, or a phenanthrene ring; and an aromatic heterocycle having a heterocycle such as a thiophene ring, a furan ring, a pyrrole ring, a benzothiophene ring, a benzofuran ring, a benzopyrrole ring, a triazine ring, an imidazole ring, a benzoimidazole ring, a triazole ring, a thiadiazole ring, or a thiazole ring.

Among these, a benzene ring is most preferable.

In Formula (p1), m represents an integer of 1 to 5 and preferably 1.

Hereinafter, specific examples of the repeating unit having a phenolic hydroxyl group included in the resin (A) will be shown, but the present invention is not limited thereto. In the formulae, a represents 1 or 2.
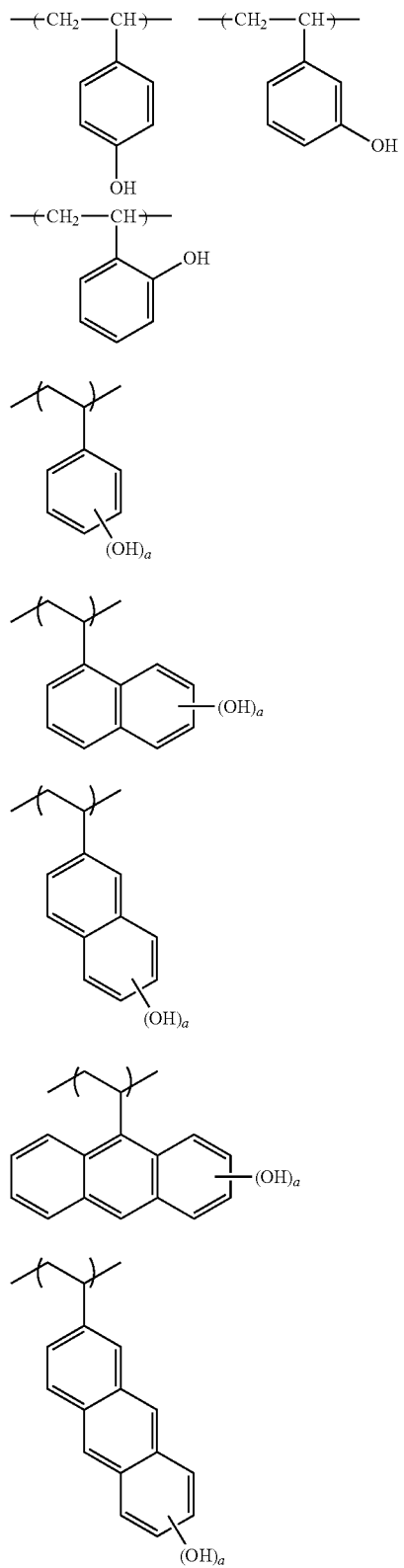
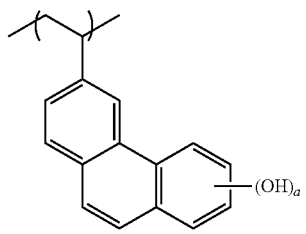
(B-6)
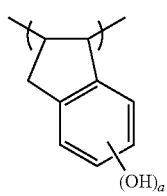
(B-7)
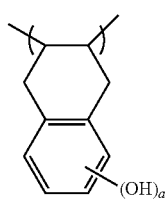
(B-8)
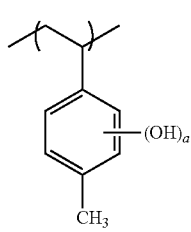
(B-9)
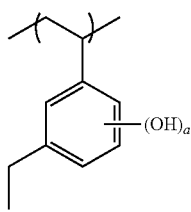
(B-10)
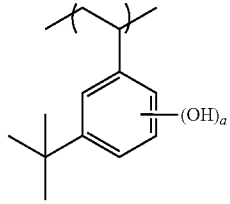
(B-11)
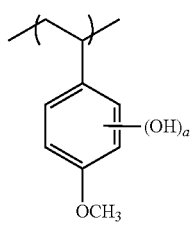
(B-12)

(B-13) 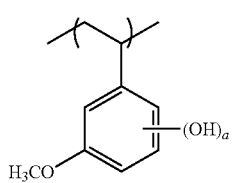
(B-14) 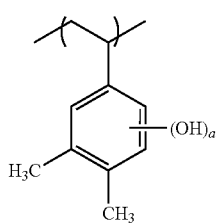
(B-15) 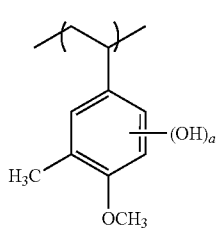
(B-16) 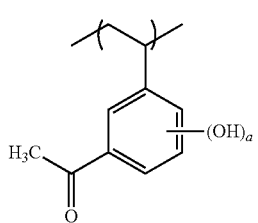
(B-17) 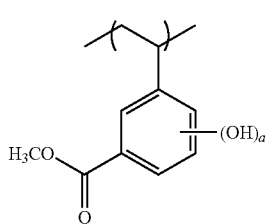
(B-18) 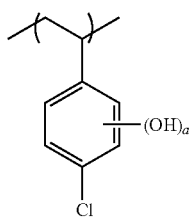
(B-19) 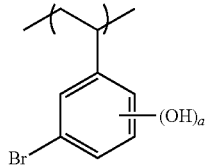
(B-20) 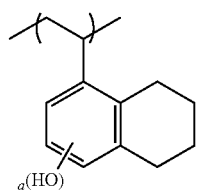
(B-21) 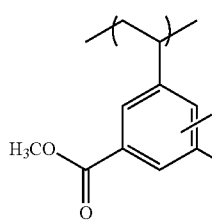
(B-22) 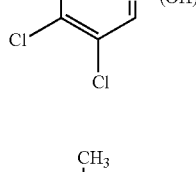
(B-23) 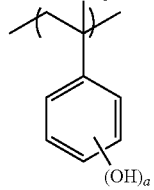
(B-24) 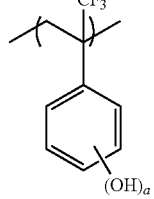
(B-25) 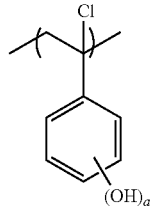
(B-26) 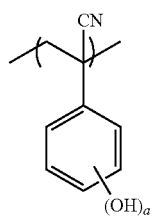

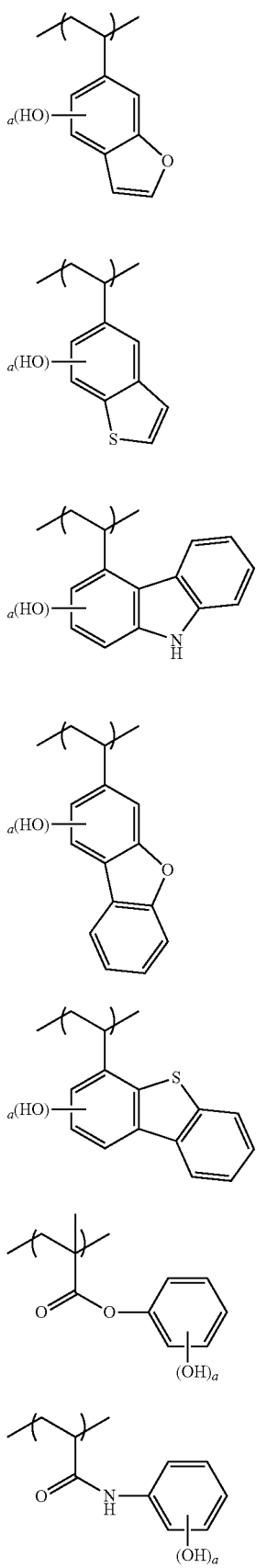
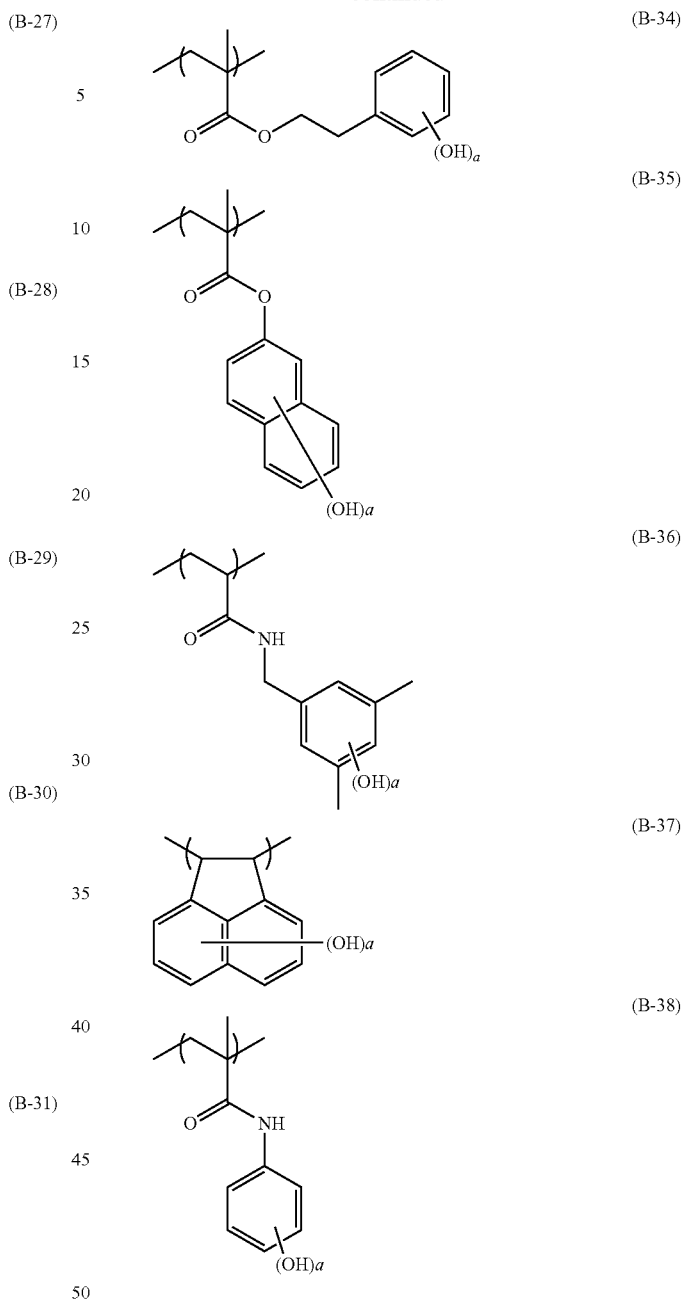

The content of the repeating unit having a phenolic hydroxyl group is preferably 0 to 50 mol %, more preferably 0 to 45 mol %, and still more preferably 0 to 40 mol % with respect to all the repeating units of the resin (A).

[1-3] Repeating Unit having Lactone Group or Sultone Group

It is preferable that the resin (A) includes a repeating unit having a lactone group or a sultone (cyclic sulfonic acid ester) group. As the lactone group or the sultone group, any group having a lactone structure or a sultone structure can be used. In particular, a group having a 5- to 7-membered lactone structure or sultone structure is preferable. In this case, it is preferable that another ring structure may be fused to group having a 5- to 7-membered lactone structure or sultone structure to form a bicyclo structure or a spiro structure.

It is preferable that the resin (A) further includes a repeating unit which has a group having with a lactone structure represented by any one of the following Formulae (LC1-1) to (LC1-17) or a sultone structure represented by any one of the following Formulae (SL1-1) to (SL1-3). In addition, the group having a lactone structure or a sultone structure may be directly bonded to a main chain. As the lactone structure or the sultone structure, a group represented by Formula (LC1-1), (LC1-4), (LC1-5), (LC1-6), (LC1-13), or (LC1-14) is preferable.

LC1-1
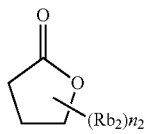

LC1-2
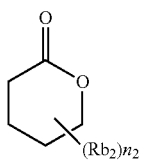

LC1-3
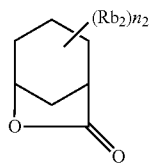

LC1-4
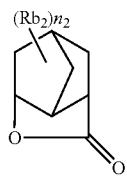

LC1-5
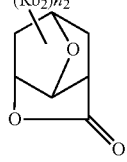

LC1-6
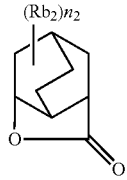

LC1-7
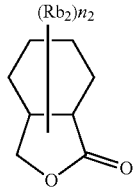

-continued

LC1-8
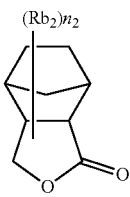

LC1-9
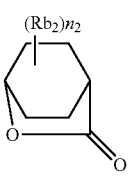

LC1-10
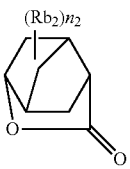

LC1-11
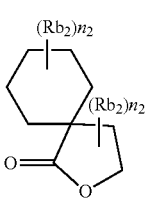

LC1-12
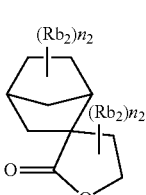

LC1-13
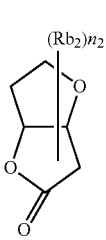

LC1-14
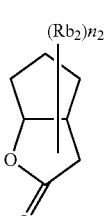

LC1-15
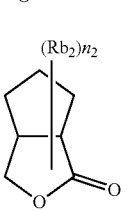

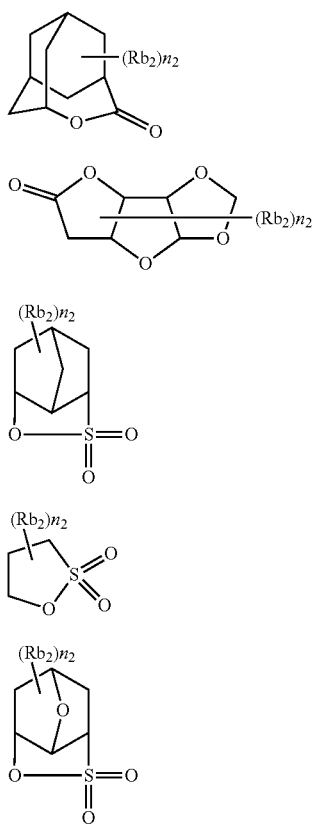

LC1-16

LC1-17

SL1-1

SL1-2

SL1-3

The lactone structure portion or the sultone structure portion may or may not have a substituent ($Rb_2$). Preferable examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, and an acid-decomposable group. n2 represents an integer of 0 to 4. In a case where n2 represents 2 or more, a plurality of $Rb_2$'s may be the same as or different from each other or may be bonded to each other to form a ring.

Examples of the repeating unit which has a group having a lactone structure represented by any one of Formulae (LC1-1) to (LC1-17) or a sultone structure represented by any one of Formulae (SL1-1) to (SL1-3) include a repeating unit represented by the following Formula (AII).

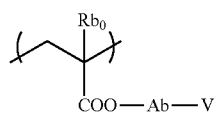

(AII)

In Formula (AII), $Rb_0$ represents a hydrogen atom, a halogen atom, or an alkyl group having 1 to 4 carbon atoms.

Preferable examples of a substituent which may be included in the alkyl group represented by $Rb_0$ include a hydroxyl group and a halogen atom.

Examples of the halogen atom represented by $Rb_0$ include a fluorine atom, a chlorine atom, a bromine atom, and an iodine atom. $Rb_0$ represents preferably a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group including a combination thereof. In particular, a single bond or a linking group represented by $-Ab_1-CO_2-$ is preferable. $Ab_1$ represents a linear or branched alkylene group or a monocyclic or polycyclic cycloalkylene group and preferably a methylene group, an ethylene group, a cyclohexylene group, an adamantylene group, or a norbornylene group.

V represents a group represented by any one of Formulae (LC1-1) to (LC1-17) and (SL1-1) to (SL1-3).

In the repeating unit which has a group having a lactone group or a sultone group, an optical isomer is present, and any optical isomer may be used. In addition, one optical isomer may be used alone, or a mixture of a plurality of optical isomers may be used. In a case where one optical isomer is mainly used, the optical purity (ee) thereof is preferably 90% or higher and more preferably 95% or higher.

Hereinafter, specific examples of the repeating unit having a lactone group or a sultone group will be shown, but the present invention is not limited thereto.

(In the formulae, Rx represents H, $CH_3$, $CH_2OH$, or $CF_3$)

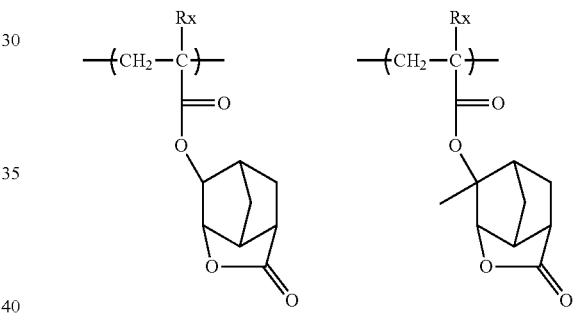

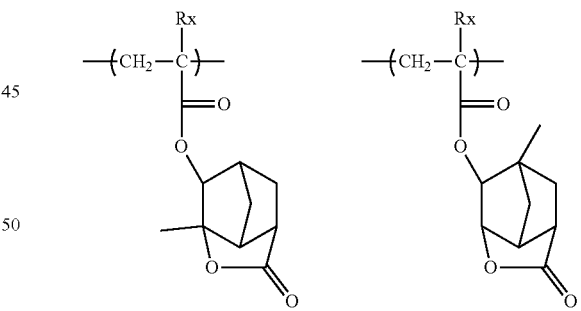

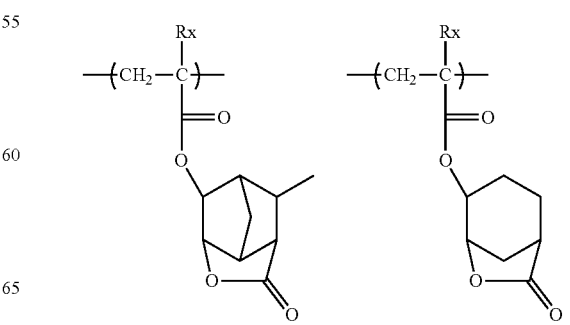

57
-continued
58
-continued
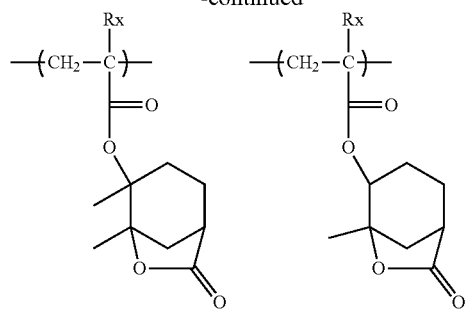
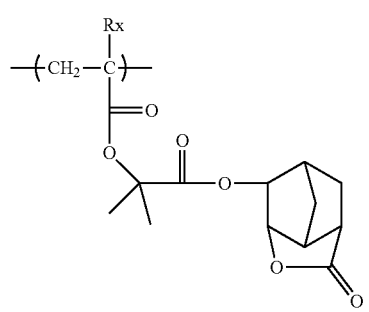
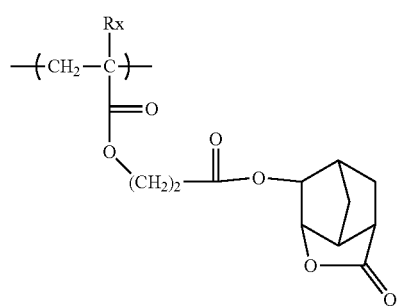
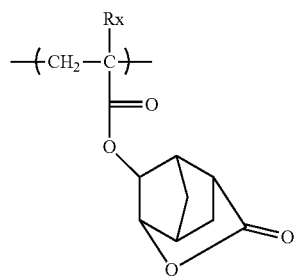
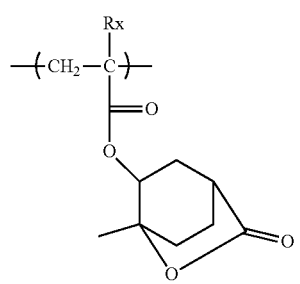
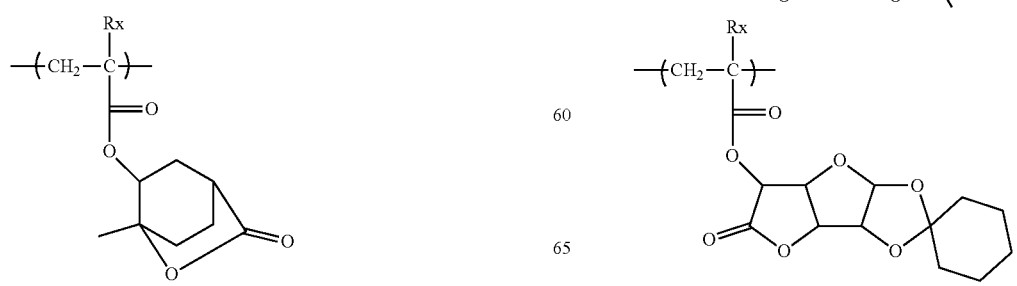

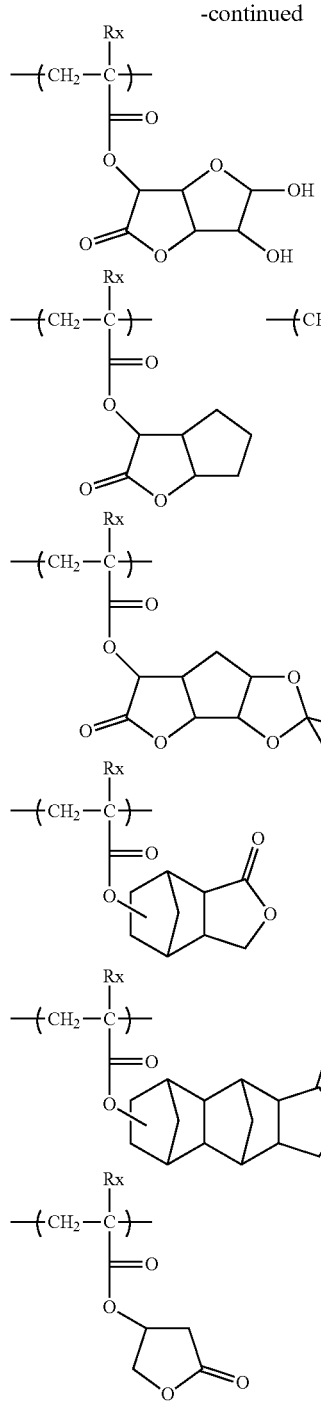

adamantyl group, a diamantyl group, or a norbornane group is preferable. As the polar group, a hydroxyl group or a cyano group is preferable.

Hereinafter, specific examples of the repeating unit having a polar group will be shown, but the present invention is not limited thereto.

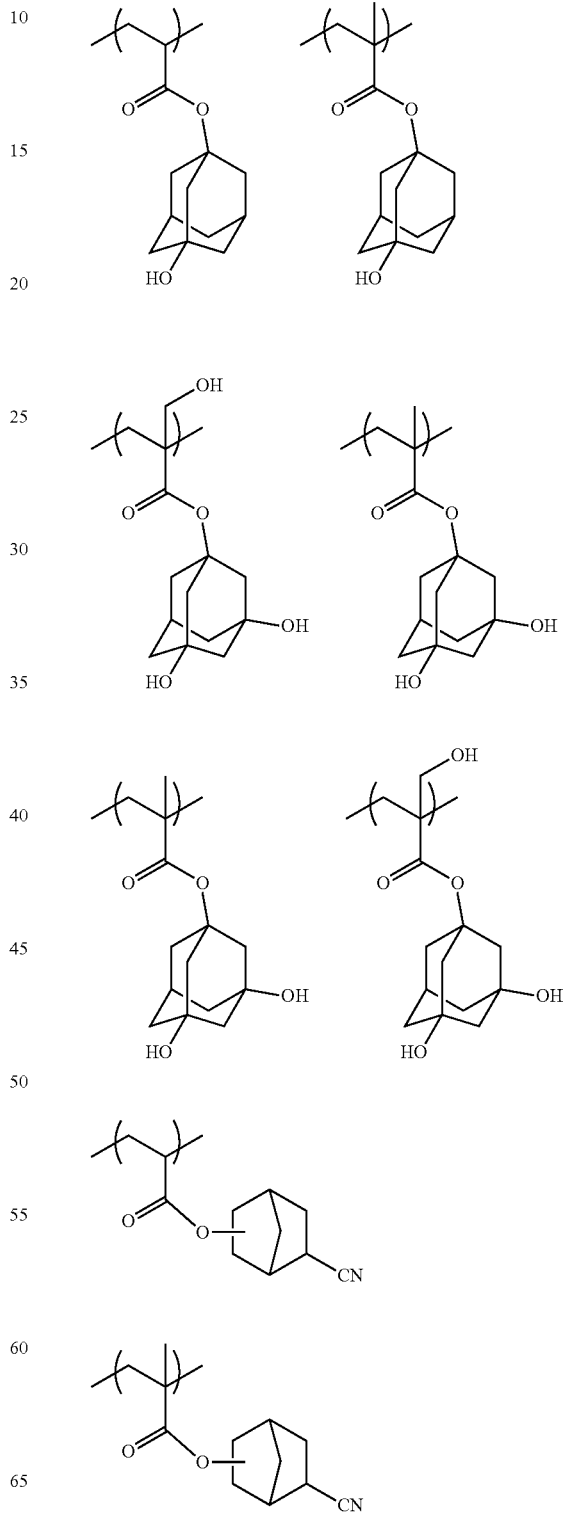

The content of the repeating unit having a lactone group or a sultone group is preferably 1 to 30 mol %, more preferably 5 to 25 mol %, and still more preferably 5 to 20 mol % with respect to all the repeating units of the resin (A).

[1-4] Repeating Unit which has Alicyclic Hydrocarbon Structure substituted with Polar Group.

The resin (A) may further include a repeating unit which has an organic group having a polar group, in particular, a repeating unit which has an alicyclic hydrocarbon structure substituted with a polar group. As a result, substrate adhesiveness or developer affinity are improved.

As the alicyclic hydrocarbon structure of the alicyclic hydrocarbon structure substituted with a polar group, an

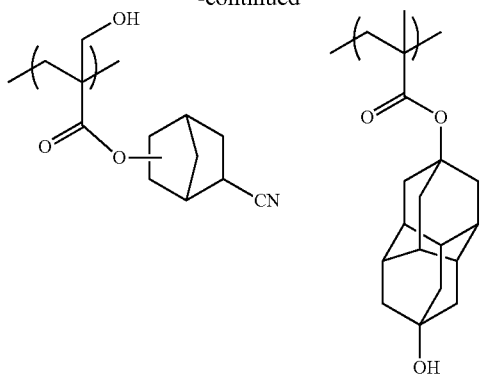
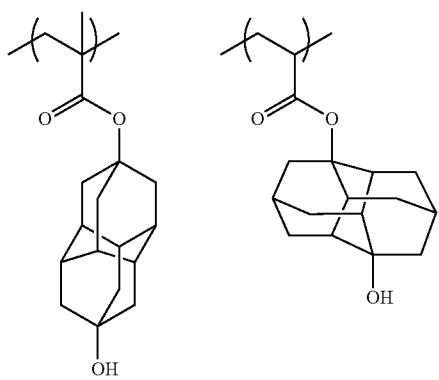

In a case where the resin (A) includes the repeating unit which has an organic group having a polar group, the content thereof is preferably 1 to 50 mol %, more preferably 1 to 30 mol %, still more preferably 5 to 25 mol %, and even still more preferably 5 to 20 mol % with respect to all the repeating units of the resin (A).

[1-5] Repeating Unit having group which generates Acid when irradiated with Actinic Ray or Radiation Further, as a repeating unit other than the above-described repeating units, the resin (A) may include a repeating unit having a group (photoacid generating group) which generates an acid when irradiated with an actinic ray or radiation. In this case, it can be considered that the repeating unit having a photoacid generating group corresponds to a compound (B) described below that generates an acid when irradiated with an actinic ray or radiation.

Examples of the repeating unit include a repeating unit represented by the following Formula (4).

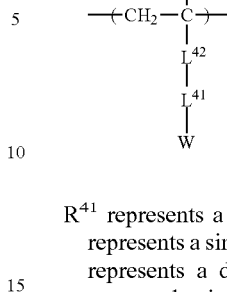

$R^{41}$ represents a hydrogen atom or a methyl group. $L^{41}$ represents a single bond or a divalent linking group. $L^{42}$ represents a divalent linking group. W represents a structural unit which is decomposed to generate an acid at a side chain when irradiated with an actinic ray or radiation.

Hereinafter, specific examples of the repeating unit represented by Formula (4) will be shown, but the present invention is not limited thereto.

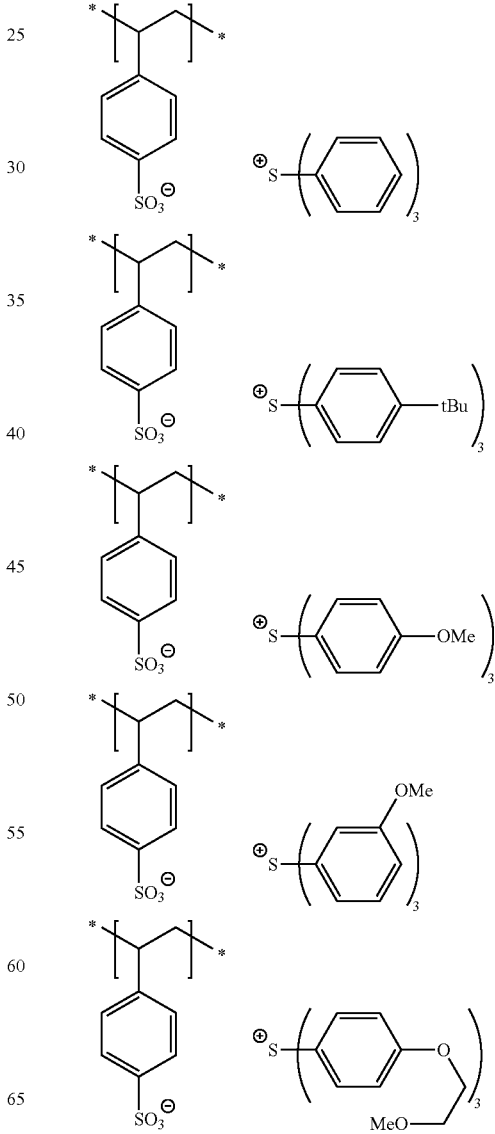

-continued
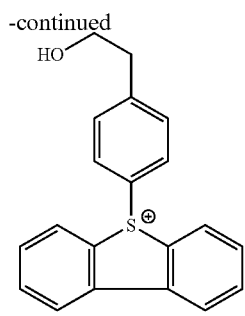
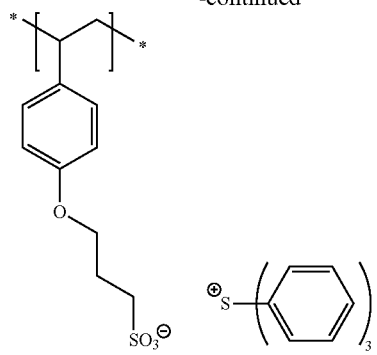
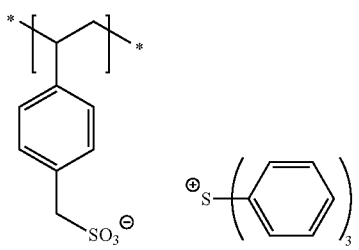
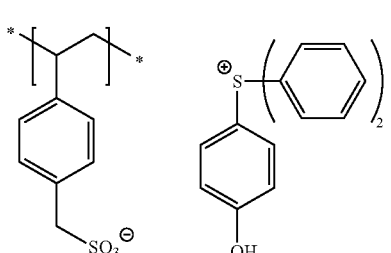
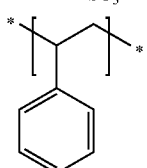
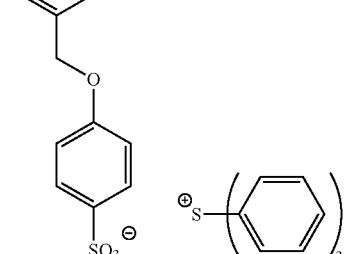
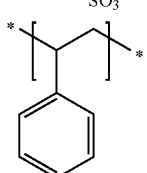
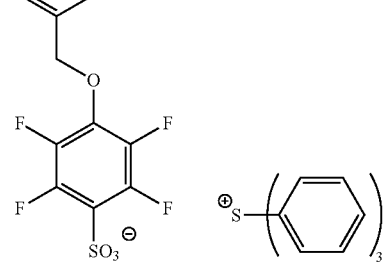
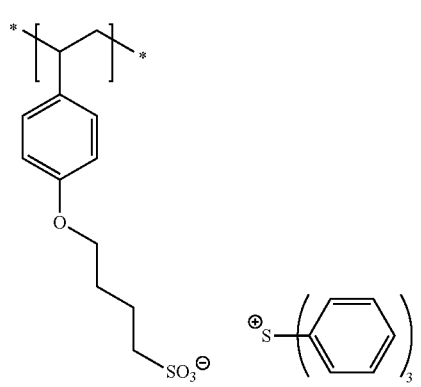
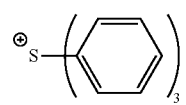

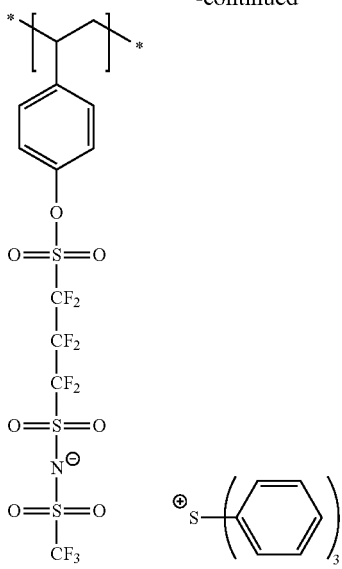

Other examples of the repeating unit represented by Formula (4) include repeating units described in paragraphs "0094" to "0105" of JP2014-041327A.

In a case where the resin (A) includes the repeating unit having a photoacid generating group, the content of the repeating unit having a photoacid generating group is preferably 1 to 40 mol %, more preferably 5 to 35 mol %, and still more preferably 5 to 30 mol % with respect to all the repeating units of the resin (A).

[1-6] Other Repeating Units

In addition, the resin (A) may include a repeating unit represented by the following Formula (VI).

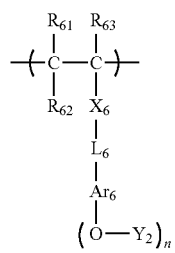

In Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. $R_{62}$ may be bonded to $Ar_6$ to form a ring. In this case, $R_{62}$ represents a single bond or an alkylene group.

$X_6$ represents a single bond, —COO—, or —CONR$_{64}$—.

$R_{a4}$ represents a hydrogen atom or an alkyl group.

$L_6$ represents a single bond or an alkylene group.

$Ar_6$ represents a (n+1)-valent aromatic ring group, and in a case where $Ar_6$ is bonded to $R_{62}$ to form a ring, $Ar_6$ represents a (n+2)-valent aromatic ring group.

In a case where n represents 2 or more, $Y_2$'s each independently represent a hydrogen atom or a group which is removed by the action of an acid. At least one of $Y_2$'s represents a group which is removed by the action of an acid.

n represents an integer of 1 to 4.

As the group which is removed by the action of an acid represented by $Y_2$, a structure represented by Formula (VI-A) is more preferable.

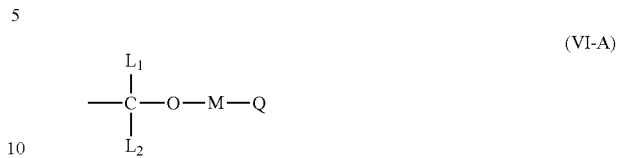

Here, $L_1$ and $L_2$ each independently represent a hydrogen atom, an alkyl group, a cycloalkyl group, an aryl group, or a group including a combination of an alkylene group and an aryl group.

M represents a single bond or a divalent linking group.

Q represents an alkyl group, a cycloalkyl group which may have a heteroatom, an aryl group which may have a heteroatom, an amino group, an ammonium group, a mercapto group, a cyano group, or an aldehyde group.

At least two of Q, M, or Li may be bonded to each other to form a ring (preferably a 5- or 6-membered ring).

It is preferable that the repeating unit represented by the formula (VI) is a repeating unit represented by the following Formula (3).

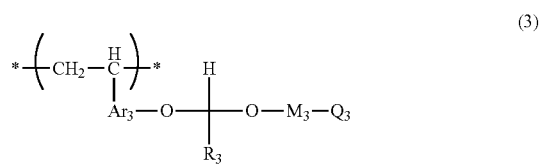

In Formula (3), $Ar_3$ represents an aromatic ring group.

$R_3$ represents a hydrogen atom, an alkyl group, a cycloalkyl group, an aryl group, an aralkyl group, an alkoxy group, an acyl group, or a heterocyclic group.

$M_3$ represents a single bond or a divalent linking group.

$Q_3$ represents an alkyl group, a cycloalkyl group, an aryl group, or a heterocyclic group.

At least two of $Q_3$, $M_3$, or $R_3$ are bonded to each other to form a ring.

The aromatic ring group represented by $Ar_3$ is the same as $Ar_6$ in Formula (VI) in a case where n in Formula (VI) represents 1. In this case, a phenylene group or a naphthylene group is more preferable, and a phenylene group is still more preferable.

Hereinafter, specific examples of the repeating unit represented by Formula (VI) will be shown, but the present invention is not limited thereto.

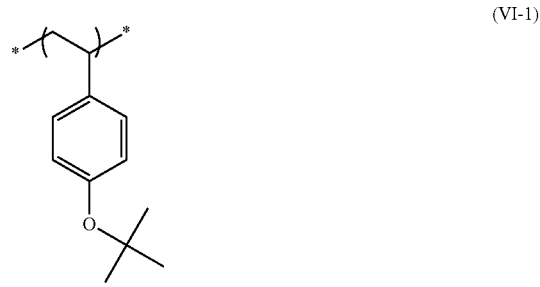

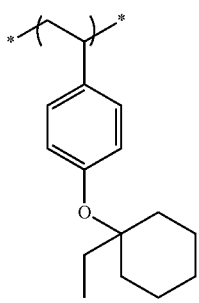
(VI-2)
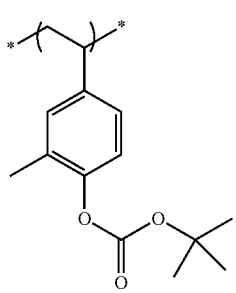
(VI-3)
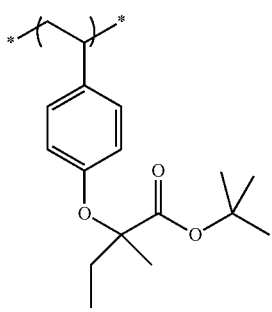
(VI-4)
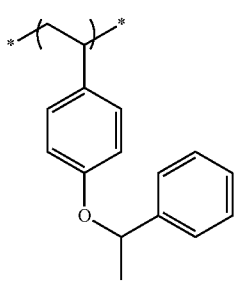
(VI-5)
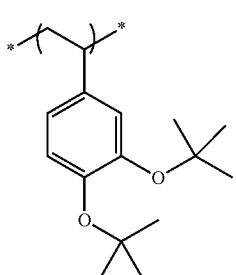
(VI-6)
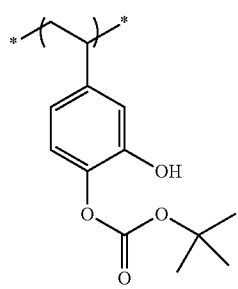
(VI-7)
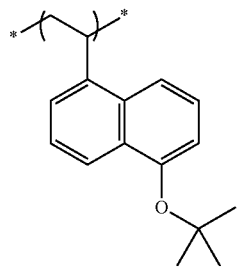
(VI-8)
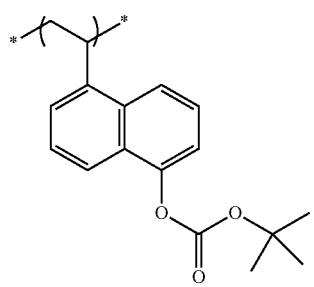
(VI-9)
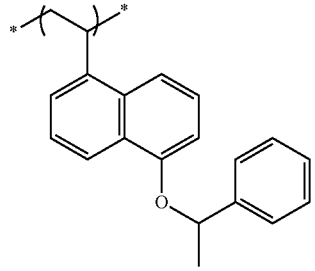
(VI-10)
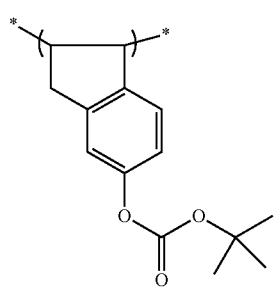
(VI-11)

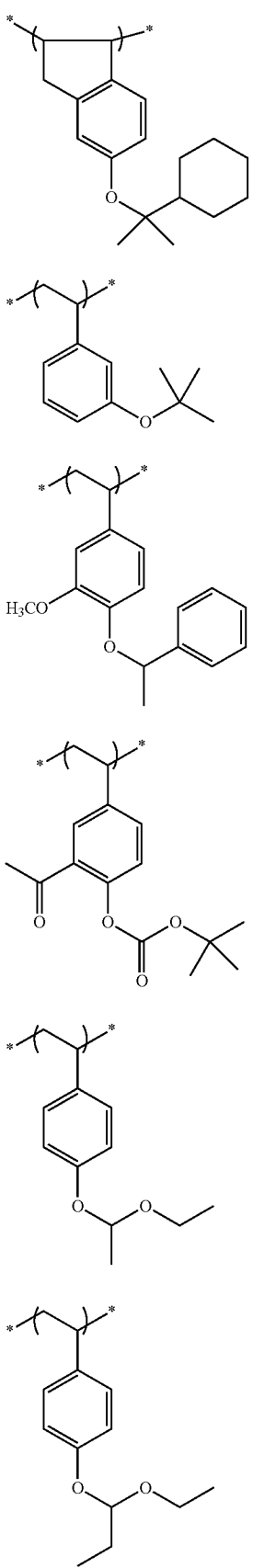
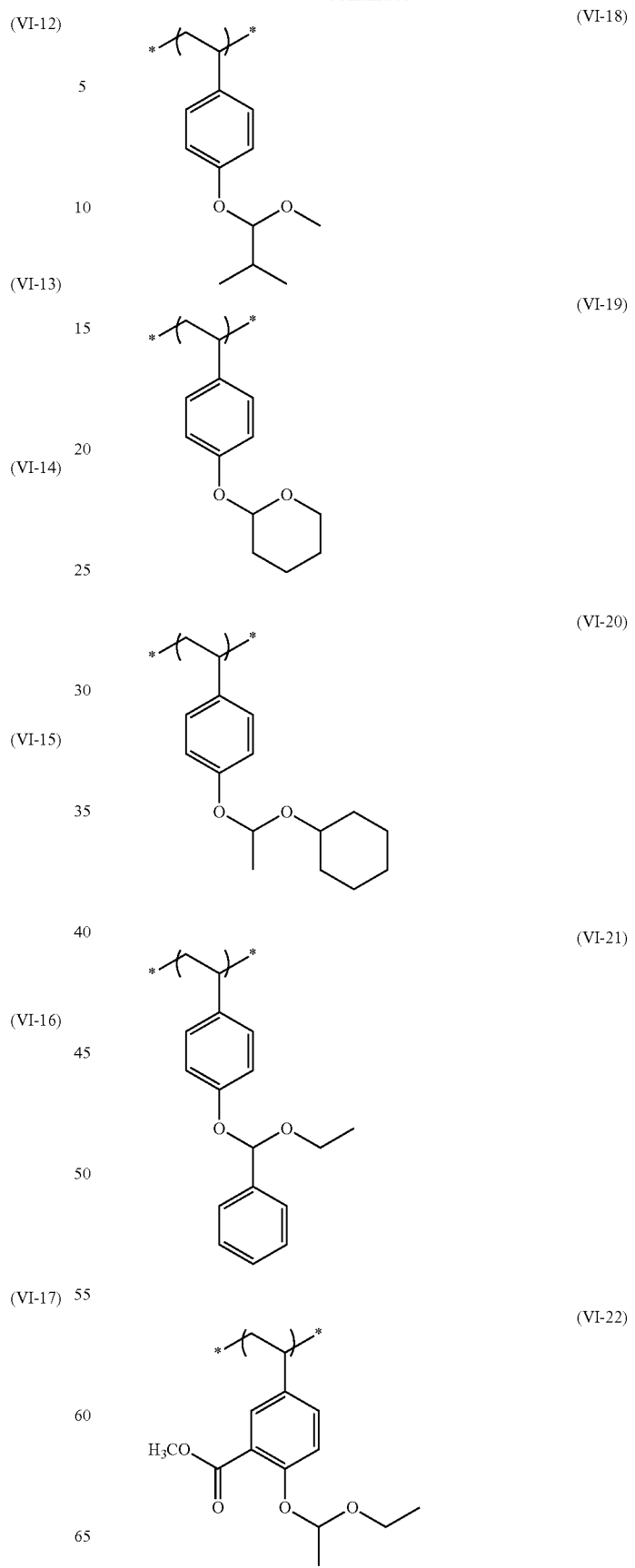

(VI-23) 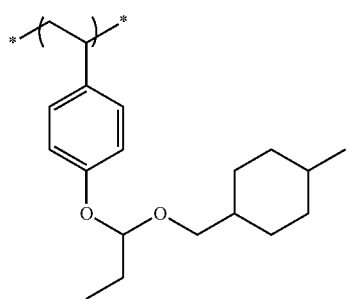
(VI-24) 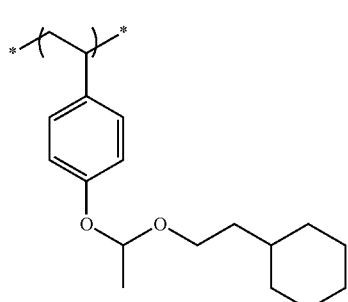
(VI-25) 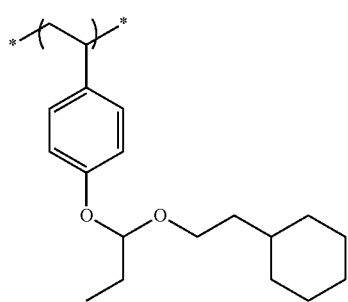
(VI-26) 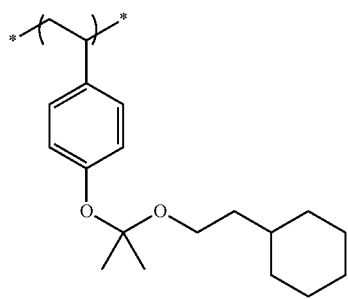
(VI-27) 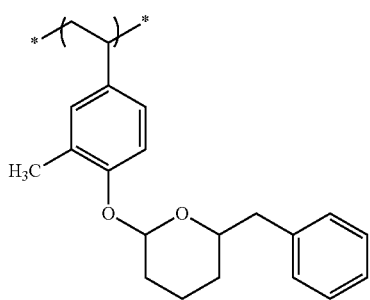
(VI-28) 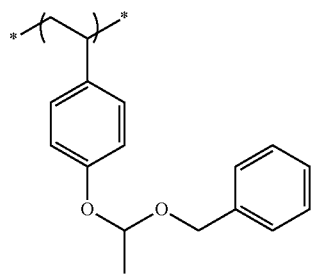
(VI-29) 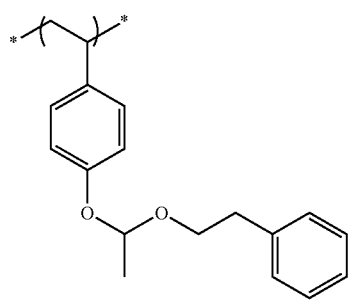
(VI-30) 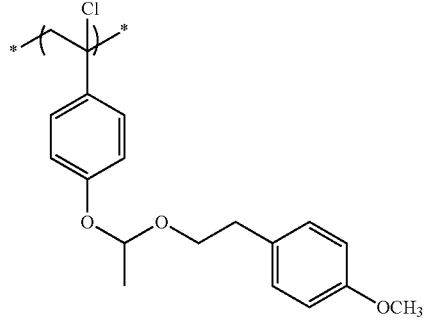
(VI-31) 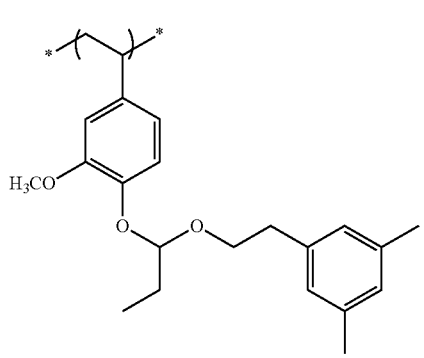
(VI-32) 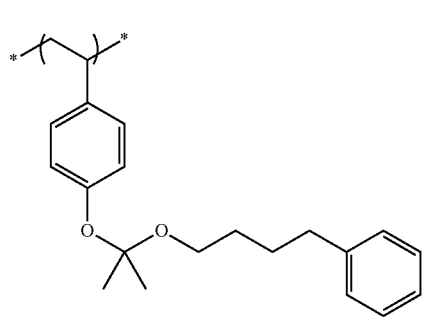

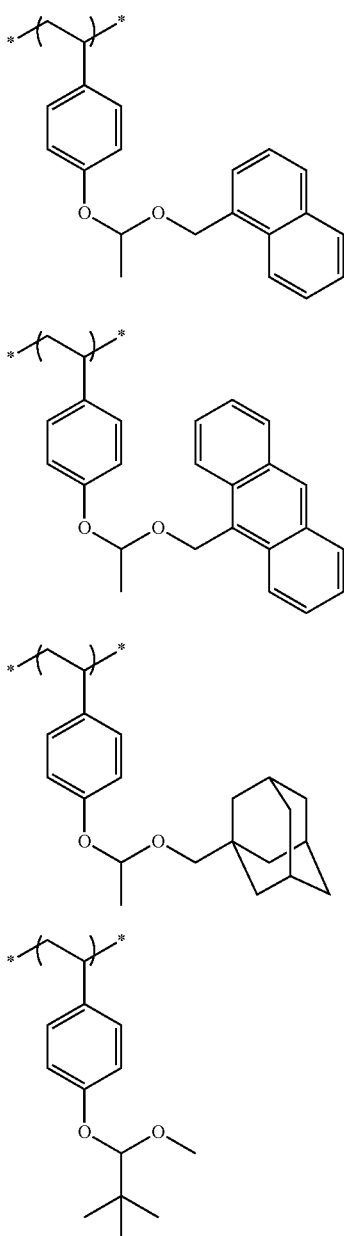

It is also preferable that the resin (A) includes a repeating unit represented by the following Formula (4).

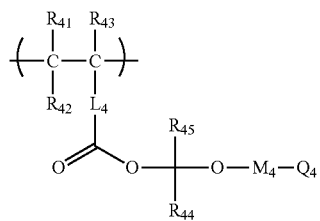

In Formula (4),
$R_{41}$, $R_{42}$, and $R_{43}$ each independently represent a hydrogen atom, an alkyl group, a cycloalkyl group, a halogen atom, a cyano group, or an alkoxycarbonyl group. $R_{42}$ may be bonded to $L_4$ to form a ring. In this case, $R_{42}$ represents an alkylene group.

$L_4$ represents a single bond or a divalent linking group. In a case where $L_4$ and $R_{42}$ form a ring, $L_4$ represents a trivalent linking group.

$R_{44}$ and $R_{45}$ represent a hydrogen atom, an alkyl group, a cycloalkyl group, an aryl group, an aralkyl group, an alkoxy group, an acyl group, or a heterocyclic group.

$M_4$ represents a single bond or a divalent linking group.

$Q_4$ represents an alkyl group, a cycloalkyl group, an aryl group, or a heterocyclic group.

At least two of $Q_4$, $M_4$, or $R_{44}$ are bonded to each other to form a ring.

$R_{41}$, $R_{42}$, and $R_{43}$ have the same definitions and the same preferable ranges as $R_{51}$, $R_{52}$, and $R_{53}$ in Formula (V).

$L_4$ has the same definition and the same preferable range as $L_5$ in Formula (V).

$R_{44}$ and $R_{45}$ have the same definition and the same preferable range as $R_3$ in Formula (3).

$M_4$ has the same definition and the same preferable range as $M_3$ in Formula (3).

$Q_4$ has the same definition and the same preferable range as $Q_3$ in Formula (3).

Examples of a ring which is formed by at least two of $Q_4$, $M_4$, or $R_{44}$ being bonded to each other include the ring which is formed by at least two of $Q_3$, $M_3$, or $R_3$ being bonded to each other, and preferable ranges thereof are also the same.

Hereinafter, specific examples of the repeating unit represented by Formula (4) will be shown, but the present invention is not limited thereto.

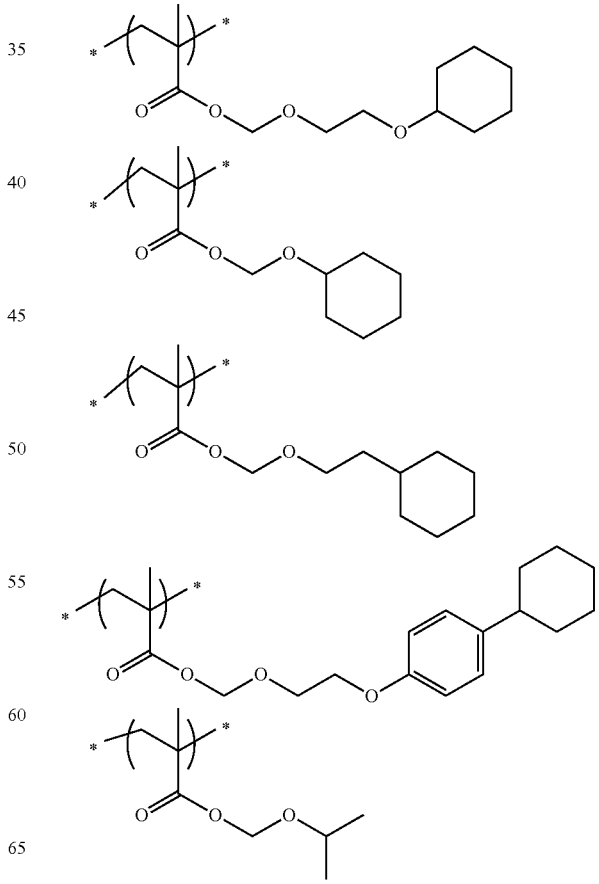

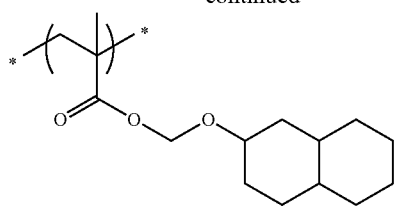
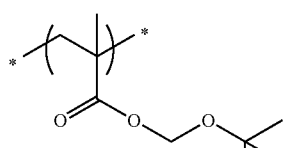
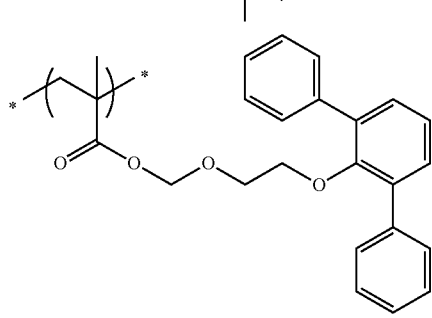
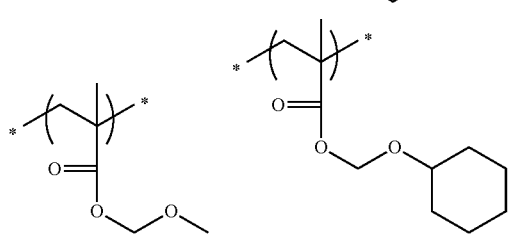
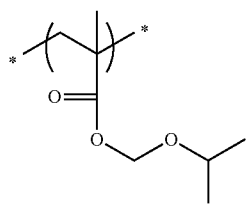
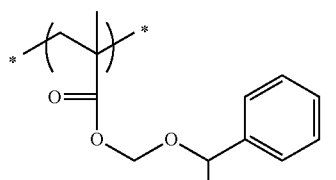
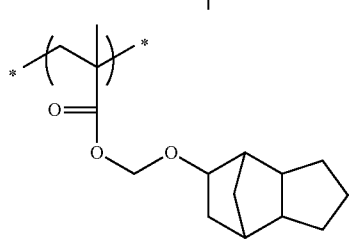
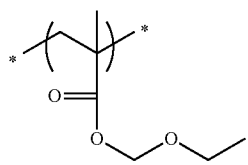

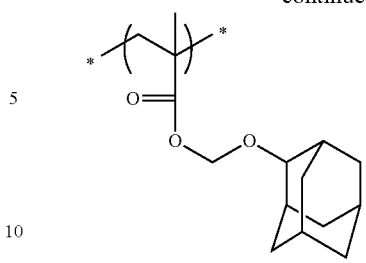
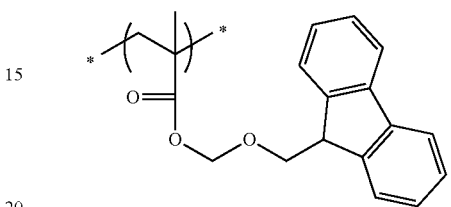
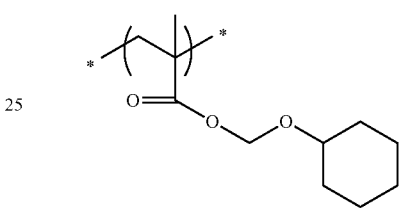
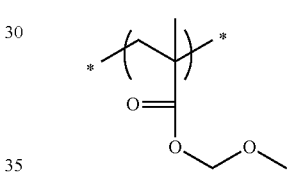
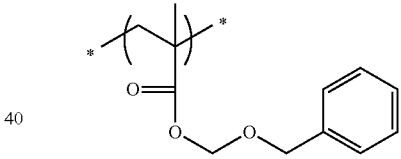

In addition, the resin (A) may include a repeating unit represented by the following Formula (BZ).

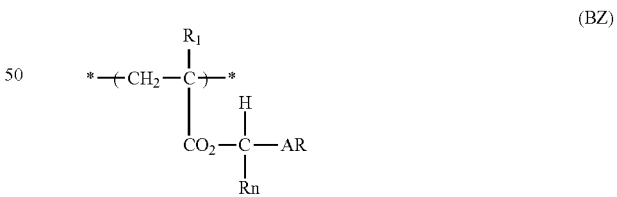

In Formula (BZ), AR represents an aryl group. $R_{11}$ represents an alkyl group, a cycloalkyl group, or an aryl group. $R_{11}$ and AR may be bonded to each other to form a nonaromatic ring.

$R_1$ represents a hydrogen atom, an alkyl group, a cycloalkyl group, a halogen atom, a cyano group, or an alkyloxycarbonyl group.

Hereinafter, specific examples of the repeating unit represented by the formula (BZ) will be shown, but the present invention is not limited thereto.

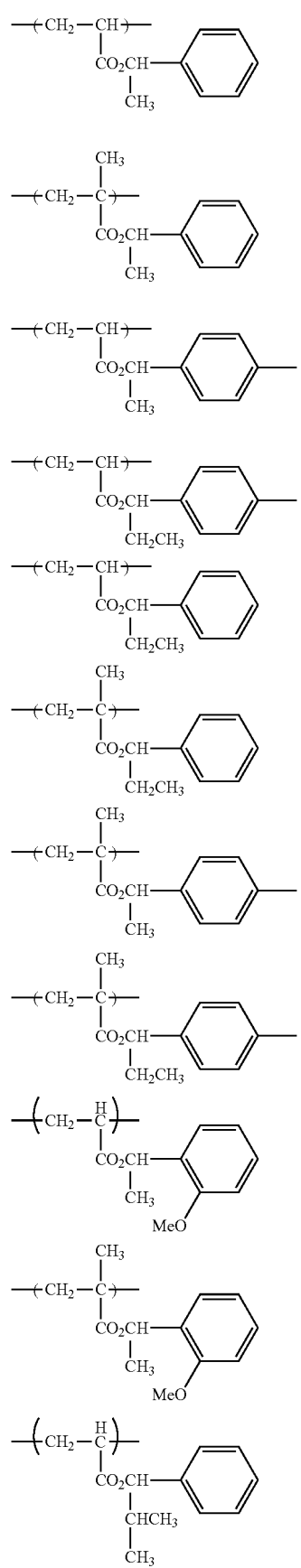
-continued
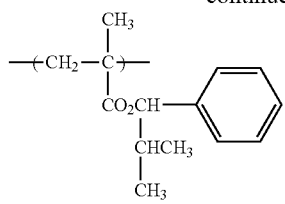
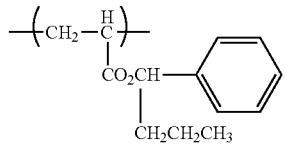
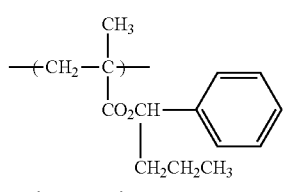
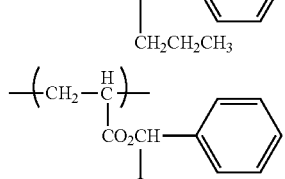
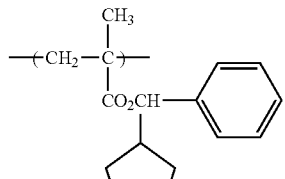
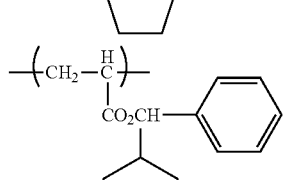
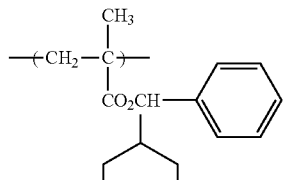
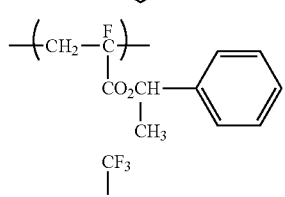
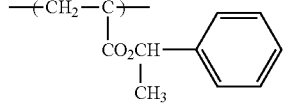

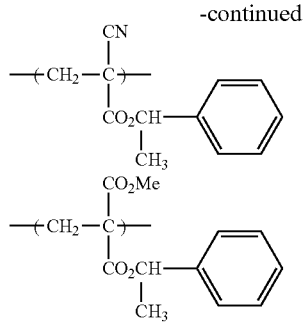

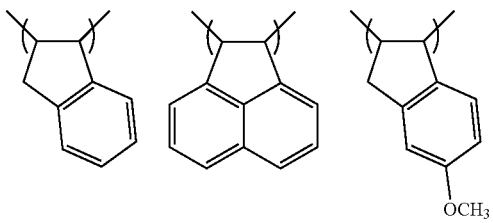

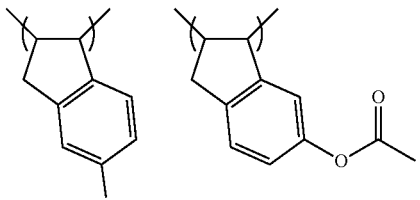

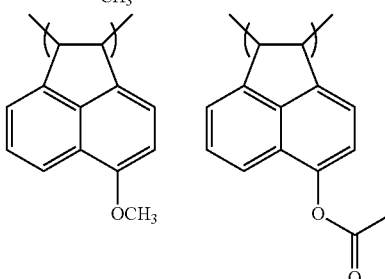

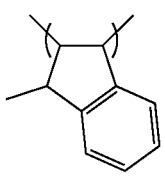

As the repeating unit having an acid-decomposable group, one kind may be used alone, or two or more kinds may be used in combination.

The content of the repeating unit having an acid-decomposable group in the resin (A) (in a case where the resin (A) includes a plurality of repeating units having an acid-decomposable group, the total content thereof) is preferably 5 mol % or higher and 80 mol % or lower, more preferably 5 mol % or higher and 75 mol % or lower, and still more preferably 10 mol % or higher and 65 mol % or lower with respect to all the repeating units of the resin (A).

The resin (A) may include a repeating unit represented by the following Formula (V) or the following Formula (VI).

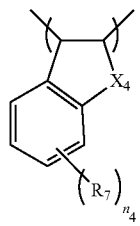

(V)

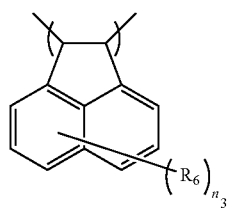

(VI)

In the formula, $R_6$ and $R_7$ each independently represent a hydrogen atom, a hydroxy group, a linear, branched, or cyclic alkyl group having 1 to 10 carbon atoms, an alkoxy group or acyloxy group, a cyano group, a nitro group, an amino group, a halogen atom, an ester group (—OCOR or —COOR: R represents an alkyl group having 1 to 6 carbon atoms or a fluorinated alkyl group), or a carboxyl group.

$n_3$ represents an integer of 0 to 6.

$n_4$ represents an integer of 0 to 4.

$X_4$ represents a methylene group, an oxygen atom, or a sulfur atom.

Hereinafter, specific examples of the repeating unit represented by Formula (V) or Formula (VI) will be shown, but the present invention is not limited thereto.

The resin (A) may further include a repeating unit having a silicon atom at a side chain. Examples of the repeating unit having a silicon atom at a side chain include a (meth)acrylate repeating unit having a silicon atom and a vinyl repeating unit having a silicon atom. The repeating unit having a silicon atom at a side chain is typically a repeating unit which has a group having a silicon atom at a side chain, and examples of the group having a silicon atom include a trimethylsilyl group, a triethylsilyl group, a triphenylsilyl group, a tricyclohexylsilyl group, a tristrimethylsilylsiloxysilyl group, a tristrimethylsilylsilyl group, a methylbistrimethylsilylsilyl group, a methylbistrimethylsilloxysilyl group, a dimethyltrimethylsilylsilyl group, a dimethyltrimethylsilloxysilyl group, a cyclic or linear polysiloxane described below, and a basket-type, ladder-type, or random-type silsesquioxane structure described below. In the formulae, R and $R_1$ each independently represent a monovalent substituent. * represents a direct bond.

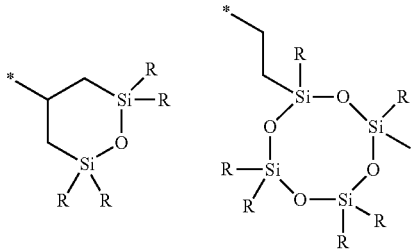

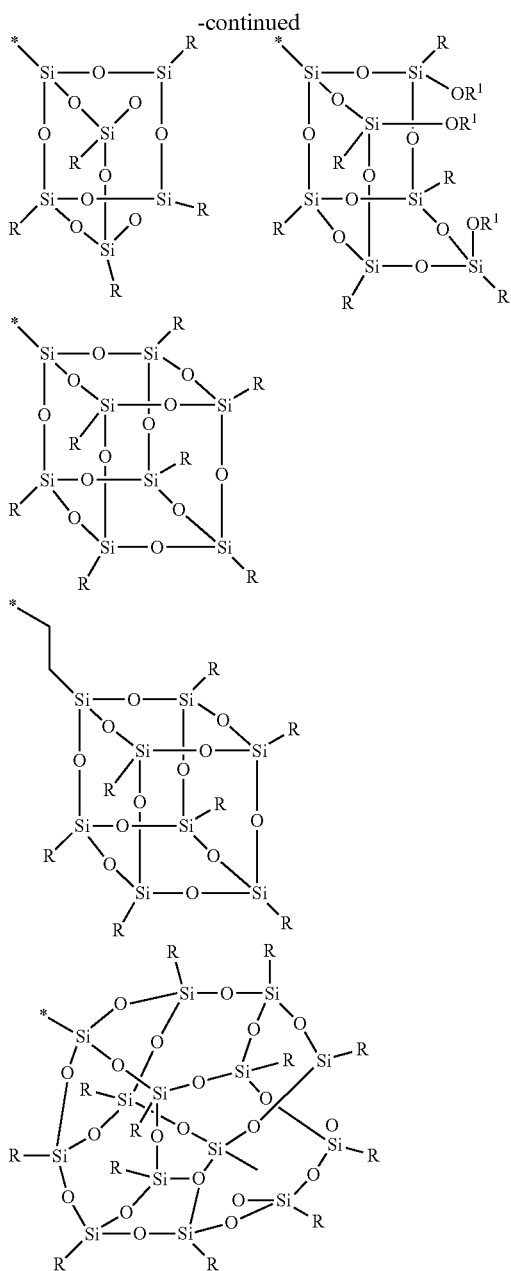

Preferable examples of the repeating unit having the above-described group include a repeating unit derived from an acrylate or methacrylate compound having the above-described group, and a repeating unit derived from a compound having the above-described group and a vinyl group.

It is preferable that the repeating unit having a silicon atom is a repeating unit having a silsesquioxane structure. As a result, excellent collapse performance can be exhibited during the formation of an ultrafine pattern (for example, line width: 50 nm or less) in which a cross-sectional shape has a high aspect ratio (for example, a thickness/line width is 3 or more).

Examples of the silsesquioxane structure include a basket-type silsesquioxane structure, a ladder-type silsesquioxane structure, and a random-type silsesquioxane structure. Among these, a basket-type silsesquioxane structure is preferable.

Here, the basket-type silsesquioxane structure refers to a silsesquioxane structure having a basket-shaped skeleton. The basket-type silsesquioxane structure may be a complete basket-type silsesquioxane structure or an incomplete basket-type silsesquioxane structure and is preferably a complete basket-type silsesquioxane structure.

In addition, the ladder-type silsesquioxane structure refers to a silsesquioxane structure having a ladder-shaped skeleton.

In addition, the random-type silsesquioxane structure refers to a silsesquioxane structure having a random skeleton.

It is preferable that the basket-type silsesquioxane structure is a siloxane structure represented by the following Formula (S).

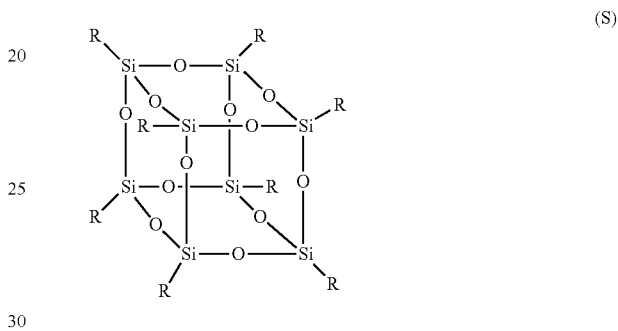

In Formula (S), R represents a monovalent organic group. A plurality of R's may be the same as or different from each other.

The organic group is not particularly limited, and specific examples thereof include a hydroxy group, a nitro group, a carboxy group, an alkoxy group, an amino group, a mercapto group, a blocked mercapto group (for example, a mercapto group blocked (protected) with an acyl group), an acyl group, an imido group, a phosphino group, a phosphinyl group, a silyl group, a vinyl group, a hydrocarbon group which may have a heteroatom, a (meth)acryl group-containing group, and an epoxy group-containing group.

Examples of the heteroatom of the hydrocarbon group which may have a heteroatom include an oxygen atom, a nitrogen atom, a sulfur atom, and a phosphorus atom.

Examples of the hydrocarbon group of the hydrocarbon group which may have a heteroatom include an aliphatic hydrocarbon group, an aromatic hydrocarbon group, and a group including a combination thereof.

The aliphatic hydrocarbon group may be linear, branched, or cyclic. Specific examples of the aliphatic hydrocarbon group include a linear or branched alkyl group (particularly having 1 to 30 carbon atoms), a linear or branched alkenyl group (particularly having 2 to 30 carbon atoms), and a linear or branched alkynyl group (particularly, having 2 to 30 carbon atoms).

Examples of the aromatic hydrocarbon group include an aromatic hydrocarbon group having 6 to 18 carbon atoms such as a phenyl group, a tolyl group, a xylyl group, or a naphthyl group.

In a case where the resin (A) includes the repeating unit which has silicon atom at a side chain, the content thereof is preferably 1 to 30 mol %, more preferably 5 to 25 mol %, and still more preferably 5 to 20 mol % with respect to all the repeating units of the resin (A).

[1-7] Synthesis of Resin (A)

The resin (A) can be synthesized using an ordinary method (for example, radical polymerization). Examples of the general synthesis method include: a batch polymerization method of dissolving a monomer species and an initiator in a solvent and heating the solution for polymerization; and a dropping polymerization method of dropping a solution of a monomer species and an initiator dropwise to a heated solvent for 1 to 10 hours. Among these, a dropping polymerization method is preferable.

Examples of the reaction solvent include: an ether such as tetrahydrofuran, 1,4-dioxane, or diisopropyl ether; a ketone such as methyl ethyl ketone or methyl isobutyl ketone; an ester solvent such as ethyl acetate; an amide solvent such as dimethyl formamide or dimethylacetamide; and a solvent for dissolving an actinic ray-sensitive or radiation-sensitive resin composition described below such as propylene glycol monomethyl ether acetate, propylene glycol monomethyl ether, or cyclohexanone. It is preferable that the same solvent as that used in the actinic ray-sensitive or radiation-sensitive resin composition is used for polymerization. As a result, particle generation during storage can be suppressed.

It is preferable that the polymerization reaction is performed in an inert gas atmosphere such as nitrogen or argon. In order to initiate the polymerization, a commercially available radical initiator (for example, an azo initiator or peroxide) is used as the polymerization initiator. As the radical initiator, an azo initiator is preferable, and examples thereof include an azo initiator having an ester group, a cyano group, or a carboxyl group. Preferable examples of the initiator include azobisisobutyronitrile, azobisdimethylvaleronitrile, and dimethyl 2,2'-azobis(2-methylpropionate). If desired, the initiator is added additionally or dividedly. After completion of the reaction, the reaction product is put into a solvent, and a desired polymer is collected using a powder or solid collecting method or the like. The reaction concentration is 5 to 50 mass % and preferably 10 to 30 mass %.

The reaction temperature is typically 10° C. to 150° C., preferably 30° C. to 120° C., and still more preferably 60° C. to 100° C.

Examples of a method which can be used for purification include a typical method such as: a liquid-liquid extraction method in which a residual monomer or an oligomer component is removed using a combination of water cleaning and an appropriate solvent; a purification method in a solution state such as ultrafiltration in which substances having a specific molecular weight or lower are extracted and removed; a redispersion method in which a residual monomer is removed by dropping a resin solution over a poor solvent to solidify the resin in the poor solvent; and a purification method in a solid state in which a resin slurry separated by filtration is cleaned with a poor solvent.

The weight-average molecular weight of the resin (A) is preferably 1000 to 200000, more preferably 3000 to 20000, and most preferably 5000 to 15000 in terms of polystyrene by GPC. By adjusting the weight-average molecular weight to be 1000 to 200000, deterioration in heat resistance and dry etching resistance can be prevented. In addition, deterioration in developability and deterioration in film forming properties caused by an increase in viscosity can be prevented.

It is still more preferable that the weight-average molecular weight of the resin (A) is 3000 to 9500 in terms of polystyrene by GPC. By adjusting the weight-average molecular weight to be 3000 to 9500, in particular, a resist residue (hereinafter also referred to as "scum") is suppressed, and a more satisfactory pattern can be formed.

The dispersity (molecular weight distribution) is typically 1 to 5, preferably 1 to 3, more preferably 1.2 to 3.0, and still more preferably 1.2 to 2.0. As the dispersity decreases, the resolution and a resist shape are improved. In addition, a side wall of a resist pattern is smooth, and roughness properties are excellent.

In the actinic ray-sensitive or radiation-sensitive resin composition, the content of the resin (A) is preferably 50 to 99.9 mass % and more preferably 60 to 99.0 mass % with respect to the total solid content of the actinic ray-sensitive or radiation-sensitive resin composition. In addition, in the actinic ray-sensitive or radiation-sensitive resin composition, one resin (A) may be used alone, or a plurality of resins (A) may be used in combination.

[2] Compound (B) which Generates Acid by Actinic Ray or Radiation

It is preferable that the actinic ray-sensitive or radiation-sensitive resin composition includes a compound (hereinafter, also referred to as "photoacid generator (PAG)") which generates an acid by an actinic ray or radiation.

The photoacid generator may be a low molecular weight compound or may be incorporated into a part of a polymer. In addition, the photoacid generator may be a low molecular weight compound which is incorporated into a polymer.

In a case where the photoacid generator is a low molecular weight compound, the molecular weight is preferably 3000 or lower, more preferably 2000 or lower, and still more preferably 1000 or lower.

In a case where the photoacid generator is incorporated into a part of a polymer, the photoacid generator may be incorporated into a part of the resin (A) or another resin different from the resin (A).

In the present invention, it is preferable that the photoacid generator is a low molecular weight compound.

The photoacid generator is not particularly limited as long as it is well-known. As the photoacid generator, a compound, which generates an organic acid, for example, at least one of sulfonic acid, bis(alkylsulfonyl)imide, or tris(alkylsulfonyl)methide when irradiated with an actinic ray or radiation and preferably an electron beam or an extreme ultraviolet ray, is preferable.

A compound represented by the following Formula (ZI), (ZII) or (ZIII) is more preferable.

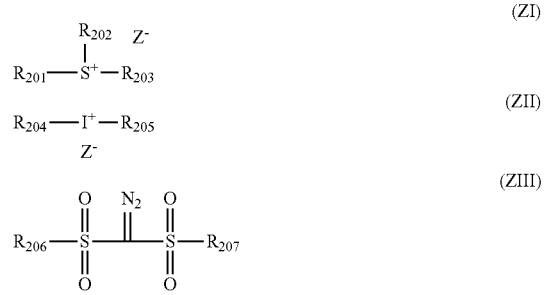

In Formula (ZI), $R_{201}$, $R_{202}$, and $R_{203}$ each independently represent an organic group.

The number of carbon atoms in the organic group represented by $R_{201}$, $R_{202}$, and $R_{203}$ is generally 1 to 30 and preferably 1 to 20.

In addition, two of $R_{201}$ to $R_{203}$ may be bonded to each other to form a ring structure, and the ring may include an oxygen atom, a sulfur atom, an ester bond, an amide bond, or a carbonyl group. Examples of the group which is formed by two of $R_{201}$ to $R_{203}$ being bonded to each other include an alkylene group (for example, a butylene group or a pentylene group).

$Z^-$ represents a non-nucleophilic anion (an anion having a significantly low ability to cause a nucleophilic reaction to occur).

Examples of the non-nucleophilic anion include a sulfonate anion (for example, an aliphatic sulfonate anion, an aromatic sulfonate anion, or a camphor sulfonate anion), a carboxylate anion (for example, an aliphatic carboxylate anion, an aromatic carboxylate anion, or an aralkyl carboxylate anion), a sulfonyl imide anion, a bis(alkylsulfonyl)imide anion, and a tris(alkylsulfonyl)methide anion.

An aliphatic site in the aliphatic sulfonate anion and the aliphatic carboxylate anion may be an alkyl group or a cycloalkyl group and is preferably a linear or branched alkyl group having 1 to 30 carbon atoms or a cycloalkyl group having 3 to 30 carbon atoms.

As the aromatic group in the aromatic sulfonate anion and the aromatic carboxylate anion, an aryl group having 6 to 14 carbon atoms is preferable, and examples thereof include a phenyl group, a tolyl group, and naphthyl group.

The alkyl group, the cycloalkyl group, and the aryl group described above may have a substituent. Specific examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

Examples of an aryl group and a ring structure included in each of the groups include an alkyl group (preferably having 1 to 15 carbon atoms) as a substituent.

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonyl imide anion include a saccharin anion.

As the alkyl group in the bis(alkylsulfonyl)imide anion and the tris(alkylsulfonyl)methide anion, an alkyl group having 1 to 5 carbon atoms is preferable. Examples of a substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group. Among these, a fluorine atom or an alkyl group substituted with a fluorine atom is preferable.

In addition, the alkyl groups in the bis(alkylsulfonyl) imide anions may be bonded to each other to form a ring structure. As a result, the acid strength increases.

Other examples of the non-nucleophilic anion include phosphorus fluoride (for example, $PF_6^-$), boron fluoride (for example, $BF_4^-$), and antimony fluoride (for example, $SbF_6^-$).

As the non-nucleophilic anion, an aliphatic sulfonate anion in which at least the α-position of sulfonic acid is substituted with a fluorine atom, an aromatic sulfonate anion substituted with a fluorine atom or a group having a fluorine atom, a bis(alkylsulfonyl)imide anion in which the alkyl group is substituted with a fluorine atom, or a tris(alkylsulfonyl)methide anion in which the alkyl group is substituted with a fluorine atom is preferable. As the non-nucleophilic anion, a perfluoroaliphatic sulfonate anion (still more preferably having 4 to 8 carbon atoms) or a benzenesulfonate anion having a fluorine atom is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of the acid generated is −1 or lower to improve sensitivity.

In addition, as the non-nucleophilic anion, for example, an anion represented by the following Formula (AN1) is preferable.

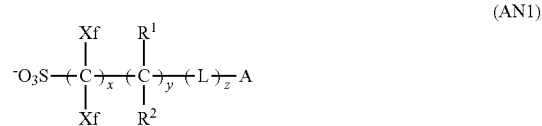

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group. In a case where a plurality of $R^1$'s and a plurality of $R^2$'s are present, $R^1$'s and $R^2$'s may be the same as or different from each other.

L represents a divalent linking group. In a case where a plurality of L's are present, L's may be the same as or different from each other.

A represents a cyclic organic group.

x represents an integer of 1 to 20, y represent an integer of 0 to 10, and z represents an integer of 0 to 10.

Formula (AN1) will be described in more detail.

As the alkyl group in the alkyl group substituted with a fluorine atom represented by Xf, an alkyl group having 1 to 10 carbon atoms is preferable, and an alkyl group having 1 to 4 carbon atoms is more preferable. In addition, as the alkyl group in the alkyl group substituted with a fluorine atom represented by Xf, a perfluoroalkyl group is preferable.

Xf represents preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, a fluorine atom or $CF_3$ is preferable.

In particular, it is preferable that both Xf's represent a fluorine atom.

The alkyl group represented by $R^1$ and $R^2$ may have a substituent (preferably a fluorine atom), and an alkyl group having 1 to 4 carbon atoms is preferable. A perfluoroalkyl group having 1 to 4 carbon atoms is more preferable. Specific examples of the alkyl group having a substituent represented by $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$. Among these, $CF_3$ is preferable.

$R^1$ and $R^2$ represent preferably a fluorine atom or $CF_3$.

x represents preferably 1 to 10 and more preferably 1 to 5.

y represents preferably 0 to 4 and more preferably 0.

z represents preferably 0 to 5 and more preferably 0 to 3.

The divalent linking group represented by L is not particularly limited, and examples thereof include —COO—, —OCO—, —CO—, —O—, —S—, —SO—, —SO$_2$—, an alkylene group, a cycloalkylene group, an alkenylene group, a linking group obtained by linking two or more kinds among the above-described groups linking to each other. A linking group having 12 or less carbon atoms in total is preferable. Among these, —COO—, —OCO—, —CO—, or —O— is preferable, and —COO— or —OCO— is more preferable.

In Formula (ANI), as a combination of partial structures other than A, for example, $SO^{3-}$—$CF_2$—$CH_2$—OCO—, $SO^{3-}$—$CF_2$—$CH_2$—CHF—OCO—, $SO^{3-}$—$CF_2$—COO—, $SO^{3-}$—$CF_2$—$CF_2$—$CH_2$—, or $SO^{3-}$—$CF_2$—CH($CF_3$)—OCO is preferable.

The cyclic organic group represented by A is not particularly limited as long as it has a cyclic structure, and examples thereof include an alicyclic group, an aryl group, a heterocyclic group (including not only an aromatic heterocyclic group but also a nonaromatic heterocyclic group).

The alicyclic group may be monocyclic or polycyclic, and a monocycloalkyl group such as a cyclopentyl group, a cyclohexyl group, or a cyclooctyl group, or a polycycloalkyl group such as a norbornyl group, a tricyclodecanyl group, a tetracyclodecanyl group, a tetracyclododecanyl group, or an adamantyl group is preferable. Among these, an alicyclic group having a bulky structure which has 7 or more carbon atoms such as a norbornyl group, a tricyclodecanyl group, a tetracyclodecanyl group, a tetracyclododecanyl group, or an adamantyl group is preferable from the viewpoints of suppressing in-film diffusion in a heating step after exposure and improving a mask error enhancement factor (MEEF).

Examples of the aryl group include a benzene ring, a naphthalene ring, a phenanthrene ring, and an anthracene ring.

Examples of the heterocyclic group include a furan ring, a thiophene ring, a benzofuran ring, a benzothiophene ring, a dibenzofuran ring, a dibenzothiophene ring, and a group derived from a pyridine ring. Among these, a furan ring, a thiophene ring, or a group derived from a pyridine ring is preferable.

In addition, as the cyclic organic group, a lactone structure can be used, and specific examples thereof include lactone structures represented by the following Formulae (LC1-1) to (LC1-17).

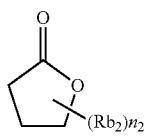
LC1-1

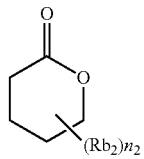
LC1-2

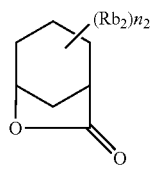
LC1-3

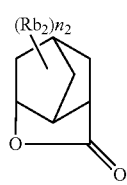
LC1-4

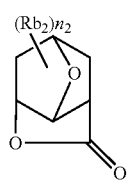
LC1-5

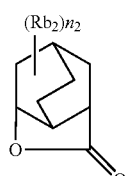
LC1-6

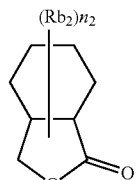
LC1-7

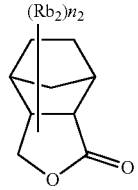
LC1-8

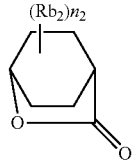
LC1-9

-continued

LC1-10
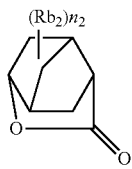

LC1-11
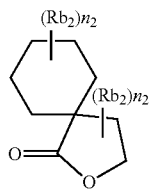

LC1-12
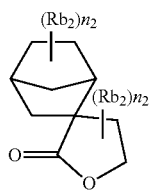

LC1-13
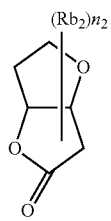

LC1-14
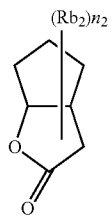

LC1-15
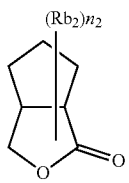

LC1-16
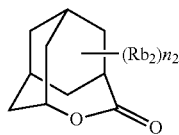

LC1-17
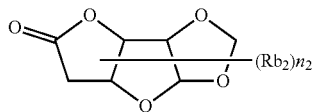

The cyclic organic group may have a substituent, and examples of the substituent include an alkyl group (a linear, branched, or cyclic alkyl group; preferably having 1 to 12 carbon atoms), a cycloalkyl group (a monocycle, a polycycle, or a spiro ring; preferably having 3 to 20 carbon atoms), an aryl group (preferably having 6 to 14 carbon atoms), a hydroxy group, an alkoxy group, an ester group, an amido group, a urethane group, an ureido group, a thioether group, a sulfonamide group, and a sulfonate group. Carbon (carbon contributing to ring formation) constituting the cyclic organic group may be carbonyl carbon.

The substituent corresponds to $Rb_2$ in (LC1-1) to (LC1-17). In addition, in (LC1-1) to (LC1-17), n2 represents an integer of 0 to 4. In a case where n2 represents 2 or more, a plurality of $Rb_2$'s may be the same as or different from each other or may be bonded to each other to form a ring.

Examples of the organic group represented by $R_{201}$, $R_{202}$, and $R_{203}$ in Formula (ZI) include an aryl group, an alkyl group, and a cycloalkyl group.

It is preferable that at least one of $R_{201}$, $R_{202}$, or $R_{203}$ represents an aryl group, and it is more preferable that all of $R_{201}$, $R_{202}$, or $R_{203}$ represent an aryl group. As the aryl group, not only a phenyl group or a naphthyl group but also a heteroaryl group such as an indole residue or a pyrrole residue may be used. As the alkyl group and the cycloalkyl group represented by $R_{201}$ to $R_{203}$, a linear or branched alkyl group having 1 to 10 carbon atoms or a cycloalkyl group having 3 to 10 carbon atoms is preferable. As the alkyl group, a methyl group, an ethyl group, a n-propyl group, an i-propyl group, or a n-butyl group is more preferable. As the cycloalkyl group, a cyclopropyl group, a cyclobutyl group, a cyclopentyl group, a cyclohexyl group, or a cycloheptyl group is more preferable.

Each of the groups may further have a substituent. Examples of the substituent include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms), but the present invention is not limited thereto.

Next, Formulae (ZII) and (ZIII) will be described.

In Formulae (ZII) and (ZIII), $R_{204}$ to $R_{207}$ each independently represent an aryl group, an alkyl group, or a cycloalkyl group As the aryl group represented by $R_{204}$ to $R_{207}$, a phenyl group or a naphthyl group is preferable, and a phenyl group is more preferable. The aryl group represented by $R_{204}$ to $R_{207}$, may be an aryl group which has a heterocyclic structure having an oxygen atom, a nitrogen atom, or a sulfur atom. Examples of a skeleton of the aryl group having a heterocyclic structure include pyrrole, furan, thiophene, indole, benzofuran, and benzothiophene.

Preferable examples of the alkyl group and the cycloalkyl group represented by $R_{204}$ to $R_{207}$ include a linear or branched alkyl group having 1 to 10 carbon atoms (for example, a methyl group, an ethyl group, a propyl group, a butyl group or a pentyl group), and a cycloalkyl group having 3 to 10 carbon atoms (a cyclopentyl group, a cyclohexyl group, or a norbornyl group).

The aryl group, the alkyl group, and the cycloalkyl group represented by $R_{204}$ to $R_{207}$ may have a substituent. Examples of the substituent which may be included in the aryl group, the alkyl group, and the cycloalkyl group represented by $R_{204}$ to $R_{207}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group.

In addition, Z⁻ in Formula (ZII) represents a non-nucleophilic anion. Specifically, Z⁻ in Formula (ZII) has the same definition and the same preferable aspect as Z⁻ in Formula (ZI).

Hereinafter, specific examples of Formulae (ZI) to (ZIII) will be shown below, but the present invention is not limited thereto.

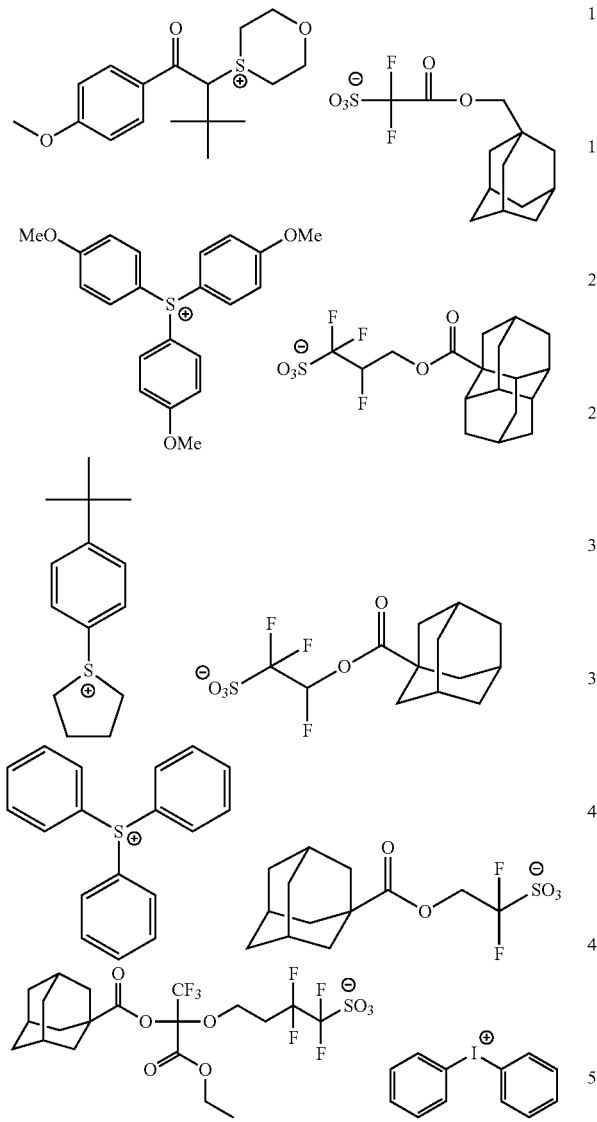

In the present invention, from the viewpoint of suppressing diffusion of an acid generated by exposure to a non-exposed portion and improving resolution, the photoacid generator is preferably a compound which generates an acid (more preferably sulfonic acid) having a volume of 130 Å$^3$ or higher when irradiated with an electron beam or an extreme ultraviolet ray, more preferably a compound which generates an acid (more preferably sulfonic acid) having a volume of 190 Å$^3$ or higher, still more preferably a compound which generates an acid (more preferably sulfonic acid) having a volume of 270 Å$^3$ or higher, and even still more preferably a compound which generates an acid (more preferably sulfonic acid) having a volume of 400 Å$^3$ or higher. From the viewpoints of sensitivity and coating solvent solubility, the volume is preferably 2000 Å$^3$ or lower and more preferably 1500 Å$^3$ or lower.

A value of the volume is obtained using "WinMOPAC" (manufactured by FUJITSU). That is, a chemical structure of an acid according to each example is input. Next, the most stable conformation of each acid is determined through a molecular field calculation using a MM3 method with the input chemical structure as an initial structure. Next, a molecular orbital calculation is performed on the most stable conformation using a PM3 method. As a result, "accessible volume" of each acid can be calculated.

In the present invention, the following examples of the photoacid generators which generate an acid when irradiated with an actinic ray or radiation are preferable. In some of the examples, a calculated value of the volume is added (unit: Å$^3$). The calculated value herein denotes a value of an acid in which a proton is bonded to the anion portion.

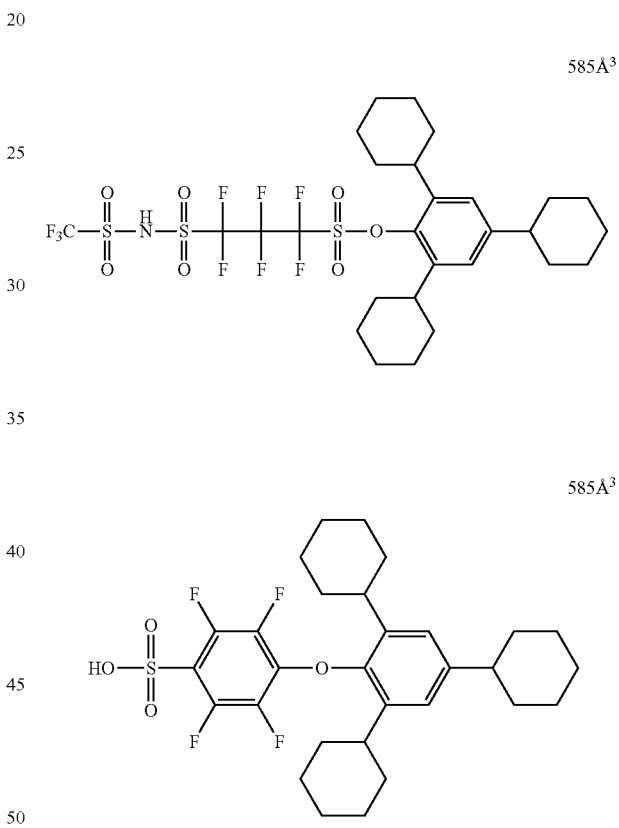

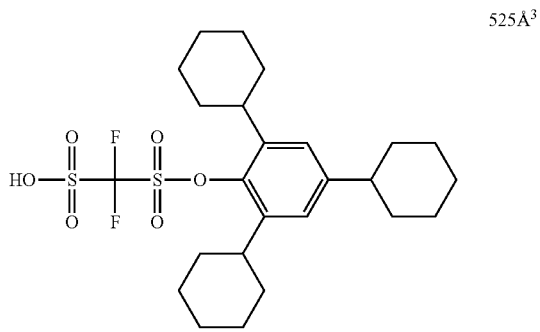

93
-continued
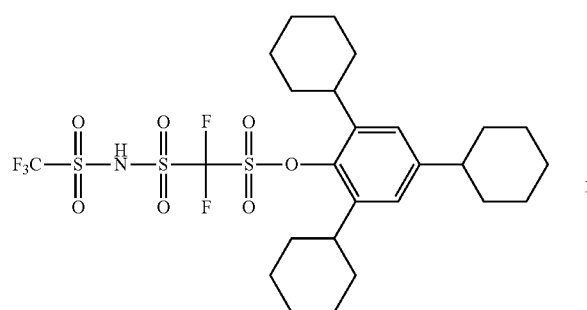
554Å³
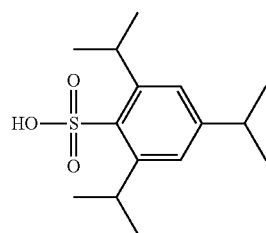
303Å²
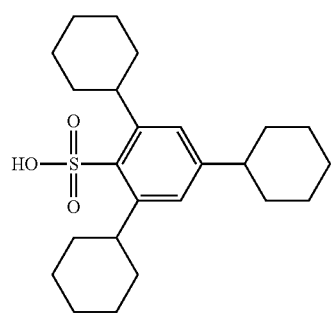
437Å³
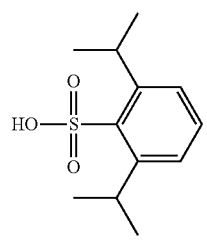
244Å³
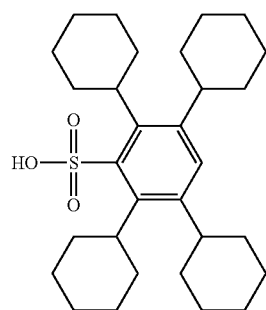
529Å³
94
-continued
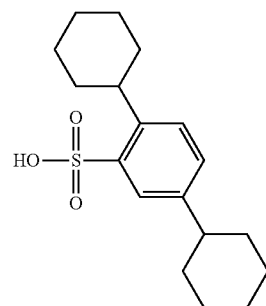
336Å³
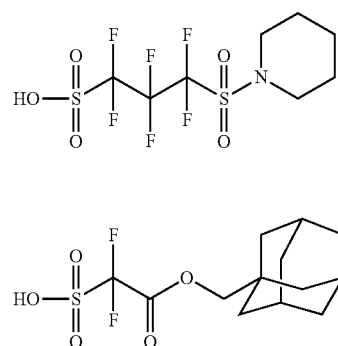
244Å³
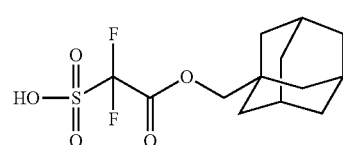
271Å³
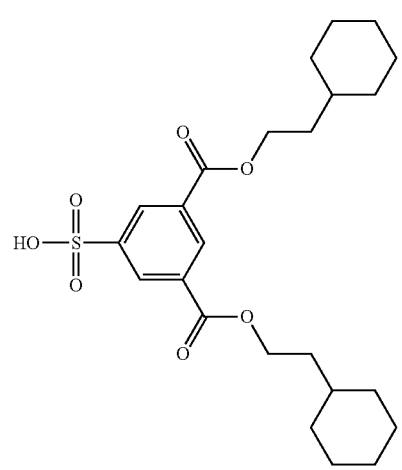
457Å³
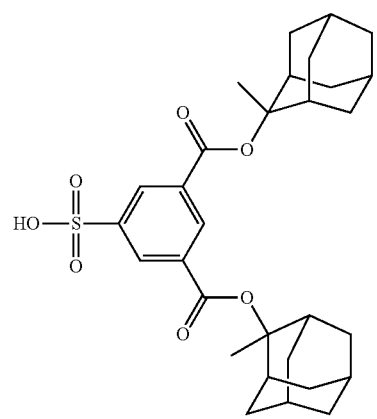
511Å³

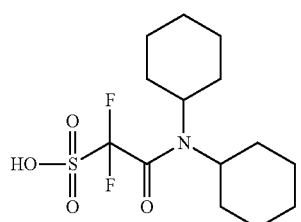
311Å³
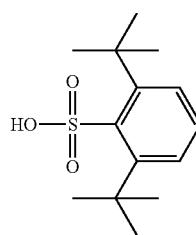
280Å³
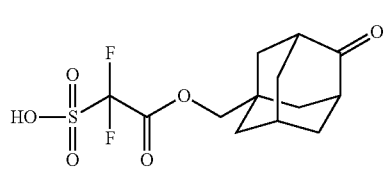
266Å³
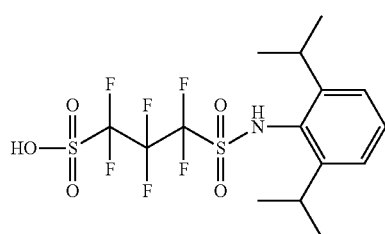
339Å³
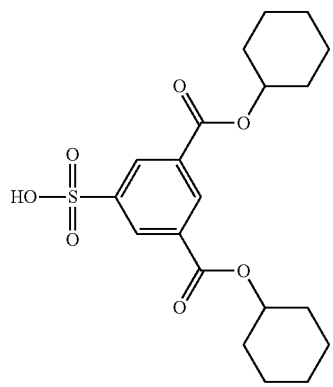
380Å³
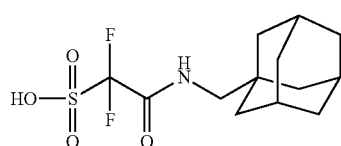
277Å³
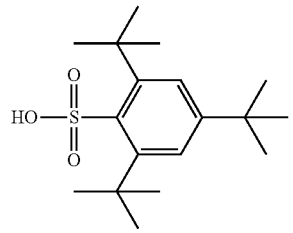
357Å³
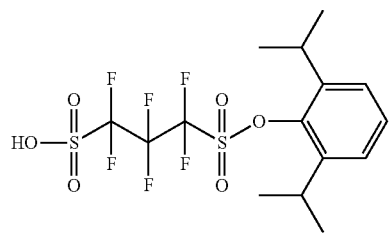
347Å³
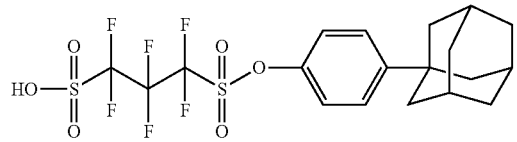
360Å³
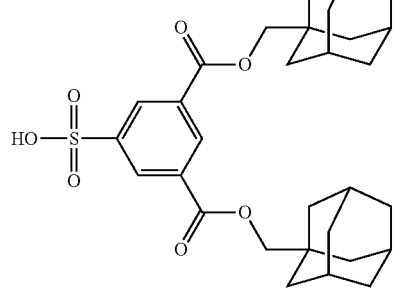
519Å³
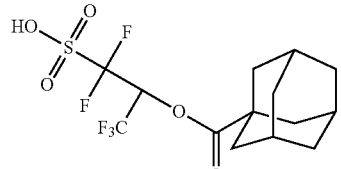
291Å³
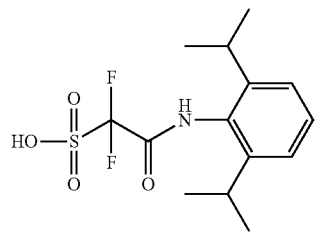
297Å³
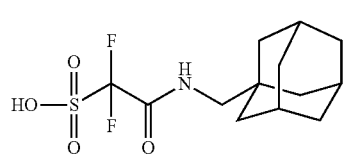
277Å³

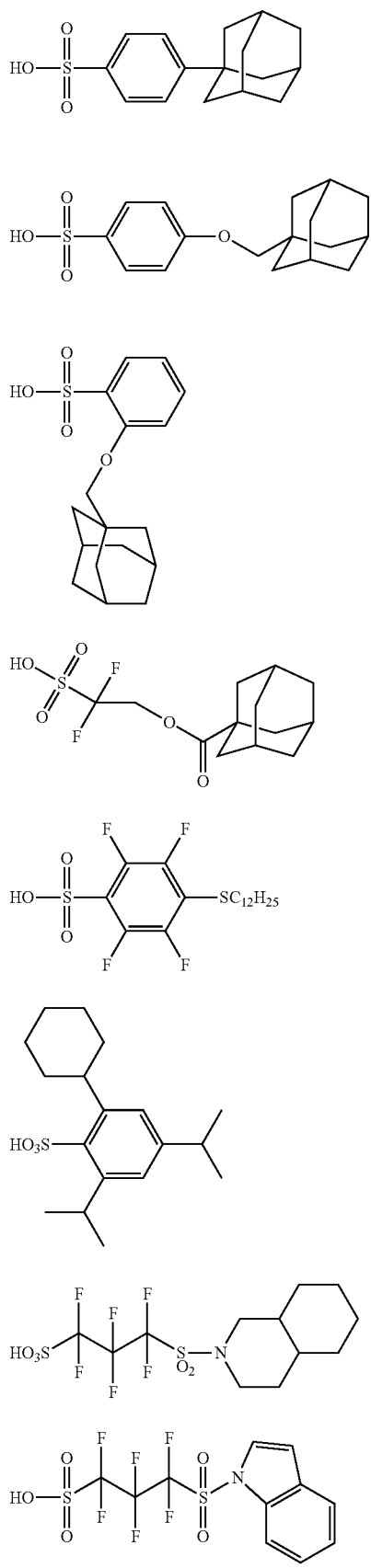
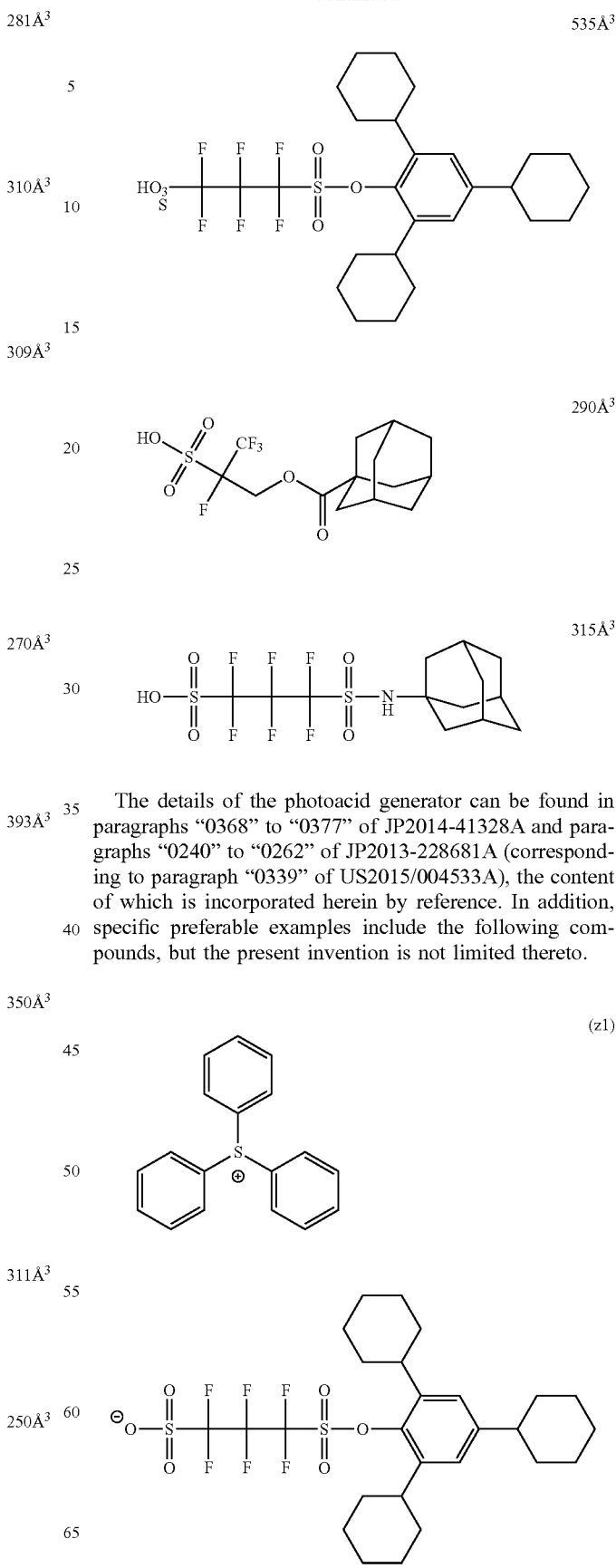
The details of the photoacid generator can be found in paragraphs "0368" to "0377" of JP2014-41328A and paragraphs "0240" to "0262" of JP2013-228681A (corresponding to paragraph "0339" of US2015/004533A), the content of which is incorporated herein by reference. In addition, specific preferable examples include the following compounds, but the present invention is not limited thereto.

99
-continued
(z2)
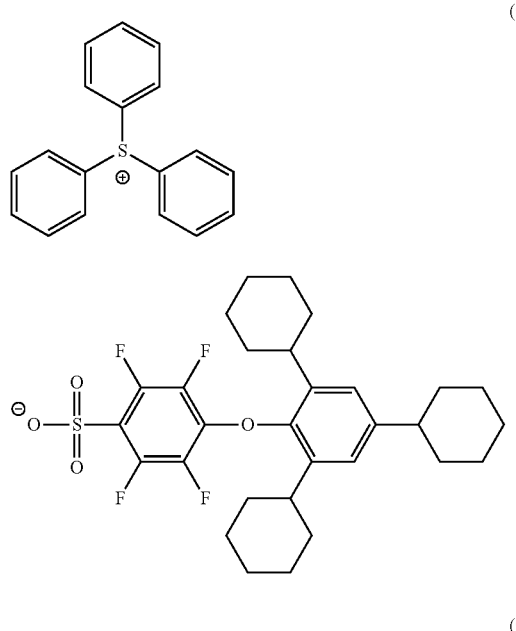
(z3)
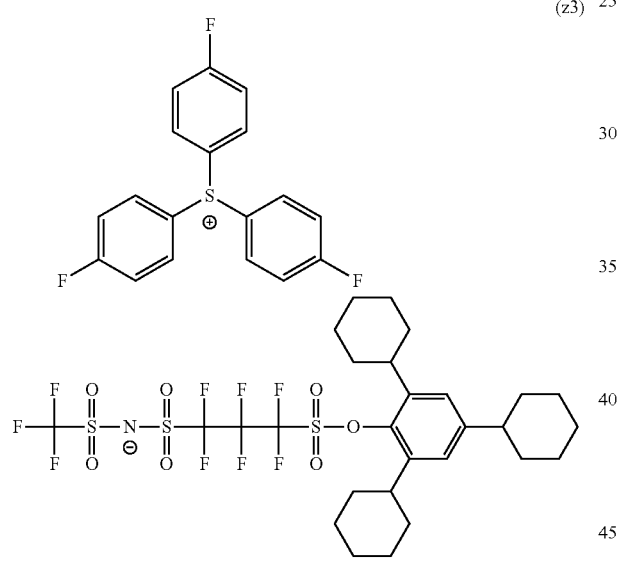
(z4)
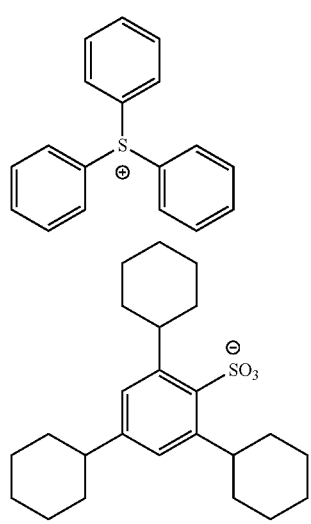
100
-continued
(z5)
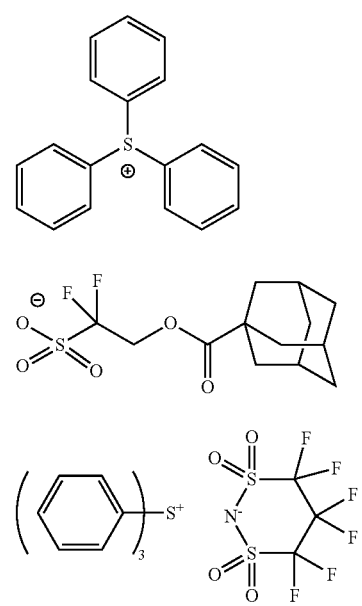
(z6)
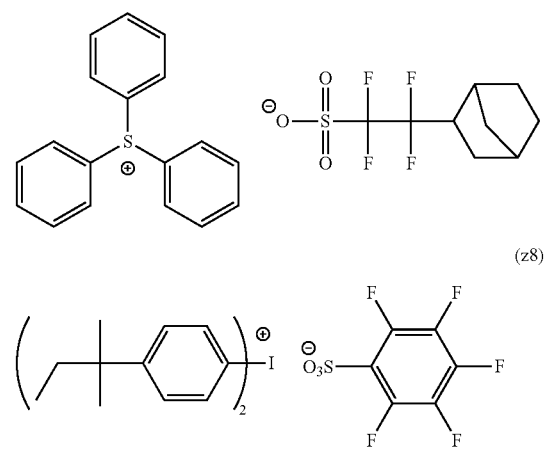
(z7)
(z8)
(z9)
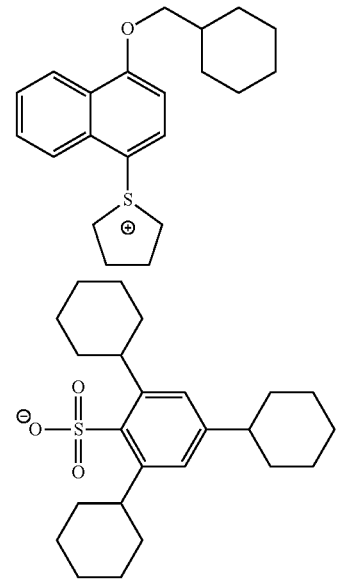

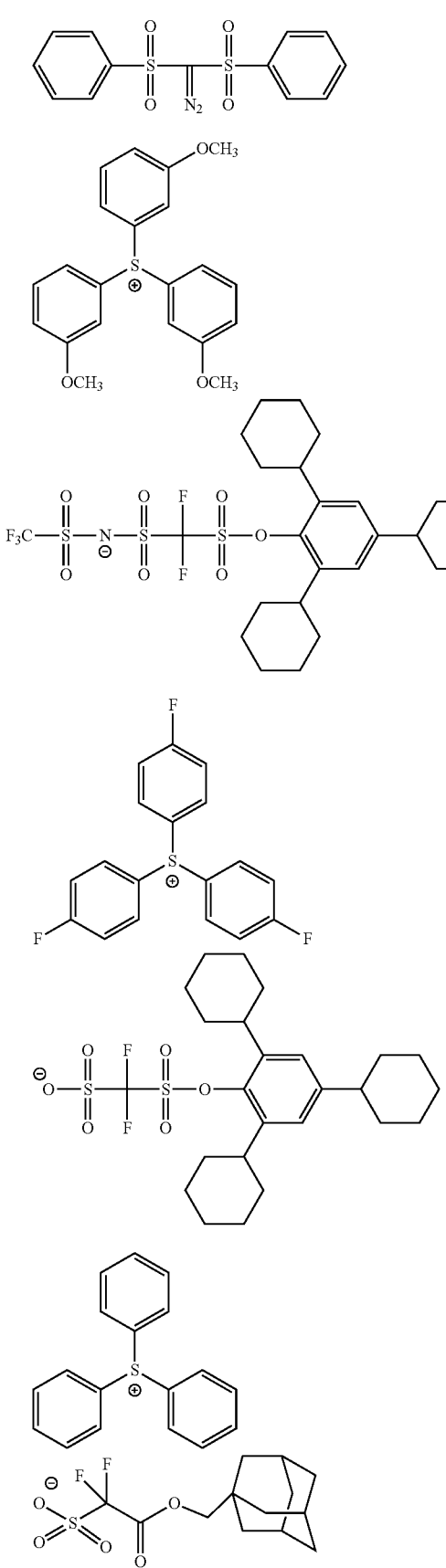
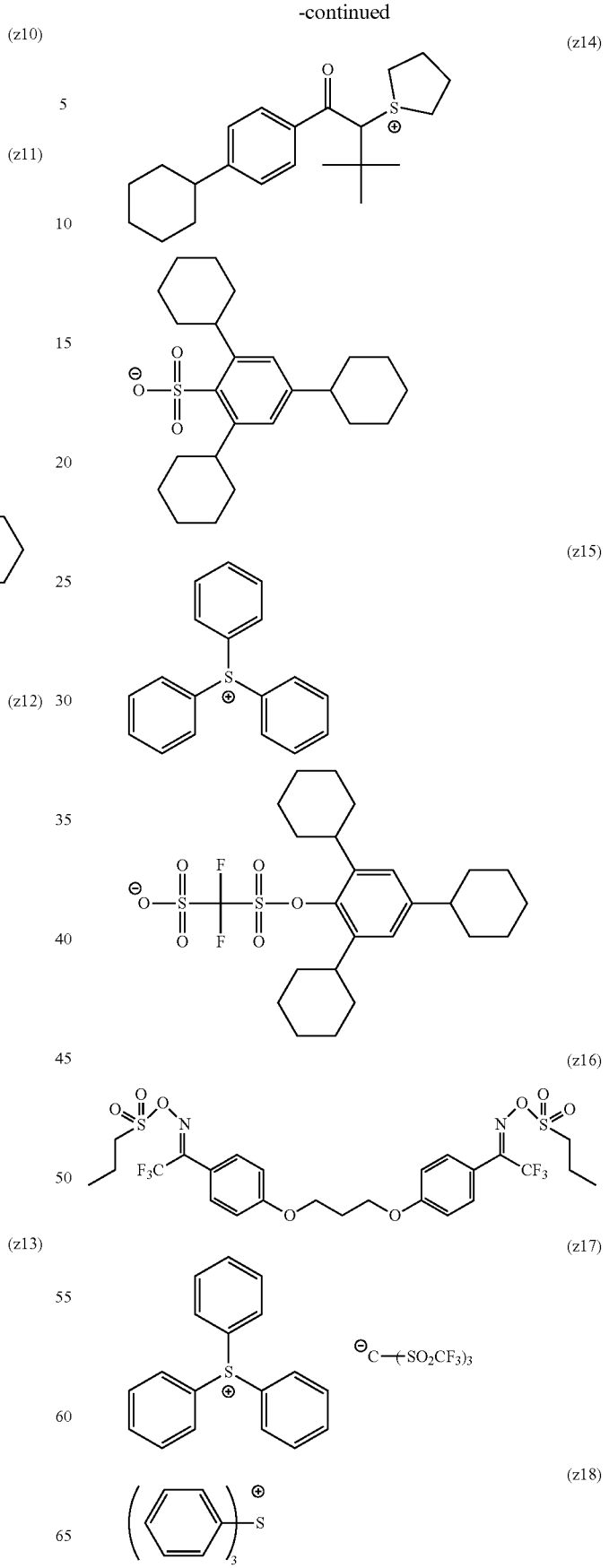

-continued
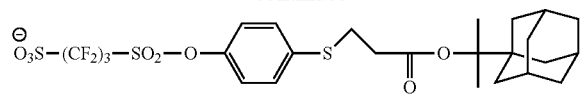
(z19)
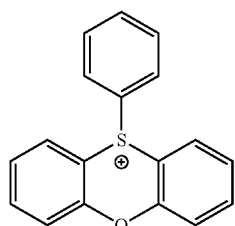
(z20)
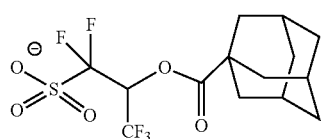
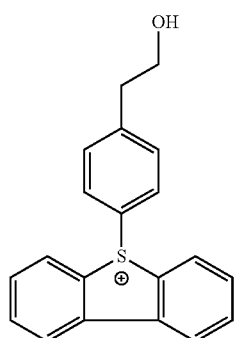
(z21)
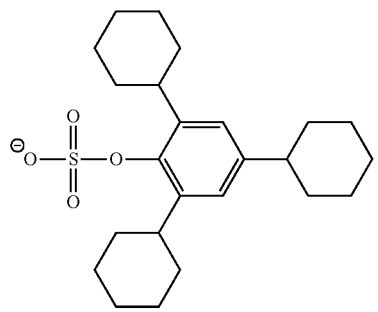
(z22)
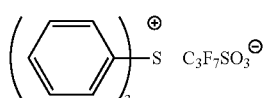
-continued
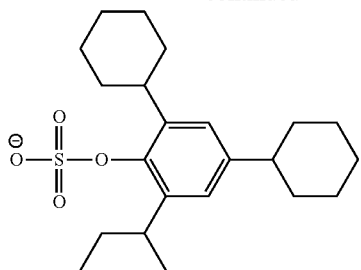
(z23)
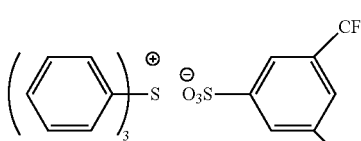
(z24)
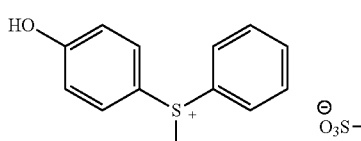
(z25)
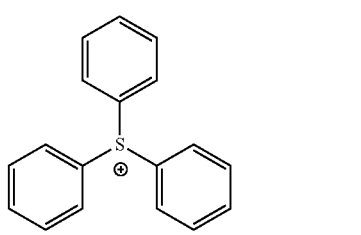
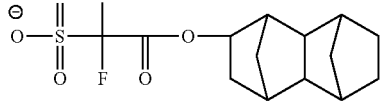
(z26)
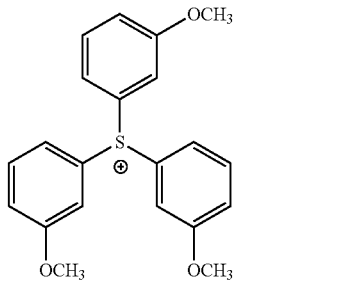

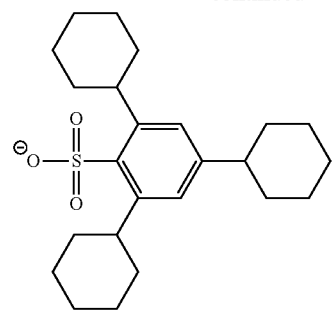
(z27)
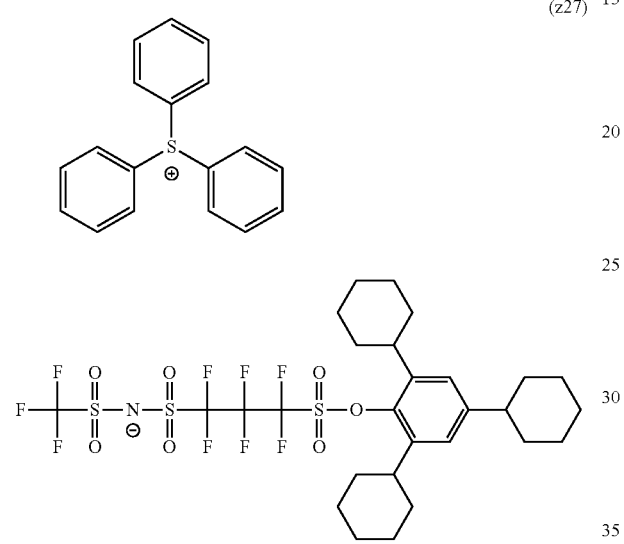
(z28)
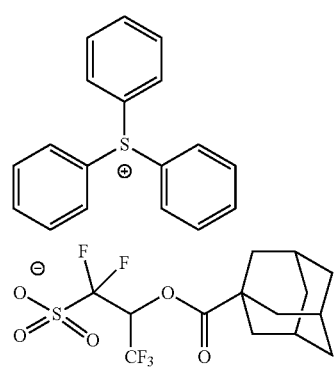
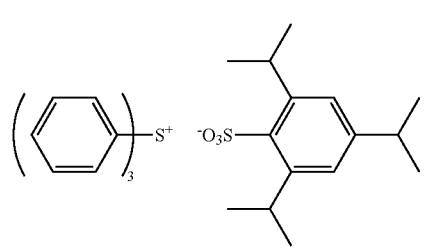
(z29)
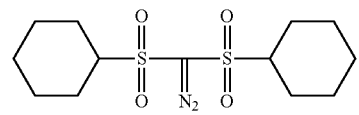
(z30)
B-1
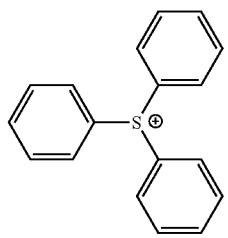
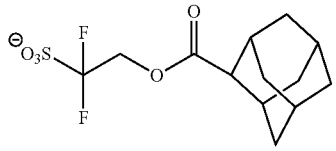
B-2
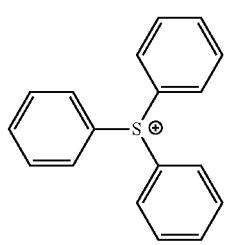
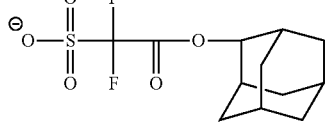
B-3
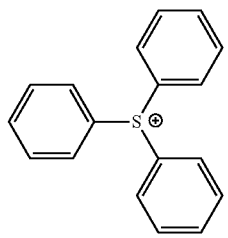
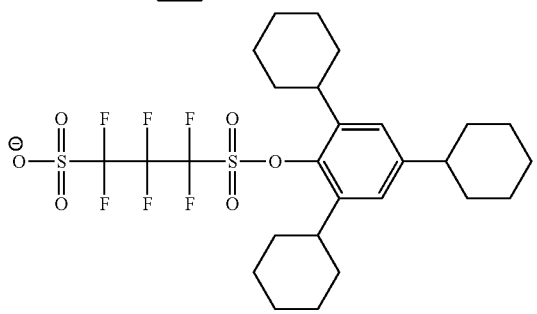
B-4

-continued
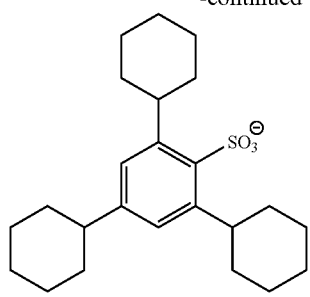
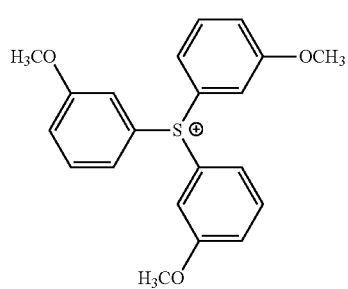
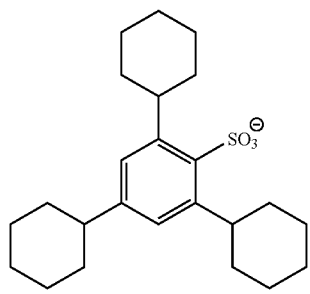
B-6
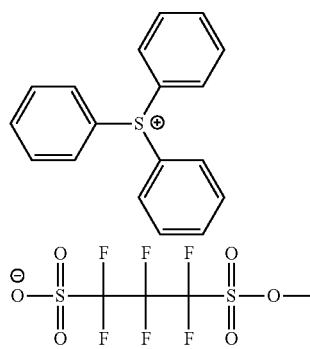
B-7
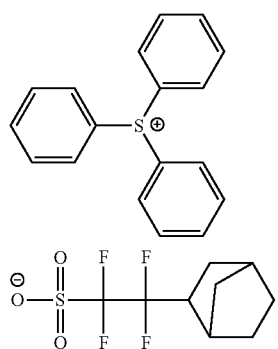
-continued
B-8
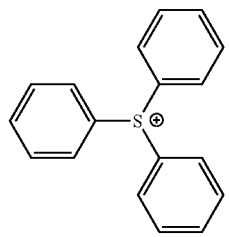
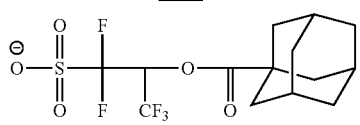
B-9
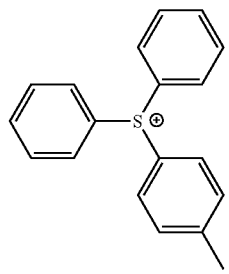
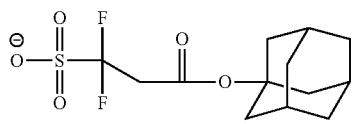
B-10
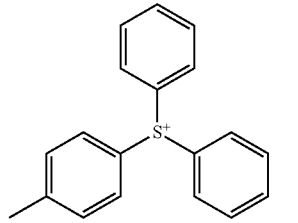
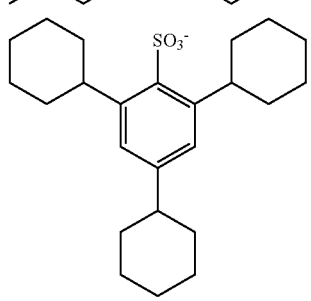
B-11
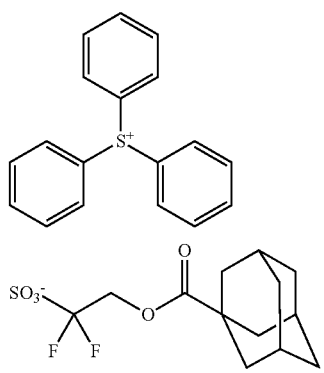

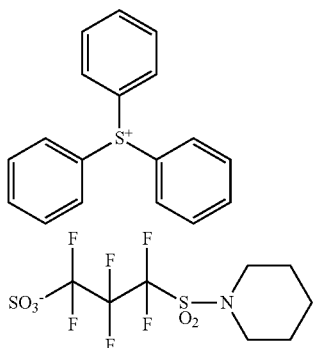

B-12

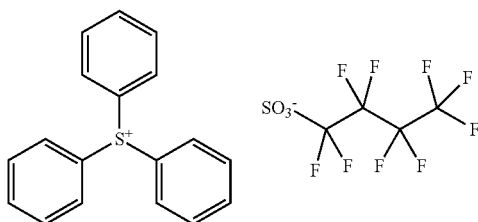

B-13

As the photoacid generator, one kind may be used alone, or two or more kinds may be used in combination.

The content of the photoacid generator in the actinic ray-sensitive or radiation-sensitive resin composition is preferably 0.1 to 50 mass %, more preferably 5 to 50 mass %, and still more preferably 8 to 40 mass % with respect to the total solid content of the composition. In particular, in order to simultaneously realize high sensitivity and high resolution during irradiation of an electron beam or an extreme ultraviolet ray, the content of the photoacid generator is preferably high, more preferably 10 to 40 mass %, and still more preferably 10 to 35 mass %.

[3] Solvent (C)

In order to dissolve the respective components to prepare the actinic ray-sensitive or radiation-sensitive resin composition, a solvent can be used. Examples of the solvent used include an organic solvent such as alkylene glycol monoalkyl ether carboxylate, alkylene glycol monoalkyl ether, alkyl lactate, alkyl alkoxy propionate, cyclic lactone having 4 to 10 carbon atoms, a monoketone compound having 4 to 10 carbon atoms which may include a ring, alkylene carbonate, alkyl alkoxy acetate, or alkyl pyruvate.

Preferable examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferable examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferable examples of the alkyl lactate include methyl lactate, ethyl lactate, propyl lactate, and butyl lactate.

Preferable examples of the alkyl alkoxy propionate include ethyl 3-ethoxypropionate, methyl 3-methoxypropionate, methyl 3-ethoxypropionate, and ethyl 3-methoxypropionate.

Preferable examples of the cyclic lactone having 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

Preferable examples of the monoketone compound having 4 to 10 carbon atoms which may include a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

Preferable examples of the alkylene carbonate include propylene carbonate, vinylene carbonate, ethylene carbonate, and butylene carbonate.

Preferable examples of the alkyl alkoxy acetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferable examples of the alkyl pyruvate include methyl pyruvate, ethyl pyruvate, and propyl pyruvate.

Preferable examples of the solvent which can be used include a solvent having a boiling point of 130° C. or higher at a normal temperature under a normal pressure. Specific examples of the solvent include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the present invention, as the solvent, one kind may be used alone, or two or more kinds may be used in combination.

In the present invention, as the organic solvent, a mixed solvent in which a solvent having a hydroxyl group in a structure is mixed with a solvent having no hydroxyl group may be used.

Examples of the solvent having a hydroxyl group include ethylene glycol, ethylene glycol monomethyl ether, ethylene glycol monoethyl ether, propylene glycol, propylene glycol monomethyl ether, propylene glycol monoethyl ether, and ethyl lactate. Among these, propylene glycol monomethyl ether or ethyl lactate is preferable.

Examples of the solvent having no hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide, and dimethyl sulfoxide. Among these, propylene glycol monomethyl ether acetate, ethyl ethoxypropionate, 2-heptanone, γ-butyrolactone, cyclohexanone, or butyl acetate is more preferable, and propylene glycol monomethyl ether acetate, ethyl ethoxypropionate, 2-heptanone is most preferable.

A mixing ratio (mass) of the solvent having a hydroxyl group to the solvent having no hydroxyl group is preferably 1/99 to 99/1, more preferably 10/90 to 90/10, and still more preferably 20/80 to 60/40 by mass. In particular, a mixed solvent including 50 mass % or higher of the solvent having no hydroxyl group is preferable from the viewpoint of coating uniformity.

It is preferable that the solvent is a mixed solvent including two or more propylene glycol monomethyl ether acetates.

As the solvent, for example, a solvent described in paragraphs "0013" to "0029" of JP2014-219664A can also be used.

[4] Basic Compound (D)

In order to reduce a change in performance with the lapse of time from exposure to heating, it is preferable that the actinic ray-sensitive or radiation-sensitive resin composition includes a basic compound (D).

Preferable examples of the basic compound include compounds having structures represented by the following Formulae (A) to (E).

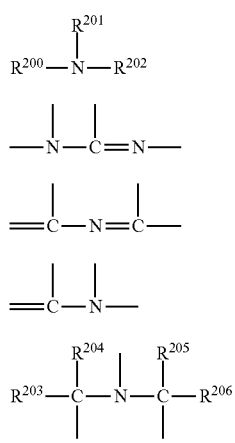

In Formulae (A) and (E), $R^{200}$, $R^{201}$, and $R^{202}$ may be the same as or different from each other and each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms). Here, $R^{201}$ and $R^{202}$ may be bonded to each other to form a ring.

As the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other and each independently represent an alkyl group having 1 to 20 carbon atoms.

It is more preferable that the alkyl group in the Formulae (A) and (E) is unsubstituted.

Examples of a preferable compound include guanidine, aminopyrrolidine, pyrazole, pyrazoline, piperazine, aminomorpholine, aminoalkylmorpholine, and piperidine. Examples of a more preferable compound include a compound having an imidazole structure, a diazabicyclo structure, an onium hydroxide structure, an onium carboxylate structure, a trialkylamine structure, an aniline structure, or a pyridine structure, an alkylamino derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole.

Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene.

As the compound having an onium hydroxide structure, for example, triarylsulfonium hydroxide, phenacyl sulfonium hydroxide, or sulfonium hydroxide having a 2-oxoalkyl group can be used, and specific examples thereof include triphenylsulfonium hydroxide, tris(t-butylphenyl)sulfonium hydroxide, bis(t-butylphenyl)iodonium hydroxide, phenacyl thiophenium hydroxide, and 2-oxopropylthiophenium hydroxide.

As the compound having an onium carboxylate structure, for example, a compound obtained by carboxylation of the anion site of a compound having an omnium hydroxide structure can be used, and examples thereof include acetate, adamantane-1-carboxylate, and perfluoroalkyl carboxylate.

Examples of the compound having trialkylamine structure include tri-(n-butyl)amine and tri-(n-octyl)amine.

Examples of the compound having an aniline structure include 2,6-diisopropylaniline, N,N-dimethylaniline, N,N-dibutylaniline, and N,N-dihexylaniline.

Examples of the alkylamino derivative having a hydroxyl group and/or an ether bond include ethanolamine, diethanolamine, triethanolamine, and tris(methoxyethoxyethyl) amine.

Examples of the aniline derivative having a hydroxyl group and/or an ether bond include N,N-bis(hydroxyethyl) aniline.

Other preferable examples of the basic compound include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. It is more preferable that the amine compound is a tertiary amine compound. In the amine compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the amine compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group (—$CH_2CH_2O$—) or an oxypropylene group (—CH($CH_3$)$CH_2O$— or —$CH_2CH_2CH_2O$—) is preferable, and an oxyethylene group is more preferable.

As the ammonium salt compound, a primary, secondary, tertiary, or quaternary ammonium salt compound can be used, and an ammonium salt compound in which at least one alkyl group is bonded to a nitrogen atom is preferable. In the ammonium salt compound, as long as at least one alkyl group (preferably having 1 to 20 carbon atoms) is bonded to a nitrogen atom, in addition to the alkyl group, a cycloalkyl group (preferably having 3 to 20 carbon atoms) or an aryl group (preferably 6 to 12 carbon atoms) may be bonded to a nitrogen atom.

In addition, it is preferable that the ammonium salt compound has an oxygen atom at an alkyl chain to form an oxyalkylene group. The number of oxyalkylene groups is 1 or more, preferably 3 to 9, and still more preferably 4 to 6 in a molecule. Among the oxyalkylene groups, an oxyethylene group (—$CH_2CH_2O$—) or an oxypropylene group (—CH(CH₃)CH₂O— or —CH₂CH₂CH₂O—) is preferable, and an oxyethylene group is more preferable.

Examples of an anion of the ammonium salt compound include a halogen atom, a sulfonate, a borate, and a phosphate. Among these, a halogen atom or a sulfonate is preferable. As the halogen atom, a chloride, a bromide, or an iodide is preferable. As the sulfonate, an organic sulfonate having 1 to 20 carbon atoms is preferable.

Examples of the organic sulfonate include an alkyl sulfonate having 1 to 20 carbon atoms and an aryl sulfonate. The alkyl group of the alkyl sulfonate may have a substituent, and examples of the substituent include fluorine, chlorine, bromine, an alkoxy group, an acyl group, and an aryl group.

Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate.

Examples of the aryl group of the aryl sulfonate include a benzene ring, a naphthalene ring, and an anthracene ring.

The benzene ring, the naphthalene ring, and the anthracene ring may have a substituent. As the substituent, a linear or branched alkyl group having 1 to 6 carbon atoms or a cycloalkyl group having 3 to 6 carbon atoms is preferable.

Specific examples of the linear or branched alkyl group and the cycloalkyl group include methyl, ethyl, n-propyl, isopropyl, n-butyl, i-butyl, t-butyl, n-hexyl, and cyclohexyl.

Other examples of the substituent include an alkoxy group having 1 to 6 carbon atoms, a halogen atom, cyano, nitro, an acyl group, and an acyloxy group.

The amine compound having a phenoxy group or the ammonium salt compound having a phenoxy group denotes an amine compound or an ammonium salt compound having a phenoxy group at a terminal of an alkyl group opposite to a nitrogen atom. The phenoxy group may have a substituent. Examples of the substituent of the phenoxy group include an alkyl group, an alkoxy group, a halogen atom, a cyano group, a nitro group, a carboxyl group, a carboxylate group, a sulfonate group, an aryl group, an aralkyl group, an acyloxy group, and an aryloxy group. The substitution position of the substituent may be any one of the 2- to 6-position. The number of substituents is 1 to 5.

It is preferable that at least one oxyalkylene group is present between a phenoxy group and a nitrogen atom. The number of oxyalkylene groups is 1 or more, preferably 3 to 9, and still more preferably 4 to 6 in a molecule. Among the oxyalkylene groups, an oxyethylene group (—CH₂CH₂O—) or an oxypropylene group (—CH(CH₃)CH₂O— or —CH₂CH₂CH₂O—) is preferable, and an oxyethylene group is more preferable.

The amine compound having a phenoxy group can be obtained by heating a primary or secondary amine having a phenoxy group and haloalkyl ether to react with each other, adding an aqueous solution of a strong base such as sodium hydroxide, potassium hydroxide, or tetraalkylammonium to the obtained reaction product, and performing extraction with an organic solvent such as ethyl acetate or chloroform. Alternatively, the amine compound having a phenoxy group can be obtained by heating a primary or secondary amine and haloalkyl ether having a phenoxy group at a terminal to react with each other, adding an aqueous solution of a strong base such as sodium hydroxide, potassium hydroxide, or tetraalkylammonium to the obtained reaction product, and performing extraction with an organic solvent such as ethyl acetate or chloroform.

(Compound (PA) having Proton-accepting Functional Group which is decomposed to generate Compound in which Proton Accepting Properties deteriorate, disappear, or change to Acidic Properties when irradiated with Actinic Ray or Radiation) The composition according to the present invention may further include, as a basic compound, a compound [hereinafter, also referred to as "compound (PA)"] having a proton-accepting functional group which is decomposed to generate a compound in which proton accepting properties deteriorate, disappear, or change to acidic properties when irradiated with an actinic ray or radiation.

The proton-accepting functional group denotes a functional group having a group or an electron which can electrostatically interact with a proton, for example, a functional group which has a macrocyclic structure such as cyclic polyether or a functional group which has a nitrogen atom having an unshared electron pair not contributing to n-conjugation. Examples of the nitrogen atom having an unshared electron pair not contributing to x-conjugation include a nitrogen atom having a partial structure represented by the following formula.

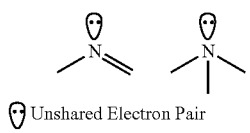

⊖ Unshared Electron Pair

Preferable examples of a partial structure of the proton-accepting functional group include crown ether, azacrown ether, primary to tertiary amine, pyridine, imidazole, and a pyrazine structure.

The compound (PA) is decomposed to generate a compound in which proton accepting properties deteriorate, disappear, or change to acidic properties when irradiated with an actinic ray or radiation. Here, proton accepting properties deteriorating, disappearing, or changing to acidic properties represents a change in proton accepting properties caused by adding a proton to the proton-accepting functional group, and specifically represents that, when a proton adduct is generated using the compound (PA) having a proton-accepting functional group and a proton, an equilibrium constant in the equilibrium constant is reduced.

Specific examples of the compound (PA) include the following compounds. Further, specific examples of the compound (PA) include compounds described in paragraphs "0421" to "0428" of JP2014-41328A and paragraphs "0108" to "0116" of JP2014-134686A, the content of which is incorporated herein by reference.

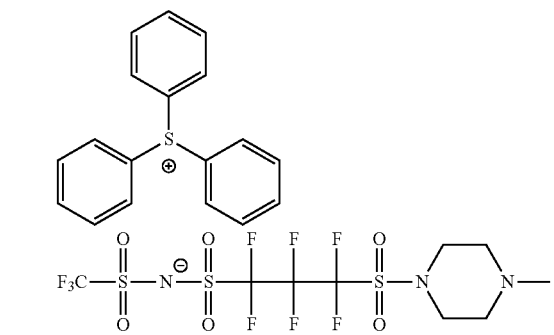

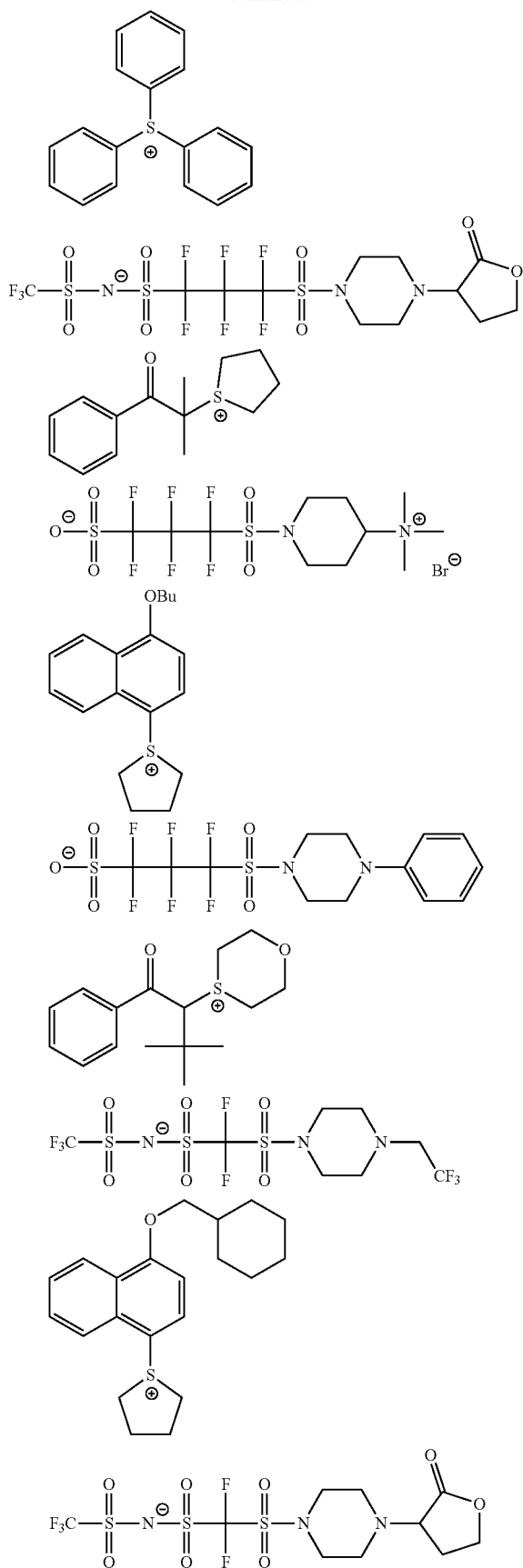
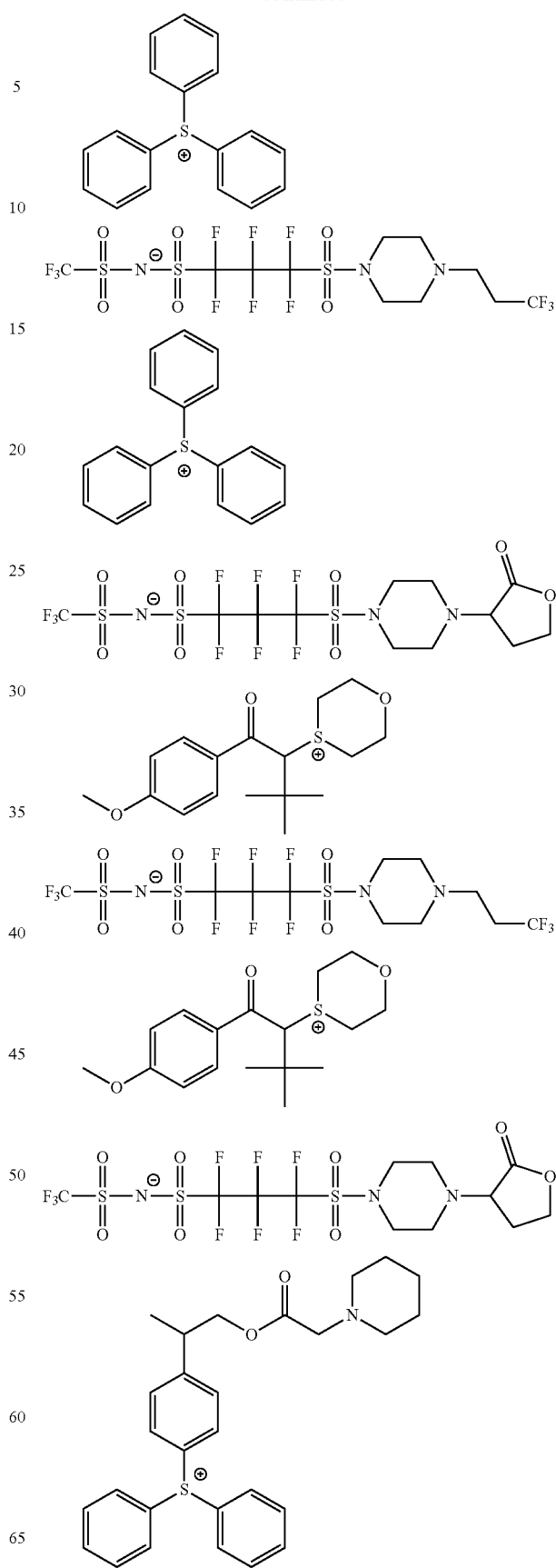

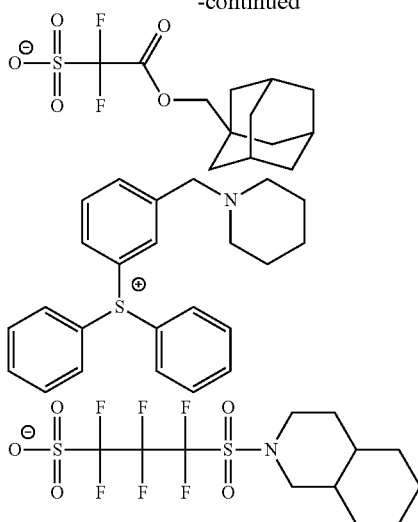

Among the basic compounds, one kind may be used alone, or two or more kinds may be used in combination.

The amount of the basic compound used is typically 0.001 to 10 mass % and preferably 0.01 to 5 mass % with respect to the solid content of the actinic ray-sensitive or radiation-sensitive resin composition.

It is preferable that a ratio (molar ratio; photoacid generator/basic compound) of the photoacid generator used to the basic compound used in the composition is 2.5 to 300. That is, the molar ratio is preferably 2.5 or higher from the viewpoints of sensitivity and resolution, and is preferably 300 or lower from the viewpoint of suppressing deterioration in resolution caused by thickening of a resist pattern with the lapse of time until a heating treatment after exposure. The molar ratio (photoacid generator/basic compound) is more preferably 5.0 to 200 and still more preferably 7.0 to 150.

As the basic compound, for example, a compound (for example, an amine compound, an amido group-containing compound, a urea compound, or a nitrogen-containing heterocyclic compound) described in paragraphs "0140" to "0144" of JP2013-11833A can be used.

[5] Hydrophobic Resin (A') The actinic ray-sensitive or radiation-sensitive resin composition may include a hydrophobic resin (A') in addition to the resin (A).

It is preferable that the hydrophobic resin is designed to be localized on a surface of a resist film. Unlike the surfactant, the hydrophobic resin does not necessarily have a hydrophilic group in a molecule and does not necessarily contribute to uniform mixing with a polar/non-polar material.

Examples of an effect obtained by the addition of the hydrophobic resin include an effect of suppressing a static/dynamic contact angle of a resist film surface with respect to water and an effect of suppressing out gas.

From the viewpoint of localization on the film surface layer, the hydrophobic resin includes preferably one or more kinds and more preferably two or more kinds among "a fluorine atom", "a silicon atom", and "a $CH_3$ partial structure included in a side chain of the resin". In addition, it is preferable that the hydrophobic resin includes a hydrocarbon group having 5 or more carbon atoms. These groups may be present at a main chain of the resin or may be substituted with a side chain.

In a case where the hydrophobic resin includes a fluorine atom and/or a silicon atom, the fluorine atom and/or the silicon atom in the hydrophobic resin may be present at a main chain or a side chain of the resin.

In a case where the hydrophobic resin includes a fluorine atom, it is preferable that a partial structure having a fluorine atom is a resin that has an alkyl group having a fluorine atom, a cycloalkyl group having a fluorine atom, or an aryl group having a fluorine atom.

The alkyl group having a fluorine atom (preferably having 1 to 10 carbon atoms and more preferably having 1 to 4 carbon atoms) is a linear or branched alkyl group in which at least one hydrogen atom is substituted with a fluorine atom and may further have a substituent other than a fluorine atom.

The cycloalkyl group having a fluorine atom is a monocyclic or polycyclic cycloalkyl group in which at least one hydrogen atom is substituted with a fluorine atom and may further have a substituent other than a fluorine atom.

Examples of the aryl group having a fluorine atom include an aryl group, such as a phenyl group or a naphthyl group, in which at least one hydrogen atom is substituted with a fluorine atom. The aryl group having a fluorine atom may further have a substituent other than a fluorine atom.

Examples of a repeating unit having a fluorine atom or a silicon atom include a repeating unit described in paragraph "0519" of US2012/0251948A$_1$.

In addition, as described above, it is preferable that the hydrophobic resin includes a $CH_3$ partial structure at a side chain.

Here, examples of the $CH_3$ partial structure included at a side chain of the hydrophobic resin include a $CH_3$ partial structure such as an ethyl group or a propyl group.

On the other hand, a methyl group (for example, an α-methyl group of a repeating unit having a methacrylic acid structure) which is directly bonded to a main chain of the hydrophobic resin has little contribution to the surface localization of the hydrophobic resin caused by the effect of the main chain, and thus is not included in examples of the $CH_3$ partial structure according to the present invention.

The details of the hydrophobic resin can be found in paragraphs "0348" to "0415" of JP2014-010245A, the content of which is incorporated herein by reference.

As the hydrophobic resin, resins described in JP2011-248019A, JP2010-175859A, and JP2012-032544A can also be preferably used.

[6] Surfactant (F) The actinic ray-sensitive or radiation-sensitive resin composition may further include a surfactant (F). By the actinic ray-sensitive or radiation-sensitive resin composition including the surfactant, particularly in a case where an exposure light source having a wavelength of 250 nm or shorter, in particular, 220 nm or shorter is used, a pattern having adhesiveness and reduced development defects can be formed with high sensitivity and resolution.

As the surfactant, a fluorine surfactant and/or a silicon surfactant is preferably used.

Examples of the fluorine surfactant and/or the silicon surfactant include surfactants described in paragraph "0276" of US2008/0248425A. In addition, F-TOP EF301 or EF303 (manufactured by Shin-akita Chemical Co., Ltd.); FLUORAD FC430, 431 or 4430 (manufactured by Sumitomo 3M Ltd.); MEGAFACE F171, F173, F176, F189, F113, F110, F177, F120, or R$_{08}$ (manufactured by DIC Corporation); SURFLON S-382, SC101, 102, 103, 104, 105, or 106 (manufactured by Asahi Glass Co., Ltd.); TROYSOL S-366 (manufactured by Troy Corporation); GF-300 or GF-150 (manufactured by Toagosei Co., Ltd.); SURFLON S-393

(manufactured by AGC Seimi Chemical Co., Ltd.); F-TOP EF121, EF122A, EF122B, RF122C, EF125M, EF135M, EF351, EF352, EF801, EF802, or EF601 (manufactured by Gemco Inc.); PF636, PF656, PF6320, or PF6520 (manufactured by OMNOVA Corp.); or FTX-204G, 208G, 218G, 230G, 204D, 208D, 212D, 218D, or 222D (manufactured by Neos Co., Ltd.) may be used. A polysiloxane polymer KP-341 (manufactured by Shin-Etsu Chemical Co., Ltd.) can also be used as the silicon surfactant.

In addition, in addition to the above-described surfactants, a surfactant may be synthesized using a fluoro aliphatic compound manufactured using a telomerization method (also referred to as a telomer method) or an oligomerization method (also referred to as an oligomer method). Specifically, a polymer including a fluoro aliphatic group derived from fluoro aliphatic compound may be used as the surfactant. This fluoro aliphatic compound can be synthesized, for example, using a method described in JP2002-90991A.

In addition, a surfactant other than a fluorine surfactant and/or a silicon surfactant which is described in paragraph "0280" of US2008/0248425A may be used.

Among these surfactants, one kind may be used alone, or two or more kinds may be used in combination.

In a case where the actinic ray-sensitive or radiation-sensitive resin composition includes the surfactant, the content of the surfactant is preferably 0 to 2 mass %, more preferably 0.0001 to 2 mass %, and still more preferably 0.0005 to 1 mass % with respect to the total solid content of the composition.

[7] Other Additives

The actinic ray-sensitive or radiation-sensitive resin composition may further include a dissolution inhibiting compound, a dye, a plasticizer, a photosensitizer, a light absorber, and/or a compound for promoting solubility in the developer (for example, a phenol compound having a molecular weight of 1000 or lower, or an aliphatic or alicyclic compound having a carboxy group).

The actinic ray-sensitive or radiation-sensitive resin composition may further include a dissolution inhibiting compound. Here, "dissolution inhibiting compound" denotes a compound having a molecular weight of 3000 or lower which is decomposed by the action of an acid such that the solubility in the organic developer decreases.

<Upper Layer Film (Top Coat Film)>

In the pattern forming method according to the present invention, an upper layer film (top coat film) may be formed over the resist film.

It is preferable that the upper layer film is not mixed with the resist film and is uniformly formed above the resist film.

The upper layer film is not particularly limited, and well-known upper layer film of the related art can be formed using a well-known method of the related art. For example, the upper layer film can be formed based on the description of paragraphs "0072" to "0082" of JP2014-059543A.

The upper layer film may be formed using an upper layer film-forming composition. As the resin of the upper layer film-forming composition, for example, a polymer described in paragraph "0072" of JP2014-059543A or a hydrophobic resin can be used.

The hydrophobic resin which may be included in the upper layer film-forming composition may be the same as the hydrophobic resin which may be included in the actinic ray-sensitive or radiation-sensitive resin composition (for example, the above-described hydrophobic resin (A')).

The details of the hydrophobic resin can be found in paragraphs "0017" to "0023" of JP2013-61647A (corresponding to paragraphs "0017" to "0023" of US2013/ 244438A) and in paragraphs "0016" to "0165" of JP2014-56194A, the content of which is incorporated herein by reference.

It is preferable that the upper layer film-forming composition includes a resin that includes a repeating unit having an aromatic ring. By the upper layer film-forming composition including the repeating unit having an aromatic ring, in particular, during exposure of an electron beam or an EUV ray, the generation efficiency of secondary electrons and the generation of efficiency of an acid from the compound which generates an acid by actinic ray or radiation are improved, and an effect of improving sensitivity and resolution during the formation of a pattern can be expected.

The weight-average molecular weight of the resin which may be included in the upper layer film-forming composition is preferably 3000 to 100000, more preferably 3000 to 30000, and most preferably 5000 to 20000. The mixing amount of the resin in the upper layer film-forming composition is preferably 50 to 99.9 mass %, more preferably 60 to 99.0 mass %, still more preferably 70 to 99.7 mass %, and even still more preferably 80 to 99.5 mass % with respect to the total solid content.

In a case where the upper layer film-forming composition (top coat composition) includes a plurality of resins, it is preferable that upper layer film-forming composition includes at least one resin (XA) having a fluorine atom and/or a silicon atom.

Regarding a preferable range of the content of the fluorine atom and the silicon atom included in the resin (XA), the content of a repeating unit having a fluorine atom and/or a silicon atom in the resin (XA) is preferably 10 to 100 mass %, more preferably 10 to 99 mol %, and still more preferably 20 to 80 mol %.

In addition, it is more preferable that the upper layer film-forming composition includes at least one resin (XA) having a fluorine atom and/or a silicon atom and a resin (XB) in which the content of a fluorine atom and/or a silicon atom is lower than that of the resin (XA). As a result, during the formation of the upper layer film, the resin (XA) is eccentrically present on the surface of the upper layer film. Therefore, the performance such as developing characteristics or followability of immersion liquid can be improved.

The content of the resin (XA) is preferably 0.01 to 30 mass %, more preferably 0.1 to 10 mass %, still more preferably 0.1 to 8 mass %, and even still more preferably 0.1 to 5 mass % with respect to the total solid content of the upper layer film-forming composition. The content of the resin (XB) is preferably 50.0 to 99.9 mass %, more preferably 60 to 99.9 mass %, still more preferably 70 to 99.9 mass %, and even still more preferably 80 to 99.9 mass % with respect to the total solid content of the upper layer film-forming composition.

It is preferable that the resin (XB) does not substantially include a fluorine atom and a silicon atom. In this case, specifically, the total content of a repeating unit having a fluorine atom and a repeating unit having a silicon atom is preferably 0 to 20 mol %, more preferably 0 to 10 mol %, still more preferably 0 to 5 mol %, even still more preferably 0 to 3 mol %, and ideally 0 mol % (that is, a fluorine atom and a silicon atom are not included) with respect to all the repeating units of the resin (XB).

In addition, it is preferable that the upper layer film-forming composition includes a compound which includes at least one group or one bond selected from the group consisting of an ether bond, a thioether bond, a hydroxyl group, a thiol group, a carbonyl bond, and an ester bond.

Further, the upper layer film-forming composition may include a photoacid generator. As the photoacid generator, the same photoacid generator (for example, the above-described photoacid generator (B)) which may be included in the actinic ray-sensitive or radiation-sensitive resin composition can be used.

It is preferable that the respective components of the upper layer film-forming composition are dissolved in a solvent and are filtered through a filter. As the filter, a filter formed of polytetrafluoroethylene, polyethylene, or nylon and having a pore size of preferably 0.1 µm or less, more preferably 0.05 µm or less, and still more preferably 0.03 µm or less is preferable. A plurality of filters may be connected in series or in parallel. In addition, the composition may be filtered multiple times, and a step of filtering various materials multiple times may be a cycle filtration step. Further, before and after the filter filtration, degassing or the like may be performed on the composition. It is preferable that the upper layer film-forming composition does not include impurities such as metal. The content of the metal components in the materials is preferably 10 ppm or lower, more preferably 5 ppm or lower, and still more preferably 1 ppm or lower, and it is still most preferable that the materials do not substantially include the metal components (the measured value is lower than a detection limit value of a measuring device).

In a case where immersion exposure is performed in the exposure step, the upper layer film is disposed between the actinic ray-sensitive or radiation-sensitive film and functions as a layer that prevents direct contact between the actinic ray-sensitive or radiation-sensitive film and the immersion liquid. In this case, preferable characteristics of the upper layer film (upper layer film-forming composition) include suitability for application to the actinic ray-sensitive or radiation-sensitive film, transparency to radiation, particularly, light at 193 nm, and insolubility in the immersion liquid (preferably water). In addition, it is preferable that the upper layer film is uniformly applied to the surface of the actinic ray-sensitive or radiation-sensitive film without being mixed with the actinic ray-sensitive or radiation-sensitive film.

In order to uniformly apply the upper layer film-forming composition to the surface of the actinic ray-sensitive or radiation-sensitive film without dissolving the actinic ray-sensitive or radiation-sensitive film, it is preferable that the upper layer film-forming composition includes a solvent in which the actinic ray-sensitive or radiation-sensitive film is not soluble. As the solvent in which the actinic ray-sensitive or radiation-sensitive film is not soluble, it is more preferable that a solvent having different components from those of a developer (organic developer) including an organic solvent is used.

An application method of the upper layer film-forming composition is not particularly limited, and a spin coating method, a spray coating method, a roller coating method, or a dipping method that is well-known in the related art can be used.

The thickness of the upper layer film is not particularly limited, and from the viewpoint of transparency to an exposure light source, is typically 5 nm to 300 nm, preferably 10 nm to 300 nm, more preferably 20 nm to 200 nm, and still more preferably 30 nm to 100 nm.

After the formation of the upper layer film, the substrate is optionally heated (PB).

From the viewpoint of resolution, it is preferable that the refractive index of the upper layer film is close to the refractive index of the actinic ray-sensitive or radiation-sensitive film.

It is preferable that the upper layer film is insoluble in the immersion liquid, and it is more preferable that the upper layer film is insoluble in water.

From the viewpoint of followability of immersion liquid, the receding contact angle (23° C.) of the immersion liquid on the upper layer film is preferably 50 to 100 degrees and more preferably 80 to 100 degrees.

During the immersion exposure, it is necessary that the immersion liquid moves on a wafer following a movement of an exposure head that scans the wafer with high speed to form an exposure pattern. Therefore, the contact angle of the immersion liquid on the actinic ray-sensitive or radiation-sensitive film in a dynamic state is important, and it is preferable that the receding contact angle is in the above-described range in order to obtain higher resist performance.

<Coloring Curable Resin Composition>

Next, the coloring curable resin composition used in the pattern forming method according to the present invention will be described in detail. The coloring curable resin composition is used for a resist for a color filter (hereinafter, also referred to as "color resist").

As the color resist, specifically, RGB 5000 series/6000 series (trade name) or CMY 3000 series (trade name) manufactured by Fuji Film Co., Ltd. can be suitably used. In addition, the details of the color resist can be found in JP5274680B, JP5283747B, JP05334624B, JP05339781B, JP05340102B, JP05344843B, JP5355069B, JP5367060B, JP5371313B, JP5371449B, JP5374189B, JP5398586B, JP5448352B, and JP5448416B, the contents of which are incorporated herein by reference.

Hereinafter, an example of materials and a method for forming the color filter will be described in detail.

Each pixel of the color filter can be formed by curing the following coloring curable resin composition. Examples of the coloring curable resin composition include a composition including an alkali-soluble resin, a polymerizable compound, a polymerization initiator, and a colorant.

[1] Alkali-Soluble Resin

As the alkali-soluble resin, an alkali-soluble resin having at least one group for promoting alkali solubility in a molecule is preferable. From the viewpoint of heat resistance, a polyhydroxystyrene resin, a polysiloxane resin, an acrylic resin, an acrylamide resin, or an acryl/acrylamide copolymer resin is preferable. From the viewpoint of controlling developability, an acrylic resin, an acrylamide resin, or an acryl/acrylamide copolymer resin is preferable. Examples of the group for promoting alkali solubility (hereinafter, also referred to as the acidic group) include a carboxy group, a phosphate group, a sulfonate group, and a phenolic hydroxyl group. A group that is soluble in an organic solvent and is developable with a weakly alkaline aqueous solution is preferable, and (meth)acrylic acid is more preferable. Among these acidic groups, one kind may be used alone, or two or more kinds may be used in combination.

As the alkali-soluble resin, a polymer having a carboxy group at a main chain or a side chain is preferable. Specific examples of the alkali-soluble resin include: an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac type resin; an acidic cellulose derivative having a carboxylic acid at a side chain thereof; and a resin obtained by adding an acid anhydride to a polymer having a hydroxyl group. In particular, a copolymer of (meth)acrylic acid and another monomer which is copolymerizable with the (meth)acrylic acid is preferable. Examples of the monomer which is copolymerizable with the (meth)acrylic acid include an alkyl (meth)acrylate, an aryl (meth)acrylate, and a vinyl compound. Examples of the alkyl (meth)acrylate and the (meth) acrylate include methyl (meth)acrylate, ethyl (meth)acrylate, propyl (meth)acrylate, n-butyl (meth)acrylate, isobutyl (meth)acrylate, (iso)pentyl (meth)acrylate, 2-hydroxyethyl (meth)acrylate, 2-hydroxypropyl (meth)acrylate, hexyl (meth)acrylate, octyl (meth)acrylate, phenyl (meth)acrylate, benzyl (meth)acrylate, tolyl (meth)acrylate, naphthyl (meth) acrylate, and cyclohexyl (meth)acrylate. Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer copolymer described in JP1998-300922A (JP-H10-300922) include N-phenylmaleimide and N-cyclohexylmaleimide.

As the alkali-soluble resin, an alkali-soluble resin having a polymerizable group is also preferable. As the polymerizable group, an ethylenically unsaturated bonding group can be used. Specifically, a (meth)acryloyl group or a vinyl group is preferable, and a (meth)acryloyl group is more preferable. As the acrylic polymer, a vinyl polymer which includes a repeating unit derived from one or more of (meth)acrylic acid, (meth)acrylic acid ester, and a (meth) acrylamide is preferable.

The polymerizable alkali-soluble resin can be synthesized using a synthesis method described in paragraphs "002T" to "0057" of JP2003-262958A. In particular, it is preferable that the synthesis is performed using a synthesis method 1 described in the same document. The details of exemplary compounds can be found in compounds described in paragraphs "0058" to "0061" of JP2003-262958A, the content of which is incorporated herein by reference. Specific examples of the compound include the following compound (Resin P-1) (weight-average molecular weight: 14000).

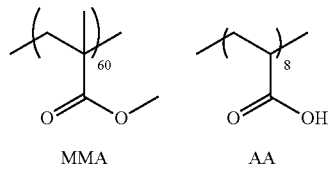

MMA           AA

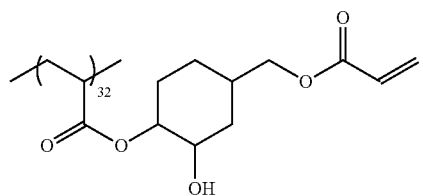

It is also preferable that the alkali-soluble resin is polymers represented by the following Formulae.

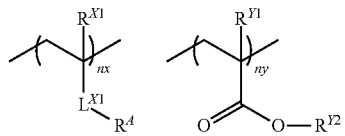

$L^{X1}$ represents a single bond or a linking group. Examples of the linking group include the above-described linking group L. Among these, a single bond is preferable.

$R^{X1}$ and $R^{Y1}$ each independently represent a hydrogen atom, a methyl group, an ethyl group, a propyl group, or a cyano group, and preferably a hydrogen atom or a methyl group.

$R^A$ represents an acidic group. Preferable aspects of the groups are as described above.

$R^{Y2}$ represents a substituent. In particular, an alkyl group (having preferably 1 to 12 carbon atoms, more preferably 1 to 6 carbon atoms, and still more preferably 1 to 3 carbon atoms), an aryl group (having preferably 6 to 22 carbon atoms, more preferably 6 to 14 carbon atoms, and still more preferably 6 to 10 carbon atoms), or an aralkyl group (having preferably 7 to 23 carbon atoms, more preferably 7 to 15 carbon atoms, and still more preferably 7 to 11 carbon atoms) is preferable. These groups may further have a substituent, and examples of the substituent include a hydroxyl group and a carboxy group.

nx and ny each independently represent a molar fraction, and nx+ny may be less than 1 (which represents that another repeating unit may be included) but is preferably 1. The lower limit of nx is preferably 0.05 or more, more preferably 0.1 or more, and still more preferably 0.2 or more. The upper limit of nx is preferably 0.7 or less, more preferably 0.6 or less, and still more preferably 0.5 or less. The lower limit of ny is preferably 0.3 or more, more preferably 0.4 or more, and still more preferably 0.6 or more. The upper limit of ny is preferably 0.9 or less and more preferably 0.8 or less.

It is preferable that the alkali-soluble resin is soluble in a tetramethylammonium hydroxide (TMAH) aqueous solution having a concentration of 0.1 mass % or higher at 23° C. Further, it is more preferable that the alkali-soluble resin is soluble in a TMAH aqueous solution of 1 mass % or higher, and it is still more preferable that the alkali-soluble resin is soluble in a TMAH aqueous solution of 2 mass % or higher.

The acid value of the alkali-soluble resin is preferably 30 to 200 mgKOH/g and more preferably 70 to 120 mgKOH/g. In the above-described range, the amount of development residues in a non-exposed portion can be effectively reduced.

The weight-average molecular weight (Mw) of the alkali-soluble resin is preferably 2000 to 50000 and more preferably 7000 to 20000.

The content of the alkali-soluble resin is preferably 10 to 50 mass %, more preferably 15 to 40 mass %, and still more preferably 20 to 35 mass % with respect to the total solid content of the coloring curable resin composition.

As the alkali-soluble resin, one kind may be used alone, or two or more kinds may be used in combination.

[2] Polymerizable Compound

The polymerizable compound is not particularly limited as long as it is a compound having a polymerizable group in a molecule. In particular, a monomer having an ethylenically unsaturated double bond (hereinafter, also referred to as "specific monomer") is preferable. It is preferable that the specific monomer is a polyfunctional monomer.

As the specific monomer, one kind may be used alone, or two or more kinds may be used in combination.

As the specific monomer, a (meth)acrylate monomer is preferable. As specific examples of the compounds, compounds described in paragraphs "0095" to "0108" of JP2009-288705A can be preferably used in the embodiment. It is preferable that the specific monomer is represented by any one of the following Formulae (MO-1) to (MO-6).

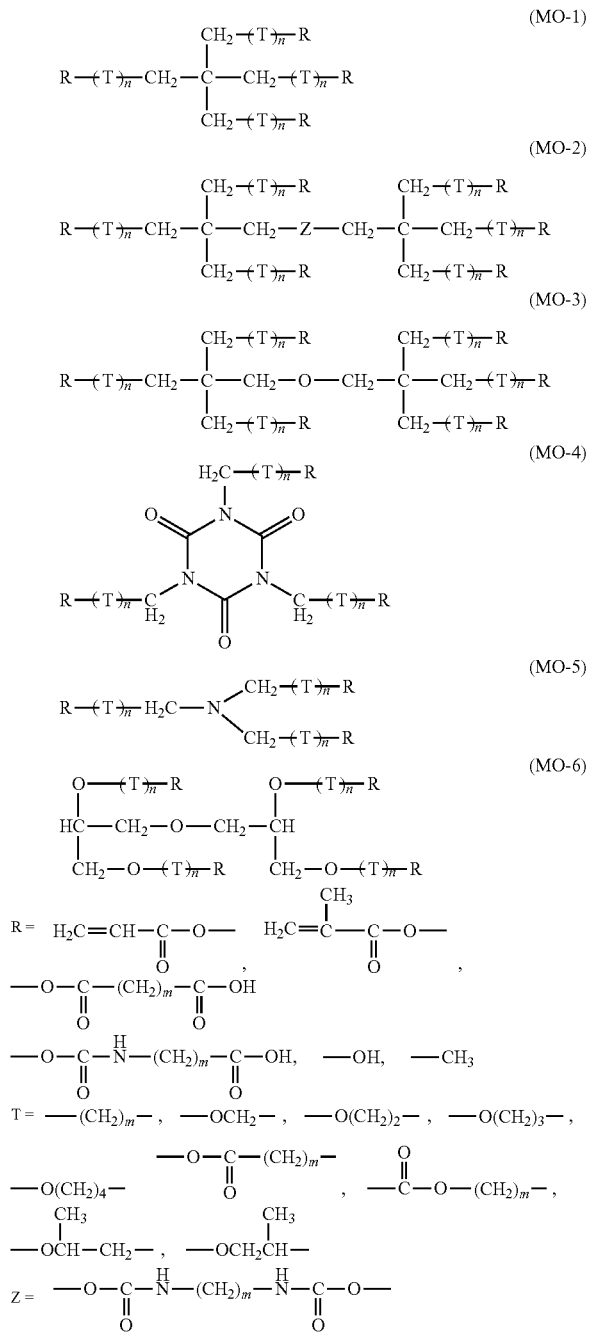

In the formulae, n's each independently represent 0 to 14, m's each independently represent 1 to 8. A plurality of R's, a plurality of T's, and a plurality of Z's which are present in one molecule may be the same as or different from each other. In a case where T represents an oxyalkylene group, a terminal thereof on a carbon atom side is bonded to R. At least one of R's represents a polymerizable group.

n represents preferably 0 to 5 and more preferably 1 to 3.
m represents preferably 1 to 5 and more preferably 1 to 3.

Specific examples of the polymerizable compounds represented by Formula (MO-1) to (MO-6) which are preferably used in the embodiment include compounds described in paragraphs "0248" to "0251" of JP2007-269779A.

In particular, as the polymerizable compound, dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), dipentaerythritol hexa(meth)acrylate (KAYARAD DPHA as a commercially available product; manufactured by Nippon Kayaku Co., Ltd.), a structure in which these (meth)acryloyl group is bonded through an ethylene glycol or a propylene glycol residue, or diglycerin ethylene oxide (EO)-modified (meth)acrylate (as a commercially available product, M-460 manufactured by Toagosei Co., Ltd.) is preferable. Oligomers of the above-described examples can be used.

The molecular weight of the polymerizable compound is not particularly limited and is preferably 300 to 1500 and more preferably 400 to 700.

The content of the polymerizable compound is preferably 1 mass % to 50 mass %, more preferably 3 mass % to 40 mass %, and still more preferably 5 mass % to 30 mass % with respect to the total solid content of the composition. In the above-described range, the refractive index or transparency does not excessively decrease, and curing properties are excellent, which is preferable. As the polymerizable compound, one kind may be used alone, or two or more kinds may be used in combination.

[3] Polymerization Initiator

The photopolymerization initiator is not particularly limited and can be appropriately selected from well-known photopolymerization initiators. For example, a compound having photosensitivity to light in a range from the ultraviolet range to the visible range is preferable. It is preferable that the photopolymerization initiator is a photoradical polymerization initiator. In addition, it is preferable that the photopolymerization initiator is at least one compound having a molar absorption coefficient of at least about 50 in a wavelength range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, as the photopolymerization initiator, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable. Examples of the α-aminoketone compound include 2-methyl-1-phenyl-2-morpholinopropan-1-one, 2-methyl-1-[4-(hexyl)phenyl]-2-morpholinopropan-1-one, 2-ethyl-2-dimethylamino-1-(4-morpholinophenyl)-butanone-1,2-benzyl-2-dimethylamino-1-(4-morpholinophenyl)-butanone-1, and 2-(dimethylamino)-2-[(4-methylphenyl)methyl]-1-[4-(4-morpholinyl)phenyl]-1-butanone. Examples of a commercially available product of the α-aminoketone compound include IRGACURE 907, IRGACURE 369, and IRGACURE 379 (trade name, all of which are manufactured by BASF SE). Examples of a commercially available product of the α-hydroxyketone compound include IRGACURE-184, DAROCUR-1173, IRGACURE-500, IRGACURE-2959, and IRGACURE-127 (trade name, all of which are manufactured by BASF SE). Examples of a commercially available product of the acylphosphine compound include IRGACURE 819 and IRGACURE TPO (trade name, all of which are manufactured by BASF SE).

As the photopolymerization initiator, an oxime compound can also be preferably used. Specific examples of the oxime compound include a compound described in JP2001-233842A, a compound described in JP2000-80068A, a compound described in JP2006-342166A, and a compound described in JP2016-21012A.

Examples of the oxime compound which can be preferably used include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminopentane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A. As a commercially available product of the oxime compound, IRGACURE-OXE01, IRGACURE-OXE02, IRGACURE-OXE03, or IRGACURE-OXE04 (all of which are manufactured by BASF SE) can also be preferably used. In addition, TR-PBG-304 (manufactured by Changzhou Tronly New Electronic Materials Co., Ltd.), ADEKA ARKLS NCI-930 (manufactured by Adeka Corporation), ADEKA OPTOMER N-1919 (manufactured by Adeka Corporation, a photopolymerization initiator 2 described in JP2012-14052A) can also be used.

In addition, in addition to the above-described oxime compounds, for example, a compound described in JP2009-519904A in which oxime is linked to a N-position of carbazole, a compound described in U.S. Pat. No. 7,626,957B in which a hetero substituent is introduced into the benzophenone site, a compound described in JP2010-15025A or US2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays, or a compound described in paragraphs "0076" to "0079" of JP2014-137466A may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

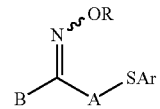

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may be further substituted with another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable. These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

As the photopolymerization initiator, for example, an oxime compound having a fluorene ring can also be used. Specific examples of the oxime compound having a fluorene ring include a compound described in JP2014-137466A. The content is incorporated herein by reference.

As the photopolymerization initiator, for example, an oxime compound having a fluorine atom can also be used. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

As the photopolymerization initiator, for example, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to 0025" of JP4223071B, and ADEKA ARKLS NCI-831 (manufactured by Adeka Corporation).

As the photopolymerization initiator, for example, an oxime compound having a benzofuran skeleton can also be used. Specific examples include OE-01 to OE-75 described in WO2015/036910A.

Hereinafter, specific examples of the oxime compound which are preferably used will be shown below, but the present invention is not limited thereto.

(C-1)

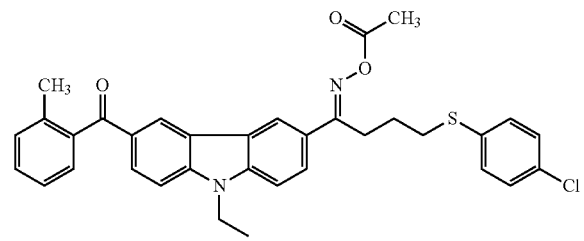

(C-2)

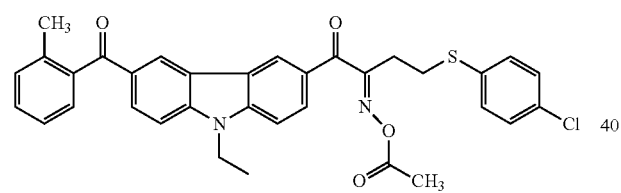

(C-3)

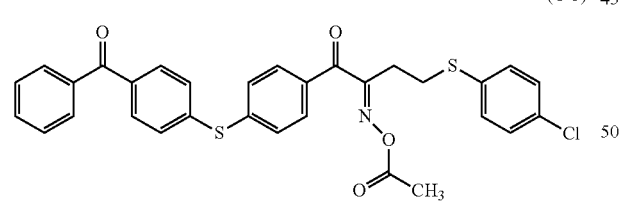

(C-4)

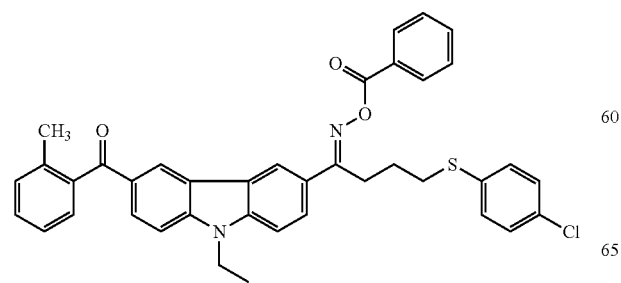

(C-5)

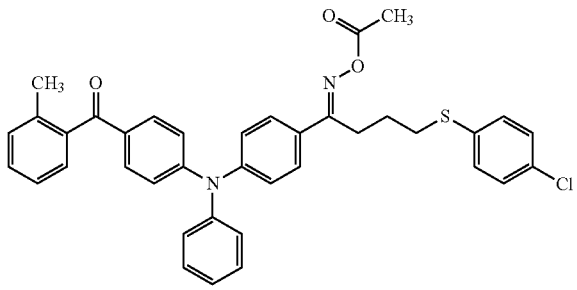

(C-6)

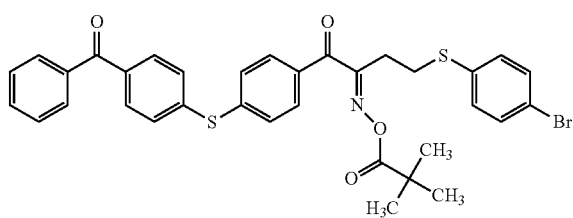

(C-7)

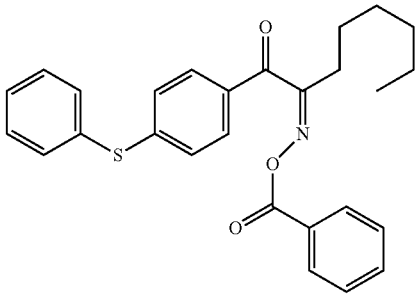

(C-8)

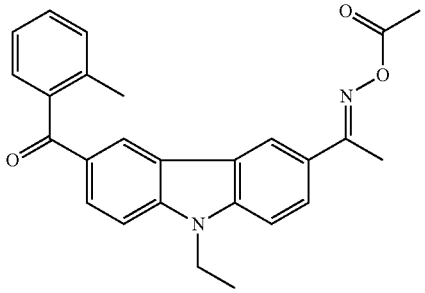

(C-9)

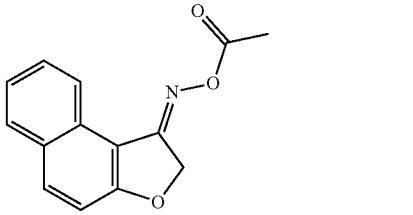

(C-10)
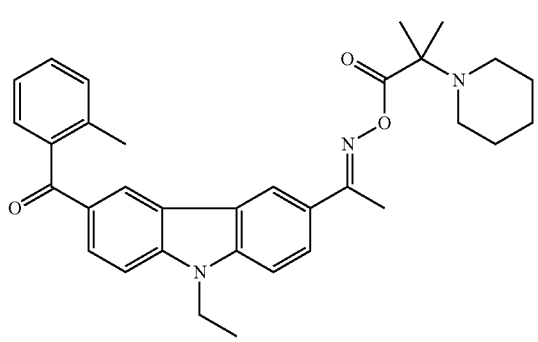

(C-11)
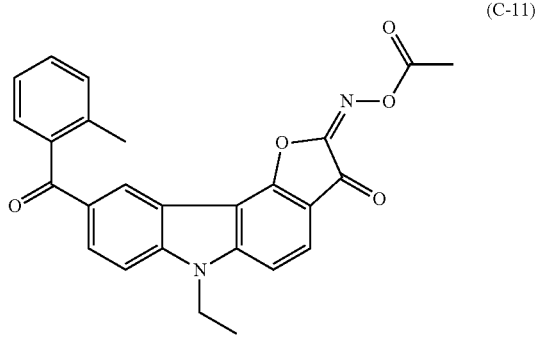

(C-12)
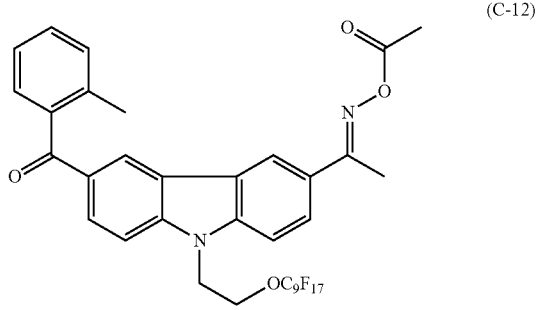

(C-13)
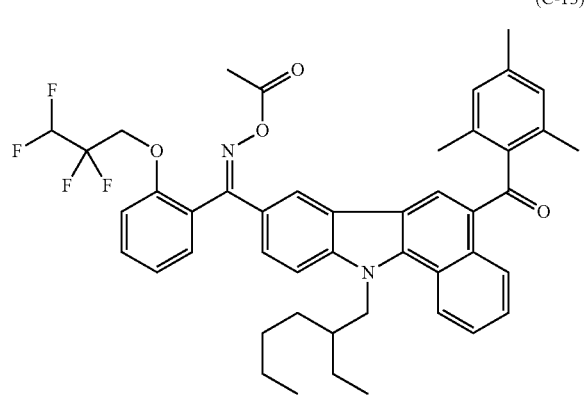

(C-14)
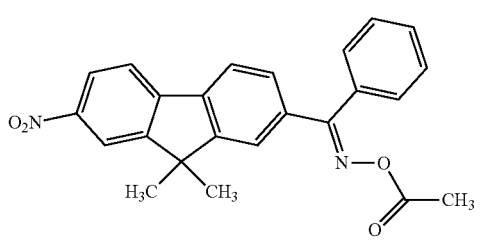

As the oxime compound, a compound having an absorption maximum in a wavelength range of 350 to 500 nm is preferable, a compound having an absorption maximum in a wavelength range of 360 to 480 nm is more preferable, and a compound having a high absorbance at 365 nm and 405 nm is still more preferable.

The molar absorption coefficient of the oxime compound at 365 nm or 405 nm is preferably 1000 to 300000, more preferably 2000 to 300000, and still more preferably 5000 to 200000 from the viewpoint of sensitivity. The molar absorption coefficient of the compound can be measured using a well-known method. Specifically, for example, it is preferable that the molar absorption coefficient of the compound is measured using an ultraviolet-visible spectrophotometer (Cary-5 spectrophotometer, manufactured by Varian Medical Systems, Inc.) and an ethyl acetate solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the coloring curable resin composition. In the above-described range, excellent sensitivity and pattern formability can be obtained. The coloring curable resin composition may include one photopolymerization initiator or two or more photopolymerization initiators. In a case where the infrared absorbing composition includes two or more photopolymerization initiators, it is preferable that the total content of the two or more photopolymerization initiators is in the above-described range.

[4] Colorant

The colorant is not particularly limited, and various dyes or pigments can be used. For example, any one of colorants (chromatic colorants) of chromatic colors such as red, magenta, yellow, blue, cyan, or green that form color pixels of the color filter and a colorant (black colorant) of black that is generally used for forming a black matrix can be used. In the embodiment, it is preferable that the colorant is at least one colorant selected from the group consisting of a red colorant, a magenta colorant, a yellow colorant, a blue colorant, and a cyan colorant.

As the inorganic pigment, for example, a metal compound such as a metal oxide or a metal complex salt can be used, and specific examples thereof include: an oxide of a metal such as iron, cobalt, aluminum, cadmium, lead, copper, titanium, magnesium, chromium, zinc, antimony, or silver; and a composite oxide of the metal. For example, a titanium nitride, a silver-tin compound, or a silver compound can be used.

Examples of the organic pigment include a perylene pigment, a perinone pigment, a quinacridone pigment, a quinacridonequinone pigment, an anthraquinone pigment, an anthanthrone pigment, a benzimidazolone pigment, a disazo pigment, an azo pigment, an indanthrone pigment, a phthalocyanine pigment, a triarylcarbonium pigment, a dioxazine pigment, an aminoanthraquinone pigment, a diketo pyrrolo pyrrole pigment, an indigo pigment, a thio-indigo pigment, an isoindoline pigment, an isoindolinone pigment, a pyranthrone pigment, and an isoviolanthrone pigment.

Examples of the dye include a triarylmethane dye, a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, an azomethine dye, a pyrrolopyrazole azo methine dye, a xanthene dye, a phthalocyanine dye, a benzopyran dye, an indigo dye, and a pyrromethene dye. In addition, a polymer of the above-described dyes may be used.

In a case where the colorant is particulate, the average primary particle size of the colorant is preferably 5 nm or more and more preferably 30 nm or more. The upper limit of the colorant is preferably 1 μm or less, more preferably 500 nm or less, and still more preferably 100 nm or less.

The particle size can be measured using a dynamic light scattering particle size distribution analyzer (Nanotrac Wave-EX150 [trade name], manufactured by Nikkiso Co., Ltd.; LB-500 [trade name], manufactured by Horiba Ltd.). The procedure is as follows. 20 ml of a sample dispersion is collected in a sample bottle and is diluted with an insoluble solvent (for example, water) such that the solid content concentration is 0.2 mass %. Data is obtained 50 times using a 2 ml quartz cell for measurement at a temperature of 25° C., and the obtained "number average" is obtained as the average particle size. Other detailed conditions and the like can be found in JIS Z8828: 2013 "Particle Size Analysis-Dynamic Light Scattering" as necessary.

The content of the colorant is preferably 10 mass % or higher, more preferably 20 mass % or higher, and still more preferably 30 mass % or higher with respect to the solid content of the coloring curable resin composition. The upper limit is not particularly limited and is preferably 80 mass % or lower and more preferably 60 mass % or lower. Eve in a case where the treatment liquid according to the present invention includes a large amount of the colorant as described above, the color resist can be sufficiently removed.

[5] Dispersant

The coloring curable resin composition may include a dispersant. Examples of the pigment dispersant include: a polymer dispersant (for example, polyamideamine or a salt thereof, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin condensate), polyoxyethylene alkyl phosphoric acid ester, polyoxyethylene alkyl amine, alkanol amine, and a pigment dispersant.

In terms of a structure, the polymer dispersant can be further classified into a linear polymer, a terminal-modified polymer, a graft polymer, and a block polymer.

Specific examples of the pigment dispersant include: "Disperbyk-101 (polyamideamine phosphate), 107 (carboxylate), 110 (copolymer containing an acid group), 130 (polyamide), 161, 162, 163, 164, 165, 166, and 170 (high molecular weight copolymer)" and "BYK—P104, P105 (high molecular weight unsaturated polycarboxylic acid), BYK 2001" all of which are manufactured by BYK Chemie; "EFKA 4047, 4050, 4010, 4165 (polyurethane compound), EFKA 4330, 4340 (block copolymer), 4400, 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)", "HOMOGENOL L-18 (high molecular polycarboxylic acid)", "EMULGEN 920, 930, 935, and 985 (polyoxyethylene nonylphenyl ether)", and "ACETAMIN 86 (stearylamine acetate)" all of which are manufactured by Kao Corporation; "SOLSPERSE 5000 (phthalocyanine derivative), 22000 (azo pigment derivative), 13240 (polyester amine), 3000, 17000, 27000 (polymer having a functional group at a terminal thereof), 24000, 28000, 32000, and 38500 (graft polymer)" all of which are manufactured by Lubrizol Corporation; and "NIKKOL T106 (polyoxyethylene sorbitan monooleate) and MYS-IEX (polyoxyethylene monostearate)" all of which manufactured by Nikko Chemicals Co., Ltd.

The concentration of the dispersant is preferably 1 to 100 parts by mass, more preferably 3 to 100 parts by mass, and still more preferably 5 to 80 parts by mass with respect to 1 part by mass of the colorant. In addition, the concentration of the dispersant is preferably 5 to 30 mass % with respect to the total solid content of the coloring curable resin composition.

As the dispersant, one kind may be used alone, or two or more kinds may be used in combination.

[6] Surfactant

Various surfactants may be added to the coloring curable resin composition according to the present invention from the viewpoint of further improving application properties. As the surfactants, various surfactants such as a fluorine surfactant, a nonionic surfactant, a cationic surfactant, an anionic surfactant, or a silicone surfactant can be used.

In a case where the coloring curable resin composition includes a surfactant, the content of the surfactant is preferably 1 mass % to 40 mass % and more preferably 5 mass % to 20 mass % with respect to the total solid content mass of the coloring curable resin composition.

The coloring curable resin composition can appropriately include other components. Examples of the other components include an organic solvent, a ultraviolet absorber, an adhesion improver, a sensitizing colorant, a cosensitizer, a diluent, a plasticizer, and a sensitizing agent.

In addition, the present invention relates to a method of manufacturing an electronic device including the pattern forming method according to the present invention.

An electronic device that is manufactured using the method of manufacturing an electronic device including the pattern forming method according to the present invention can be suitably mounted on electric and electronic apparatuses (home electronics, apparatuses relating to office automation (OA) and media, optical apparatuses, and communication apparatuses).

EXAMPLES

Hereinafter, the present invention will be described in detail using Examples, but the scope of the present invention is not limited thereto. Unless specified otherwise, "part(s)" represents "part(s) by mass".

A-1. Treatment Liquid for Manufacturing Semiconductor: Examples 1 to 39, Comparative Examples 1 to 15

[Quaternary Ammonium Compound]

Hereinafter, the following compounds were used as a quaternary ammonium compound. These quaternary ammonium compounds were purified by repeating filter filtration as well as adsorption purification using silicon carbide as described in WO2012/043496A.

S-1: tetramethylammonium hydroxide (TMAH)
S-2: dimethyl bis(2-hydroxyethyl)ammonium hydroxide (AH-212)

[Additive]

The following compounds were used as an additive.
AA-1: NEWCOL B4-SN (manufactured by Nippon Nyukazai Co., Ltd.) (anionic surfactant)
AN-1: Surfynol 465 (manufactured by Air Products&Chemicals Ltd.) (nonionic surfactant)
AN-2: DKS NL-15 (manufactured by DKS Co. Ltd.) (nonionic surfactant)
AN-3: NEWCOL 610 (manufactured by Nippon Nyukazai Co., Ltd.) (nonionic surfactant)
AC-1: TEXNOL R2 (manufactured by Nippon Nyukazai Co., Ltd.) (cationic surfactant)
AH-1: ethylenediaminetetraacetic acid (chelating agent)
AH-2: diethylenetriaminepentaacetic acid (chelating agent)

[Water]

Water was purified using a method described in JP2007-254168A, and was used for adjusting the treatment liquid for manufacturing a semiconductor after verifying that the metal content in the liquid was lower than 0.001 mass ppt.

A-2. Preparation of Developer: Examples 1 to 39, Comparative Examples 1 to 15

Tables 1-1 to 1-3 show ratios of the addition amounts of the quaternary ammonium compounds and the additives with respect to the treatment liquid for manufacturing a semiconductor. 1000 g of each of mixed solutions was prepared according to the ratio shown in Tables 1-1 to 1-3 with respect to water as a balance. The obtained mixed solution was purified by repeating filter filtration to adjust metal atoms. The treatment liquid for manufacturing a semiconductor obtained as described above was used as a developer.

The preparation, filling, storage, and the like of the above-described treatment liquid for manufacturing a semiconductor (developer) were performed in a clean room satisfying ISO Class 2 or lower. In addition, a container to be used was cleaned using the above-described water and/or the treatment liquid for manufacturing a semiconductor according to the present invention.

TABLE 1-1

| | Quaternary Ammonium Compound | | A: Additive | | | | | | | | | Metal Atom Ratio |
|---|---|---|---|---|---|---|---|---|---|---|---|---|
| | | | Anionic Surfactant | | Nonionic Surfactant | | | Cationic Surfactant | | Chelating Agent | | |
| | Kind | mass % | Kind | mass ppm | Kind | mass ppm | HLB | Kind | mass ppm | Kind | mass ppm | $T_1$ |
| Example 1 | S-1 | 2.5 | AA-1 | 200 | — | 0 | — | — | 0 | — | 0 | 0.0000000700 |
| Example 2 | S-1 | 2.5 | — | 0 | AN-1 | 200 | 13 | — | 0 | — | 0 | 0.0000000700 |
| Example 3 | S-1 | 2.5 | — | 0 | — | 0 | — | AC-1 | 200 | — | 0 | 0.0000000700 |
| Example 4 | S-1 | 2.5 | AA-1 | 200 | — | 0 | — | — | 0 | AH-1 | 200 | 0.0000000350 |
| Example 5 | S-1 | 2.5 | — | 0 | AN-1 | 200 | 13 | — | 0 | AH-1 | 200 | 0.0000000350 |
| Example 6 | S-1 | 2.5 | — | 0 | — | 0 | — | AC-1 | 200 | AH-1 | 200 | 0.0000000350 |
| Example 7 | S-1 | 2.5 | AA-1 | 300 | — | 0 | — | — | 0 | — | 0 | 0.0000000700 |
| Example 8 | S-1 | 2.5 | — | 0 | AN-1 | 300 | 13 | — | 0 | — | 0 | 0.0000000700 |
| Example 9 | S-1 | 2.5 | — | 0 | — | 0 | — | AC-1 | 300 | — | 0 | 0.0000000700 |
| Example 10 | S-1 | 2.5 | AA-1 | 300 | — | 0 | — | — | 0 | AH-1 | 300 | 0.0000000350 |
| Example 11 | S-1 | 2.5 | — | 0 | AN-1 | 300 | 13 | — | 0 | AH-1 | 300 | 0.0000000350 |
| Example 12 | S-1 | 2.5 | — | 0 | — | 0 | — | AC-1 | 300 | AH-1 | 300 | 0.0000000350 |
| Example 13 | S-1 | 2.5 | AA-1 | 300 | — | 0 | — | — | 0 | — | 0 | 0.0000001050 |
| Example 14 | S-1 | 2.5 | — | 0 | AN-1 | 300 | 13 | — | 0 | — | 0 | 0.0000001050 |
| Example 15 | S-1 | 2.5 | — | 0 | — | 0 | — | AC-1 | 300 | — | 0 | 0.0000001050 |
| Example 16 | S-1 | 2.5 | AA-1 | 300 | — | 0 | — | — | 0 | AH-1 | 300 | 0.0000000525 |
| Example 17 | S-1 | 2.5 | — | 0 | AN-1 | 300 | 13 | — | 0 | AH-1 | 300 | 0.0000000525 |
| Example 18 | S-1 | 2.5 | — | 0 | — | 0 | — | AC-1 | 300 | AH-1 | 300 | 0.0000000525 |

TABLE 1-2

| | Quaternary Ammonium Compound | | A: Additive | | | | | | | | | Metal Atom Ratio |
|---|---|---|---|---|---|---|---|---|---|---|---|---|
| | | | Anionic Surfactant | | Nonionic Surfactant | | | Cationic Surfactant | | Chelating Agent | | |
| | Kind | mass % | Kind | mass ppm | Kind | mass ppm | HLB | Kind | mass ppm | Kind | mass ppm | $T_1$ |
| Example 19 | S-1 | 2.5 | AA-1 | 200 | — | 0 | — | — | 0 | — | 0 | 0.0000000700 |
| Example 20 | S-1 | 2.5 | — | 0 | AN-2 | 200 | 5 | — | 0 | — | 0 | 0.0000000700 |
| Example 21 | S-1 | 2.5 | — | 0 | — | 0 | — | AC-1 | 200 | — | 0 | 0.0000000700 |
| Example 22 | S-1 | 2.5 | AA-1 | 200 | — | 0 | — | — | 0 | AH-1 | 200 | 0.0000000350 |
| Example 23 | S-1 | 2.5 | — | 0 | AN-2 | 200 | 5 | — | 0 | AH-1 | 200 | 0.0000000350 |
| Example 24 | S-1 | 2.5 | — | 0 | — | 0 | — | AC-1 | 200 | AH-1 | 200 | 0.0000000350 |

TABLE 1-2-continued

| | Quaternary Ammonium Compound | | A: Additive | | | | | | | | | Metal Atom Ratio |
| --- | --- | --- | --- | --- | --- | --- | --- | --- | --- | --- | --- | --- |
| | | | Anionic Surfactant | | Nonionic Surfactant | | | Cationic Surfactant | | Chelating Agent | | |
| | Kind | mass % | Kind | mass ppm | Kind | mass ppm | HLB | Kind | mass ppm | Kind | mass ppm | $T_1$ |
| Example 25 | S-2 | 2.5 | — | 0 | AN-1 | 200 | 13 | — | 0 | — | 0 | 0.0000000700 |
| Example 26 | S-2 | 2.5 | — | 0 | AN-1 | 200 | 13 | — | 0 | AH-1 | 200 | 0.0000000350 |
| Example 27 | S-1 | 2.5 | — | 0 | AN-1 | 200 | 13 | — | 0 | — | 0 | 0.0000000700 |
| Example 28 | S-1 | 2.5 | — | 0 | AN-1 | 200 | 13 | — | 0 | AH-1 | 200 | 0.0000000350 |
| Example 29 | S-1 | 2.5 | — | 0 | AN-3 | 200 | 13.8 | — | 0 | — | 0 | 0.0000000700 |
| Example 30 | S-1 | 2.5 | — | 0 | AN-3 | 200 | 13.8 | — | 0 | AH-1 | 200 | 0.0000000350 |
| Example 31 | S-1 | 2.5 | — | 0 | AN-3 | 200 | 13.8 | — | 0 | AH-2 | 200 | 0.0000000350 |
| Example 32 | S-2 | 2.5 | — | 0 | AN-1 | 200 | 13 | — | 0 | — | 0 | 0.0000000750 |
| Example 33 | S-1 | 2.5 | — | 0 | AN-3 | 200 | 13.8 | — | 0 | AH-3 | 200 | 0.0000000350 |
| Comparative Example 1 | S-1 | 2.5 | AA-1 | 200 | — | 0 | — | — | 0 | — | 0 | 0.0000061200 |
| Comparative Example 2 | S-1 | 2.5 | AA-1 | 200 | — | 0 | — | — | 0 | — | 0 | 0.0000061200 |
| Comparative Example 3 | S-1 | 2.5 | — | 0 | AN-1 | 200 | 13 | — | 0 | — | 0 | 0.0000061800 |

TABLE 1-3

| | Quaternary Ammonium Compound | | A: Additive | | | | | | | | | Metal Atom Ratio $T_1$ |
| --- | --- | --- | --- | --- | --- | --- | --- | --- | --- | --- | --- | --- |
| | | | Anionic Surfactant | | Nonionic Surfactant | | | Cationic Surfactant | | Chelating Agent | | |
| | Kind | mass % | Kind | mass ppm | Kind | mass ppm | HLB | Kind | mass ppm | Kind | mass ppm | |
| Comparative Example 4 | S-1 | 2.5 | — | 0 | AN-1 | 200 | 13 | — | 0 | — | 0 | 0.0000061800 |
| Comparative Example 5 | S-1 | 2.5 | — | 0 | AN-1 | 200 | 13 | — | 0 | — | 0 | 0.0000062400 |
| Comparative Example 6 | S-1 | 2.5 | — | 0 | AN-1 | 200 | 13 | — | 0 | — | 0 | 0.0000063000 |
| Comparative Example 7 | S-1 | 2.5 | — | 0 | — | 0 | — | AC-1 | 200 | — | 0 | 0.0000063600 |
| Comparative Example 8 | S-1 | 2.5 | — | 0 | — | 0 | — | AC-1 | 200 | — | 0 | 0.0000064200 |
| Comparative Example 9 | S-1 | 2.5 | AA-1 | 200 | — | 0 | — | — | 0 | AH-1 | 200 | 0.0000030600 |
| Comparative Example 10 | S-1 | 2.5 | AA-1 | 200 | — | 0 | — | — | 0 | AH-1 | 200 | 0.0000030600 |
| Comparative Example 11 | S-1 | 2.5 | — | 0 | AN-1 | 200 | 13 | — | 0 | AH-1 | 200 | 0.0000030900 |
| Comparative Example 12 | S-1 | 2.5 | — | 0 | AN-1 | 200 | 13 | — | 0 | AH-1 | 200 | 0.0000031200 |
| Comparative Example 13 | S-1 | 2.5 | — | 0 | AN-1 | 200 | 13 | — | 0 | AH-1 | 200 | 0.0000031500 |
| Comparative Example 14 | S-1 | 2.5 | — | 0 | — | 0 | — | AC-1 | 200 | AH-1 | 200 | 0.0000031800 |
| Comparative Example 15 | S-1 | 2.5 | — | 0 | — | 0 | — | AC-1 | 200 | AH-1 | 200 | 0.0000032100 |
| Example 34 | S-1 | 2.5 | AA-1 | 20000 | — | 0 | — | — | 0 | — | 0 | 0.0000000007 |
| Example 35 | S-1 | 2.5 | — | 0 | AN-1 | 20000 | 13 | — | 0 | — | 0 | 0.0000000007 |
| Example 36 | S-1 | 2.5 | — | 0 | — | 0 | — | AC-1 | 20000 | — | 0 | 0.0000000007 |
| Example 37 | S-1 | 2.5 | AA-1 | 20000 | — | 0 | — | — | 0 | AH-1 | 20000 | 0.0000000004 |
| Example 38 | S-1 | 2.5 | — | 0 | AN-1 | 20000 | 13 | — | 0 | AH-1 | 20000 | 0.0000000004 |
| Example 39 | S-1 | 2.5 | — | 0 | — | 0 | — | AC-1 | 20000 | AH-1 | 20000 | 0.0000000004 |

[Measurement of Metal Atoms]

One kind or two or more kinds of metal atoms selected from the group consisting of Na, K, Ca, Fe, Cu, Mg, Mn, Li, Al, Cr, Ni, and Zn in the developer were measured as follows.

(1) Preparation of Standard Material and Calibration Curve of Each Metal Atom

Ultrapure water was weighed and charged into a clean glass container, and metal atoms as a measurement target having a median size of 60 nm were added thereto such that the concentration was 10000 atoms/ml. Next, the solution was treated using an ultrasonic cleaning machine for 30 minutes to obtain a dispersion. The obtained dispersion was used as a standard material for transport efficiency measurement. Using an inductively coupled plasma (ICP) standard solution, the calibration curve of each of the metal atoms was created.

In addition, a standard material solution for transport efficiency measurement in a SP-ICP-MS method was prepared as follows. Ultrapure water was weighed and charged into a clean glass container, and gold particles having a median size of 50 nm were added thereto such that the concentration was 10000 atoms/ml. Next, the solution was treated using an ultrasonic cleaning machine for 30 minutes to obtain a dispersion.

(2) Measurement

In an inductively coupled plasma-mass spectrometry (ICP-MS) device, the measurement target liquid was aspirated at about 0.2 mL/min using a PFA coaxial nebulizer formed of PFA, a cyclonic spray chamber formed of quartz, and a torch injector having an inner diameter of 1 mm formed of quartz. The addition amount of oxygen was set as 0.1 L/min, the plasma power was set as 1600 W, and the inside of the cell was purged using ammonia gas. The temporal resolution was set as 50 μs for analysis.

Manufacturer: PerkinElmer
Model: NexION 350S

In addition, for the measurement of particulate metal, SP-ICP-MS was measured using software Syngistix for ICP-MS of the above-described ICP-MS device.

The temporal resolution was set as 50 μs for analysis. Based on the transport efficiency determined by the measurement result of the standard material for transport efficiency measurement and the analysis thereof, and the calibration curve of each metal atom determined by the measurement result of the ICP standard solution and the analysis thereof, the concentration (Mp) of the particulate metal including target atoms in the measurement target liquid was measured using the above-described analysis software.

All the analysis and measurement described above were performed in a clean room satisfying a level of ISO Class 2 or lower. The measurement results are shown in Tables 2-1 to 2-6.

[Metal Atom Ratio $T_1$ and Particulate Metal Ratio $T_2$] A ratio $T_1$ of the total mass of the metal atoms obtained as described above to the sum of the total mass of the additive and the total mass of the metal atoms was calculated.

$T_1$=[Total Mass of Metal Atoms]/[Total Mass of Additive+Total Mass of Metal Atoms]

In addition, a ratio $T_2$ of the total mass of the particulate metal obtained as described above to the sum of the total mass of the additive and the total mass of the particulate metal was calculated.

$T_2$=[Total Mass of Particulate Metal]/[Total Mass of Additive+Total Mass of Particulate Metal] The calculation results are shown in Tables 1-1 to 1-3 and Tables 2-1 to 2-6.

[Measurement of Impurities]

A ratio of the mass of each of a peroxide, an ester compound, an amine compound, and a chelate complex in the developer to the developer was analyzed using a high-performance liquid chromatography (HPLC: detector RI); LC-2000, manufactured by Jasco Corporation).

A ratio of the total mass of an inorganic salt in the developer to the developer was analyzed using an ion chromatography method (DX-500, manufactured by Nippon Dionex K.K.).

All the analysis and measurement described above were performed in a clean room satisfying a level of ISO Class 2 or lower. The results are shown in Tables 2-1 to 2-3.

A-3. Examples 1 to 39, Comparative Examples 1 to 15

[Evaluation of Defects]

Using a wafer surface inspection device (SP-5, manufactured by KLA-Tencor Corporation), the number of foreign matters having a diameter of 32 nm or more present on a silicon substrate surface having a diameter of 300 mm and the address of each of the foreign matters were calculated. After the calculation of the number of foreign matters present on the silicon substrate surface, the wafer was set on a rotational type wafer spin processor (manufactured by EKC Technology Inc.). The above-described treatment liquid for manufacturing a semiconductor was discharged to the surface of the set wafer at a flow rate of 1.5 L/min for 1 hour. Next, the wafer was spin-dried. Using the wafer surface inspection device, the number of foreign matters on the wafer and the address of each of the foreign matter were calculated. After spin-drying the treatment liquid for manufacturing a semiconductor, elemental analysis was performed on newly increased foreign matters by energy dispersive X-ray spectrometry (EDX) using a defect analyzer (SEMVISION G6, manufactured by Applied Materials Inc.). Na, K, Ca, Fe, Cu, Mg, Mn, Li, Al, Cr, Ni, and Zn were set as target metal elements, and foreign matters including the target metal elements were counted as particles. The obtained number of particles was evaluated based on the following evaluation standards. The results are shown in Tables 2-4 to 2-6.

A: the number of particles having a diameter of 32 nm or more including the target metal elements is 0 or more and less than 100

B: the number of particles having a diameter of 32 nm or more including the target metal atoms is 100 or more and less than 300

C: the number of particles having a diameter of 32 nm or more including the target metal atoms is 300 or more and less than 500

D: the number of particles having a diameter of 32 nm or more including the target metal atoms is 500 or more and less than 700

E: the number of particles having a diameter of 32 nm or more including the target metal atoms is 700 or more A-4. Actinic Ray-Sensitive or Radiation-Sensitive Resin Composition: Examples 1 to 39, Comparative Examples 1 to 15

Synthesis Example 1: Synthesis of Resin (1)

8.6 g of cyclohexanone was put into a three-neck flask in a nitrogen stream and was heated to 80° C. Next, 9.8 g of 2-adamantyl isopropyl methacrylate, 4.4 g of dihydroxyadamantyl methacrylate, 8.9 g of norbomane lactone methacrylate, and 8 mol % (with respect to the monomers) of a polymerization initiator V-601 (manufactured by Wako Pure Chemical Industries, Ltd.) were dissolved in 79 g of cyclohexanone to prepare a monomer solution. The obtained monomer solution was added dropwise to the flask heated to 80° C. for 6 hours. After completion of the dropwise addition, a reaction was performed at 80° C. for 2 hours. The obtained reaction solution was cooled to room temperature and was added dropwise to a mixed solution of 800 ml of hexane and 200 ml of ethyl acetate for 20 minutes. The precipitated powder was separated by filtration and was dried. As a result, 19 g of a resin (1) was obtained. In a case where the obtained resin (1) was measured by gel permeation chromatography (GPC; solvent: tetrahydrofuran (THF)) in terms of standard polystyrene, the weight-average molecular weight (Mw) was 9800, and the molecular weight dispersity (Mw/Mn) was 1.9. A composition ratio (molar ratio) of the obtained resin (1) was calculated by $^1$H-nuclear magnetic resonance (NMR) measurement. The composition ratio was 39/20/41 in order from the left repeating unit.

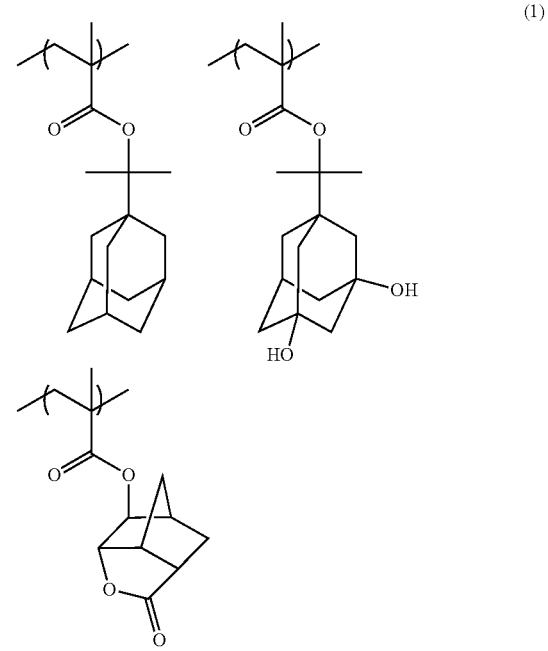

(1)

Synthesis Example 2: Synthesis of Hydrophobic Resin (C-1)

0.06 mol of (3,5-bis(1,1,1,3,3,3-hexafluoro-2-hydroxypropane-2-yl)cyclohexyl) 2-trifluoromethylmethacrylate and 0.04 mol of (5-norbornene-2-methyl)-1,1,1,3,3,3-hexafluoropropane-2-ol were prepared. While stirring the mixture in a nitrogen atmosphere at 80° C., 1.5 mol % of a polymerization initiator V-59 (manufactured by Wako Pure Chemical Industries, Ltd.) was added thereto, and the solution was stirred for 3 hours. Next, while adding 1.5 mol % of the polymerization initiator V-59 every 3 hours, the solution was stirred 12 hours to cause the components to react with each other. The reaction solution was dissolved in 20 mL of tetrahydrofuran (THF) and was cooled to room temperature. 800 mL of hexane was added, and the crystallized and precipitated white powder was separated by filtration. As a result, a hydrophobic resin (C-1) was obtained.

A polymer composition ratio obtained by $^1$H-NMR was 60/40 (in order from the left structural formula). In addition, in a case where the hydrophobic resin (C-1) was measured by GPC in terms of standard polystyrene, the weight-average molecular weight was 8800, and the dispersity was 1.5.

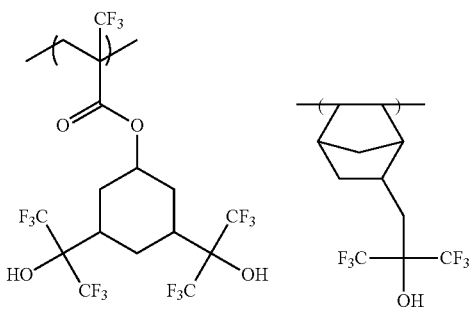

[Configuration of Actinic Ray-Sensitive or Radiation-Sensitive Resin Composition]

The following compounds were prepared as components of the actinic ray-sensitive or radiation-sensitive resin composition.

solution including: 12.6 parts of a mixture of C.I. Pigment Green 36 and C.I. Pigment yellow 139 at a mass ratio of 100/55 as a pigment; 5.2 parts of BYK2001 (Disperbyk; manufactured by BYK Chemie, concentration of solid contents: 45.1 mass %) as a dispersant; and 2.7 parts of a benzyl methacrylate/methacrylic acid copolymer (acid value=134 mgKOH/g, Mw=30000) as a dispersion resin; and 78.3 parts of propylene glycol monomethyl ether acetate as a solvent.

[Red Pigment Dispersion (Pigment Dispersion 2)]

A mixed solution was mixed using beads mills for 15 hours to prepare a Red pigment dispersion, the mixed solution including: 12.1 parts of C.I. Pigment Red 254 as a pigment; 10.4 parts of BYK2001 (Disperbyk; manufactured by BYK Chemie, concentration of solid contents: 45.1 mass %) as a dispersant; and 3.8 parts of a benzyl methacrylate/methacrylic acid copolymer (acid value=134 mgKOH/g, Mw=30000) as a dispersion resin; and 73.7 parts of propylene glycol monomethyl ether acetate as a solvent.

[Blue Pigment Dispersion (Pigment Dispersion 3)]

A mixed solution was mixed using beads mills for 15 hours to prepare a Blue pigment dispersion, the mixed solution including: 14 parts of a mixture of C.I. Pigment Blue 15:6 and C.I. Pigment Violet 23 at a mass ratio of 100/25 as a pigment; 4.7 parts of BYK2001 (Disperbyk; manufactured by BYK Chemie, concentration of solid contents: 45.1 mass %) as a dispersant; and 3.5 parts of a benzyl methacrylate/methacrylic acid copolymer (acid value=134 mgKOH/g, Mw=30000) as a dispersion resin; and 77.8 parts of propylene glycol monomethyl ether acetate as a solvent.

A-7. Preparation of Color Resist Solution:
Examples 1 to 39, Comparative Examples 1 to 15

Any one of the pigment dispersions 1 to 3 was mixed and stirred to obtain the following composition A. As a result, a coloring curable resin composition was prepared.

| | |
|---|---|
| Resin (1) | 2 g |
| Photoacid generator (z2) | 80 mg |

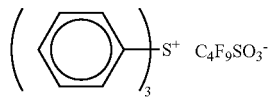

(z2)

| | |
|---|---|
| Basic compound (N,N-dihydroethylaniline) | 7 mg |
| Hydrophobic resin (C-1) | 2 mg |
| Solvent (cyclohexanone/propylene glycol monomethyl ether acetate) 60/40 (mass ratio) | |
| Surfactant (MEGAFACE F176 (manufactured by DIC Corporation) (fluorine surfactant) | 3 mg |

A-5. Preparation of Resist Solution

The above-described components were dissolved in the above-described solvent to prepare solution in which the concentration of solid contents was 7 mass %. This mixed solution was filtered through a polyethylene filter having a pore size of 0.1 μm to prepare a positive type resist solution.

A-6. Coloring Curable Resin Composition

[Green Pigment Dispersion (Pigment Dispersion 1)]

A mixed solution was mixed using beads mills for 15 hours to prepare a Green pigment dispersion, the mixed

[Composition A]

| | |
|---|---|
| Pigment dispersion (any one of the pigment dispersions 1 to 3) | 82.35 parts |
| Alkali-Soluble Resin | 2.05 parts |
| Polymerization initiator: | 1.2 parts |
| DPHA (polymerizable compound) | 1.4 parts |
| M-30 (polymerizable compound) | 1.4 parts |
| p-methoxyphenol | 0.001 parts |
| PEGMEA | 7.4 parts |
| F781 | 4.2 parts |

The respective components included in the composition A are as follows.

Polymerization initiator: IRGACURE OXE01 [trade name], manufactured by BASF SE

DPHA: KAYARAD DPHA [trade name], manufactured by Nippon Kayaku Co., Ltd. dipentaerythritol hexaacrylate, M-305: a mixture of triacrylate and pentaerythritol tetraacrylate [trade name], manufactured by Toagosei Co., Ltd.

PEGMEA: propylene glycol monomethyl ether acetate

F781: MEGAFACE F-781 [trade name], manufactured by DIC Corporation

Alkali-soluble resin: a copolymer including benzyl methacrylate, methacrylic acid, and 2-hydroxyethyl methacrylate (60/22/18 [molar ratio], weight-average molecular weight: 15000, number-average molecular weight: 8000)

The weight-average molecular weight was measured as a value in terms of polystyrene using a gel permeation chromatography (GPC) method.

The GPC Method is based on a method in which HLC-8020 GPC (manufactured by Tosoh Corporation) was used, Tsk gel Super HZM-H, TSK gel Super HZ4000, and TSK gel Super HZ2000 (manufactured by Tosoh Corporation; 4.6 mm IDx15 cm) was used as a column, and tetrahydrofuran (THF) was used as an eluent.

A-8. Examples 1 to 39, Comparative Examples 1 to 15: Resist Pattern

An organic antireflection film ARC29A (manufactured by Nissan Chemical Industries Ltd.) was applied to a silicon wafer and was baked at 205° C. for 60 seconds to form an antireflection film having a thickness of 78 nm. The prepared positive type resist composition was applied to the antireflection film and was baked at 130° C. for 60 seconds to form a resist film having a thickness of 250 nm. The obtained wafer was exposed in a pattern shape using an ArF excimer laser scanner (PAS5500/1100, manufactured by ASML, NA: 0.75, σo/σi=0.85/0.55). Next, the wafer was heated at 120° C. for 90 seconds, was developed using the developer shown in Tables 1-1 to 1-3 for 30 seconds, was rinsed with ultrapure water, and was spin-dried. As a result, a silicon wafer on which a resist pattern was formed was obtained.

[Evaluation of Resist Pattern]

The obtained pattern shape was observed and evaluated using a scanning electron microscope (S-4800, manufactured by Hitachi, Ltd.). In addition, the line width of a pattern cross-section was measured at three points of the pattern including (a) a pattern top portion, (b) a pattern middle portion, and (c) a pattern-substrate interface. In a case where a difference in line width between (a) to (c) was less than 5%, the profile was defined as "rectangular". A case where the line width of (a) was less than that of (b) by 5% or more and the line width of (b) was less than that of (c) by 5% or more, the profile was defined as "forward tapered". In a case where the line width of (a) was more than that of (b) by 5% or more and the line width of (b) was more than that of (c) by 5% or more, the profile was defined as "reverse tapered". In a case where a difference in line width between (a) and (b) was less than 5% and the line width of (b) was more than that of (c) by 5% or more, the profile was defined as "fitting". In a case where a difference in line width between (b) and (c) was less than 5% and the line width of (a) was more than that of (b) by 5% or more, the profile was defined as "T-Top". The evaluation results are shown in Tables 2-4 to 2-6.

[Evaluation of Pattern Defects]

Regarding the pattern formed as described above, the number of defects having a diameter of 20 nm or more present on the substrate surface was measured using a wafer surface inspection device (PUMA 9850; manufactured by KLA-Tencor Corporation). The obtained number of defects was evaluated based on the following standards, and the results thereof are shown in the tables. In the following standards, the evaluation C represents that an ability of suppressing defects that is required for the treatment liquid for manufacturing a semiconductor is achieved.

A: the number of defects was 0 to 500

B: the number of defects was more than 500 and 1000 or less

C: the number of defects was more than 1000 and 3000 or less

D: the number of defects was more than 3000 and 5000 or less

E: the number of defects was more than 5000

A-9. Examples 1 to 39, Comparative Examples 1 to 15: Color Filter

The coloring curable resin compositions of each of the colors prepared as described above was applied to a 8-inch silicon wafer to which hexamethyldisilazane was sprayed in advance. As a result, a photocurable coating film was formed. The coating film was heated (pre-baked) using a hot plate at 100° C. for 180 seconds such that the thickness of the coating film after drying was 1.0 µm. Next, using a stepper exposure device FPA-3000 i5+(manufactured by Canon Corporation), the coating film was irradiated with i-rays having a wavelength of 365 nm through a Bayer pattern mask having a size of 1.0 µm×1.0 µm at 50 to 1000 mJ/cm$^2$ (the exposure dose changed by 50 mJ/cm$^2$). Next, the silicon wafer on which the irradiated coating film was disposed was placed on a horizontal rotary table of a spin-shower developing machine (DW-30, manufactured by Chemitronics Co., Ltd.). Puddle development was performed using the developer shown in Tables 1-1 to 1-3 at 23° C. for 180 seconds. As a result, a colored pattern was formed on the silicon wafer.

The silicon wafer on which the colored pattern was formed was fixed to the horizontal rotary table using a vacuum chuck method. While rotating the silicon wafer at a rotation speed of 50 rpm using a rotating device, the silicon wafer was rinsed with ultrapure water supplied from a region above the rotation center through a spray nozzle and then was spray-dried. Next, the obtained silicon wafer was heated using a hot plate at 200° C. for 5 minutes. As a result, a silicon wafer on which the color filter was disposed was obtained.

[Evaluation of Linearity of Color Resist]

The prepared color filter was cut with a glass cutter, and the obtained cross-section was observed with a scanning electron microscope (S-4800, manufactured by Hitachi Ltd.) at a magnification of 15000 times and was evaluated based on the following evaluation standards. The evaluation results are shown in Tables 2-4 and 2-6 together with the content of the metal atoms with respect to the additive.

A: as compared to a case where the line width of the pattern was 1.2 µm, the line width was 1.08 µm to 1.32 µm and the linearity was excellent B: as compared to a case where the line width of the pattern was 1.2 µm, the line width was in a range of 1.02 µm or more and less than 1.08 µm or in a range of more than 1.32 µm and 1.38 µm or less C: as compared to a case where the line width of the pattern was 1.2 µm, the line width was in a range of 0.96 µm or more and less than 1.02 µm or in a range of more than 1.38 µm and 1.44 µm or less, and there were no problems in practice D: as compared to a case where the line width of the pattern was 1.2 µm, the line width was in a range of 0.9 µm or more and less than 0.96 µm or in a range of more than 1.44 µm and 1.5 µm or less, and there were no problems in practice although the linearity was poor E: as compared to a case where the line width of the pattern was 1.2 μm, the line width was less than 0.9 μm or more than 1.5 μm, and the linearity was significantly poor

TABLE 2-1

| | B: Metal Atom (mass ppt) | | | | | | | | |
|---|---|---|---|---|---|---|---|---|---|
| | Na | K | Ca | Fe | Cu | Mg | Mn | Li | Al |
| Example 1 | 2 | 1 | 1 | 2 | 1 | 1 | 1 | 1 | 1 |
| Example 2 | 2 | 2 | 1 | 1 | 1 | 1 | 1 | 1 | 1 |
| Example 3 | 1 | 2 | 2 | 1 | 1 | 1 | 1 | 1 | 1 |
| Example 4 | 2 | 1 | 1 | 2 | 1 | 1 | 1 | 1 | 1 |
| Example 5 | 2 | 2 | 1 | 1 | 1 | 1 | 1 | 1 | 1 |
| Example 6 | 1 | 2 | 2 | 1 | 1 | 1 | 1 | 1 | 1 |
| Example 7 | 3 | 1.5 | 1.5 | 3 | 1.5 | 1.5 | 1.5 | 1.5 | 1.5 |
| Example 8 | 3 | 3 | 1.5 | 1.5 | 1.5 | 1.5 | 1.5 | 1.5 | 1.5 |
| Example 9 | 1.5 | 3 | 3 | 1.5 | 1.5 | 1.5 | 1.5 | 1.5 | 1.5 |
| Example 10 | 3 | 1.5 | 1.5 | 3 | 1.5 | 1.5 | 1.5 | 1.5 | 1.5 |
| Example 11 | 3 | 3 | 1.5 | 1.5 | 1.5 | 1.5 | 1.5 | 1.5 | 1.5 |
| Example 12 | 1.5 | 3 | 3 | 1.5 | 1.5 | 1.5 | 1.5 | 1.5 | 1.5 |
| Example 13 | 4.5 | 2.25 | 2.25 | 4.5 | 2.25 | 2.25 | 2.25 | 2.25 | 2.25 |
| Example 14 | 4.5 | 4.5 | 2.25 | 2.25 | 2.25 | 2.25 | 2.25 | 2.25 | 2.25 |
| Example 15 | 2.25 | 4.5 | 4.5 | 2.25 | 2.25 | 2.25 | 2.25 | 2.25 | 2.25 |
| Example 16 | 4.5 | 2.25 | 2.25 | 4.5 | 2.25 | 2.25 | 2.25 | 2.25 | 2.25 |
| Example 17 | 4.5 | 4.5 | 2.25 | 2.25 | 2.25 | 2.25 | 2.25 | 2.25 | 2.25 |
| Example 18 | 2.25 | 4.5 | 4.5 | 2.25 | 2.25 | 2.25 | 2.25 | 2.25 | 2.25 |

| | B: Metal Atom (mass ppt) | | | C (mass ppt) | | | | | Metal Atom Ratio $T_1$ |
|---|---|---|---|---|---|---|---|---|---|
| | Cr | Ni | Zn | Ester Peroxide | Amine Compound | Inorganic Compound | Salt | Chelate Complex | |
| Example 1 | 1 | 1 | 1 | 0 | 0 | 0 | 1 | 0 | 0.0000000700 |
| Example 2 | 1 | 1 | 1 | 1 | 1 | 1 | 0 | 0 | 0.0000000700 |
| Example 3 | 1 | 1 | 1 | 0 | 0 | 0 | 1 | 0 | 0.0000000700 |
| Example 4 | 1 | 1 | 1 | 0 | 0 | 0 | 1 | 1 | 0.0000000350 |
| Example 5 | 1 | 1 | 1 | 1 | 1 | 1 | 0 | 1 | 0.0000000350 |
| Example 6 | 1 | 1 | 1 | 0 | 0 | 0 | 1 | 1 | 0.0000000350 |
| Example 7 | 1.5 | 1.5 | 1.5 | 0 | 0 | 0 | 1.1 | 0 | 0.0000000700 |
| Example 8 | 1.5 | 1.5 | 1.5 | 1.2 | 1.2 | 1.3 | 0 | 0 | 0.0000000700 |
| Example 9 | 1.5 | 1.5 | 1.5 | 0 | 0 | 0 | 1.2 | 0 | 0.0000000700 |
| Example 10 | 1.5 | 1.5 | 1.5 | 0 | 0 | 0 | 1.5 | 1.4 | 0.0000000350 |
| Example 11 | 1.5 | 1.5 | 1.5 | 1.1 | 1.3 | 1.4 | 0 | 1.5 | 0.0000000350 |
| Example 12 | 1.5 | 1.5 | 1.5 | 0 | 0 | 0 | 1.1 | 1.4 | 0.0000000350 |
| Example 13 | 2.25 | 2.25 | 2.25 | 0 | 0 | 0 | 2 | 0 | 0.0000001050 |
| Example 14 | 2.25 | 2.25 | 2.25 | 1.8 | 1.7 | 2.1 | 0 | 0 | 0.0000001050 |
| Example 15 | 2.25 | 2.25 | 2.25 | 0 | 0 | 0 | 1.8 | 0 | 0.0000001050 |
| Example 16 | 2.25 | 2.25 | 2.25 | 0 | 0 | 0 | 1.5 | 1.6 | 0.0000000525 |
| Example 17 | 2.25 | 2.25 | 2.25 | 1.9 | 1.4 | 1.8 | 0 | 1.6 | 0.0000000525 |
| Example 18 | 2.25 | 2.25 | 2.25 | 0 | 0 | 0 | 1.8 | 1.5 | 0.0000000525 |

TABLE 2-2

| | B: Metal Atom (mass ppt) | | | | | | | | | | | | C (mass ppt) | | | | | Metal Atom Ratio $T_1$ |
|---|---|---|---|---|---|---|---|---|---|---|---|---|---|---|---|---|---|---|
| | Na | K | Ca | Fe | Cu | Mg | Mn | Li | Al | Cr | Ni | Zn | Peroxide | Ester Compound | Amine Compound | Inorganic Salt | Chelate Complex | |
| Example 19 | 2 | 1 | 1 | 2 | 1 | 1 | 1 | 1 | 1 | 1 | 1 | 1 | 0 | 0 | 0 | 1 | 0 | 0.0000000700 |
| Example 20 | 2 | 2 | 1 | 1 | 1 | 1 | 1 | 1 | 1 | 1 | 1 | 1 | 1 | 1 | 1 | 0 | 0 | 0.0000000700 |
| Example 21 | 1 | 2 | 2 | 1 | 1 | 1 | 1 | 1 | 1 | 1 | 1 | 1 | 0 | 0 | 0 | 1 | 0 | 0.0000000700 |
| Example 22 | 2 | 1 | 1 | 2 | 1 | 1 | 1 | 1 | 1 | 1 | 1 | 1 | 0 | 0 | 0 | 1 | 1 | 0.0000000350 |
| Example 23 | 2 | 2 | 1 | 1 | 1 | 1 | 1 | 1 | 1 | 1 | 1 | 1 | 1 | 1 | 1 | 0 | 1 | 0.0000000350 |
| Example 24 | 1 | 2 | 2 | 1 | 1 | 1 | 1 | 1 | 1 | 1 | 1 | 1 | 0 | 0 | 0 | 1 | 1 | 0.0000000350 |
| Example 25 | 2 | 2 | 1 | 1 | 1 | 1 | 1 | 1 | 1 | 1 | 1 | 1 | 1 | 1 | 1 | 0 | 0 | 0.0000000700 |
| Example 26 | 2 | 2 | 1 | 1 | 1 | 1 | 1 | 1 | 1 | 1 | 1 | 1 | 1 | 1 | 1 | 0 | 1 | 0.0000000700 |
| Example 27 | 2 | 2 | 1 | 1 | 1 | 1 | 1 | 1 | 1 | 1 | 1 | 1 | 1 | 1 | 1 | 0 | 0 | 0.0000000700 |
| Example 28 | 2 | 2 | 1 | 1 | 1 | 1 | 1 | 1 | 1 | 1 | 1 | 1 | 1 | 1 | 1 | 0 | 1 | 0.0000000350 |
| Example 29 | 2 | 2 | 1 | 1 | 1 | 1 | 1 | 1 | 1 | 1 | 1 | 1 | 1 | 1 | 1 | 0 | 0 | 0.0000000700 |
| Example 30 | 2 | 2 | 1 | 1 | 1 | 1 | 1 | 1 | 1 | 1 | 1 | 1 | 1 | 1 | 1 | 0 | 1 | 0.0000000350 |
| Example 31 | 2 | 2 | 1 | 1 | 1 | 1 | 1 | 1 | 1 | 1 | 1 | 1 | 1 | 1 | 1 | 0 | 1 | 0.0000000350 |
| Example 32 | 1 | 1 | 1 | 1 | 1 | 1 | 1 | 1 | 1 | 1 | 1 | 1 | 1 | 1 | 1 | 0 | 0 | 0.0000000750 |

TABLE 2-2-continued

| | B: Metal Atom (mass ppt) | | | | | | | | | | | | C (mass ppt) | | | | Metal Atom |
|---|---|---|---|---|---|---|---|---|---|---|---|---|---|---|---|---|---|---|
| | | | | | | | | | | | | | Peroxide | Ester Compound | Amine Compound | Inorganic Salt | Chelate Complex | Ratio $T_1$ |
| | Na | K | Ca | Fe | Cu | Mg | Mn | Li | Al | Cr | Ni | Zn | | | | | | |
| Example 33 | 2 | 2 | 1 | 1 | 1 | 1 | 1 | 1 | 1 | 1 | 1 | 1 | 1 | 1 | 1 | 0 | 1 | 0.0000000350 |
| Comparative Example 1 | 105 | 100 | 101 | 103 | 100 | 99 | 100 | 104 | 100 | 107 | 100 | 105 | 0 | 0 | 0 | 1 | 0 | 0.0000061200 |
| Comparative Example 2 | 105 | 100 | 101 | 103 | 100 | 99 | 100 | 104 | 100 | 107 | 100 | 105 | 0 | 0 | 0 | 1500 | 0 | 0.0000061200 |
| Comparative Example 3 | 106 | 101 | 102 | 104 | 101 | 100 | 101 | 105 | 101 | 108 | 101 | 106 | 1 | 1 | 1 | 0 | 0 | 0.0000061800 |

TABLE 2-3

| | B: Metal Atom (mass ppt) | | | | | | | | | | | | C (mass ppt) | | | | | Metal Atom |
|---|---|---|---|---|---|---|---|---|---|---|---|---|---|---|---|---|---|---|
| | Na | K | Ca | Fe | Cu | Mg | Mn | Li | Al | Cr | Ni | Zn | Peroxide | Ester Compound | Amine Compound | Inorganic Salt | Chelate Complex | Ratio $T_1$ |
| Comparative Example 4 | 106 | 101 | 102 | 104 | 101 | 100 | 101 | 105 | 101 | 108 | 101 | 106 | 1500 | 1 | 1 | 0 | 0 | 0.0000061800 |
| Comparative Example 5 | 107 | 102 | 103 | 105 | 102 | 101 | 102 | 106 | 102 | 109 | 102 | 107 | 1 | 1500 | 1 | 0 | 0 | 0.0000062400 |
| Comparative Example 6 | 108 | 103 | 104 | 106 | 103 | 102 | 103 | 107 | 103 | 110 | 103 | 108 | 0 | 1 | 1500 | 0 | 0 | 0.0000063000 |
| Comparative Example 7 | 109 | 104 | 105 | 107 | 104 | 103 | 104 | 108 | 104 | 111 | 104 | 109 | 0 | 0 | 0 | 1 | 0 | 0.0000063600 |
| Comparative Example 8 | 110 | 105 | 106 | 108 | 105 | 104 | 105 | 109 | 105 | 112 | 105 | 110 | 0 | 0 | 0 | 1500 | 0 | 0.0000064200 |
| Comparative Example 9 | 105 | 100 | 101 | 103 | 100 | 99 | 100 | 104 | 100 | 107 | 100 | 105 | 0 | 0 | 0 | 1 | 1 | 0.0000030600 |
| Comparative Example 10 | 105 | 100 | 101 | 103 | 100 | 99 | 100 | 104 | 100 | 107 | 100 | 105 | 0 | 0 | 0 | 100 | 1 | 0.0000030600 |
| Comparative Example 11 | 106 | 101 | 102 | 104 | 101 | 100 | 101 | 105 | 101 | 108 | 101 | 106 | 100 | 1 | 1 | 0 | 1 | 0.0000030900 |
| Comparative Example 12 | 107 | 102 | 103 | 105 | 102 | 101 | 102 | 106 | 102 | 109 | 102 | 107 | 1 | 100 | 1 | 0 | 1 | 0.0000031200 |
| Comparative Example 13 | 108 | 103 | 104 | 106 | 103 | 102 | 103 | 107 | 103 | 110 | 103 | 108 | 1 | 1 | 100 | 0 | 1 | 0.0000031500 |
| Comparative Example 14 | 109 | 104 | 105 | 107 | 104 | 103 | 104 | 108 | 104 | 111 | 104 | 109 | 0 | 0 | 0 | 1 | 1 | 0.0000031800 |
| Comparative Example 15 | 110 | 105 | 106 | 108 | 105 | 104 | 105 | 109 | 105 | 112 | 105 | 110 | 0 | 0 | 0 | 100 | 1 | 0.0000032100 |
| Example 34 | 2 | 1 | 1 | 2 | 1 | 1 | 1 | 1 | 1 | 1 | 1 | 1 | 0 | 0 | 0 | 1 | 0 | 0.0000000007 |
| Example 35 | 2 | 2 | 1 | 1 | 1 | 1 | 1 | 1 | 1 | 1 | 1 | 1 | 1 | 1 | 1 | 0 | 0 | 0.0000000007 |
| Example 36 | 1 | 2 | 2 | 1 | 1 | 1 | 1 | 1 | 1 | 1 | 1 | 1 | 0 | 0 | 0 | 1 | 0 | 0.0000000007 |
| Example 37 | 2 | 1 | 1 | 2 | 1 | 1 | 1 | 1 | 1 | 1 | 1 | 1 | 0 | 0 | 0 | 1 | 1 | 0.0000000004 |
| Example 38 | 2 | 2 | 1 | 1 | 1 | 1 | 1 | 1 | 1 | 1 | 1 | 1 | 1 | 1 | 1 | 0 | 1 | 0.0000000004 |
| Example 39 | 1 | 2 | 2 | 1 | 1 | 1 | 1 | 1 | 1 | 1 | 1 | 1 | 0 | 0 | 0 | 1 | 1 | 0.0000000004 |

TABLE 2-4

| | D: Particulate Metal (mass ppt) | | | | | | | | |
|---|---|---|---|---|---|---|---|---|---|
| | Na | K | Ca | Fe | Cu | Mg | Mn | Li | Al |
| Example 1 | 0.200 | 0.100 | 0.100 | 0.200 | 0.100 | 0.100 | 0.100 | 0.100 | 0.100 |
| Example 2 | 0.200 | 0.200 | 0.100 | 0.100 | 0.100 | 0.100 | 0.100 | 0.100 | 0.100 |
| Example 3 | 0.100 | 0.200 | 0.200 | 0.100 | 0.100 | 0.100 | 0.100 | 0.100 | 0.100 |
| Example 4 | 0.200 | 0.100 | 0.100 | 0.200 | 0.100 | 0.100 | 0.100 | 0.100 | 0.100 |
| Example 5 | 0.200 | 0.200 | 0.100 | 0.100 | 0.100 | 0.100 | 0.100 | 0.100 | 0.100 |
| Example 6 | 0.100 | 0.200 | 0.200 | 0.100 | 0.100 | 0.100 | 0.100 | 0.100 | 0.100 |
| Example 7 | 0.300 | 0.150 | 0.150 | 0.300 | 0.150 | 0.150 | 0.150 | 0.150 | 0.150 |
| Example 8 | 0.300 | 0.300 | 0.150 | 0.150 | 0.150 | 0.150 | 0.150 | 0.150 | 0.150 |
| Example 9 | 0.150 | 0.300 | 0.300 | 0.150 | 0.150 | 0.150 | 0.150 | 0.150 | 0.150 |
| Example 10 | 0.300 | 0.150 | 0.150 | 0.300 | 0.150 | 0.150 | 0.150 | 0.150 | 0.150 |
| Example 11 | 0.300 | 0.300 | 0.150 | 0.150 | 0.150 | 0.150 | 0.150 | 0.150 | 0.150 |
| Example 12 | 0.150 | 0.300 | 0.300 | 0.150 | 0.150 | 0.150 | 0.150 | 0.150 | 0.150 |

TABLE 2-4-continued

| | | | | | | | | |
|---|---|---|---|---|---|---|---|---|
| Example 13 | 0.450 | 0.225 | 0.225 | 0.450 | 0.225 | 0.225 | 0.225 | 0.225 | 0.225 |
| Example 14 | 0.450 | 0.450 | 0.225 | 0.225 | 0.225 | 0.225 | 0.225 | 0.225 | 0.225 |
| Example 15 | 0.225 | 0.450 | 0.450 | 0.225 | 0.225 | 0.225 | 0.225 | 0.225 | 0.225 |
| Example 16 | 0.450 | 0.225 | 0.225 | 0.450 | 0.225 | 0.225 | 0.225 | 0.225 | 0.225 |
| Example 17 | 0.450 | 0.450 | 0.225 | 0.225 | 0.225 | 0.225 | 0.225 | 0.225 | 0.225 |
| Example 18 | 0.225 | 0.450 | 0.450 | 0.225 | 0.225 | 0.225 | 0.225 | 0.225 | 0.225 |

| | D: Particulate Metal (mass ppt) | | | Particulate Metal Ratio $T_2$ | Particulate Defect | Resist Pattern Shape | Resist Pattern Defect Performance | Color Filter Linearity of Pattern |
|---|---|---|---|---|---|---|---|---|
| | Cr | Ni | Zn | | | | | |
| Example 1 | 0.100 | 0.100 | 0.100 | 0.00000000700 | A | Rectangular | A | A |
| Example 2 | 0.100 | 0.100 | 0.100 | 0.00000000700 | A | Rectangular | A | A |
| Example 3 | 0.100 | 0.100 | 0.100 | 0.00000000700 | A | Rectangular | A | A |
| Example 4 | 0.100 | 0.100 | 0.100 | 0.00000000350 | A | Rectangular | A | A |
| Example 5 | 0.100 | 0.100 | 0.100 | 0.00000000350 | A | Rectangular | A | A |
| Example 6 | 0.100 | 0.100 | 0.100 | 0.00000000350 | A | Rectangular | A | A |
| Example 7 | 0.150 | 0.150 | 0.150 | 0.00000000700 | A | Rectangular | A | A |
| Example 8 | 0.150 | 0.150 | 0.150 | 0.00000000700 | A | Rectangular | A | A |
| Example 9 | 0.150 | 0.150 | 0.150 | 0.00000000700 | A | Rectangular | A | A |
| Example 10 | 0.150 | 0.150 | 0.150 | 0.00000000350 | A | Rectangular | A | A |
| Example 11 | 0.150 | 0.150 | 0.150 | 0.00000000350 | A | Rectangular | A | A |
| Example 12 | 0.150 | 0.150 | 0.150 | 0.00000000350 | A | Rectangular | A | A |
| Example 13 | 0.225 | 0.225 | 0.225 | 0.00000001050 | A | Rectangular | A | A |
| Example 14 | 0.225 | 0.225 | 0.225 | 0.00000001050 | A | Rectangular | A | A |
| Example 15 | 0.225 | 0.225 | 0.225 | 0.00000001050 | A | Rectangular | A | A |
| Example 16 | 0.225 | 0.225 | 0.225 | 0.00000000525 | A | Rectangular | A | A |
| Example 17 | 0.225 | 0.225 | 0.225 | 0.00000000525 | A | Rectangular | A | A |
| Example 18 | 0.225 | 0.225 | 0.225 | 0.00000000525 | A | Rectangular | A | A |

TABLE 2-5

| | D: Particulate Metal (mass ppt) | | | | | | | | |
|---|---|---|---|---|---|---|---|---|---|
| | Na | K | Ca | Fe | Cu | Mg | Mn | Li | Al |
| Example 19 | 0.200 | 0.100 | 0.100 | 0.200 | 0.100 | 0.100 | 0.100 | 0.100 | 0.100 |
| Example 20 | 0.200 | 0.200 | 0.100 | 0.100 | 0.100 | 0.100 | 0.100 | 0.100 | 0.100 |
| Example 21 | 0.100 | 0.200 | 0.200 | 0.100 | 0.100 | 0.100 | 0.100 | 0.100 | 0.100 |
| Example 22 | 0.200 | 0.100 | 0.100 | 0.200 | 0.100 | 0.100 | 0.100 | 0.100 | 0.100 |
| Example 23 | 0.200 | 0.200 | 0.100 | 0.100 | 0.100 | 0.100 | 0.100 | 0.100 | 0.100 |
| Example 24 | 0.100 | 0.200 | 0.200 | 0.100 | 0.100 | 0.100 | 0.100 | 0.100 | 0.100 |
| Example 25 | 0.200 | 0.200 | 0.100 | 0.100 | 0.100 | 0.100 | 0.100 | 0.100 | 0.100 |
| Example 26 | 0.200 | 0.200 | 0.100 | 0.100 | 0.100 | 0.100 | 0.100 | 0.100 | 0.100 |
| Example 27 | 0.200 | 0.200 | 0.100 | 0.100 | 0.100 | 0.100 | 0.100 | 0.100 | 0.100 |
| Example 28 | 0.200 | 0.200 | 0.100 | 0.100 | 0.100 | 0.100 | 0.100 | 0.100 | 0.100 |
| Example 29 | 0.200 | 0.200 | 0.100 | 0.100 | 0.100 | 0.100 | 0.100 | 0.100 | 0.100 |
| Example 30 | 0.200 | 0.200 | 0.100 | 0.100 | 0.100 | 0.100 | 0.100 | 0.100 | 0.100 |
| Example 31 | 0.200 | 0.200 | 0.100 | 0.100 | 0.100 | 0.100 | 0.100 | 0.100 | 0.100 |
| Example 32 | 0.100 | 0.100 | 0.100 | 0.100 | 0.100 | 0.100 | 0.100 | 0.100 | 0.100 |
| Example 33 | 0.200 | 0.200 | 0.100 | 0.100 | 0.100 | 0.100 | 0.100 | 0.100 | 0.100 |
| Comparative Example 1 | 10.500 | 10.000 | 10.100 | 10.300 | 10.000 | 9.900 | 10.000 | 10.400 | 10.000 |
| Comparative Example 2 | 10.500 | 10.000 | 10.100 | 10.300 | 10.000 | 9.900 | 10.000 | 10.400 | 10.000 |
| Comparative Example 3 | 10.600 | 10.100 | 10.200 | 10.400 | 10.100 | 10.000 | 10.100 | 10.500 | 10.100 |

| | D: Particulate Metal (mass ppt) | | | Particulate Metal Ratio $T_2$ | Particulate Defect | Resist Pattern Shape | Resist Pattern Defect Performance | Color Filter Linearity of Pattern |
|---|---|---|---|---|---|---|---|---|
| | Cr | Ni | Zn | | | | | |
| Example 19 | 0.100 | 0.100 | 0.100 | 0.00000000700 | B | Rectangular | A | B |
| Example 20 | 0.100 | 0.100 | 0.100 | 0.00000000700 | B | Rectangular | A | C |
| Example 21 | 0.100 | 0.100 | 0.100 | 0.00000000700 | B | Rectangular | A | B |
| Example 22 | 0.100 | 0.100 | 0.100 | 0.00000000350 | B | Rectangular | A | B |
| Example 23 | 0.100 | 0.100 | 0.100 | 0.00000000350 | B | Rectangular | A | C |
| Example 24 | 0.100 | 0.100 | 0.100 | 0.00000000350 | B | Rectangular | A | B |
| Example 25 | 0.100 | 0.100 | 0.100 | 0.00000000700 | B | Rectangular | A | B |
| Example 26 | 0.100 | 0.100 | 0.100 | 0.00000000350 | B | Rectangular | A | B |

TABLE 2-5-continued

| | | | | | | | | |
|---|---|---|---|---|---|---|---|---|
| Example 27 | 0.100 | 0.100 | 0.100 | 0.00000000700 | A | Rectangular | A | B |
| Example 28 | 0.100 | 0.100 | 0.100 | 0.00000000350 | A | Rectangular | A | B |
| Example 29 | 0.100 | 0.100 | 0.100 | 0.00000000700 | B | Rectangular | A | B |
| Example 30 | 0.100 | 0.100 | 0.100 | 0.00000000350 | B | Rectangular | A | B |
| Example 31 | 0.100 | 0.100 | 0.100 | 0.00000000350 | B | Rectangular | A | B |
| Example 32 | 0.100 | 0.100 | 0.100 | 0.00000000750 | A | Rectangular | A | A |
| Example 33 | 0.100 | 0.100 | 0.100 | 0.00000000350 | B | Rectangular | A | B |
| Comparative Example 1 | 10.700 | 10.000 | 10.500 | 0.00000061200 | D | Forward Tapered | E | D |
| Comparative Example 2 | 10.700 | 10.000 | 10.500 | 0.00000061200 | E | Forward Tapered | E | D |
| Comparative Example 3 | 10.800 | 10.100 | 10.600 | 0.00000061800 | D | Forward Tapered | E | D |

TABLE 2-6

| | D: Particulate Metal (mass ppt) | | | | | | | | | | | | Particulate | | Resist | | Color Filter |
|---|---|---|---|---|---|---|---|---|---|---|---|---|---|---|---|---|---|
| | Na | K | Ca | Fe | Cu | Mg | Mn | Li | Al | Cr | Ni | Zn | Metal Ratio $T_2$ | Defect | Pattern Shape | Pattern Defect Performance | Linearity of Pattern |
| Comparative Example 4 | 10.600 | 10.100 | 10.200 | 10.400 | 10.100 | 10.000 | 10.100 | 10.500 | 10.100 | 10.800 | 10.100 | 10.600 | 0.00000061800 | E | Forward Tapered | E | D |
| Comparative Example 5 | 10.700 | 10.200 | 10.300 | 10.500 | 10.200 | 10.100 | 10.200 | 10.600 | 10.200 | 10.900 | 10.200 | 10.700 | 0.00000062400 | E | Forward Tapered | E | D |
| Comparative Example 6 | 10.800 | 10.300 | 10.400 | 10.600 | 10.300 | 10.200 | 10.300 | 10.700 | 10.300 | 11.000 | 10.300 | 10.800 | 0.00000063000 | E | Forward Tapered | E | D |
| Comparative Example 7 | 10.900 | 10.400 | 10.500 | 10.700 | 10.400 | 10.300 | 10.400 | 10.800 | 10.400 | 11.100 | 10.400 | 10.900 | 0.00000063600 | D | Forward Tapered | E | D |
| Comparative Example 8 | 11.000 | 10.500 | 10.600 | 10.800 | 10.500 | 10.400 | 10.500 | 10.900 | 10.500 | 11.200 | 10.500 | 11.000 | 0.00000064200 | E | Forward Tapered | E | D |
| Comparative Example 9 | 10.500 | 10.000 | 10.100 | 10.300 | 10.000 | 9.900 | 10.000 | 10.400 | 10.000 | 10.700 | 10.000 | 10.500 | 0.00000030600 | D | Forward Tapered | E | D |
| Comparative Example 10 | 10.500 | 10.000 | 10.100 | 10.300 | 10.000 | 9.900 | 10.000 | 10.400 | 10.000 | 10.700 | 10.000 | 10.500 | 0.00000030600 | E | Forward Tapered | E | D |
| Comparative Example 11 | 10.600 | 10.100 | 10.200 | 10.400 | 10.100 | 10.000 | 10.100 | 10.500 | 10.100 | 10.800 | 10.100 | 10.600 | 0.00000030900 | E | Forward Tapered | E | D |
| Comparative Example 12 | 10.700 | 10.200 | 10.300 | 10.500 | 10.200 | 10.100 | 10.200 | 10.600 | 10.200 | 10.900 | 10.200 | 10.700 | 0.00000031200 | E | Forward Tapered | E | D |
| Comparative Example 13 | 10.800 | 10.300 | 10.400 | 10.600 | 10.300 | 10.200 | 10.300 | 10.700 | 10.300 | 11.000 | 10.300 | 10.800 | 0.00000031500 | E | Forward Tapered | E | D |
| Comparative Example 14 | 10.900 | 10.400 | 10.500 | 10.700 | 10.400 | 10.300 | 10.400 | 10.800 | 10.400 | 11.100 | 10.400 | 10.900 | 0.00000031800 | D | Forward Tapered | E | D |
| Comparative Example 15 | 11.000 | 10.500 | 10.600 | 10.800 | 10.500 | 10.400 | 10.500 | 10.900 | 10.500 | 11.200 | 10.500 | 11.000 | 0.00000032100 | E | Forward Tapered | E | D |
| Example 34 | 0.200 | 0.100 | 0.100 | 0.200 | 0.100 | 0.100 | 0.100 | 0.100 | 0.100 | 0.100 | 0.100 | 0.100 | 0.00000000007 | C | Forward Tapered | A | D |
| Example 35 | 0.200 | 0.200 | 0.100 | 0.100 | 0.100 | 0.100 | 0.100 | 0.100 | 0.100 | 0.100 | 0.100 | 0.100 | 0.00000000007 | C | Forward Tapered | A | D |
| Example 36 | 0.100 | 0.200 | 0.200 | 0.100 | 0.100 | 0.100 | 0.100 | 0.100 | 0.100 | 0.100 | 0.100 | 0.100 | 0.00000000007 | C | Forward Tapered | A | D |
| Example 37 | 0.200 | 0.100 | 0.100 | 0.200 | 0.100 | 0.100 | 0.100 | 0.100 | 0.100 | 0.100 | 0.100 | 0.100 | 0.00000000004 | C | Forward Tapered | A | D |
| Example 38 | 0.200 | 0.200 | 0.100 | 0.100 | 0.100 | 0.100 | 0.100 | 0.100 | 0.100 | 0.100 | 0.100 | 0.100 | 0.00000000004 | C | Forward Tapered | A | D |
| Example 39 | 0.100 | 0.200 | 0.200 | 0.100 | 0.100 | 0.100 | 0.100 | 0.100 | 0.100 | 0.100 | 0.100 | 0.100 | 0.00000000004 | C | Forward Tapered | A | D |

B-1. Treatment Liquid for Manufacturing Semiconductor: Examples 101 to 152, Comparative Examples 101 and 102

[Quaternary Ammonium Compound]
The following quaternary ammonium compound was used under the same conditions as in Examples 1 to 39 and Comparative Examples 1 to 15.
S-1: tetramethylammonium hydroxide (TMAH)
[Additive]
The following compounds were used as an additive.
AA-2: NEWKALGEN FS-3 (manufactured by Takemoto Oil&Fat Co., Ltd.) (anionic surfactant: amine salt)
AA-3: NEWKALGEN FS-7 (manufactured by Takemoto Oil&Fat Co., Ltd.) (anionic surfactant: amine salt)
AA-4: EMAL 20C (manufactured by Takemoto Oil&Fat Co., Ltd.) (anionic surfactant: ether)
AN-4: Surfynol S420 (manufactured by Air Products&Chemicals Ltd.) (nonionic surfactant: acetylene)
AN-5: Surfynol S440 (manufactured by Air Products&Chemicals Ltd.) (nonionic surfactant: acetylene)
AN-1: Surfynol S465 (manufactured by Air Products&Chemicals Ltd.) (nonionic surfactant: acetylene)
AN-6: Surfynol S485 (manufactured by Air Products&Chemicals Ltd.) (nonionic surfactant: acetylene)
AN-7: OLFINE E1004 (manufactured by Nissin Chemical Co., Ltd.) (nonionic surfactant: acetylene)
AN-8: OLFINE E1010 (manufactured by Nissin Chemical Co., Ltd.) (nonionic surfactant: acetylene)
AN-9: OLFINE E1020 (manufactured by Nissin Chemical Co., Ltd.) (nonionic surfactant: acetylene)
AN-10: BLAUNON EL-1502.2 (manufactured by Aoki Oil Industrial Co., Ltd.) (nonionic surfactant: ether)
AN-11: BLAUNON EL-1505 (manufactured by Aoki Oil Industrial Co., Ltd.) (nonionic surfactant: ether)
AN-12: BLAUNON EL-1507.5 (manufactured by Aoki Oil Industrial Co., Ltd.) (nonionic surfactant: ether)
AN-13: BLAUNON EL-1509.5 (manufactured by Aoki Oil Industrial Co., Ltd.) (nonionic surfactant: ether)
AN-14: BLAUNON L-207 (manufactured by Aoki Oil Industrial Co., Ltd.) (nonionic surfactant: amine)
AN-15: BLAUNON L-220 (manufactured by Aoki Oil Industrial Co., Ltd.) (nonionic surfactant: amine)
AN-16: RHEODOL TW-L120 (manufactured Kao Corporation) (nonionic surfactant: fatty acid ester)
AN-17: RHEODOL SP-L10 (manufactured Kao Corporation) (nonionic surfactant: fatty acid ester)
AN-18: RHEODOL 430V (manufactured Kao Corporation) (nonionic surfactant: fatty acid ester)
AC-2: PIONIN B-251 (manufactured by Takemoto Oil&Fat Co., Ltd.) (cationic surfactant: pyridinium salt)
AC-3: PIONIN B-111 (manufactured by Takemoto Oil&Fat Co., Ltd.) (cationic surfactant: pyridinium salt)
AC-4: AMPHITOL 24B (manufactured Kao Corporation) (cationic surfactant: betaine)
AH-2: diethylenetriaminepentaacetic acid (chelating agent)
[Water]
Water was the same as that of Examples 1 to 39 and Comparative Examples 1 to 15.

B-2. Preparation of Developer: Examples 101 to 152, Comparative Examples 101 and 102

Tables 3-1 to 3-4 show ratios of the addition amounts of the quaternary ammonium compounds and the additives with respect to the treatment liquid for manufacturing a semiconductor. 1000 g of each of mixed solutions was prepared according to the ratio shown in Tables 3-1 to 3-4 with respect to water as a balance. The obtained mixed solution was treated under the same conditions as in Examples 1 to 39 and Comparative Examples 1 to 15 to obtain a treatment liquid for manufacturing a semiconductor. This treatment liquid for manufacturing a semiconductor was used as a developer.

The preparation, charging, storage, and the like of the above-described treatment liquid for manufacturing a semiconductor (developer) were performed and the container to be used was treated under the same conditions as in Examples 1 to 39 and Comparative Examples 1 to 15.
[Measurement of Metal Atoms]
One kind or two or more kinds of metal atoms selected from the group consisting of Na, K, Ca, Fe, Cu, Mg, Mn, Li, Al, Cr, Ni, and Zn in the developer were measured under the same conditions as in Examples 1 to 39 and Comparative Examples 1 to 15.
[Metal Atom Ratio $T_1$ and Particulate Metal Ratio $T_2$] The metal atom ratio $T_1$ and the particulate metal ratio $T_2$ were calculated under the same conditions as in Examples 1 to 39 and Comparative Examples 1 to 15. The calculation results are shown in Tables 3-1 to 3-4 and Tables 4-1 to 4-8.

TABLE 3-1

| | Quaternary Ammonium Compound | | Anionic Surfactant | | Nonionic Surfactant | | | Cationic Surfactant | | Chelating Agent | | |
|---|---|---|---|---|---|---|---|---|---|---|---|---|
| | | | | | A: Additive | | | | | | | |
| | Kind | mass % | Kind | mass ppm | Kind | mass ppm | HLB | Kind | mass ppm | Kind | mass ppm | Metal Atom Ratio $T_1$ |
| Example 101 | S-1 | 2 | — | — | AN-4 | 100 | 4 | — | — | — | — | 0.00000033000 |
| Example 102 | S-1 | 2 | — | — | AN-5 | 100 | 8 | — | — | — | — | 0.00000027000 |
| Example 103 | S-1 | 2 | — | — | AN-5 | 1,000 | 8 | — | — | — | — | 0.00000003000 |
| Example 104 | S-1 | 2 | — | — | AN-5 | 10,000 | 8 | — | — | — | — | 0.00000000310 |
| Example 105 | S-1 | 2 | — | — | AN-5 | 15,000 | 8 | — | — | — | — | 0.00000000227 |
| Example 106 | S-1 | 2 | — | — | AN-1 | 100 | 13 | — | — | — | — | 0.00000031000 |
| Example 107 | S-1 | 2 | — | — | AN-6 | 100 | 17 | — | — | — | — | 0.00000027000 |
| Example 108 | S-1 | 2 | — | — | AN-7 | 100 | 7 to 9 | — | — | — | — | 0.00000030000 |
| Example 109 | S-1 | 2 | — | — | AN-8 | 100 | 13 to 14 | — | — | — | — | 0.00000034000 |
| Example 110 | S-1 | 2 | — | — | AN-9 | 100 | 15 to 16 | — | — | — | — | 0.00000033000 |

TABLE 3-1-continued

| | Quaternary Ammonium Compound | | A: Additive | | | | | | | | |
|---|---|---|---|---|---|---|---|---|---|---|---|
| | | | Anionic Surfactant | | Nonionic Surfactant | | | Cationic Surfactant | | Chelating Agent | | |
| | Kind | mass % | Kind | mass ppm | Kind | mass ppm | HLB | Kind | mass ppm | Kind | mass ppm | Metal Atom Ratio $T_1$ |
| Example 111 | S-1 | 2 | — | — | AN-10 | 100 | 6 | — | — | — | — | 0.00000032000 |
| Example 112 | S-1 | 2 | — | — | AN-11 | 100 | 11 | — | — | — | — | 0.00000033000 |
| Example 113 | S-1 | 2 | — | — | AN-12 | 100 | 12 | — | — | — | — | 0.00000036000 |

TABLE 3-2

| | Quaternary Ammonium Compound | | A: Additive | | | | | | | | | |
|---|---|---|---|---|---|---|---|---|---|---|---|---|
| | | | Anionic Surfactant | | Nonionic Surfactant | | | Cationic Surfactant | | Chelating Agent | | |
| | Kind | mass % | Kind | mass ppm | Kind | mass ppm | HLB | Kind | mass ppm | Kind | mass ppm | Metal Atom Ratio $T_1$ |
| Example 114 | S-1 | 2 | — | — | AN-13 | 100 | 15 | — | — | — | — | 0.00000028000 |
| Example 115 | S-1 | 2 | — | — | AN-14 | 100 | 12 | — | — | — | — | 0.00000029000 |
| Example 116 | S-1 | 2 | — | — | AN-15 | 100 | 16 | — | — | — | — | 0.00000028000 |
| Example 117 | S-1 | 2 | — | — | AN-16 | 100 | 17 | — | — | — | — | 0.00000029000 |
| Example 118 | S-1 | 2 | — | — | AN-17 | 100 | 9 | — | — | — | — | 0.00000034000 |
| Example 119 | S-1 | 2 | — | — | AN-18 | 100 | 11 | — | — | — | — | 0.00000033000 |
| Example 120 | S-1 | 2 | AA-2 | 100 | — | — | — | — | — | — | — | 0.00000031000 |
| Example 121 | S-1 | 2 | AA-3 | 100 | — | — | — | — | — | — | — | 0.00000032000 |
| Example 122 | S-1 | 2 | AA-4 | 100 | — | — | — | — | — | — | — | 0.00000029000 |
| Example 123 | S-1 | 2 | — | — | — | — | — | AC-2 | 100 | — | — | 0.00000034000 |
| Example 124 | S-1 | 2 | — | — | — | — | — | AC-3 | 100 | — | — | 0.00000029000 |
| Example 125 | S-1 | 2 | — | — | — | — | — | AC-4 | 100 | — | — | 0.00000030000 |
| Example 126 | S-1 | 2 | — | — | — | — | — | — | — | AH-2 | 1,000 | 0.00000003100 |

TABLE 3-3

| | Quaternary Ammonium Compound | | A-1: Additive Nonionic Surfactant | | | A-2: Additive | | | | | | | | | Additive Sum | | |
|---|---|---|---|---|---|---|---|---|---|---|---|---|---|---|---|---|---|
| | | | | | | Anionic Surfactant | | Nonionic Surfactant | | | Cationic Surfactant | | Chelating Agent | | | | |
| | Kind | mass % | Kind | mass ppm | HLB | Kind | mass ppm | Kind | mass ppm | HLB | Kind | mass ppm | Kind | mass ppm | (A-2)/(A1) | mass ppm | Metal Atom Ratio $T_1$ |
| Example 127 | S-1 | 2 | AN-4 | 100 | 4 | — | — | AN-5 | 100 | 8 | — | — | — | — | 1 | 200 | 0.00000014500 |
| Example 128 | S-1 | 2 | AN-4 | 100 | 4 | — | — | AN-1 | 100 | 13 | — | — | — | — | 1 | 200 | 0.00000014500 |
| Example 129 | S-1 | 2 | AN-5 | 100 | 8 | — | — | AN-1 | 100 | 13 | — | — | — | — | 1 | 200 | 0.00000015000 |
| Example 130 | S-1 | 2 | AN-5 | 1,000 | 8 | — | — | AN-1 | 1,000 | 13 | — | — | — | — | 1 | 2,000 | 0.00000016500 |
| Example 131 | S-1 | 2 | AN-5 | 200 | 8 | — | — | AN-1 | 200 | 13 | — | — | — | — | 1 | 400 | 0.00000001500 |
| Example 132 | S-1 | 2 | AN-5 | 50 | 8 | — | — | AN-1 | 50 | 13 | — | — | — | — | 1 | 100 | 0.00000008500 |
| Example 133 | S-1 | 2 | AN-5 | 100 | 8 | — | — | AN-6 | 100 | 17 | — | — | — | — | 1 | 200 | 0.00000034000 |
| Example 134 | S-1 | 2 | AN-1 | 100 | 13 | — | — | AN-6 | 100 | 17 | — | — | — | — | 1 | 200 | 0.00000015500 |
| Example 135 | S-1 | 2 | AN-5 | 100 | 8 | AA-2 | 100 | — | — | — | — | — | — | — | 1 | 200 | 0.00000018000 |
| Example 136 | S-1 | 2 | AN-5 | 100 | 8 | AA-3 | 100 | — | — | — | — | — | — | — | 1 | 200 | 0.00000017500 |
| Example 137 | S-1 | 2 | AN-5 | 100 | 8 | AA-4 | 100 | — | — | — | — | — | — | — | 1 | 200 | 0.00000016000 |
| Example 138 | S-1 | 2 | AN-5 | 100 | 8 | — | — | — | — | — | AC-2 | 100 | — | — | 1 | 200 | 0.00000014500 |
| Example 139 | S-1 | 2 | AN-5 | 100 | 8 | — | — | — | — | — | AC-3 | 100 | — | — | 1 | 200 | 0.00000015500 |
| Example 140 | S-1 | 2 | AN-5 | 100 | 8 | — | — | — | — | — | AC-4 | 100 | — | — | 1 | 200 | 0.00000015000 |

TABLE 3-4

| | Quaternary Ammonium Compound | | A-1: Additive Nonionic Surfactant | | | A-2: Additive | | | | | | | Additive Chelating Agent | | (A-2)/ (A-1) | Sum | Metal Atom Ratio T₁ |
|---|---|---|---|---|---|---|---|---|---|---|---|---|---|---|---|---|---|
| | | | | | | Anionic Surfactant | | Nonionic Surfactant | | | Cationic Surfactant | | | | | | |
| | Kind | mass % | Kind | mass ppm | HLB | Kind | mass ppm | Kind | mass ppm | HLB | Kind | mass ppm | Kind | mass ppm | | mass ppm | |
| Example 141 | S-1 | 2 | AN-5 | 100 | 8 | — | — | — | — | — | — | — | AH-2 | 1,000 | 10 | 1,100 | 0.00000014500 |
| Example 142 | S-1 | 2 | AN-7 | 100 | 7 to 9 | — | — | AN-8 | 100 | 13 to 14 | — | — | — | — | 1 | 200 | 0.00000003364 |
| Example 143 | S-1 | 2 | AN-7 | 85 | 7 to 9 | — | — | AN-8 | 200 | 13 to 14 | — | — | — | — | 2 | 285 | 0.00000014000 |
| Example 144 | S-1 | 2 | AN-7 | 100 | 7 to 9 | — | — | AN-8 | 350 | 13 to 14 | — | — | — | — | 4 | 450 | 0.00000011228 |
| Example 145 | S-1 | 2 | AN-7 | 100 | 7 to 9 | — | — | AN-8 | 50 | 13 to 14 | — | — | — | — | 1 | 150 | 0.00000007111 |
| Example 146 | S-1 | 2 | AN-7 | 100 | 7 to 9 | — | — | AN-9 | 100 | 15 to 16 | — | — | — | — | 1 | 200 | 0.00000019333 |
| Example 147 | S-1 | 2 | AN-5 | 100 | 8 | — | — | AN-1 | 100 | 13 | — | — | — | — | 1 | 200 | 0.00000018500 |
| Example 148 | S-1 | 2 | AN-5 | 100 | 8 | — | — | AN-1 | 100 | 13 | — | — | — | — | 1 | 200 | 0.00000075500 |
| Example 149 | S-1 | 2 | AN-5 | 100 | 8 | — | — | AN-1 | 100 | 13 | — | — | — | — | 1 | 200 | 0.00000192000 |
| Example 150 | S-1 | 12 | AN-5 | 100 | 8 | — | — | AN-1 | 100 | 13 | — | — | — | — | 1 | 200 | 0.00000534997 |
| Example 151 | S-1 | 24 | AN-5 | 100 | 8 | — | — | AN-1 | 100 | 13 | — | — | — | — | 1 | 200 | 0.00000018000 |
| Example 152 | S-1 | 29 | AN-5 | 100 | 8 | — | — | AN-1 | 100 | 13 | — | — | — | — | 1 | 200 | 0.00000018000 |
| Example 153 | S-1 | 2 | AN-5 | 100 | 8 | — | — | AN-1 | 100 | 13 | — | — | — | — | 1 | 200 | 0.00000015000 |
| Comparative Example 101 | S-1 | 2 | AN-5 | 100 | 8 | — | — | AN-1 | 100 | 13 | — | — | — | — | 1 | 200 | 0.00204580610 |
| Comparative Example 102 | S-1 | 2 | AN-5 | 100,000 | 8 | — | — | AN-1 | 100,000 | 13 | — | — | AH-2 | 200,000 | 1 | 400,000 | 0.0000000000006 |

B-3. Examples 101 to 152, Comparative Examples 101 and 102

[Evaluation of Defects]

The evaluation was performed under the same conditions as in Examples 1 to 39 and Comparative Examples 1 to 15. The results are shown in Tables 4-5 to 4-8.

B-4. Actinic Ray-Sensitive or Radiation-Sensitive Resin Composition: Examples 101 to 152, Comparative Examples 101 and 102

The components of the actinic ray-sensitive or radiation-sensitive resin composition were the same as in Examples 1 to 39 and Comparative Examples 1 to 15.

B-5. Preparation of Resist Solution: Examples 101 to 152, Comparative Examples 101 and 102

The resist solution was prepared under the same conditions as in Examples 1 to 39 and Comparative Examples 1 to 16.

B-6. Examples 101 to 152, Comparative Example 101: Resist Pattern

A silicon wafer on which a resist pattern was formed was obtained using the same method as that of the resist pattern in Examples 1 to 39 and Comparative Examples 1 to 16.

B-7. Evaluation of Pattern Defect Performance: Examples 101 to 152, Comparative Examples 101 and 102

Regarding each of the patterns obtained in Examples 101 to 152 and Comparative Examples 101 and 102, the number of defects having a diameter of 20 nm or more present on the substrate surface was measured using a wafer surface inspection device (PUMA 9850; manufactured by KLA-Tencor Corporation). The obtained number of defects was evaluated based on the following standards, and the results thereof are shown in Tables 4-5 to 4-8. In the following standards, the evaluation C represents that an ability of suppressing defects that is required for the treatment liquid for manufacturing a semiconductor is achieved.

A: the number of defects was 0 to 500
B: the number of defects was more than 500 and 1000 or less
C: the number of defects was more than 1000 and 3000 or less D: the number of defects was more than 3000 and 5000 or less E: the number of defects was more than 5000

B-8. Evaluation of Pattern Collapse: Examples 101 to 152, Comparative Example 101

An area ratio of pattern collapse to the defects measured in the evaluation of the pattern defect performance was evaluated based on the following standards. The results are shown in Tables 4-5 to 4-8.
A: 0.5% or lower
B: 0.5% to 0.8%
C: 0.8% to 1.0%
D: 1.0% to 2.0%
E: 2.0% or higher C. Example 153

The treatment liquid according to Example 148 was further filtered using a nylon filter 5A (ULTIPLEAT P-Nylon, manufactured by Pall Corporation, 20 inch, pore size: 20 nm) set on a high-density polyethylene filter. The defect performance was evaluated under the same conditions as in Examples 101 to 152 and Comparative Examples 101 and 102. Further, a resist solution was prepared under the same conditions as in Examples 101 to 152 and Comparative Examples 101 and 102, and the defect performance, the pattern defect performance, and the pattern collapse were evaluated under the same conditions as in Examples 101 to 152 and Comparative Examples 101 and 102. The evaluation results of the defect performance, the pattern defect performance, and the pattern collapse are shown in Table 4-8.

D. Example 154

The defect performance, the pattern defect performance, and the pattern collapse were evaluated under the same conditions as in Example 153, except that a nylon-based microfilter membrane (manufactured by Entegris Japan Co., Ltd.) having a pore size of 10 nm was used instead of the filter used in Example 153 and that the filtration temperature was 15° C. The same result as in Example 153 was obtained.

E. Example 155

A coloring curable resin composition was prepared under the same conditions as in Example 1, except that the following F-1 was used instead of F781 in the coloring curable resin composition. Using this coloring curable resin composition, a color resist solution was prepared. Using the prepared color resist solution and the same method as in Example 1, the pattern linearity was evaluated, and the same result was obtained.

F-1: a mixture of resins represented by the following structural formulae (Mw=14000) was dissolved in a solution of 0.2% of PEGMEA

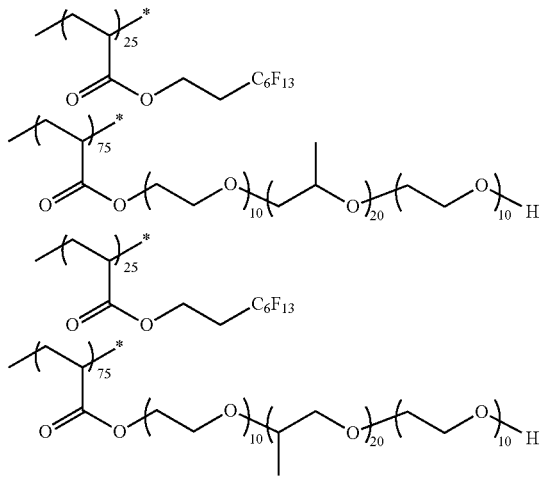

TABLE 4-1

| | B: Metal Atoms (mass ppt) | | | | | | | | | | | | | Metal |
|---|---|---|---|---|---|---|---|---|---|---|---|---|---|---|
| | Na | K | Ca | Fe | Cu | Mg | Mn | Li | Al | Cr | Ni | Zr | Total | Atom Ratio $T_1$ |
| Example 101 | 3 | 2 | 5 | 6 | 2 | 3 | 2 | 1 | 5 | 1 | 2 | 1 | 33 | 0.00000033000 |
| Example 102 | 4 | 1 | 6 | 4 | 1 | 2 | 1 | 1 | 4 | 1 | 1 | 1 | 27 | 0.00000027000 |
| Example 103 | 3 | 2 | 5 | 5 | 1 | 2 | 2 | 1 | 6 | 1 | 1 | 1 | 30 | 0.00000003000 |
| Example 104 | 4 | 2 | 4 | 4 | 2 | 3 | 2 | 1 | 5 | 1 | 2 | 1 | 31 | 0.00000000310 |
| Example 105 | 3 | 3 | 5 | 5 | 2 | 4 | 1 | 1 | 6 | 1 | 2 | 1 | 34 | 0.00000000227 |
| Example 106 | 2 | 2 | 5 | 4 | 3 | 3 | 2 | 1 | 6 | 1 | 1 | 1 | 31 | 0.00000031000 |
| Example 107 | 3 | 2 | 3 | 4 | 2 | 2 | 1 | 1 | 5 | 1 | 2 | 1 | 27 | 0.00000027000 |
| Example 108 | 3 | 2 | 4 | 4 | 2 | 3 | 2 | 1 | 4 | 1 | 3 | 1 | 30 | 0.00000030000 |
| Example 109 | 4 | 2 | 5 | 5 | 2 | 4 | 2 | 1 | 5 | 1 | 2 | 1 | 34 | 0.00000034000 |
| Example 110 | 4 | 4 | 5 | 4 | 1 | 3 | 1 | 1 | 6 | 1 | 2 | 1 | 33 | 0.00000033000 |
| Example 111 | 3 | 2 | 6 | 4 | 2 | 4 | 2 | 1 | 5 | 1 | 1 | 1 | 32 | 0.00000032000 |
| Example 112 | 4 | 2 | 5 | 4 | 3 | 2 | 3 | 1 | 5 | 1 | 2 | 1 | 33 | 0.00000033000 |
| Example 113 | 3 | 3 | 7 | 5 | 2 | 3 | 2 | 1 | 6 | 1 | 2 | 1 | 36 | 0.00000036000 |

TABLE 4-2

| | B: Metal Atoms (mass ppt) | | | | | | | | | | | | | Metal |
|---|---|---|---|---|---|---|---|---|---|---|---|---|---|---|
| | Na | K | Ca | Fe | Cu | Mg | Mn | Li | Al | Cr | Ni | Zr | Total | Atom Ratio $T_1$ |
| Example 114 | 3 | 2 | 5 | 4 | 1 | 3 | 1 | 1 | 5 | 1 | 1 | 1 | 28 | 0.00000028000 |
| Example 115 | 2 | 2 | 5 | 5 | 2 | 3 | 1 | 1 | 4 | 1 | 2 | 1 | 29 | 0.00000029000 |
| Example 116 | 3 | 1 | 3 | 4 | 1 | 4 | 2 | 1 | 5 | 1 | 2 | 1 | 28 | 0.00000028000 |
| Example 117 | 3 | 2 | 5 | 5 | 1 | 3 | 2 | 1 | 4 | 1 | 1 | 1 | 29 | 0.00000029000 |
| Example 118 | 4 | 3 | 5 | 5 | 2 | 2 | 3 | 1 | 5 | 1 | 2 | 1 | 34 | 0.00000034000 |

TABLE 4-2-continued

| | B: Metal Atoms (mass ppt) | | | | | | | | | | | | Metal Atom Ratio $T_1$ |
|---|---|---|---|---|---|---|---|---|---|---|---|---|---|
| | Na | K | Ca | Fe | Cu | Mg | Mn | Li | Al | Cr | Ni | Zr | Total | |
| Example 119 | 3 | 2 | 7 | 4 | 3 | 3 | 2 | 1 | 4 | 1 | 2 | 1 | 33 | 0.00000033000 |
| Example 120 | 3 | 2 | 5 | 5 | 2 | 3 | 2 | 1 | 5 | 1 | 1 | 1 | 31 | 0.00000031000 |
| Example 121 | 3 | 3 | 5 | 4 | 2 | 4 | 2 | 1 | 4 | 1 | 2 | 1 | 32 | 0.00000032000 |
| Example 122 | 3 | 2 | 4 | 3 | 2 | 3 | 3 | 1 | 5 | 1 | 1 | 1 | 29 | 0.00000029000 |
| Example 123 | 4 | 2 | 5 | 4 | 3 | 4 | 2 | 1 | 6 | 1 | 1 | 1 | 34 | 0.00000034000 |
| Example 124 | 3 | 1 | 5 | 4 | 2 | 4 | 1 | 1 | 4 | 1 | 2 | 1 | 29 | 0.00000029000 |
| Example 125 | 3 | 2 | 3 | 5 | 3 | 3 | 1 | 1 | 5 | 1 | 2 | 1 | 30 | 0.00000030000 |
| Example 126 | 3 | 2 | 5 | 4 | 3 | 3 | 2 | 1 | 5 | 1 | 1 | 1 | 31 | 0.00000003100 |

TABLE 4-3

| | B: Metal Atoms (mass ppt) | | | | | | | | | | | | Metal Atom Ratio $T_1$ |
|---|---|---|---|---|---|---|---|---|---|---|---|---|---|
| | Na | K | Ca | Fe | Cu | Mg | Mn | Li | Al | Cr | Ni | Zr | Total | |
| Example 127 | 3 | 2 | 5 | 3 | 2 | 3 | 2 | 1 | 5 | 1 | 1 | 1 | 29 | 0.00000014500 |
| Example 128 | 2 | 1 | 6 | 4 | 1 | 4 | 3 | 1 | 4 | 1 | 2 | 1 | 30 | 0.00000014500 |
| Example 129 | 3 | 2 | 4 | 4 | 2 | 4 | 2 | 1 | 6 | 1 | 3 | 1 | 33 | 0.00000015000 |
| Example 130 | 2 | 3 | 5 | 2 | 4 | 2 | 3 | 1 | 4 | 1 | 2 | 1 | 30 | 0.00000016500 |
| Example 131 | 2 | 3 | 5 | 3 | 3 | 3 | 3 | 1 | 6 | 1 | 3 | 1 | 34 | 0.00000001500 |
| Example 132 | 3 | 2 | 4 | 5 | 2 | 4 | 4 | 1 | 6 | 1 | 1 | 1 | 34 | 0.00000008500 |
| Example 133 | 3 | 1 | 5 | 4 | 3 | 3 | 2 | 1 | 5 | 1 | 2 | 1 | 31 | 0.00000034000 |
| Example 134 | 2 | 2 | 4 | 4 | 5 | 3 | 4 | 1 | 6 | 1 | 3 | 1 | 36 | 0.00000015500 |
| Example 135 | 3 | 3 | 5 | 6 | 2 | 4 | 3 | 1 | 4 | 1 | 2 | 1 | 35 | 0.00000018000 |
| Example 136 | 2 | 4 | 5 | 4 | 2 | 4 | 3 | 1 | 4 | 1 | 1 | 1 | 32 | 0.00000017500 |
| Example 137 | 2 | 2 | 3 | 5 | 1 | 3 | 2 | 1 | 6 | 1 | 2 | 1 | 29 | 0.00000016000 |
| Example 138 | 3 | 3 | 5 | 4 | 2 | 2 | 2 | 1 | 6 | 1 | 1 | 1 | 31 | 0.00000014500 |
| Example 139 | 2 | 2 | 4 | 3 | 3 | 2 | 4 | 1 | 5 | 1 | 2 | 1 | 30 | 0.00000015500 |
| Example 140 | 2 | 2 | 5 | 4 | 2 | 3 | 3 | 1 | 4 | 1 | 1 | 1 | 29 | 0.00000015000 |

TABLE 4-4

| | B: Metal Atoms (mass ppt) | | | | | | | |
|---|---|---|---|---|---|---|---|---|
| | Na | K | Ca | Fe | Cu | Mg | Mn | Li |
| Example 141 | 3 | 4 | 4 | 5 | 3 | 4 | 3 | 1 |
| Example 142 | 2 | 2 | 5 | 4 | 2 | 3 | 2 | 1 |
| Example 143 | 3 | 2 | 5 | 5 | 2 | 3 | 2 | 1 |
| Example 144 | 3 | 1 | 4 | 4 | 3 | 4 | 3 | 1 |
| Example 145 | 4 | 1 | 4 | 4 | 2 | 3 | 2 | 1 |
| Example 146 | 3 | 2 | 5 | 5 | 3 | 4 | 3 | 1 |
| Example 147 | 15 | 2 | 21 | 12 | 14 | 16 | 13 | 8 |
| Example 148 | 50 | 2 | 63 | 48 | 21 | 36 | 26 | 19 |
| Example 149 | 123 | 1 | 215 | 116 | 59 | 94 | 73 | 51 |
| Example 150 | 4 | 2 | 5 | 5 | 3 | 4 | 3 | 1 |
| Example 151 | 2 | 3 | 6 | 5 | 2 | 3 | 4 | 1 |
| Example 152 | 3 | 2 | 3 | 4 | 1 | 4 | 2 | 1 |
| Example 153 | 2 | 2 | 5 | 3 | 1 | 2 | 1 | 1 |
| Comparative Example 101 | 50,000 | 65,000 | 65,000 | 60,000 | 20,000 | 30,000 | 20,000 | 10,000 |
| Comparative Example 102 | <1 | <1 | <1 | <1 | <1 | <1 | <1 | <1 |

| | B: Metal Atoms (mass ppt) | | | | | Metal Atom Ratio $T_1$ |
|---|---|---|---|---|---|---|
| | Al | Cr | Ni | Zr | Total | |
| Example 141 | 6 | 1 | 2 | 1 | 37 | 0.00000014500 |
| Example 142 | 4 | 1 | 1 | 1 | 28 | 0.00000003364 |
| Example 143 | 5 | 1 | 2 | 1 | 32 | 0.00000014000 |
| Example 144 | 4 | 1 | 3 | 1 | 32 | 0.00000011228 |
| Example 145 | 4 | 1 | 2 | 1 | 29 | 0.00000007111 |
| Example 146 | 6 | 1 | 3 | 1 | 37 | 0.00000019333 |
| Example 147 | 21 | 7 | 15 | 7 | 151 | 0.00000018500 |
| Example 148 | 54 | 16 | 35 | 14 | 384 | 0.00000075500 |
| Example 149 | 131 | 51 | 97 | 59 | 1,070 | 0.00000192000 |

TABLE 4-4-continued

| | | | | | | |
|---|---|---|---|---|---|---|
| Example 150 | 4 | 1 | 3 | 1 | 36 | 0.00000534997 |
| Example 151 | 6 | 1 | 2 | 1 | 36 | 0.00000018000 |
| Example 152 | 5 | 1 | 3 | 1 | 30 | 0.00000018000 |
| Example 153 | 4 | 1 | 1 | 1 | 24 | 0.00000015000 |
| Comparative Example 101 | 50,000 | 10,000 | 20,000 | 10,000 | 410,000 | 0.00204580610 |
| Comparative Example 102 | <1 | <1 | <1 | <1 | 0.25 | 0.0000000000006 |

TABLE 4-5

| | D: Particulate Metal (mass ppt) | | | | | | | | | | | | | Particulate Metal Ratio $T_2$ | Evaluation | | |
|---|---|---|---|---|---|---|---|---|---|---|---|---|---|---|---|---|---|
| | | | | | | | | | | | | | | | Defect Performance | Defect Pattern Collapse | Pattern Defect Performance |
| | Na | K | Ca | Fe | Cu | Mg | Mn | Li | Al | Cr | Ni | Zr | Total | | | | |
| Example 101 | 0.300 | 0.200 | 0.600 | 0.700 | 0.100 | 0.200 | 0.100 | 0.100 | 0.600 | 0.100 | 0.100 | 0.100 | 3.200 | 0.00000003200 | C | C | C |
| Example 102 | 0.300 | 0.200 | 0.700 | 0.400 | 0.100 | 0.200 | 0.100 | 0.100 | 0.400 | 0.100 | 0.100 | 0.100 | 2.800 | 0.00000002800 | C | C | C |
| Example 103 | 0.200 | 0.300 | 0.500 | 0.500 | 0.100 | 0.200 | 0.100 | 0.100 | 0.600 | 0.100 | 0.100 | 0.100 | 2.900 | 0.00000000290 | C | C | C |
| Example 104 | 0.400 | 0.200 | 0.400 | 0.400 | 0.100 | 0.300 | 0.200 | 0.100 | 0.600 | 0.100 | 0.100 | 0.100 | 3.000 | 0.00000000030 | C | C | C |
| Example 105 | 0.200 | 0.200 | 0.600 | 0.400 | 0.100 | 0.400 | 0.100 | 0.100 | 0.500 | 0.100 | 0.100 | 0.100 | 2.900 | 0.00000000019 | C | D | C |
| Example 106 | 0.200 | 0.200 | 0.500 | 0.400 | 0.300 | 0.400 | 0.100 | 0.100 | 0.500 | 0.100 | 0.100 | 0.100 | 3.000 | 0.00000003000 | C | C | C |
| Example 107 | 0.200 | 0.100 | 0.300 | 0.400 | 0.200 | 0.200 | 0.100 | 0.100 | 0.500 | 0.100 | 0.100 | 0.100 | 2.400 | 0.00000002400 | C | C | C |
| Example 108 | 0.200 | 0.100 | 0.400 | 0.400 | 0.100 | 0.200 | 0.200 | 0.100 | 0.400 | 0.100 | 0.200 | 0.100 | 2.500 | 0.00000002500 | C | C | C |
| Example 109 | 0.500 | 0.100 | 0.500 | 0.500 | 0.100 | 0.400 | 0.200 | 0.100 | 0.500 | 0.100 | 0.100 | 0.100 | 3.200 | 0.00000003200 | C | C | C |
| Example 110 | 0.400 | 0.200 | 0.600 | 0.500 | 0.100 | 0.400 | 0.100 | 0.100 | 0.800 | 0.100 | 0.100 | 0.100 | 3.500 | 0.00000003500 | C | C | C |
| Example 111 | 0.200 | 0.100 | 0.600 | 0.500 | 0.200 | 0.500 | 0.100 | 0.100 | 0.600 | 0.100 | 0.100 | 0.100 | 3.200 | 0.00000003200 | C | C | C |
| Example 112 | 0.400 | 0.100 | 0.600 | 0.400 | 0.200 | 0.100 | 0.200 | 0.100 | 0.500 | 0.100 | 0.100 | 0.100 | 2.900 | 0.00000002900 | C | C | C |
| Example 113 | 0.200 | 0.200 | 0.800 | 0.500 | 0.200 | 0.200 | 0.100 | 0.100 | 0.500 | 0.100 | 0.100 | 0.100 | 3.100 | 0.00000003100 | C | C | C |

TABLE 4-6

| | D: Particulate Metal (mass ppt) | | | | | | | | | | | | | Particulate Metal Ratio $T_2$ | Evaluation | | |
|---|---|---|---|---|---|---|---|---|---|---|---|---|---|---|---|---|---|
| | | | | | | | | | | | | | | | Defect Performance | Defect Pattern Collapse | Pattern Defect Performance |
| | Na | K | Ca | Fe | Cu | Mg | Mn | Li | Al | Cr | Ni | Zr | Total | | | | |
| Example 114 | 0.300 | 0.200 | 0.500 | 0.400 | 0.100 | 0.200 | 0.100 | 0.100 | 0.400 | 0.100 | 0.100 | 0.100 | 2.600 | 0.00000002600 | C | C | C |
| Example 115 | 0.300 | 0.200 | 0.500 | 0.500 | 0.100 | 0.200 | 0.100 | 0.100 | 0.300 | 0.100 | 0.100 | 0.100 | 2.600 | 0.00000002600 | C | C | C |
| Example 116 | 0.300 | 0.100 | 0.300 | 0.400 | 0.100 | 0.300 | 0.100 | 0.100 | 0.300 | 0.100 | 0.100 | 0.100 | 2.300 | 0.00000002300 | C | C | C |
| Example 117 | 0.200 | 0.200 | 0.300 | 0.500 | 0.100 | 0.100 | 0.200 | 0.100 | 0.400 | 0.100 | 0.100 | 0.100 | 2.400 | 0.00000002400 | C | C | C |
| Example 118 | 0.400 | 0.200 | 0.300 | 0.500 | 0.200 | 0.100 | 0.300 | 0.100 | 0.400 | 0.100 | 0.100 | 0.100 | 2.800 | 0.00000002800 | C | C | C |
| Example 119 | 0.400 | 0.200 | 0.600 | 0.400 | 0.300 | 0.200 | 0.100 | 0.100 | 0.300 | 0.100 | 0.100 | 0.100 | 2.900 | 0.00000002900 | C | C | C |
| Example 120 | 0.300 | 0.200 | 0.700 | 0.500 | 0.200 | 0.300 | 0.100 | 0.100 | 0.300 | 0.100 | 0.100 | 0.100 | 3.000 | 0.00000003000 | C | C | C |
| Example 121 | 0.300 | 0.200 | 0.400 | 0.400 | 0.100 | 0.300 | 0.200 | 0.100 | 0.400 | 0.100 | 0.100 | 0.100 | 2.700 | 0.00000002700 | C | C | C |
| Example 122 | 0.300 | 0.100 | 0.300 | 0.400 | 0.200 | 0.200 | 0.300 | 0.100 | 0.400 | 0.100 | 0.100 | 0.100 | 2.600 | 0.00000002600 | C | C | C |

TABLE 4-6-continued

| | D: Particulate Metal (mass ppt) | | | | | | | | | | | | | Particulate Metal Ratio $T_2$ | Evaluation | | |
|---|---|---|---|---|---|---|---|---|---|---|---|---|---|---|---|---|---|
| | Na | K | Ca | Fe | Cu | Mg | Mn | Li | Al | Cr | Ni | Zr | Total | | Defect Performance | Pattern Collapse | Defect Pattern Defect Performance |
| Example 123 | 0.300 | 0.100 | 0.300 | 0.400 | 0.200 | 0.300 | 0.100 | 0.100 | 0.600 | 0.100 | 0.100 | 0.100 | 2.700 | 0.00000002700 | C | C | C |
| Example 124 | 0.400 | 0.100 | 0.300 | 0.400 | 0.100 | 0.400 | 0.100 | 0.100 | 0.300 | 0.100 | 0.100 | 0.100 | 2.500 | 0.00000002500 | C | C | C |
| Example 125 | 0.300 | 0.200 | 0.200 | 0.500 | 0.300 | 0.200 | 0.100 | 0.100 | 0.400 | 0.100 | 0.100 | 0.100 | 2.600 | 0.00000002600 | C | C | C |
| Example 126 | 0.300 | 0.200 | 0.400 | 0.400 | 0.300 | 0.300 | 0.100 | 0.100 | 0.400 | 0.100 | 0.100 | 0.100 | 2.800 | 0.00000000280 | C | C | C |

TABLE 4-7

| | D: Particulate Metal (mass ppt) | | | | | | | | | | | | | Particulate Metal Ratio $T_2$ | Evaluation | | |
|---|---|---|---|---|---|---|---|---|---|---|---|---|---|---|---|---|---|
| | Na | K | Ca | Fe | Cu | Mg | Mn | Li | Al | Cr | Ni | Zr | Total | | Defect Performance | Lithography | Pattern Defect Performance |
| Example 127 | 0.200 | 0.200 | 0.600 | 0.200 | 0.200 | 0.200 | 0.200 | 0.100 | 0.500 | 0.100 | 0.100 | 0.100 | 2.700 | 0.00000000900 | C | C | C |
| Example 128 | 0.200 | 0.100 | 0.700 | 0.400 | 0.100 | 0.400 | 0.300 | 0.100 | 0.400 | 0.100 | 0.100 | 0.100 | 3.000 | 0.00000001000 | A | A | B |
| Example 129 | 0.300 | 0.100 | 0.400 | 0.400 | 0.200 | 0.300 | 0.200 | 0.100 | 0.600 | 0.100 | 0.200 | 0.100 | 3.000 | 0.00000001000 | A | A | B |
| Example 130 | 0.100 | 0.300 | 0.500 | 0.200 | 0.400 | 0.200 | 0.200 | 0.100 | 0.400 | 0.100 | 0.100 | 0.100 | 2.700 | 0.00000000090 | B | B | B |
| Example 131 | 0.200 | 0.200 | 0.500 | 0.300 | 0.200 | 0.300 | 0.300 | 0.100 | 0.500 | 0.100 | 0.100 | 0.100 | 2.900 | 0.00000000483 | A | A | B |
| Example 132 | 0.200 | 0.100 | 0.400 | 0.500 | 0.200 | 0.400 | 0.500 | 0.100 | 0.600 | 0.100 | 0.100 | 0.100 | 3.300 | 0.00000002200 | B | B | B |
| Example 133 | 0.200 | 0.100 | 0.500 | 0.400 | 0.200 | 0.300 | 0.200 | 0.100 | 0.500 | 0.100 | 0.100 | 0.100 | 2.800 | 0.00000000933 | A | A | B |
| Example 134 | 0.100 | 0.100 | 0.500 | 0.500 | 0.500 | 0.200 | 0.400 | 0.100 | 0.500 | 0.100 | 0.200 | 0.100 | 3.300 | 0.00000001100 | C | C | C |
| Example 135 | 0.200 | 0.200 | 0.500 | 0.600 | 0.200 | 0.300 | 0.300 | 0.100 | 0.400 | 0.100 | 0.100 | 0.100 | 3.100 | 0.00000001550 | C | C | C |
| Example 136 | 0.100 | 0.400 | 0.500 | 0.300 | 0.100 | 0.400 | 0.300 | 0.100 | 0.400 | 0.100 | 0.100 | 0.100 | 2.900 | 0.00000001450 | C | C | C |
| Example 137 | 0.200 | 0.200 | 0.300 | 0.400 | 0.100 | 0.300 | 0.100 | 0.100 | 0.600 | 0.100 | 0.100 | 0.100 | 2.600 | 0.00000001300 | C | C | C |
| Example 138 | 0.200 | 0.300 | 0.500 | 0.400 | 0.100 | 0.200 | 0.200 | 0.100 | 0.500 | 0.100 | 0.100 | 0.100 | 2.800 | 0.00000001400 | C | C | C |
| Example 139 | 0.200 | 0.200 | 0.400 | 0.400 | 0.400 | 0.100 | 0.400 | 0.100 | 0.500 | 0.100 | 0.100 | 0.100 | 3.000 | 0.00000001500 | C | C | C |
| Example 140 | 0.100 | 0.100 | 0.500 | 0.300 | 0.200 | 0.300 | 0.300 | 0.100 | 0.400 | 0.100 | 0.100 | 0.100 | 2.600 | 0.00000001300 | C | C | C |

TABLE 4-8

| | D: Particulate Metal (mass ppt) | | | | | | | | |
|---|---|---|---|---|---|---|---|---|---|
| | Na | K | Ca | Fe | Cu | Mg | Mn | Li | Al |
| Example 141 | 0.300 | 0.400 | 0.400 | 0.400 | 0.200 | 0.400 | 0.300 | 0.100 | 0.700 |
| Example 142 | 0.200 | 0.100 | 0.400 | 0.300 | 0.200 | 0.300 | 0.300 | 0.100 | 0.400 |
| Example 143 | 0.200 | 0.100 | 0.500 | 0.400 | 0.100 | 0.300 | 0.200 | 0.100 | 0.500 |
| Example 144 | 0.200 | 0.100 | 0.500 | 0.400 | 0.300 | 0.300 | 0.200 | 0.100 | 0.300 |
| Example 145 | 0.400 | 0.100 | 0.400 | 0.300 | 0.200 | 0.300 | 0.200 | 0.100 | 0.400 |
| Example 146 | 0.300 | 0.100 | 0.400 | 0.500 | 0.200 | 0.400 | 0.300 | 0.100 | 0.600 |
| Example 147 | 1.700 | 0.100 | 2.300 | 1.300 | 2.100 | 1.500 | 1.200 | 0.700 | 2.800 |
| Example 148 | 6.900 | 0.200 | 7.900 | 3.900 | 2.900 | 4.300 | 2.500 | 2.100 | 7.200 |
| Example 149 | 13.800 | 0.100 | 11.900 | 9.200 | 7.800 | 10.800 | 6.900 | 5.700 | 15.800 |
| Example 150 | 0.300 | 0.100 | 0.400 | 0.300 | 0.200 | 0.400 | 0.300 | 0.100 | 0.400 |

TABLE 4-8-continued

| | | | | | | | | | |
|---|---|---|---|---|---|---|---|---|---|
| Example 151 | 0.200 | 0.200 | 0.600 | 0.400 | 0.200 | 0.300 | 0.300 | 0.100 | 0.600 |
| Example 152 | 0.300 | 0.100 | 0.300 | 0.400 | 0.100 | 0.400 | 0.200 | 0.100 | 0.500 |
| Example 153 | 0.200 | 0.100 | 0.500 | 0.300 | 0.100 | 0.200 | 0.100 | 0.100 | 0.400 |
| Comparative Example 101 | 750.000 | 650.000 | 650.000 | 600.000 | 200.000 | 300.000 | 200.000 | 100.000 | 500.000 |
| Comparative Example 102 | 0.001 | 0.001 | 0.001 | 0.001 | 0.001 | 0.001 | 0.001 | 0.001 | 0.001 |

| | D: Particulate Metal (mass ppt) | | | | Particulate Metal Ratio $T_2$ | Evaluation | | |
|---|---|---|---|---|---|---|---|---|
| | Cr | Ni | Zr | Total | | Defect Performance | Lithography | Pattern Defect Performance |
| Example 141 | 0.100 | 0.100 | 0.100 | 3.500 | 0.00000000167 | C | C | C |
| Example 142 | 0.100 | 0.100 | 0.100 | 2.600 | 0.00000000867 | A | A | B |
| Example 143 | 0.100 | 0.100 | 0.100 | 2.700 | 0.00000000557 | A | A | A |
| Example 144 | 0.100 | 0.200 | 0.100 | 2.800 | 0.00000000350 | A | A | A |
| Example 145 | 0.100 | 0.100 | 0.100 | 2.700 | 0.00000001350 | A | A | C |
| Example 146 | 0.100 | 0.100 | 0.100 | 3.200 | 0.00000001067 | A | A | B |
| Example 147 | 0.800 | 2.300 | 0.800 | 17.600 | 0.00000005867 | A | B | B |
| Example 148 | 2.100 | 4.100 | 1.200 | 45.300 | 0.0000015100 | B | A | B |
| Example 149 | 4.900 | 10.200 | 6.300 | 103.400 | 0.00000034467 | C | A | C |
| Example 150 | 0.100 | 0.300 | 0.100 | 3.000 | 0.00000001000 | B | B | C |
| Example 151 | 0.100 | 0.200 | 0.100 | 3.300 | 0.00000001100 | C | C | C |
| Example 152 | 0.100 | 0.300 | 0.100 | 2.900 | 0.00000000967 | C | D | C |
| Example 153 | 0.100 | 0.100 | 0.100 | 2.300 | 0.00000000767 | A | A | A |
| Comparative Example 101 | 1,380 | 200.000 | 100.000 | 5,630.000 | 0.00001874105 | E | D | E |
| Comparative Example 102 | 0.001 | 0.001 | 0.001 | 0.001 | 0.00000000000 | C | E | E |

What is claimed is:

1. A method for manufacturing an electronic device, the method comprising performing a treatment using a treatment liquid for manufacturing a semiconductor, the treatment liquid for manufacturing a semiconductor comprising:
    a quaternary ammonium compound represented by the following Formula (N);
    at least one additive selected from the group consisting of an anionic surfactant, a nonionic surfactant, a cationic surfactant, and a chelating agent;
    water; and
    one kind or two or more kinds of metal atoms selected from the group consisting of Na, K, Ca, Fe, Cu, Mg, Mn, Li, Al, Cr, Ni, and Zn,
    wherein a ratio $T_1$ of a total mass of the metal atoms to the sum of a total mass of the additive and the total mass of the metal atoms as defined by the following formula is in a range from 1 ppt to 1 ppm, $T_1$=[total mass of the metal atoms]/([total mass of the additive]+[total mass of the metal atoms]),

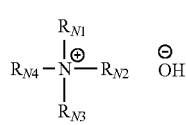

in Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent.

2. The method for manufacturing an electronic device according to claim 1,
    wherein the ratio $T_1$ is in a range from 1 ppb to 1 ppm.

3. The method for manufacturing an electronic device according to claim 1,
    wherein a ratio $T_2$ of a total mass of particulate metal of the metal atoms measured by a SP-ICP-MS method to the sum of the total mass of the additive and the total mass of the particulate metal as defined by the following formula is in a range from 0.1 ppt to 0.1 ppm, $T_2$=[total mass of the particulate metal]/([total mass of the additive]+[total mass of the particulate metal]).

4. The method for manufacturing an electronic device according to claim 1,
    wherein a ratio $T_2$ of a total mass of particulate metal of the metal atoms measured by a SP-ICP-MS method to the sum of the total mass of the additive and the total mass of the particulate metal as defined by the following formula is in a range from 0.1 ppt to 1 ppb, $T_2$=[total mass of the particulate metal]/([total mass of the additive]+[total mass of the particulate metal]).

5. The method for manufacturing an electronic device according to claim 1,
    wherein a content of the quaternary ammonium compound is 25 mass % or lower and a content of the additive is 1 mass % or lower with respect to the treatment liquid for manufacturing a semiconductor.

6. The method for manufacturing an electronic device according to claim 1,
    wherein a content of each of the one kind or two or more kinds of metal atoms selected from the group consisting of Na, K, Ca, Fe, Cu, Mg, Mn, Li, Al, Cr, Ni, and Zn is 1 mass ppq to 1000 mass ppt with respect to the treatment liquid for manufacturing a semiconductor.

7. The method for manufacturing an electronic device according to claim 1,
wherein a content of each of the one kind or two or more kinds of metal atoms selected from the group consisting of Na, K, and Ca is 1 mass ppq to 1000 mass ppt with respect to the treatment liquid for manufacturing a semiconductor.

8. The method for manufacturing an electronic device according to claim 1,
wherein the treatment liquid for manufacturing a semiconductor comprises at least the nonionic surfactant as the additive and further comprises a peroxide, and
a content of the peroxide is 1 mass ppq to 1000 mass ppt with respect to the treatment liquid for manufacturing a semiconductor.

9. The method for manufacturing an electronic device according to claim 1,
wherein the treatment liquid for manufacturing a semiconductor comprises at least the nonionic surfactant as the additive and further comprises an ester compound, and
a content of the ester compound is 1 mass ppq to 1000 mass ppt with respect to the treatment liquid for manufacturing a semiconductor.

10. The method for manufacturing an electronic device according to claim 1,
wherein the treatment liquid for manufacturing a semiconductor comprises at least the nonionic surfactant as the additive and further comprises an amine compound, and
a content of the amine compound is 1 mass ppq to 1000 mass ppt with respect to the treatment liquid for manufacturing a semiconductor.

11. The method for manufacturing an electronic device according to claim 1,
wherein the treatment liquid for manufacturing a semiconductor comprises at least the nonionic surfactant as the additive, and
a hydrophile-lipophile balance value of the nonionic surfactant is 8 or higher.

12. The method for manufacturing an electronic device according to claim 1,
wherein the treatment liquid for manufacturing a semiconductor comprises at least the nonionic surfactant as the additive, and
the treatment liquid for manufacturing a semiconductor comprises at least a compound represented by the following Formula (A1) as the nonionic surfactant,

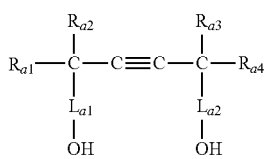

in Formula (A1),
$R_{a1}$, $R_{a2}$, $R_{a3}$, and $R_{a4}$ each independently represent an alkyl group, and
$L_{a1}$ and $L_{a2}$ each independently represent a single bond or a divalent linking group.

13. The method for manufacturing an electronic device according to claim 1,
wherein the treatment liquid for manufacturing a semiconductor comprises at least the anionic surfactant as the additive and further comprises an inorganic salt, and
a content of the inorganic salt is 1 mass ppq to 1000 mass ppt with respect to the treatment liquid for manufacturing a semiconductor.

14. The method for manufacturing an electronic device according to claim 1,
wherein the treatment liquid for manufacturing a semiconductor comprises at least the cationic surfactant as the additive and further comprises an inorganic salt, and
a content of the inorganic salt is 1 mass ppq to 1000 mass ppt with respect to the treatment liquid for manufacturing a semiconductor.

15. The method for manufacturing an electronic device according to claim 1,
wherein the treatment liquid for manufacturing a semiconductor comprises at least a chelating agent represented by the following Formula (K1) or (K2) as the additive,
a portion of the chelating agent forms a chelate complex with the one kind or two or more kinds of metal atoms selected from the group consisting of Na, K, Ca, Fe, Cu, Mg, Mn, Li, Al, Cr, Ni, and Zn, and
a content of the chelate complex is 1 mass ppq to 1000 mass ppt with respect to the treatment liquid for manufacturing a semiconductor,

in Formula (K1),
$R^{K1}$ and $R_{K2}$ each independently represent a single bond or an alkylene group,
$R^{K3}$ represents a divalent organic group,
$X_1$ represents a CH group or a nitrogen atom,
$Y^{K1}$ and $Y^{K2}$ each independently represent a metal-adsorbing group, and
$A_1$ represents a hydrogen atom or a hydrophilic group, and
in Formula (K2),
$R^{K4}$, $R^{K5}$, $R^{K6}$, and $R^{K7}$ each independently represent a single bond or an alkylene group,
$R^{K8}$ represents a trivalent organic group,
$X_2$ and $X_3$ each independently represent a CH group or a nitrogen atom,
$Y^{K3}$, $Y^{K4}$, $Y^{K5}$ and $Y^{K6}$ each independently represent a metal-adsorbing group, and
$A_2$ represents a hydrogen atom or a hydrophilic group.

16. The method for manufacturing an electronic device according to claim 1,
wherein the treatment liquid for manufacturing a semiconductor comprises two or more of the additives.

17. The method for manufacturing an electronic device according to claim 1,
wherein the treatment liquid for manufacturing a semiconductor comprises two or more of the nonionic surfactants as the additive.

18. The method for manufacturing an electronic device according to claim 17,
wherein the treatment liquid for manufacturing a semiconductor comprises at least one first nonionic surfactant having a hydrophile-lipophile balance value of 12 or higher and at least one second nonionic surfactant having a hydrophile-lipophile balance value of 10 or lower as the two or more of the nonionic surfactants.

19. The method for manufacturing an electronic device according to claim 1,
wherein the treatment liquid for manufacturing a semiconductor comprises at least the nonionic surfactant as the additive, and
the treatment liquid for manufacturing a semiconductor comprises at least a compound represented by the following Formula (A1) as the nonionic surfactant,

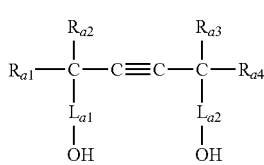

(A1)

in Formula (A1),
$R_{a1}$, $R_{a2}$, $R_{a3}$, and $R_{a4}$ each independently represent an alkyl group, and
$L_{a1}$ and $L_{a2}$ each independently represent a single bond or a divalent linking group.

20. The method for manufacturing an electronic device according to claim 19,
wherein the treatment liquid for manufacturing a semiconductor comprises at least two of the nonionic surfactants as the additive, and
the at least two of the nonionic surfactants are the compounds represented by Formula (A1).

21. The method for manufacturing an electronic device according to claim 19,
wherein the compound represented by Formula (A1) is a compound represented by the following Formula (A2),

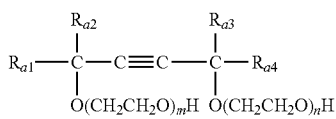

(A2)

in Formula (A2),
$R_{a1}$, $R_{a2}$, $R_{a3}$, and $R_{a4}$ each independently represent an alkyl group,
m and n each independently represent a positive number of 0.5 to 80, and
$m+n \geq 1$ is satisfied.

22. The method for manufacturing an electronic device according to claim 1, comprising a pattern forming method, the pattern forming method comprising:
forming a film using an actinic ray-sensitive or radiation-sensitive resin composition or a coloring curable resin composition;
exposing the formed film; and
treating the exposed film using the treatment liquid for manufacturing a semiconductor to form a treated film.

23. The method for manufacturing an electronic device according to claim 22,
wherein the treatment is developing.

24. The method for manufacturing an electronic device according to claim 22,
wherein the treatment is developing and rinsing.

25. The method for manufacturing an electronic device according to claim 22, further comprising:
cleaning the treated film using a rinsing liquid including an organic solvent or using water.

26. The method for manufacturing an electronic device according to claim 25,
wherein the rinsing liquid including an organic solvent is a rinsing liquid including at least one organic solvent selected from the group consisting of a hydrocarbon solvent, a ketone solvent, an ester solvent, an alcohol solvent, an amide solvent, and an ether solvent as the organic solvent.

27. The method for manufacturing an electronic device according to claim 25,
wherein the rinsing liquid including an organic solvent is a rinsing liquid including at least an alcohol solvent as the organic solvent.

28. The method for manufacturing an electronic device according to claim 25,
wherein the rinsing liquid including an organic solvent is a rinsing liquid including a linear, branched, or cyclic monohydric alcohol having 6 to 8 carbon atoms as the organic solvent.

29. The method for manufacturing an electronic device according to claim 25,
wherein a moisture content of the rinsing liquid including an organic solvent is 30 mass % or lower.

30. The method for manufacturing an electronic device according to claim 1,
wherein the ratio $T_1$ is in a range from 400 ppt to 1 ppm.

31. The method for manufacturing an electronic device according to claim 1,
wherein the ratio $T_1$ is in a range from 35 ppb to 0.105 ppm.

32. A method for manufacturing an electronic device, the method comprising performing a treatment using a treatment liquid for manufacturing a semiconductor, the treatment liquid for manufacturing a semiconductor comprising:
a quaternary ammonium compound represented by the following Formula (N);
at least one additive selected from the group consisting of an anionic surfactant, a nonionic surfactant, a cationic surfactant, and a chelating agent;
water; and
one kind or two or more kinds of metal atoms selected from the group consisting of Na, K, Ca, Fe, Cu, Mg, Mn, Li, Al, Cr, Ni, and Zn,
wherein a ratio $T_1$ of a total mass of the metal atoms to the sum of a total mass of the additive and the total mass of the metal atoms as defined by the following formula is in a range from 1 ppt to 1 ppm, $T_1$=[total mass of the metal atoms]/([total mass of the additive]+[total mass of the metal atoms]),

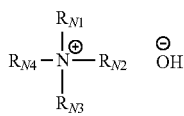
(N)

in Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent, a content of each of the one kind or two or more kinds of metal atoms selected from the group consisting of Na, K, Ca, Fe, Cu, Mg, Mn, Li, Al, Cr, Ni, and Zn is 1 mass ppq to 500 mass ppt with respect to the treatment liquid for manufacturing a semiconductor, and a content of the additive is 1 mass % or lower with respect to the treatment liquid for manufacturing a semiconductor.

33. The method for manufacturing an electronic device according to claim 32, wherein a content of each of the one kind or two or more kinds of metal atoms selected from the group consisting of Na, K, and Ca is 1 mass ppq to 500 mass ppt with respect to the treatment liquid for manufacturing a semiconductor.

34. A method for manufacturing an electronic device, the method comprising performing a treatment using a treatment liquid for manufacturing a semiconductor, the treatment liquid for manufacturing a semiconductor comprising:

a quaternary ammonium compound represented by the following Formula (N);

at least one additive selected from the group consisting of an anionic surfactant, a nonionic surfactant, a cationic surfactant, and a chelating agent;

water; and one kind or two or more kinds of metal atoms selected from the group consisting of Na, K, Ca, Fe, Cu, Mg, Mn, Li, Al, Cr, Ni, and Zn, wherein a ratio $T_1$ of a total mass of the metal atoms to the sum of a total mass of the additive and the total mass of the metal atoms as defined by the following formula is in a range from 1 ppt to 1 ppm, $T_1$=[total mass of the metal atoms]/([total mass of the additive]+[total mass of the metal atoms]), a ratio $T_2$ of a total mass of particulate metal of the metal atoms measured by a SP-ICP-MS method to the sum of the total mass of the additive and the total mass of the particulate metal as defined by the following formula is in a range from 0.1 ppt to 0.1 ppm, $T_2$=[total mass of the particulate metal]/([total mass of the additive]+[total mass of the particulate metal]), where the particulate metal is a nonionic metal component derived from the metal atoms which is not dissolved in the treatment liquid and exists as a solid, and

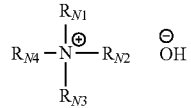
(N)

in Formula (N), $R_{N1}$ to $R_{N4}$ each independently represent an alkyl group, a phenyl group, a benzyl group, or a cyclohexyl group, and the alkyl group, the phenyl group, the benzyl group, or the cyclohexyl group may have a substituent.

\* \* \* \* \*